(12) United States Patent
Song et al.

(10) Patent No.: US 9,351,178 B2
(45) Date of Patent: *May 24, 2016

(54) DIGITAL BROADCASTING SYSTEM AND METHOD OF PROCESSING DATA

(71) Applicant: LG ELECTRONICS INC., Seoul (KR)

(72) Inventors: Jae Hyung Song, Seoul (KR); In Hwan Choi, Gwacheon-si (KR); Ho Taek Hong, Seoul (KR); Kook Yeon Kwak, Anyang-si (KR); Byoung Gill Kim, Seoul (KR); Jong Yeul Suh, Seoul (KR); Jin Pil Kim, Seoul (KR); Won Gyu Song, Seoul (KR); Chul Soo Lee, Seoul (KR); Jin Woo Kim, Seoul (KR); Hyoung Gon Lee, Seoul (KR); Joon Hui Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 6 days.

This patent is subject to a terminal disclaimer.

(21) Appl. No.: 14/173,698

(22) Filed: Feb. 5, 2014

(65) Prior Publication Data

US 2014/0219266 A1 Aug. 7, 2014

Related U.S. Application Data

(63) Continuation of application No. 13/118,345, filed on May 27, 2011, now abandoned, which is a
(Continued)

(30) Foreign Application Priority Data

Jun. 26, 2008 (KR) .......................... 10-2008-0061230

(51) Int. Cl.
*H04W 24/02* (2009.01)
*H04H 20/30* (2008.01)
(Continued)

(52) U.S. Cl.
CPC .......... *H04W 24/02* (2013.01); *H03M 13/2912* (2013.01); *H03M 13/2915* (2013.01);
(Continued)

(58) Field of Classification Search
CPC ....... H04H 20/28; H04H 20/30; H04H 20/33; H04J 3/02; H04J 3/16; H03M 13/15; H03M 13/1515; H04N 21/23614
USPC ................... 370/345, 470, 471; 375/240, 295
See application file for complete search history.

(56) References Cited

U.S. PATENT DOCUMENTS

| 5,754,651 A | 5/1998 | Blatter et al. |
| 7,068,326 B2 | 6/2006 | Choi et al. |

(Continued)

FOREIGN PATENT DOCUMENTS

| CN | 1418433 | 5/2003 |
| CN | 1965508 | 5/2007 |

(Continued)

OTHER PUBLICATIONS

ATSC Standard: Digital Television Standard (A/53), Revision D, Including Amendment No. 1, 27, Jul. 2005.
(Continued)

*Primary Examiner* — Xavier S. Wong
(74) *Attorney, Agent, or Firm* — Dentons US LLP

(57) ABSTRACT

The present invention relates to a digital broadcasting system for transmitting/receiving a digital broadcasting signal and a method of processing data. In one aspect of the present invention provides a method of processing data, the method including receiving a broadcasting signal in which mobile service data and main service data are multiplexed, demodulating the received broadcasting signal, obtaining an identifier indicating that data frame of the broadcasting signal includes service guide information, decoding and storing the service guide information from the data frame; and outputting a service included in the mobile service data according to the decoded service guide information.

10 Claims, 110 Drawing Sheets

Related U.S. Application Data continuation of application No. 12/165,162, filed on Jun. 30, 2008, now Pat. No. 7,986,715.

(60) Provisional application No. 60/977,379, filed on Oct. 4, 2007, provisional application No. 60/974,084, filed on Sep. 21, 2007, provisional application No. 60/957,714, filed on Aug. 24, 2007, provisional application No. 60/946,989, filed on Jun. 29, 2007.

(51) Int. Cl.

| | | |
|---|---|---|
| *H04H 20/57* | (2008.01) | |
| *H04N 21/23* | (2011.01) | |
| *H04N 21/43* | (2011.01) | |
| *H04J 3/02* | (2006.01) | |
| *H03M 13/29* | (2006.01) | |
| *H04H 60/72* | (2008.01) | |
| *H04N 21/236* | (2011.01) | |
| *H04N 21/2362* | (2011.01) | |
| *H04N 21/2381* | (2011.01) | |
| *H04N 21/2383* | (2011.01) | |
| *H04N 21/434* | (2011.01) | |
| *H04N 21/438* | (2011.01) | |
| *H04N 21/6437* | (2011.01) | |
| *H03M 13/09* | (2006.01) | |
| *H03M 13/15* | (2006.01) | |
| *H03M 13/23* | (2006.01) | |
| *H04H 20/55* | (2008.01) | |

(52) U.S. Cl.
CPC .......... *H03M13/2945* (2013.01); *H04H 20/30* (2013.01); *H04H 20/57* (2013.01); *H04H 60/72* (2013.01); *H04J 3/02* (2013.01); *H04N 21/2362* (2013.01); *H04N 21/2381* (2013.01); *H04N 21/2383* (2013.01); *H04N 21/23614* (2013.01); *H04N 21/4345* (2013.01); *H04N 21/4348* (2013.01); *H04N 21/4381* (2013.01); *H04N 21/4382* (2013.01); *H04N 21/6437* (2013.01); *H03M 13/09* (2013.01); *H03M 13/15* (2013.01); *H03M 13/1515* (2013.01); *H03M 13/23* (2013.01); *H04H 20/55* (2013.01)

(56) References Cited

U.S. PATENT DOCUMENTS

| | | | |
|---|---|---|---|
| 7,593,474 B2 | 9/2009 | Jeong et al. | |
| 7,646,828 B2 | 1/2010 | Song et al. | |
| 7,705,920 B2 | 4/2010 | Lee et al. | |
| 7,733,819 B2 | 6/2010 | Lee et al. | |
| 7,733,820 B2 | 6/2010 | Choi et al. | |
| 7,782,808 B2 | 8/2010 | Suh et al. | |
| 7,801,181 B2 | 9/2010 | Song et al. | |
| 7,809,139 B2 | 10/2010 | Choi et al. | |
| 7,813,310 B2 | 10/2010 | Song et al. | |
| 7,966,633 B2 * | 6/2011 | Yun et al. | 725/68 |
| 7,986,715 B2 | 7/2011 | Song et al. | |
| 8,190,979 B2 | 5/2012 | Song et al. | |
| 8,325,760 B2 | 12/2012 | Song et al. | |
| 2001/0052133 A1 | 12/2001 | Pack et al. | |
| 2003/0121045 A1 | 6/2003 | Cho | |
| 2004/0179612 A1 | 9/2004 | Choi et al. | |
| 2004/0237024 A1 | 11/2004 | Limberg | |
| 2005/0262419 A1 * | 11/2005 | Becker et al. | 714/758 |
| 2005/0277417 A1 | 12/2005 | Yoon et al. | |
| 2005/0289586 A1 * | 12/2005 | Park et al. | 725/31 |
| 2006/0126633 A1 | 6/2006 | Park | |
| 2006/0140301 A1 | 6/2006 | Choi et al. | |
| 2006/0184965 A1 | 8/2006 | Lee et al. | |
| 2006/0239378 A1 * | 10/2006 | Jung et al. | 375/295 |
| 2006/0253544 A1 * | 11/2006 | Luoma | H04H 60/25 709/217 |
| 2007/0061841 A1 | 3/2007 | Bae et al. | |
| 2007/0076758 A1 | 4/2007 | Kim et al. | |
| 2007/0092043 A1 | 4/2007 | Yu et al. | |
| 2007/0101352 A1 * | 5/2007 | Rabina et al. | 725/1 |
| 2007/0140369 A1 | 6/2007 | Limberg | |
| 2007/0220558 A1 * | 9/2007 | Jung | H04W 68/00 725/62 |
| 2007/0268883 A1 | 11/2007 | Quelle et al. | |
| 2008/0130617 A1 | 6/2008 | Singh et al. | |
| 2008/0189540 A1 * | 8/2008 | Jansky | H04H 60/39 713/2 |
| 2008/0246887 A1 | 10/2008 | Lee et al. | |
| 2009/0034442 A1 | 2/2009 | Song et al. | |
| 2009/0034556 A1 | 2/2009 | Song et al. | |

FOREIGN PATENT DOCUMENTS

| | | |
|---|---|---|
| EP | 1085750 | 3/2001 |
| JP | 9284664 | 10/1997 |
| JP | 2001-54031 | 2/2001 |
| JP | 2002141877 | 5/2002 |
| JP | 2007096403 | 4/2007 |
| KR | 10-2002-0080992 | 10/2002 |
| KR | 10-2002-0089078 | 11/2002 |
| KR | 10-2003-0037138 | 5/2003 |
| KR | 10-2003-0062138 | 7/2003 |
| KR | 10-2005-0049923 | 5/2005 |
| KR | 10-2005-0036552 | 4/2006 |
| KR | 10-2006-0039728 | 5/2006 |
| KR | 1020060053061 | 5/2006 |
| KR | 10-2006-0063867 | 6/2006 |
| KR | 10-2007-0007995 | 1/2007 |
| KR | 10-2007-0068960 | 7/2007 |
| WO | 2005/032034 | 4/2005 |
| WO | 2005-071958 | 8/2005 |
| WO | 2006/003531 | 1/2006 |

OTHER PUBLICATIONS

European Telecommunications Standards Institute (ETSI), "Radio Broadcasting Systems; Digital Audio Broadcasting (DAB) to Mobile, Portable and Fixed Receivers," ETSI EN 300 401, REN/JTC-DAB-36, Version 1.4.1, Jun. 2006.

Digital Video Broadcasting (DVB), "DVB-H Implementation Guidelines," DVB Doc. A092, Rev. 2, May 2007.

Gorry Fairhurst, et al., "Extension Formats for Unidirectional Lightweight Encapsulation (ULE) and the Generic Stream Encapsulation (GSE)," draft-ietf-ipdvb-ule-ext-04.txt, Internet Draft, Internet Engineering Task Force (IETF), Aug. 2007.

Graell et al., "Analysis and Design of Rate Compatible Serial Concatenated Convolutional Codes," Information Theory, 2005. ISIT 2005. Proceedings. International Symposium, IEEE, Sep. 4-9, 2005.

Gunther May, "Loss-Free Handover for IP Datacast over DVB-H Networks," Proceedings of the Ninth International Symposium on Consumer Electronics, pp. 203-08, Jun. 2005.

* cited by examiner

FIG. 9

| Sub-Frame #0 | | Sub-Frame #1 | | Sub-Frame #2 | | Sub-Frame #3 | | Sub-Frame #4 | | | | | | | |
|---|---|---|---|---|---|---|---|---|---|---|---|---|---|---|---|
| 0 | 8 | 4 | 12 | 1 | 9 | 5 | 13 | 2 | 10 | 2 | 14 | 3 | 11 | 7 | 15 |
| Slot #0 | Slot #1 | Slot #2 | Slot #3 | Slot #4 | Slot #5 | Slot #6 | Slot #7 | Slot #8 | Slot #9 | Slot #10 | Slot #11 | Slot #12 | Slot #13 | Slot #14 | Slot #15 |

Group number (Group assignment order)

Slot number

MPH Frame

FIG. 22
(a) 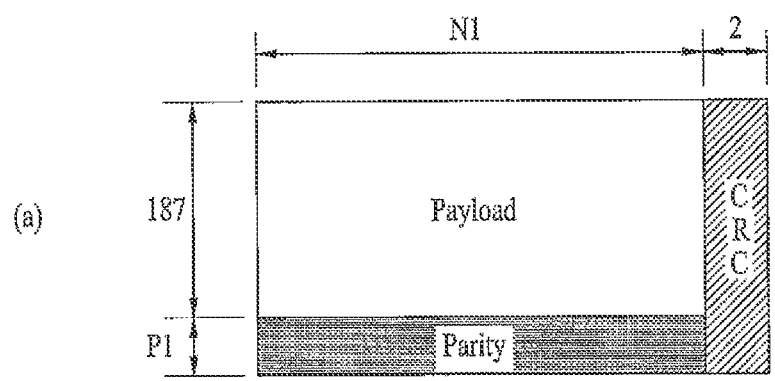
(b) 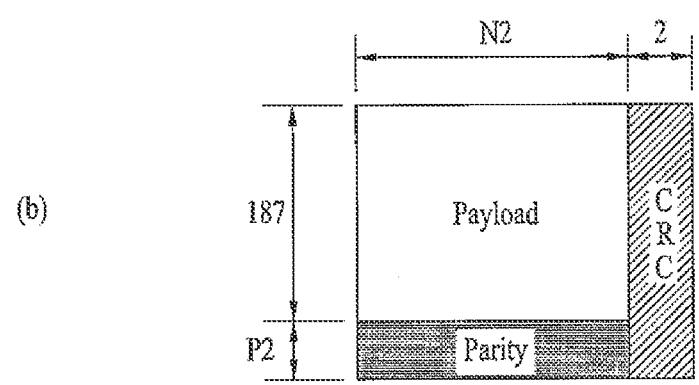

FIG. 26

| i | 0 | 1 | 2 | 3 | 4 | 5 | 6 | 7 | 8 | 9 | 10 | 11 | 12 | 13 | 14 | 15 | ... | 2110 | 2111 |
|---|---|---|---|---|---|---|---|---|---|---|----|----|----|----|----|----|-----|------|------|
| P(i) | 0 | 89 | 267 | 534 | 890 | 1335 | 1869 | 2492 | 3204 | 4005 | 799 | 1778 | 2846 | 4003 | 1153 | 2483 | ... | 2809 | 2272 |
| P(i) | 0 | 89 | 267 | 534 | 890 | 1335 | 1869 | 799 | 1778 | 1153 | 1329 | 526 | 79 | 2037 | 253 | 874 | ... | 444 | 2048 |

FIG. 31

| Syntax | No. of bits | Format |
|---|---|---|
| TPC_data { | | |
|    Sub-Frame_number | 3 | uimsbf |
|    Slot_number | 4 | uimsbf |
|    Parade_id | 7 | uimsbf |
|    starting_Group_number | 4 | uimsbf |
|    number_of_Groups | 3 | uimsbf |
|    Parade_repetition_cycle | 3 | uimsbf |
|    RS_Frame_mode | 2 | bslbf |
|    RS_code_mode_primary | 2 | bslbf |
|    RS_code_mode_secondary | 2 | bslbf |
|    SCCC_Block_mode | 2 | bslbf |
|    SCCC_outer_code_mode_A | 2 | bslbf |
|    SCCC_outer_code_mode_B | 2 | bslbf |
|    SCCC_outer_code_mode_C | 2 | bslbf |
|    SCCC_outer_code_mode_D | 2 | bslbf |
|    FIC_version | 5 | uimsbf |
|    Parade_continuity_counter | 4 | uimsbf |
|    TNoG | 5 | uimsbf |
|    reserved | 26 | bslbf |
| } | | |

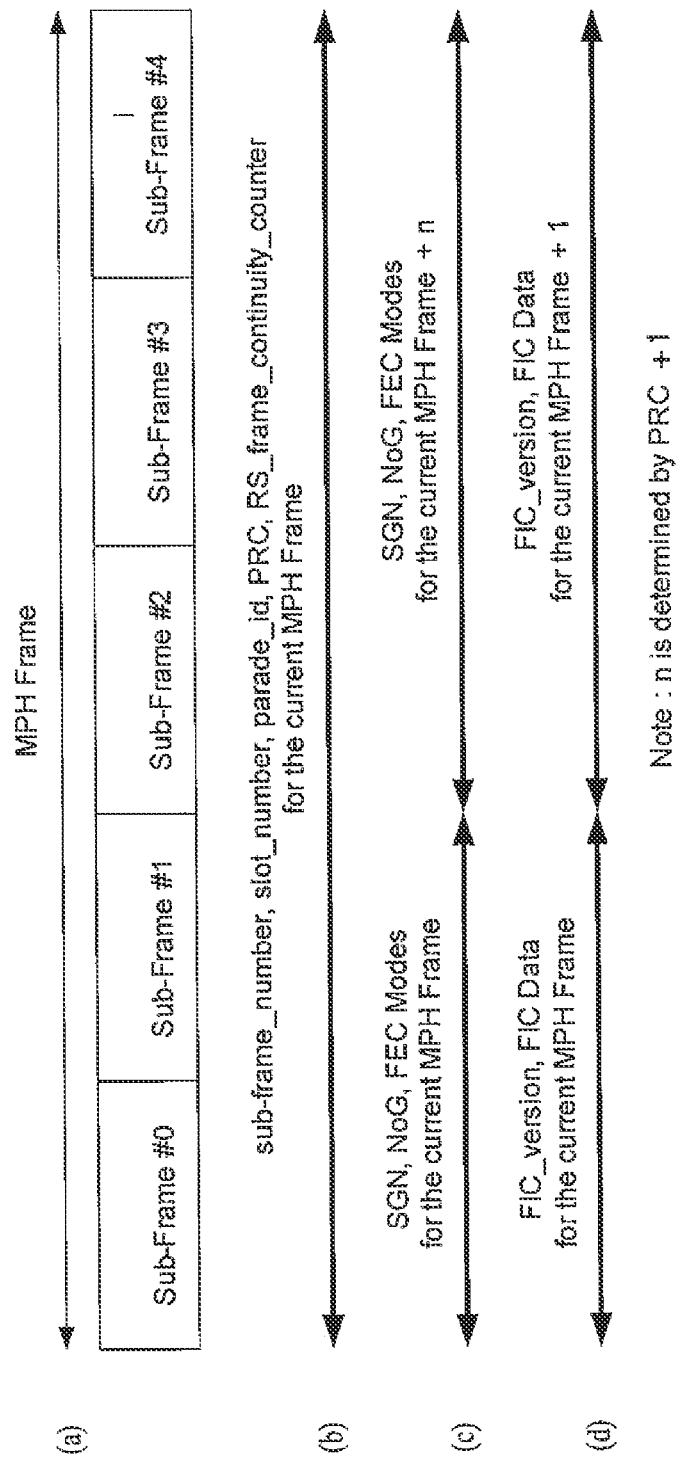

FIG. 67

| Syntax | No. of Bits | Format |
|---|---|---|
| virtual_channel_table_section(){ | | |
|   table_id | 8 | 0xC8 |
|   section_syntax_indicator | 1 | '1' |
|   Private_indicator | 1 | '1' |
|   reserved | 2 | '11' |
|   section_length | 12 | uimsbf |
|   transport_stream_id | 16 | uimsbf |
|   reserved | 2 | '11' |
|   version_number | 5 | uimsbf |
|   current_next_indicator | 1 | bslbf |
|   section_number | 8 | uimsbf |
|   last_section_number | 8 | uimsbf |
|   protocol_version | 8 | uimsbf |
|   num_channels_in_section | 8 | uimsbf |
|   for(i=0;i<num_channels_in_section;i++){ | | |
|     short_name | 7*16 | uimsbf |
|     reserved | 4 | '1111' |
|     major_channel_number | 10 | uimsbf |
|     minor_channel_number | 10 | uimsbf |
|     modulation_mode | 8 | uimsbf |
|     carrier_frequency | 32 | uimsbf |
|     channel_TSID | 16 | uimsbf |
|     program_number | 16 | uimsbf |
|     ETM_location | 2 | uimsbf |
|     access_controlled | 1 | bslbf |
|     hidden | 1 | bslb |
|     reserved | 6 | '111111' |
|     service_type | 6 | uimsbf |
|     source_id | 16 | uimsbf |
|     reserved | 6 | '111111' |
|     descriptors_length | 10 | uimsbf |
|     for(i=0;i<N;i++){ | | |
|       descriptors() | | |
|     } | | |
|   } | | |
|   reserved | 6 | '111111' |
|   additional_descriptors_length | 10 | uimsbf |
|   for(j=0;j<N;j++){ | | |
|     additional_descriptors() | | |
|   } | | |
|   CRC_32 | 32 | rpchof |
| } | | |

FIG. 68

| service_type | Meaning |
|---|---|
| 0x00 | [Reserved] |
| 0x01 | analog_television --- The virtual channel carries analog television programming |
| 0x02 | ATSC_digital_television --- The virtual channel carries television programming (audio, video and optional associated data) conforming to ATSC standards |
| 0x03 | ATSC_audio --- The virtual channel carries audio programming (audio service and optional associated data) conforming to ATSC standards |
| 0x04 | ATSC_data_only_service --- The virtual channel carries a data service conforming to ATSC standards, but no video of stream_type 0x02 or audio of stream_type 0x81 |
| 0x05 | mobile_service |
| 0x06 - 0x3F | [Reserved for future ATSC use] |

FIG. 69

| Syntax | Bits | Format |
|---|---|---|
| service_location_descriptor() { | | |
| descriptor_tag | 8 | 0xA1 |
| descriptor_length | 8 | uimsbf |
| reserved | 3 | '111' |
| PCR_PID | 13 | uimsbf |
| number_elements | 8 | uimsbf |
| for(i=0; i<number_elements; i++) { | | |
| stream_type | 8 | uimsbf |
| reserved | 3 | '111' |
| elementary_PID | 13 | uimsbf |
| ISO_639_language_code | 8*3 | uimsbf |
| } | | |
| } | | |

FIG. 70

| Value | Description |
|---|---|
| 0x00 | ITU-T | ISO/IEC Reserved |
| 0x01 | ISO/IEC 11172 Video |
| 0x02 | ITU-T Rec. H.262 | ISO/IEC 13818-2 Video or ISO/IEC 11172-2 constrained parameter video stream |
| 0x03 | ISO/IEC 11172 Audio |
| 0x04 | ISO/IEC 13818-3 Audio |
| 0x05 | ITU-T Rec. H.222.0 | ISO/IEC 13818-1 private_sections |
| 0x06 | ITU-T Rec. H.222.0 | ISO/IEC 13818-1 PES packets containing private data ISO/IEC 13522 MHEG |
| 0x07 | ITU-T Rec. H.222.0 | ISO/IEC 13818-1 Annex A DSM CC |
| 0x08 | ITU-T Rec. H.222.1 |
| 0x09 | ISO/IEC 13818-6 type A |
| 0x0A | ISO/IEC 13818-6 type B |
| 0x0B | ISO/IEC 13818-6 type C |
| 0x0C | ISO/IEC 13818-6 type D |
| 0x0D | ISO/IEC 13818-1 auxiliary |
| 0x0E | MPH - video stream : Non-hierarchical mode |
| 0x0F | MPH - audio stream : Non-hierarchical mode |
| 0x10 | MPH - Non-A/V stream : Non-hierarchical mode |
| 0x11 | MPH - High Priority video stream : Hierarchical mode |
| 0x12 | MPH - High Priority audio stream : Hierarchical mode |
| 0x13 | MPH - Low Priority video stream : Hierarchical mode |
| 0x14 | MPH - Low priority audio stream : Hierarchical mode |
| 0x15 | ITU-T Rec. H.222.0 | ISO/IEC 13818-1 Reserved |
| 0x16~0x7F | User Private |
| 0x80~0xFF | |

FIG. 71

| Syntax | No. of Bits | Format |
|---|---|---|
| event_information_table_section(){ | | |
|     table_id | 8 | 0xCB |
|     section_syntax_indicator | 1 | '1' |
|     Private_indicator | 1 | '1' |
|     reserved | 2 | '11' |
|     section_length | 12 | uimsbf |
|     source_id | 16 | uimsbf |
|     reserved | 2 | '11' |
|     version_number | 5 | uimsbf |
|     current_next_indicator | 1 | '1' |
|     section_number | 8 | uimsbf |
|     last_section_number | 8 | uimsbf |
|     protocol_version | 8 | uimsbf |
|     num_events_in_section | 8 | uimsbf |
|     for(j=0;j<num_events_in_section;j++){ | | |
|         reserved | 2 | '11' |
|         event_id | 14 | uimsbf |
|         start_time | 32 | uimsbf |
|         reserved | 2 | '11' |
|         ETM_location | 2 | uimsbf |
|         length_in_seconds | 20 | uimsbf |
|         title_length | 8 | uimsbf |
|         title_text() | var | |
|         reserved | 4 | '1111' |
|         descriptors_length | 12 | |
|         for(i=0;i<N;i++){ | | |
|             descriptors() | | |
|         } | | |
|     } | | |
|     CRC_32 | 32 | rpchof |
| } | | |

| Type Indicator(3) | Error Indicator(1) | Priority or stuff indicator (1) | Pointer Field (11) |

FIG. 80
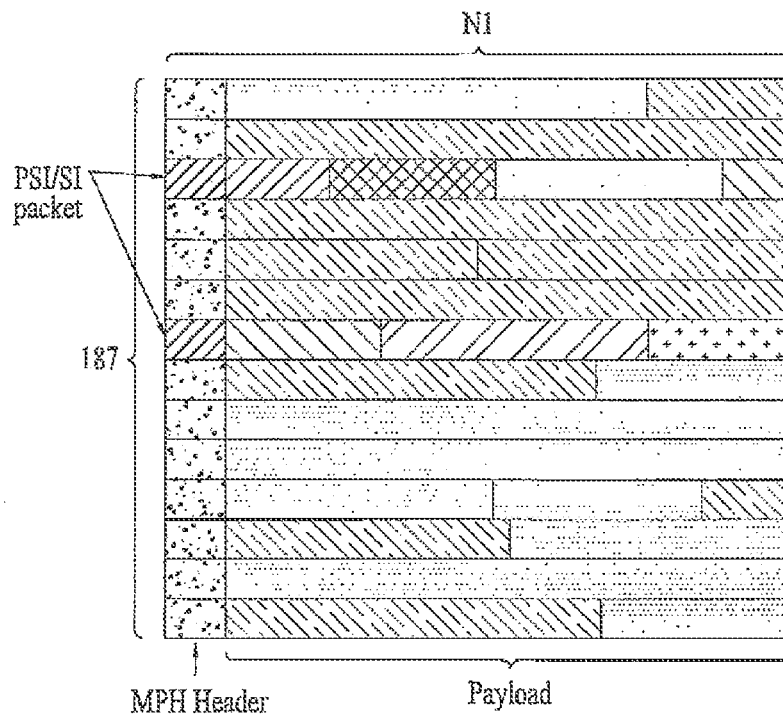
(a)
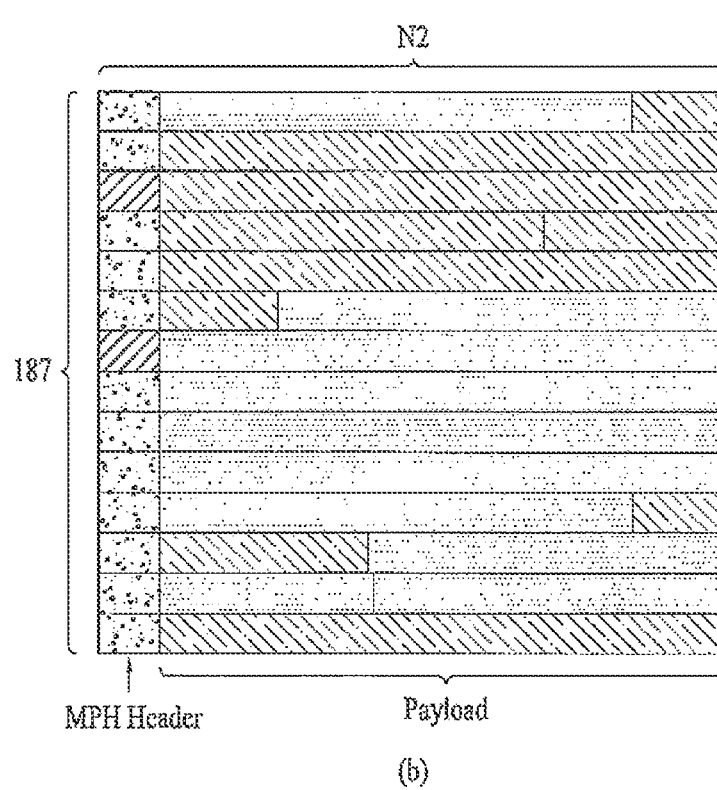
(b)

FIG. 82

| Physical Layer | No. of Bits |
|---|---|
| mph_stl_header() { | |
| parade_id | 8 |
| region_id | 1 |
| reserved | 7 |
| pkt_number | 16 |
| max_pkt_number | 16 |
| parade_size | 5 |
| sccc_mode | 3 |
| rs_mode | 2 |
| reserved | 6 |
| } | |

FIG. 101

| Syntax | No. of bits | Mnemonics |
|---|---|---|
| ESG Access Descriptor {<br>  n_o_ESGEntries<br>  for(i=0; i<n_o_ESGEntries; i++){<br>  ESGEntry[i] ()<br>} | 16 | uimsbf |

FIG. 102

| Syntax | No. of bits | Mnemonics | |
|---|---|---|---|
| ESGEntry{ | | | |
|   ESGEntryVersion | 8 | uimsbf | 2 |
|   ESGEntryLength | 8+ | vluimsbf8 | |
|   ProviderID | 16 | uimsbf | |
|   n_o_AccessPoints | 8 | uimsbf | |
|   for (i=0; i< n_o_AccessPoints; i++){ | | | |
|     AccessType | 8 | uimsbf | 1 for BC<br>2 for IA |
|     AccessPointLength | 8+ | vluimsbf8 | |
|     If (AccessType==0x01){ | | | |
|       MultipleStreamTransport | 1 | bslbf | |
|       IPVersion6 | 1 | bslbf | |
|       Reserved | 6 | bslbf | |
|       if(IPVersion6){ | | | |
|         SourceIPAddress | 128 | bslbf | |
|         DestinationIPAddress | 128 | bslbf | |
|       }else{ | | | |
|         SourceIPAddress | 32 | bslbf | |
|         DestinationIPAddress | 32 | bslbf | |
|       } | | | |
|       Port | 16 | uimsbf | |
|       TSI | 16 | uimsbf | |
|     } | | | |
|     Else if (AccessType==0x02){ | | | |
|       ServerCapability | 8 | bslbf | |
|       URL_Length | 8+ | vluimsbf8 | Note: Null terminating characters not included |
|       For (j=0; j<URL_Length;j++){ | | | |
|         URLByte | 8 | bslbf | Note:UTF-8 encoded<br>e.g.<br>http://bbc.co.uk/ESG1 |
|       } | | | |
|     } | | | |
|   } | | | |
| } | | | |

FIG. 103

| Field | Semantics |
|---|---|
| ESGEntryVersion | The Version SHALL be "1" if the AccessDescriptor contains only broadcast access description. The Version SHALL be "2" if the AccessDescriptor contains interactive ESG Access Point descriptions |
| AccessType | The Type SHALL be "1" for broadcast access descriptions. The Type SHALL be "2" for interactive access description |
| ServerCapability | The capability of ESG server. e.g. support SOAP, complete ESG download, repair fragment download, or complemeting data download. |
| URL_Length | The length of the interactive ESG Access Point URL |
| URLByte | UTF-8 encoded character of the interactive ESG AccessPoint URL |

| Capability | Semantics |
|---|---|
| COMPLETE | The complete ESG can be requested and deliverd over the given ESG Access Point |
| REPAIR | The server is able to deliver repair containers that may have been lost over broadcast |
| COMPLEMENTING | A Complementing ESG can be requested and delivered over the given ESG Access Point |
| SOAP SUPPORT | ESG can be queried via SOAP |

```
<ESGMain xmlns="urn : dvb : ipdc : esg : 2005">
    <ESG>
        <ContentTable/>
        <ScheduleEventTable/>
        <ServiceTable/>
        <ServiceBundleTable/>
        <PurchaseTable/>
        <PurchaseChannelTable/>
        <AcquisitionTable/>
    </ESG>
</ESGMain>
```

FIG. 106

```
<complexType name="ServiceType">
    <sequence>
        <element name="Servicename" type="tva ; ServiceInformationNameType"
            maxOccure="unbounded"/>
        <element name="ServiceNumber" type="unsignedShort" minOccure="0"/>
        <element name="ServiceLogo" type="mpeg7 : TitleMediaType" minOccurs="0"
            maxOccurs="unbounded"/>
        <element name ="ServiceDescription" type="tva : SynopsisType" minOccurs="0"
            maxOccurs="unbounded"/>
        <element name="ServiceGenre" type="tva : GenerType" minOccure="0" maxOccurs ="unbounded"/>
        <element name="ServiceType" type="tva : ControlledTermType" minOccurs="0"
            maxOccurs="unbounded"/>
        <element name="ParentalGuidance" type="mpeg7 : ParentalGuidanceType" minOccurs="0"
            maxOccurs="unbounded"/>
        <element name="ServiceLanguage" type="language" minOccurs="0" />
        <element name="ServiceProvider" type="esg ; ProviderType" minOccurs="0" />
        <element name="AcquisitionRef" type="esg : AcquisitionRefType" minOccurs="0"
            maxOccurs="unbounded"/>
        <element name="RelatedMaterial" type="esg : RelatedMaterialType" minOccurs="0"
            maxOccurs="unbounded"/>
        <element name="privateData" type="esg : PrivateDataType" minOccurs="0"
            maxOccurs="undbouded"/>
        </sequence>
        <attribute name="servicesID" type="anyURI" use="required"/>
        <attribute name="freeToAir" type="boolean" use="optional"/>
        <attribute name="clearToAir" type="boolean" use="optional"/>
    </complexType>
```

FIG. 107

```
<complexType name="ServiceBundleType">
    <sequence>
        <element name="ServiceBundleName" type="mpeg7 : TextualType" maxOccurs="unbounded"/>
        <element name="ServiceBundleProvider" type="esg : ProviderType" minOccurs="0"/>
        <element name="ServiceBundleMediaTitle" type="mpeg7 : TitlemediaType" minOccurs="0"/>
        <element name="ServiceBundleDescription" type="mpeg7 : TextualType" minOccurs="0"
        maxOccurs="unbounded"/>
        <element name="ServiceBundleGenre" type="tva : GenreType" minOccurs="0"
        maxOccurs="unbounded"/>
        <element name="ServiceRef" type="esg : ServiceRefType" minOccurs="0" maxOccurs="unbounded"/>
        <element name="ParentalGuidance" type="mpeg7 : ParentalGuidanceType" minOccurs="0"
        maxOccurs="unbounded"/>
        <element name="RelatedMaterial" type="esg : RelatedMaterialType" minOccurs="0"
        maxOccurs="unbounded"/>
    </sequence>
    <attribute name="serviceBundleID" type="anURI" use="required"/>
</complexType>
```

FIG. 108

```xml
<complexType name="contentType">
    <sequence>
        <element name="Title" type="mpeg7 : TitleType" minOccurs="0" maxOccurs="unbounded"/>
        <element name="MediaTitle" type="mpeg7 : TitleMediaType" minOccurs="0" maxOccurs="unbounded"/>
        <element name="ServiceRef" type="esg : ESGIDRefType" minOccurs="0" maxOccurs="unbounded"/>
        <element name="Synopsis" type="tva : SynopsisType" minOccurs="0" maxOccurs="unbounded"/>
        <element name="Keyword" type="tva : KeywordType" minOccurs="0" maxOccurs="unbounded"/>
        <element name="Genre" type="tva : GenreType" minOccurs="0" maxOccurs="unbounded"/>
        <element name=ContentType" type="tva ; ControlledTermType" minOccurs="0" maxOccurs="unbounded"/>
        <element name="ParentalGuidance" type="mpeg7 : ParentalGuidanceType" minOccurs="0" maxOccurs="unbounded"/>
        <element name="Language" type="mpeg7 : ExtendedLanguageType" minOccurs="0" maxOccurs="unbounded"/>
        <element name="CaptionLanguage" type="type="tva : CaptionLanguageType" minOccurs="0" maxOccurs="unbounded"/>
        <element name="SignLanguage" type="tva : SignLanguageType" minOccurs="0" maxOccurs="unbounded"/>
        <element name="CreditsList" type="tva : CreditsListTupe" minOccurs="0"/>
        <element name="RelatedMaterial" type="esg : RelatedMaterialType" minOccurs="0" maxOccurs="unbounded"/>
        <element name="Duration" type="duration" minOccurs="0"/>
        <element name="PrivateData" type="esg ; PrivateDataType" minOccurs="0" maxOccurs="unbounded"/>
    </sequence>
    <attribute name="contentID" type="anyURI" use="required"/>
</complexType>
```

FIG. 109

```
<complexType name="ScheduleEventType">
    <sequence>
        <element name="PublishedStartTime" type="dateTime" minOccurs="0"/>
        <element name="PublishedendTime" type="dateTime" minOccurs="0"/>
        <element name="ServiceRef" type="esg : ESGIDRefType"/>
        <sequence maxOccurs="unbounded">
            <element name="ContentFragmentRef" type="esg : ESGIDRefType" minOccurs="0"/>
            <sequence maxOccurs="unbounded">
                <element name="AcquisitionRef" type="esg : AcquisitionRefType"
                <element name="ContentLocation" type="anyURI" minOccurs="0"/>
            </sequence>
        </sequence>
    </sequence>
    <attribute name="live" type="boolean" use="optional"/>
    <attribute name="repeat" type="boolean" use="optional"/>
    <attribute name="freeToAir" type="boolean" use="optional"/>
    <attribute name="clearToAir" type="boolean" use="optional"/>
    <attribute name="scheduleID" type="anyURIn" use="optional"/>
</complexType>
```

FIG. 110

```xml
<complexType name="PurchaseType">
    <sequence>
        <element name="ServiceBundleRef" type="esg : ESGIDRefType" minOccurs="0"/>
        <element name="Prise" maxOccurs="unbounded">
            <complexType>
                <simpleConsent>
                    <extension base="float">
                        <attribute name="currency" type="esg : currencyCodeType" use="required"/>
                    <extension>
                </simpleContent>
            </complexType>
        <element>
        <element name="UsageConstraints" type="esg : UsageConstraintsType" minOccurs="0"
          maxOccurs="unbounded"/>
        <element name="Description" type="mpeg7 : TextualType" minOccurs="0"
          maxOccurs="unbounded"/>
        <element name="PurchaseRequest" type="esg : PurchaseRequestType" minOccurs="0"
          maxOccurs="unbounded"/>
        <element name="MediaTitle" type="mpeg7 : TitleMediaType" minOccurs="0"
          maxOccurs="unbounded"/>
    </sequence>
    <attribute name="start" type="dateTime" use="optional"/>
    <attribute name="end" type="dateTime" use="optional"/>
    <attribute name="purchaseID" type="anyURI" use="optional"/>
</complexType>
<simpleType name="currencyCodeType">
    <restriction base="string">
        <pattern value="[a-zA-Z]{3}"/>
    </restriction>
</simpleType>
<complexType name="UsageConstraintsType">
    <sequence>
        <element name="PurchaseType" type="tva : ControlleedTermType" minOccurs="0"/>
        <element name="QuantityUnit" type="tva : ControlleedTermType" minOccurs="0"/>
        <element name="QuantityRange" minOccurs="0"/>
            <complexType>
                <attribute name="min" type="unsignedInt" use="optional"/>
                <attribute name="max" type="unsignedInt" use="optional"/>
            <complexType>
        <element>
    <sequence>
<complexType>
<complexType name="PurchaseRequestType">
    <sequence>
        <element name="DRMSystem" type="anyURI"/>
        <element name="PurchaseData" type="esg : PurchaseDataBaseType" minOccurs= "0"/>
        <element name="PurchaseChannelDRef" type="esg : ESGIDRefType" minOccurs="0"/>
    </sequence>
</complexType>
<complexType name="PurchaseDataBaseType" abstract="true"/>
<complexType name="PurchaseDataType">
    <complexContent>
        <extension base="esg : PurchaseDataBaseType">
            <sequence>
                <element name="Data" type="string"/>
            </sequence>
        </extension>
    <complexContent>
<complexType>
```

FIG. 111

```
<complexType name="PurchaseChannelType">
    <sequence>
        <element name="Name" type="mpeg7 : TextualType" maxOccurs="unbounded"/>
        <element name="Description" type="mpeg7 : TextualType" minOccurs="0"
        maxOccurs="unbounded"/>
        <element name="PortalURL" type="anyURI" minOccurs="0"/>
        <element name="ContactInfo" type="anyURI" minOccurs="0" maxOccurs="unbounded"/>
        <element name="MediaTitle" type="mpeg7 : TitleMediaType" minOccurs="0"
        maxOccurs="unbounded"/>
        <element name="PrivateData" type="esg ; PrivateDataType" minOccurs="0"
        maxOccurs="unbounded"/>
    </sequence>
    <attribute name="purchaseChannelID" type="anyURI" use="required"/>
</complexType>
```

FIG. 112

```xml
<complexType name="AcquisitionType">
    <sequence>
        <element name="ComponentDescription" type="esg : ComponentDescriptionType"
        maxOccurs="unbounded"/>
        <element name="ZappingSupport" type="esg : ZappingSupportType" minOccurs="0"/>
        <element name="KeyStream" type="esg : KeyStreamBaseType" minOccurs="0"
        maxOccurs="unbounded"/>
    </sequence>
    <attribute name="contentMimeType" type="mpeg7 : mimeType" use="required"/>
    <attribute name="acquisitionID" type="anyURI" use="required"/>
</complexType>

<complexType name="ComponentDescriptionType">
<sequence>
    <element name="ComponentCharacteristic" type="esg : ComponentCharacteristicType"
    minOccurs="0" maxOccurs="unbounded"/>
    <element name="SessionDescription" type="esg : sessionDescriptionBaseType"/>
</sequence>
</complexType>
```

FIG. 115
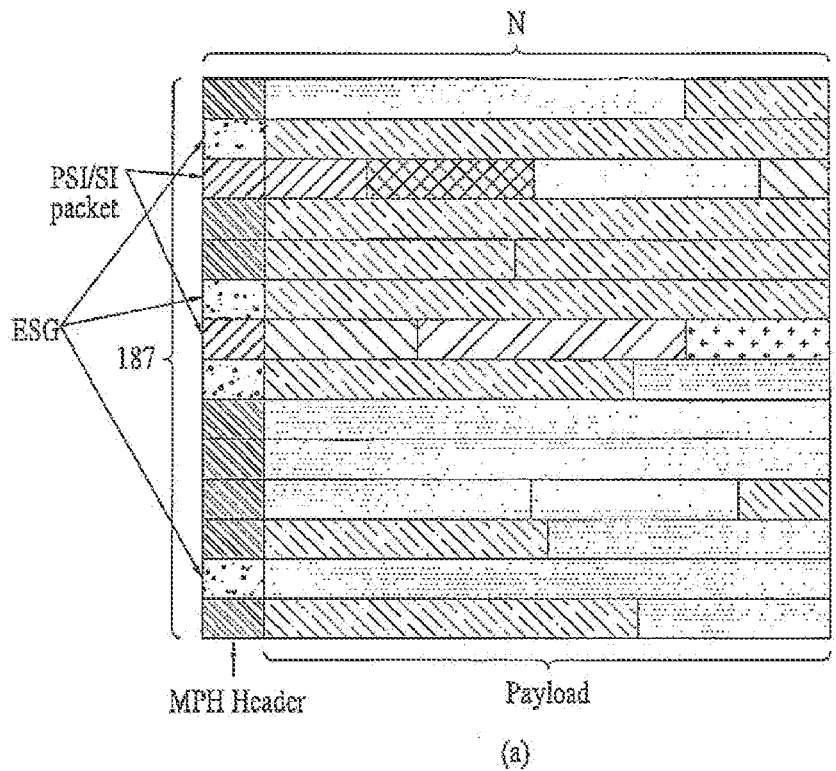
(a)
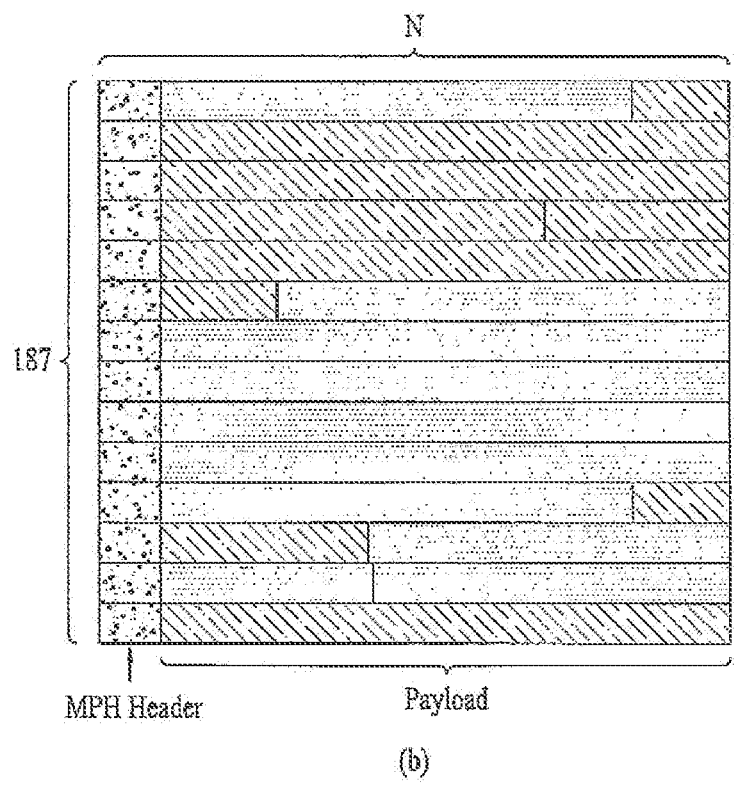
(b)

FIG. 119

```xml
<?xml version="1.0" encoding="UTF-8"?>
<xs:schema xmlns="urn:dvb:ipdc:cdp:flute:fdt:2005"
xmlns:xs="http://www.w3.org/2001/XMLSchema"
targetNamespace="urn:dvb:ipdc:cdp:flute:fdt::2005"
elementFormDefault="qualified">

<xs:element name="FDT-Instance" type="FDT-InstanceType"/>

<xs:complexType name="FDT-InstanceType">
<xs:sequence>
<xs:element name="File" type="File-Type" maxOccurs="unbounded"/>
<xs:element name="Group" type="xs:string" minOccurs="0" maxOccurs="unbounded"/>
<xs:any namespace="##other" processContents="skip" minOccurs="0" maxOccurs="unbounded"/>
</xs:sequence>

<xs:attribute name="Expires" type="xs:string" use="required"/>
<xs:attribute name="Complete" type="xs:boolean" use="optional"/>
<xs:attribute name="Content-Type" type="xs:string" use="optional"/>
<xs:attribute name="Content-Encoding" type="xs:string" use="optional"/>

<xs:attribute name="FEC-OTI-FEC-Encoding-ID" type="xs:unsignedLong" use="optional"/>
<xs:attribute name="FEC-OTI-FEC-Instance-ID" type="xs:unsignedLong" use="optional"/>
<xs:attribute name="FEC-OTI-Maximum-Source-Block-Length" type="xs:unsignedLong" use="optional"/>
<xs:attribute name="FEC-OTI-Encoding-Symbol-Length" type="xs:unsignedLong" use="optional"/>
<xs:attribute name="FEC-OTI-Max-Number-of-Encoding-Symbols" type="xs:unsignedLong" use="optional"/>
<xs:attribute name="FEC-OTI-Scheme-Specific-Info" type="xs:base64Binary" use="optional"/>

<xs:anyAttribute processContents="skip"/>
</xs:complexType>

<xs:complexType name="File-Type">
<xs:sequence>
<xs:element name="Group" type="xs:string" minOccurs="0" maxOccurs="unbounded"/>
<xs:any namespace="##other" processContents="skip" minOccurs="0" maxOccurs="unbounded"/>
</xs:sequence>

<xs:attribute name="Content-Location" type="xs:anyURI" use="required"/>
<xs:attribute name="TOI" type="xs:positiveInteger" use="required"/>
<xs:attribute name="Content-Length" type="xs:unsignedLong" use="required"/>
<xs:attribute name="Transfer-Length" type="xs:unsignedLong" use="optional"/>
<xs:attribute name="Content-Type" type="xs:string" use="optional"/>
<xs:attribute name="Content-Encoding" type="xs:string" use="optional"/>
<xs:attribute name="Content-MD5" type="xs:base64Binary" use="optional"/>

<xs:attribute name="FEC-OTI-FEC-Encoding-ID" type="xs:unsignedLong" use="optional"/>
<xs:attribute name="FEC-OTI-FEC-Instance-ID" type="xs:unsignedLong" use="optional"/>
<xs:attribute name="FEC-OTI-Maximum-Source-Block-Length" type="xs:unsignedLong" use="optional"/>
<xs:attribute name="FEC-OTI-Encoding-Symbol-Length" type="xs:unsignedLong" use="optional"/>
<xs:attribute name="FEC-OTI-Max-Number-of-Encoding-Symbols" type="xs:unsignedLong" use="optional"/>
<xs:attribute name="FEC-OTI-Scheme-Specific-Info" type="xs:base64Binary" use="optional"/>

<xs:anyAttribute processContents="skip"/>
</xs:complexType>

</xs:schema>
```

DIGITAL BROADCASTING SYSTEM AND METHOD OF PROCESSING DATA

CROSS-REFERENCE TO RELATED APPLICATIONS

This application is a continuation of U.S. patent application Ser. No. 12/165,162, filed Jun. 30, 2008, currently pending, which claims the benefit of earlier filing date and right of priority to Korean Application No 10-2008-0061230, filed on Jun. 26, 2008 and U.S. Provisional Patent Application Ser. Nos. 60/977,379, filed on Oct. 4, 2007, 60/974,084, filed on Sep. 21, 2007, 60/957,714, filed on Aug. 24, 2007, and 60/946,989, filed on Jun. 29, 2007, the contents of which are incorporated by reference herein in their entirety

BACKGROUND OF THE INVENTION

1. Field of the Invention

The present invention relates to a digital broadcasting system for transmitting/receiving a digital broadcasting signal and a method of processing data.

2. Discussion of the Related Art

In a digital broadcast, since a vestigial sideband (VSB) transmission method employed in North America and Korea is a single carrier method, the reception performance of a receiving system may deteriorate in an inferior channel environment. In particular, since robustness against a channel variation and noise is further required in a mobile or portable broadcasting receiver, the reception performance may further deteriorate in the case where mobile service data is transmitted by the VSB transmission method.

SUMMARY OF THE INVENTION

Accordingly, the present invention is directed to a digital broadcasting system and a method of processing data that substantially obviate one or more problems due to limitations and disadvantages of the related art.

An object of the present invention is to provide a digital broadcasting system, which is robust against a channel variation and noise, and a method of processing data.

Another object of the present invention is to provide a digital broadcasting system which is capable of improving the reception performance of a receiving system by performing an additional encoding process with respect to mobile service data and transmitting the mobile service data to the receiving system, and a method of processing data.

Another object of the present invention is to provide a digital broadcasting system which is capable of improving the reception performance of a receiving system by inserting known data into a predetermined region of a data region by the agreement between a transmitter and a receiver, and a method of processing data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of processing data is provided. The method of processing data includes receiving a broadcasting signal in which mobile service data and main service data are multiplexed, demodulating the received broadcasting signal, obtaining an identifier indicating that data frame of the broadcasting signal includes service guide information, decoding and storing the service guide information from the data frame and outputting a service included in the mobile service data according to the decoded service guide information.

In another aspect of the present invention, a method of processing data is provided. The method of processing data includes generating program table information of mobile service data and service guide information of a service provided by the mobile service data, multiplexing the generated program table information, the generated service guide information, the mobile service data and main service data and transmitting the demultiplexed broadcasting signal, wherein the mobile service data has an identifier indicating that service guide information is included in data frame of the mobile service data.

In another aspect of the present invention, a digital broadcasting system is provided. The digital broadcasting system includes a receiving unit configured to receive a broadcasting signal in which mobile service data and main service data are multiplexed, a demodulator configured to demodulate the received broadcasting signal, a service guide information decoder configured to obtain an identifier indicating that data frame of the broadcasting signal includes service guide information and decode the service guide information from the data frame, a database configured to store the decoded service guide information and a controller configured to control a service according to the mobile service data in the broadcasting signal to be output according to the decoded service guide information.

In another aspect of the present invention, a method of processing data is provided. The method of processing data includes generating internet protocol (IP) datagram of mobile service data in IP layer by packetizing mobile service data stream to an Real time Transport Protocol (RTP) packet and packetizing the RTP packet to an User Datagram Protocol (UDP) packet, and packetizing the UDP packet in accordance with the IP, generating, in an adaptation layer, an RS frame including a plurality of MPH service data packets, each of which includes MPH header of M bytes including identification information and payload of N−M bytes, the identification information identifying whether payloads of the MPH service data packets are IP datagram and allocating a part of at least one region in a plurality of data groups including a plurality of region to the RS frame and modulating and transmitting the RS frame.

The broadcast signal includes a data group in which the mobile service data error-correction-encoded by at least one of code rates and the main service data are interleaved, and the mobile service data in the interleaved data group includes periodically-inserted known data.

The broadcasting signal includes information on the capability of a server for providing the service guide information and the information on the capability of the server is at least one of complete, complement and repair.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 9 illustrates an exemplary assignment order of data groups being assigned to one of 5 sub-frames according to the present invention;

FIG. 22(a) and FIG. 22(b) illustrate an example of creating an RS frame by grouping data, thereby performing error correction encoding and error detection encoding;

FIG. 26 illustrates a symbol interleaver of the block processor of FIG. 24;

FIG. 31 illustrates an example of a syntax structure of TPC data according to the present invention;

FIG. 32(a) and FIG. 32(b) illustrate an example of power saving of in a receiver when transmitting 3 parades to an MPH frame level according to the present invention;

FIG. 60 illustrates a block diagram of an example of a CIR estimator according to the present invention;

FIG. 63(a) to FIG. 65(f) illustrate process steps of error correction decoding according to an embodiment of the present invention;

FIG. 67 illustrates a bit stream syntax for a VCT according to the present invention;

FIG. 68 illustrates a service_type field according to an embodiment of the present invention;

FIG. 69 illustrates a service location descriptor according to an embodiment of the present invention;

FIG. 70 illustrates examples that may be assigned to the stream_type field according to the present invention;

FIG. 71 illustrates a bit stream syntax for an EIT according to the present invention.

FIG. 82 is a view showing fields allocated to the header regions (mph_stl_header) of the first and second temporary packets of the present invention;

FIG. 101 is a view showing an example in which the bootstrap information for receiving the service guide information is represented in the form of a descriptor;

FIG. 102 shows an example representing the entry information ESGEntry of the service guide information shown in FIG. 101;

FIG. 103 shows the semantics of values of the main fields of FIG. 102;

FIG. 106 is a view showing an example of the service fragment;

FIG. 107 is a view showing an example of the service bundle fragment;

FIG. 108 is a view showing an example of the content fragment;

FIG. 109 is a view showing an example of the schedule event fragment;

FIG. 110 is a view showing an example of the purchase fragment;

FIG. 111 is a view showing an example of the purchase channel fragment;

FIG. 112 is a view showing an example of the acquisition fragment;

FIG. 115(a) and FIG. 115(b) show the structure of the RS packet in the case where the service guide information (ESG) is transmitted by the MPH packet;

FIG. 119 shows the structure of the FDT;

DETAILED DESCRIPTION OF THE INVENTION

Figure 1:
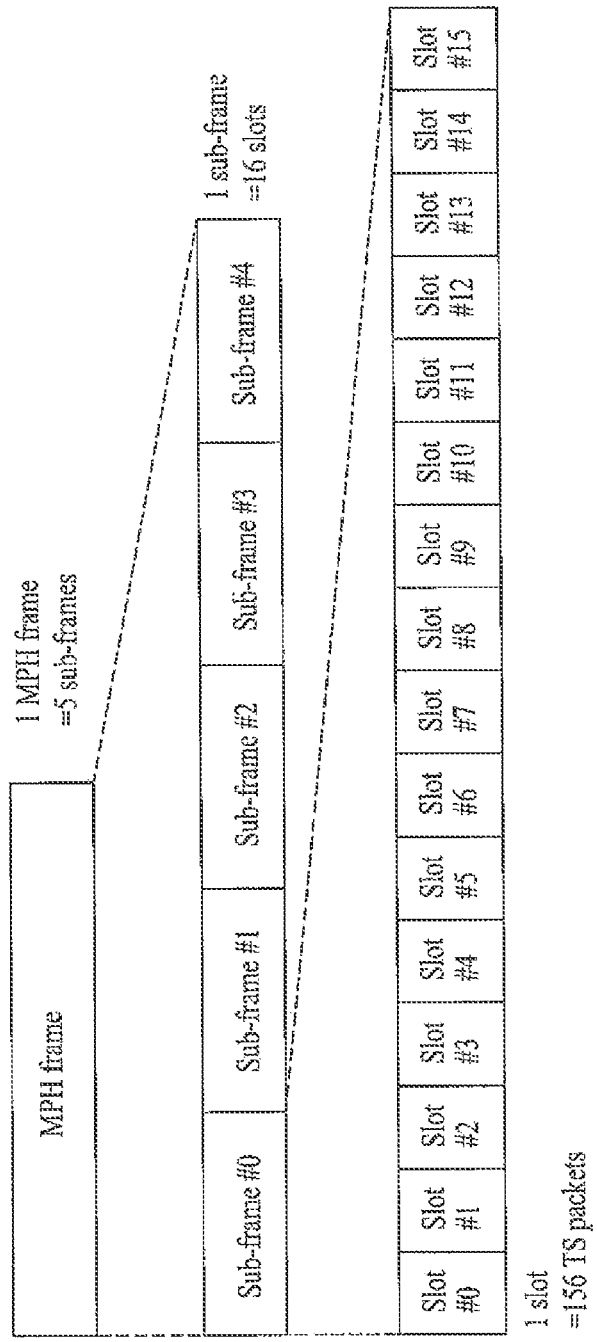
FIG. 1 illustrates a structure of a MPH frame for transmitting and receiving mobile service data according to the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system. Additionally, among the terms used in the present invention, "MPH" corresponds to the initials of "mobile", "pedestrian", and "handheld" and represents the opposite concept of a fixed-type system. Furthermore, the MPH service data may include at least one of mobile service data, pedestrian service data, and handheld service data, and will also be referred to as "mobile service data" for simplicity. Herein, the mobile service data not only correspond to MPH service data but may also include any type of service data with mobile or portable characteristics. Therefore, the mobile service data according to the present invention are not limited only to the MPH service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above. In the present invention, the transmitting system provides backward compatibility in the main service data so as to be received by the conventional receiving system. Herein, the main service data and the mobile service data are multiplexed to the same physical channel and then transmitted.

Furthermore, the digital broadcast transmitting system according to the present invention performs additional encoding on the mobile service data and inserts the data already known by the receiving system and transmitting system (e.g., known data), thereby transmitting the processed data. Therefore, when using the transmitting system according to the present invention, the receiving system may receive the mobile service data during a mobile state and may also receive the mobile service data with stability despite various distortion and noise occurring within the channel.

MPH Frame Structure

In the embodiment of the present invention, the mobile service data are first multiplexed with main service data in MPH frame units and, then, modulated in a VSB mode and transmitted to the receiving system. At this point, one MPH frame consists of K1 number of sub-frames, wherein one sub-frame includes K2 number of slots. Also, each slot may be configured of K3 number of data packets. In the embodiment of the present invention, K1 will be set to 5, K2 will be set to 16, and K3 will be set to 156 (i.e., K1=5, K2=16, and K3=156). The values for K1, K2, and K3 presented in this embodiment either correspond to values according to a preferred embodiment or are merely exemplary. Therefore, the above-mentioned values will not limit the scope of the present invention.

FIG. 1 illustrates a structure of a MPH frame for transmitting and receiving mobile service data according to the present invention. In the example shown in FIG. 1, one MPH frame consists of 5 sub-frames, wherein each sub-frame includes 16 slots. In this case, the MPH frame according to the present invention includes 5 sub-frames and 80 slots. Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of data as a data segment, a data packet prior to being interleaved may also be used as a data segment. At this point, two VSB fields are grouped to form a VSB frame.

Figure 2:
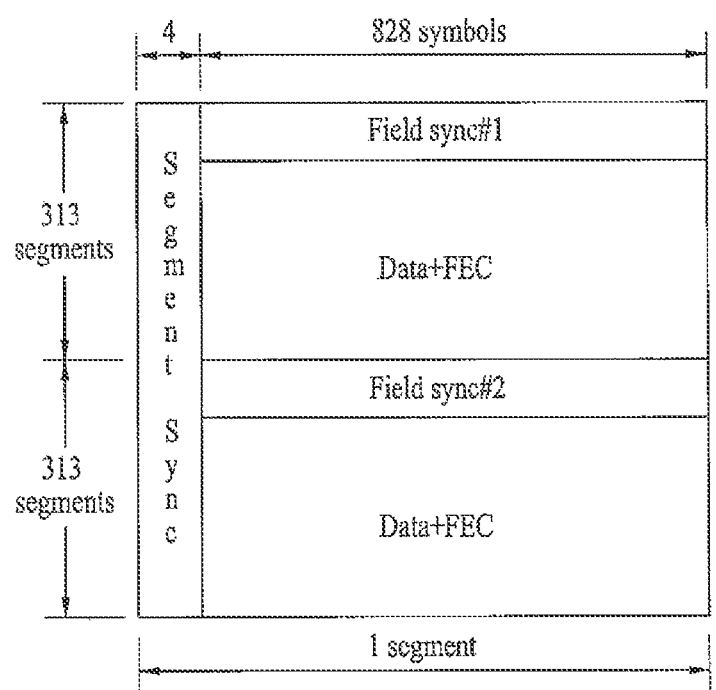
FIG. 2 illustrates an exemplary structure of a VSB frame.

FIG. 2 illustrates an exemplary structure of a VSB frame, wherein one VSB frame consists of 2 VSB fields (i.e., an odd field and an even field). Herein, each VSB field includes a field synchronization segment and 312 data segments. The slot corresponds to a basic time period for multiplexing the mobile service data and the main service data. Herein, one slot may either include the mobile service data or be configured only of the main service data. If one MPH frame is transmitted during one slot, the first 118 data packets within the slot correspond to a data group. And, the remaining 38 data packets become the main service data packets. In another example, when no data group exists in a slot, the corresponding slot is configured of 156 main service data packets. Meanwhile, when the slots are assigned to a VSB frame, an offset exists for each assigned position.

Figure 3:
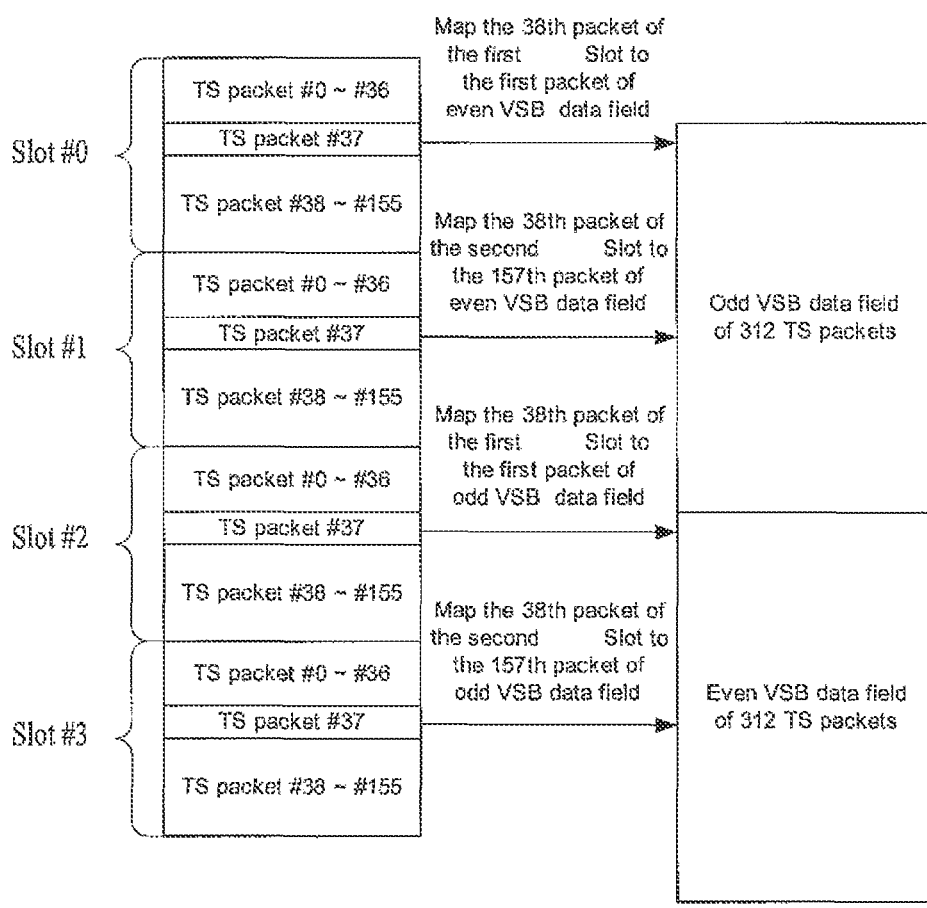
FIG. 3 illustrates a mapping example of the positions to which the first 4 slots of a sub-frame are assigned with respect to a VSB frame in a space region.
Figure 4:
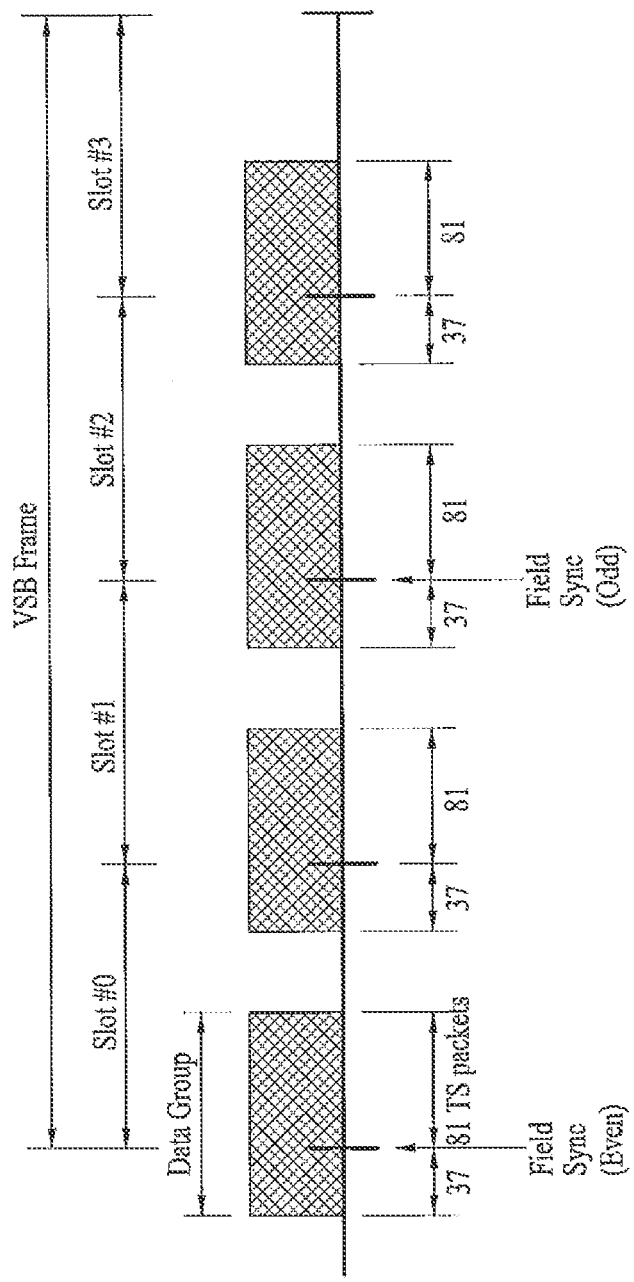
FIG. 4 illustrates a mapping example of the positions to which the first 4 slots of a sub-frame are assigned with respect to a VSB frame in a time region.

FIG. 3 illustrates a mapping example of the positions to which the first 4 slots of a sub-frame are assigned with respect to a VSB frame in a space region. And, FIG. 4 illustrates a mapping example of the positions to which the first 4 slots of a sub-frame are assigned with respect to a VSB frame in a time region. Referring to FIG. 3 and FIG. 4, a $38^{th}$ data packet (TS packet #37) of a $1^{st}$ slot (Slot #0) is mapped to the $1^{st}$ data packet of an odd VSB field. A $38^{th}$ data packet (TS packet #37) of a $2^{nd}$ slot (Slot #1) is mapped to the $157^{th}$ data packet of an odd VSB field. Also, a $38^{th}$ data packet (TS packet #37) of a $3^{rd}$ slot (Slot #2) is mapped to the $1^{st}$ data packet of an even VSB field. And, a $38^{th}$ data packet (TS packet #37) of a $4^{th}$ slot (Slot #3) is mapped to the $157^{th}$ data packet of an even VSB field. Similarly, the remaining 12 slots within the corresponding sub-frame are mapped in the subsequent VSB frames using the same method.

Meanwhile, one data group may be divided into at least one or more hierarchical regions. And, depending upon the characteristics of each hierarchical region, the type of mobile service data being inserted in each region may vary. For example, the data group within each region may be divided (or categorized) based upon the receiving performance. In an example given in the present invention, a data group is divided into regions A, B, C, and D in a data configuration prior to data deinterleaving.

Figure 5:
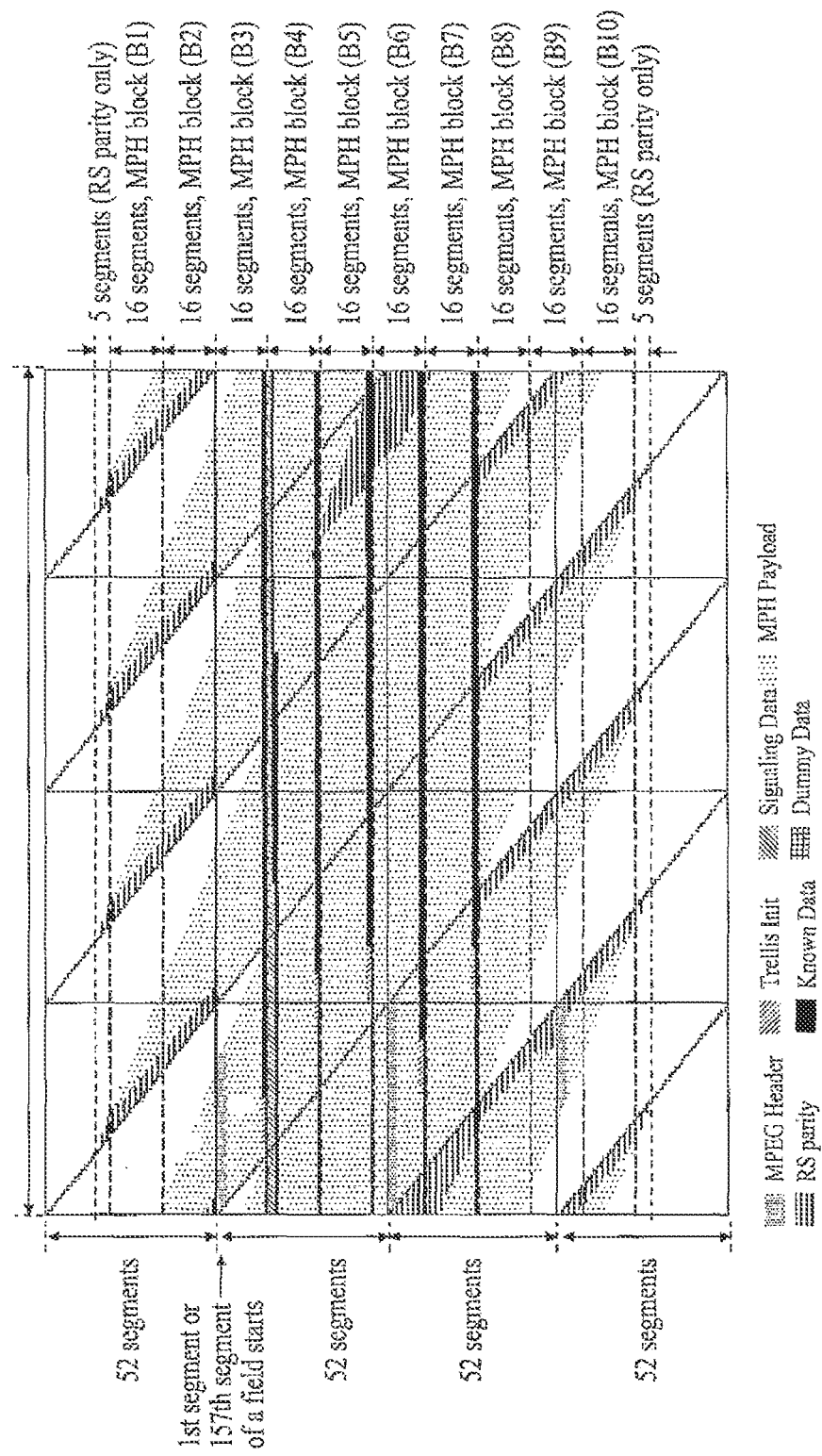
FIG. 5 illustrates an alignment of data after being data interleaved and identified.
Figure 6:
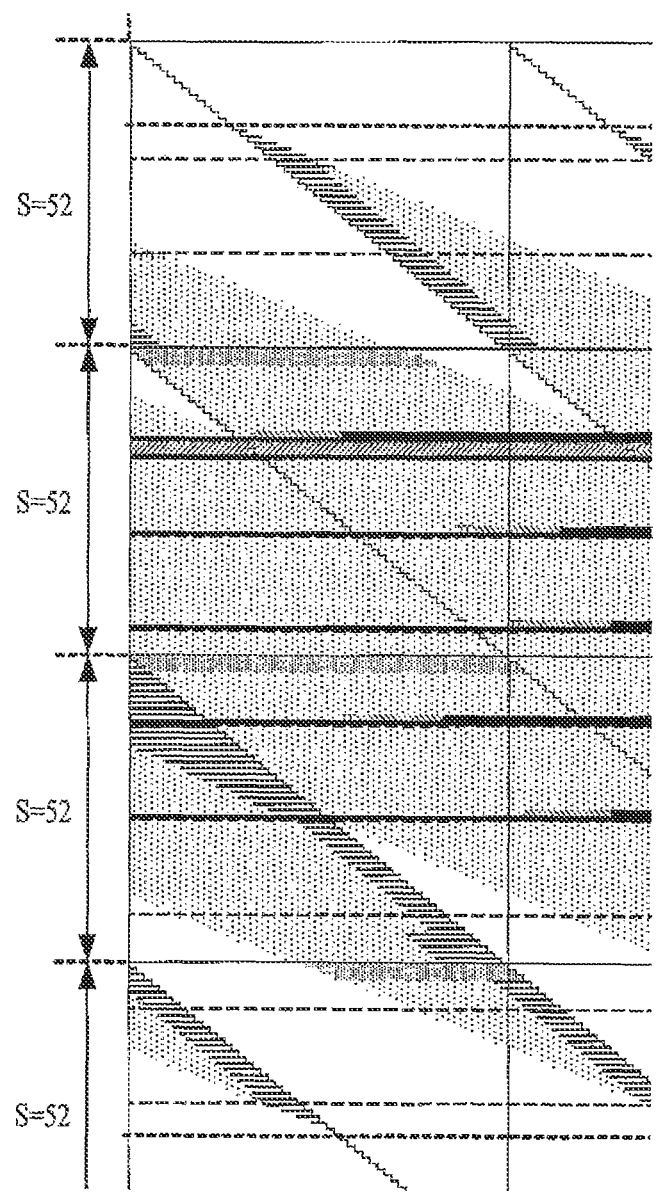
FIG. 6 illustrates an enlarged portion of the data group shown in FIG. 5 for a better understanding of the present invention.
Figure 7:
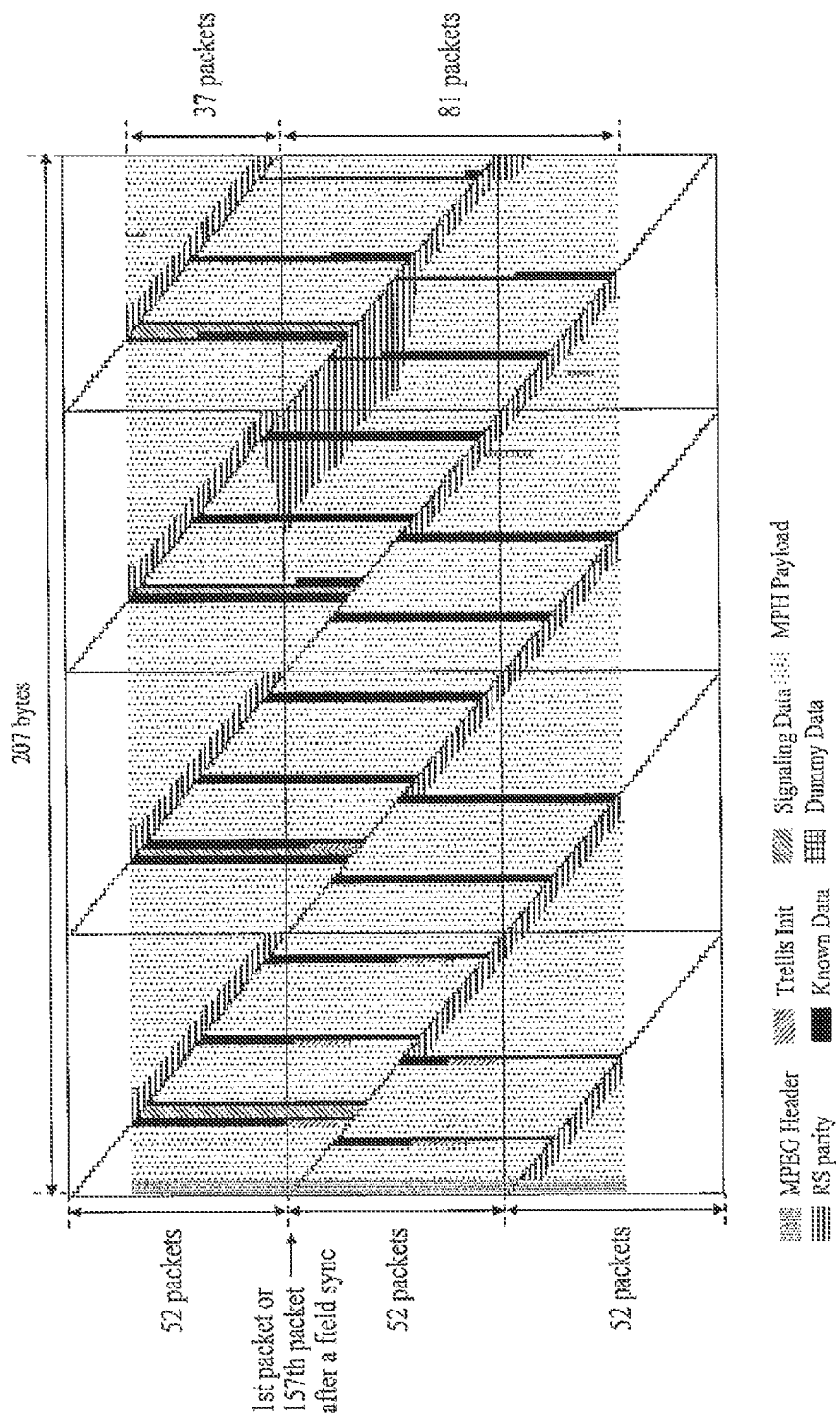
FIG. 7 illustrates an alignment of data before being data interleaved and identified.
Figure 8:
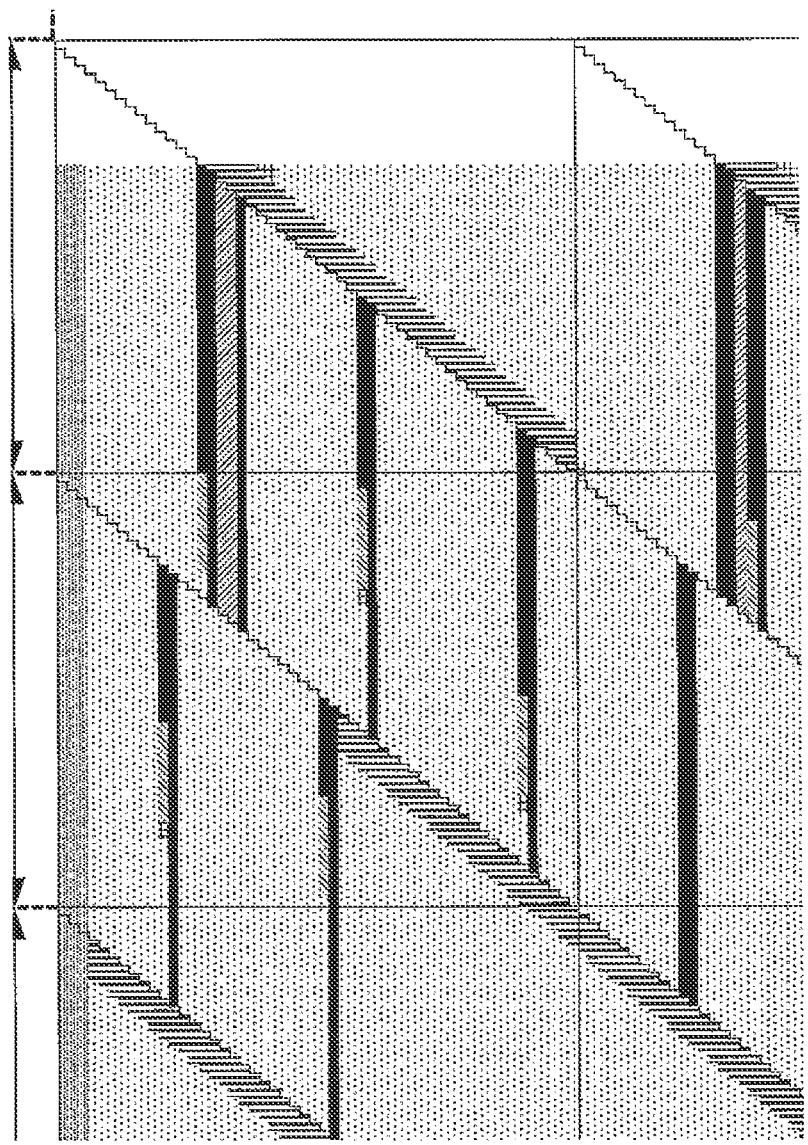
FIG. 8 illustrates an enlarged portion of the data group shown in FIG. 7 for a better understanding of the present invention.

FIG. 5 illustrates an alignment of data after being data interleaved and identified. FIG. 6 illustrates an enlarged portion of the data group shown in FIG. 5 for a better understanding of the present invention. FIG. 7 illustrates an alignment of data before being data interleaved and identified. And, FIG. 8 illustrates an enlarged portion of the data group shown in FIG. 7 for a better understanding of the present invention. More specifically, a data structure identical to that shown in FIG. 5 is transmitted to a receiving system. In other words, one data packet is data-interleaved so as to be scattered to a plurality of data segments, thereby being transmitted to the receiving system. FIG. 5 illustrates an example of one data group being scattered to 170 data segments. At this point, since one 207-byte packet has the same amount of data as one data segment, the packet that is not yet processed with data-interleaving may be used as the data segment.

FIG. 5 shows an example of dividing a data group prior to being data-interleaved into 10 MPH blocks (i.e., MPH block 1 (B1) to MPH block 10 (B10)). In this example, each MPH block has the length of 16 segments. Referring to FIG. 5, only the RS parity data are allocated to portions of the first 5 segments of the MPH block 1 (B1) and the last 5 segments of the MPH block 10 (B10). The RS parity data are excluded in regions A to D of the data group. More specifically, when it is assumed that one data group is divided into regions A, B, C, and D, each MPH block may be included in any one of region A to region D depending upon the characteristic of each MPH block within the data group.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 5, MPH block 4 (B4) to MPH block 7 (B7) correspond to regions without interference of the main service data. MPH block 4 (B4) to MPH block 7 (B7) within the data group shown in FIG. 5 correspond to a region where no interference from the main service data occurs. In this example, a long known data sequence is inserted at both the beginning and end of each MPH block. In the description of the present invention, the region including MPH block 4 (B4) to MPH block 7 (B7) will be referred to as "region A (=B4+B5+B6+B7)". As described above, when the data group includes region A having a long known data sequence inserted at both the beginning and end of each MPH block, the receiving system is capable of performing equalization by using the channel information that can be obtained from the known data. Therefore, the strongest equalizing performance may be yielded (or obtained) from one of region A to region D.

In the example of the data group shown in FIG. 5, MPH block 3 (B3) and MPH block 8 (B8) correspond to a region having little interference from the main service data. Herein, a long known data sequence is inserted in only one side of each MPH block B3 and B8. More specifically, due to the interference from the main service data, a long known data sequence is inserted at the end of MPH block 3 (B3), and another long known data sequence is inserted at the beginning of MPH block 8 (B8). In the present invention, the region including MPH block 3 (B3) and MPH block 8 (B8) will be referred to as "region B (=B3+B8)". As described above, when the data group includes region B having a long known data sequence inserted at only one side (beginning or end) of each MPH block, the receiving system is capable of performing equalization by using the channel information that can be obtained from the known data. Therefore, a stronger equalizing performance as compared to region C/D may be yielded (or obtained).

Referring to FIG. 5, MPH block 2 (B2) and MPH block 9 (B9) correspond to a region having more interference from the main service data as compared to region B. A long known data sequence cannot be inserted in any side of MPH block 2 (B2) and MPH block 9 (B9). Herein, the region including MPH block 2 (B2) and MPH block 9 (B9) will be referred to as "region C (=B2+B9)". Finally, in the example shown in FIG. 5, MPH block 1 (B1) and MPH block 10 (B10) correspond to a region having more interference from the main service data as compared to region C. Similarly, a long known data sequence cannot be inserted in any side of MPH block 1 (B1) and MPH block 10 (B10). Herein, the region including MPH block 1 (B1) and MPH block 10 (B10) will be referred to as "region D (=B1+B10)". Since region C/D is spaced further apart from the known data sequence, when the channel environment undergoes frequent and abrupt changes, the receiving performance of region C/D may be deteriorated.

FIG. 7 illustrates a data structure prior to data interleaving. More specifically, FIG. 7 illustrates an example of 118 data packets being allocated to a data group. FIG. 7 shows an example of a data group consisting of 118 data packets, wherein, based upon a reference packet (e.g., a $1^{st}$ packet (or data segment) or $157^{th}$ packet (or data segment) after a field synchronization signal), when allocating data packets to a VSB frame, 37 packets are included before the reference packet and 81 packets (including the reference packet) are included afterwards. In other words, with reference to FIG. 5, a field synchronization signal is placed (or assigned) between MPH block 2 (B2) and MPH block 3 (B3). Accordingly, this indicates that the slot has an offset of 37 data packets with respect to the corresponding VSB field. The size of the data groups, number of hierarchical regions within the data group, the size of each region, the number of MPH blocks included in each region, the size of each MPH block, and so on described above are merely exemplary. Therefore, the present invention will not be limited to the examples described above.

FIG. 9 illustrates an exemplary assignment order of data groups being assigned to one of 5 sub-frames, wherein the 5 sub-frames configure an MPH frame. For example, the method of assigning data groups may be identically applied to all MPH frames or differently applied to each MPH frame. Furthermore, the method of assigning data groups may be identically applied to all sub-frames or differently applied to each sub-frame. At this point, when it is assumed that the data groups are assigned using the same method in all sub-frames of the corresponding MPH frame, the total number of data groups being assigned to an MPH frame is equal to a multiple of '5'. According to the embodiment of the present invention, a plurality of consecutive data groups is assigned to be spaced as far apart from one another as possible within the MPH frame. Thus, the system can be capable of responding promptly and effectively to any burst error that may occur within a sub-frame.

For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively. FIG. 9 illustrates an example of assigning 16 data groups in one sub-frame using the above-described pattern (or rule). In other words, each data group is serially assigned to 16 slots corresponding to the following numbers: 0, 8, 4, 12, 1, 9, 5, 13, 2, 10, 6, 14, 3, 11, 7, and 15. Equation 1 below shows the above-described rule (or pattern) for assigning data groups in a sub-frame.

$$j=(4i+O)\mod 16 \qquad \text{Equation 1}$$

$$\text{Herein,} \begin{cases} O = 0 & \text{if } i < 4, \\ O = 2 & \text{else if } i < 8, \\ O = 1 & \text{else if } i < 12, \\ O = 3 & \text{else.} \end{cases}$$

Herein, j indicates the slot number within a sub-frame. The value of j may range from 0 to 15 (i.e., $0 \le j \le 15$). Also, variable i indicates the data group number. The value of i may range from 0 to 15 (i.e., $0 \le i \le 15$).

In the present invention, a collection of data groups included in a MPH frame will be referred to as a "parade". Based upon the RS frame mode, the parade transmits data of at least one specific RS frame. The mobile service data within one RS frame may be assigned either to all of regions A/B/C/D within the corresponding data group, or to at least one of regions A/B/C/D. In the embodiment of the present invention, the mobile service data within one RS frame may be assigned either to all of regions A/B/C/D, or to at least one of regions A/B and regions C/D. If the mobile service data are assigned to the latter case (i.e., one of regions A/B and regions C/D), the RS frame being assigned to regions A/B and the RS frame being assigned to regions C/D within the corresponding data group are different from one another.

In the description of the present invention, the RS frame being assigned to regions A/B within the corresponding data group will be referred to as a "primary RS frame", and the RS frame being assigned to regions C/D within the corresponding data group will be referred to as a "secondary RS frame", for simplicity. Also, the primary RS frame and the secondary RS frame form (or configure) one parade. More specifically, when the mobile service data within one RS frame are assigned either to all of regions A/B/C/D within the corresponding data group, one parade transmits one RS frame. Conversely, when the mobile service data within one RS frame are assigned either to at least one of regions A/B and regions C/D, one parade may transmit up to 2 RS frames. More specifically, the RS frame mode indicates whether a parade transmits one RS frame, or whether the parade transmits two RS frames. Table 1 below shows an example of the RS frame mode.

TABLE 1

| RS frame mode (2 bits) | Description |
|---|---|
| 00 | There is only one primary RS frame for all group regions |
| 01 | There are two separate RS frames. Primary RS frame for group regions A and B Secondary RS frame for group regions C and D |
| 10 | Reserved |
| 11 | Reserved |

Table 1 illustrates an example of allocating 2 bits in order to indicate the RS frame mode. For example, referring to Table 1, when the RS frame mode value is equal to '00', this indicates that one parade transmits one RS frame. And, when the RS frame mode value is equal to '01', this indicates that one parade transmits two RS frames, i.e., the primary RS frame and the secondary RS frame. More specifically, when the RS frame mode value is equal to '01', data of the primary RS frame for regions A/B are assigned and transmitted to regions A/B of the corresponding data group. Similarly, data of the secondary RS frame for regions C/D are assigned and transmitted to regions C/D of the corresponding data group.

Additionally, one RS frame transmits one ensemble. Herein, the ensemble is a collection of services requiring the same quality of service (QOS) and being encoded with the same FEC codes. More specifically, when one parade is configured of one RS frame, then one parade transmits one ensemble. Conversely, when one parade is configured of two RS frames, i.e., when one parade is configured of a primary RS frame and a secondary RS frame, then one parade transmits two ensembles (i.e., a primary ensemble and a secondary ensemble). More specifically, the primary ensemble is transmitted through a primary RS frame of a parade, and the secondary ensemble is transmitted through a secondary RS frame of a parade. The RS frame is a 2-dimensional data frame through which an ensemble is RS-CRC encoded.

As described in the assignment of data groups, the parades are also assigned to be spaced as far apart from one another as possible within the sub-frame. Thus, the system can be capable of responding promptly and effectively to any burst error that may occur within a sub-frame. Furthermore, the method of assigning parades may be identically applied to all sub-frames or differently applied to each sub-frame. According to the embodiment of the present invention, the parades may be assigned differently for each MPH frame and identically for all sub-frames within an MPH frame. More specifically, the MPH frame structure may vary by MPH frame units. Thus, an ensemble rate may be adjusted on a more frequent and flexible basis.

Figure 10:
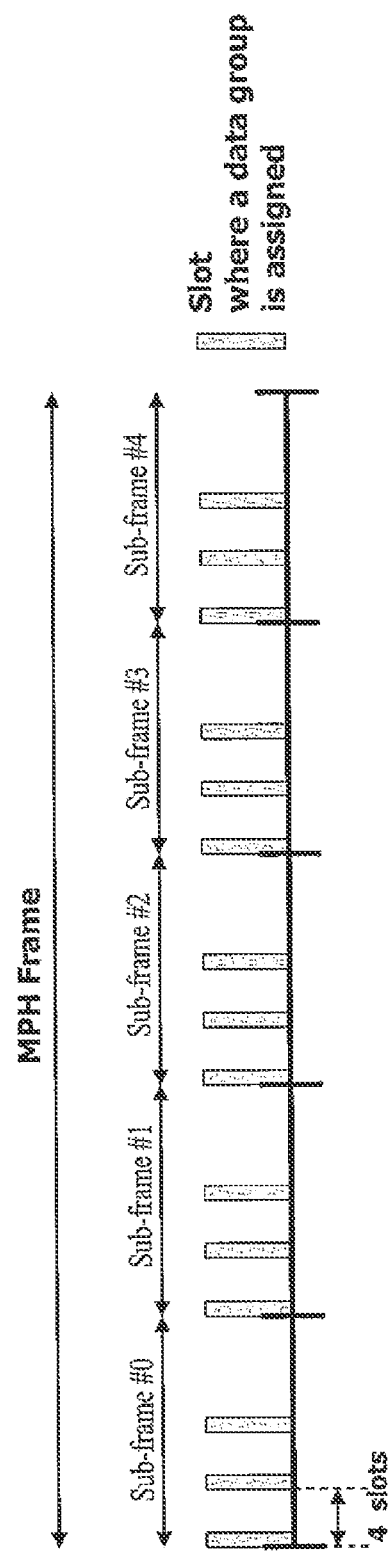
FIG. 10 illustrates an example of multiple data groups of a single parade being assigned (or allocated) to an MPH frame.

FIG. 10 illustrates an example of multiple data groups of a single parade being assigned (or allocated) to an MPH frame. More specifically, FIG. 10 illustrates an example of a plurality of data groups included in a single parade, wherein the number of data groups included in a sub-frame is equal to '3', being allocated to an MPH frame. Referring to FIG. 10, 3 data groups are sequentially assigned to a sub-frame at a cycle period of 4 slots. Accordingly, when this process is equally performed in the 5 sub-frames included in the corresponding MPH frame, 15 data groups are assigned to a single MPH frame. Herein, the 15 data groups correspond to data groups included in a parade. Therefore, since one sub-frame is configured of 4 VSB frame, and since 3 data groups are included in a sub-frame, the data group of the corresponding parade is not assigned to one of the 4 VSB frames within a sub-frame.

For example, when it is assumed that one parade transmits one RS frame, and that a RS frame encoder located in a later block performs RS-encoding on the corresponding RS frame, thereby adding 24 bytes of parity data to the corresponding RS frame and transmitting the processed RS frame, the parity data occupy approximately 11.37% (=24/(187+24)×100) of the total code word length. Meanwhile, when one sub-frame includes 3 data groups, and when the data groups included in the parade are assigned, as shown in FIG. 10, a total of 15 data groups form an RS frame. Accordingly, even when an error occurs in an entire data group due to a burst noise within a channel, the percentile is merely 6.67% (=1/15×100). Therefore, the receiving system may correct all errors by performing an erasure RS decoding process. More specifically, when the erasure RS decoding is performed, a number of channel errors corresponding to the number of RS parity bytes may be corrected. By doing so, the receiving system may correct the error of at least one data group within one parade. Thus, the minimum burst noise length correctable by a RS frame is over 1 VSB frame.

Meanwhile, when data groups of a parade are assigned as described above, either main service data may be assigned between each data group, or data groups corresponding to different parades may be assigned between each data group. More specifically, data groups corresponding to multiple parades may be assigned to one MPH frame. Basically, the method of assigning data groups corresponding to multiple parades is very similar to the method of assigning data groups corresponding to a single parade. In other words, data groups included in other parades that are to be assigned to an MPH frame are also respectively assigned according to a cycle period of 4 slots. At this point, data groups of a different parade may be sequentially assigned to the respective slots in a circular method. Herein, the data groups are assigned to slots starting from the ones to which data groups of the previous parade have not yet been assigned. For example, when it is assumed that data groups corresponding to a parade are assigned as shown in FIG. 10, data groups corresponding to the next parade may be assigned to a sub-frame starting either from the $12^{th}$ slot of a sub-frame. However, this is merely exemplary. In another example, the data groups of the next parade may also be sequentially assigned to a different slot within a sub-frame at a cycle period of 4 slots starting from the $3^{rd}$ slot.

Figure 11:
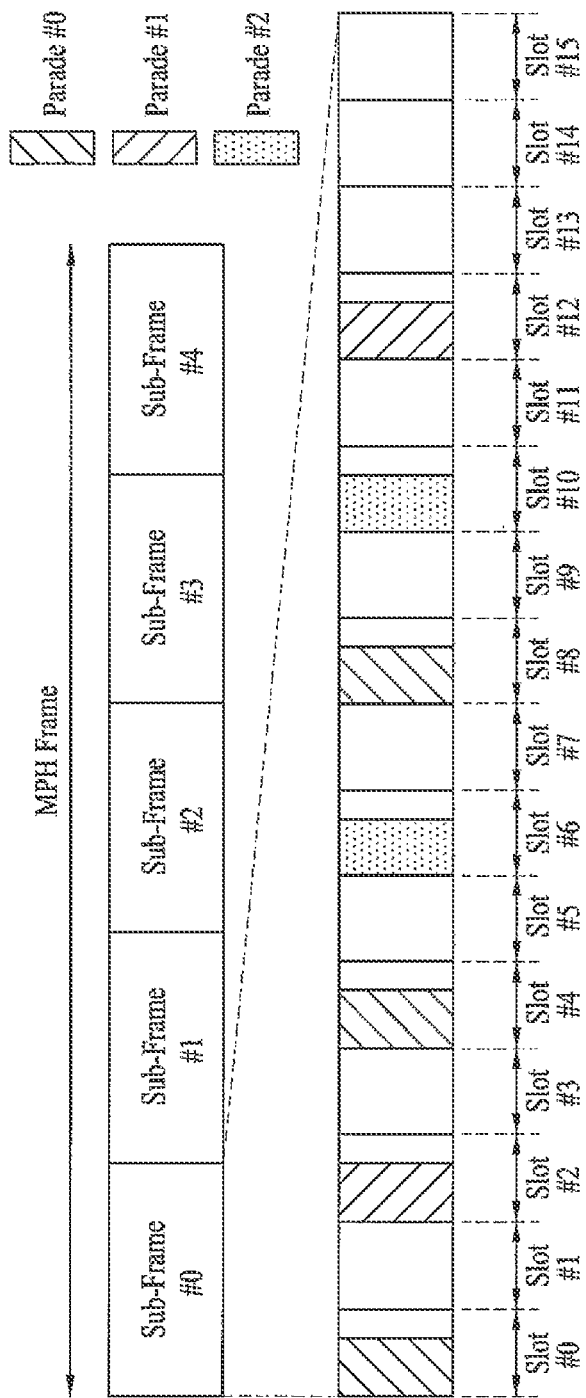
FIG. 11 illustrates an example of transmitting 3 parades to an MPH frame according to the present invention.

FIG. 11 illustrates an example of transmitting 3 parades (Parade #0, Parade #1, and Parade #2) to an MPH frame. More specifically, FIG. 11 illustrates an example of transmitting parades included in one of 5 sub-frames, wherein the 5 sub-frames configure one MPH frame. When the $1^{st}$ parade (Parade #0) includes 3 data groups for each sub-frame, the positions of each data groups within the sub-frames may be obtained by substituting values '0' to '2' for i in Equation 1. More specifically, the data groups of the $1^{st}$ parade (Parade #0) are sequentially assigned to the $1^{st}$, $5^{th}$, and $9^{th}$ slots (Slot #0, Slot #4, and Slot #8) within the sub-frame. Also, when the $2^{nd}$ parade includes 2 data groups for each sub-frame, the positions of each data groups within the sub-frames may be obtained by substituting values '3' and '4' for i in Equation 1. More specifically, the data groups of the $2^{nd}$ parade (Parade #1) are sequentially assigned to the $2^{nd}$ and $12^{th}$ slots (Slot #3 and Slot #11) within the sub-frame. Finally, when the $3^{rd}$ parade includes 2 data groups for each sub-frame, the positions of each data groups within the sub-frames may be obtained by substituting values '5' and '6' for i in Equation 1. More specifically, the data groups of the $3^{rd}$ parade (Parade #2) are sequentially assigned to the $7^{th}$ and $11^{th}$ slots (Slot #6 and Slot #10) within the sub-frame.

As described above, data groups of multiple parades may be assigned to a single MPH frame, and, in each sub-frame, the data groups are serially allocated to a group space having 4 slots from left to right. Therefore, a number of groups of one parade per sub-frame (NOG) may correspond to any one integer from '1' to '8'. Herein, since one MPH frame includes 5 sub-frames, the total number of data groups within a parade that can be allocated to an MPH frame may correspond to any one multiple of '5' ranging from '5' to '40'.

Figure 12:
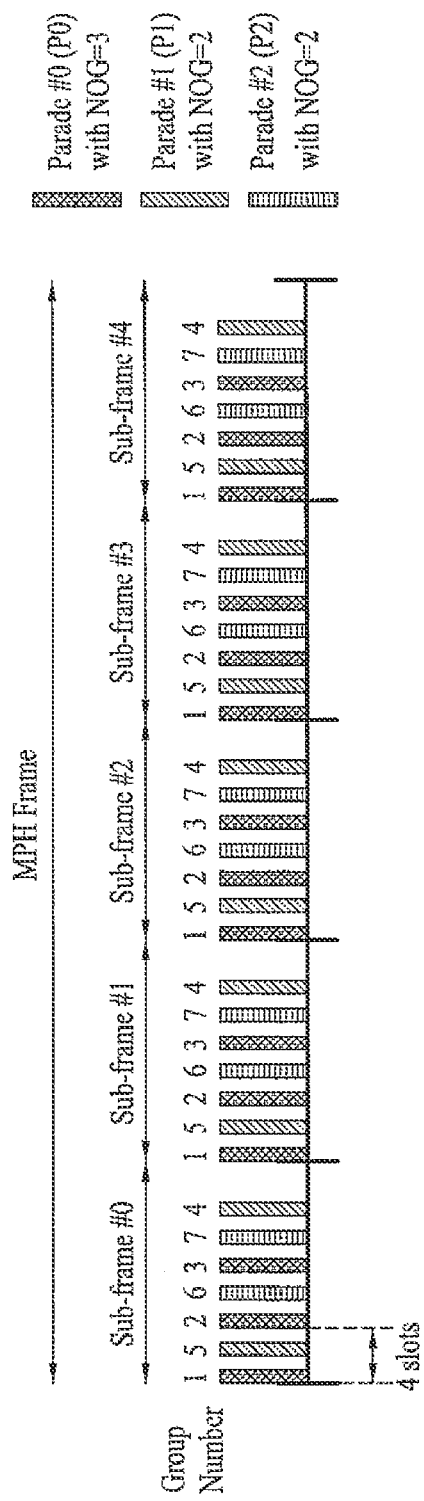
FIG. 12 illustrates an example of expanding the assignment process of 3 parades to 5 sub-frames within an MPH frame.

FIG. 12 illustrates an example of expanding the assignment process of 3 parades, shown in FIG. 11, to 5 sub-frames within an MPH frame.

General Description of the Transmitting System

Figure 13:
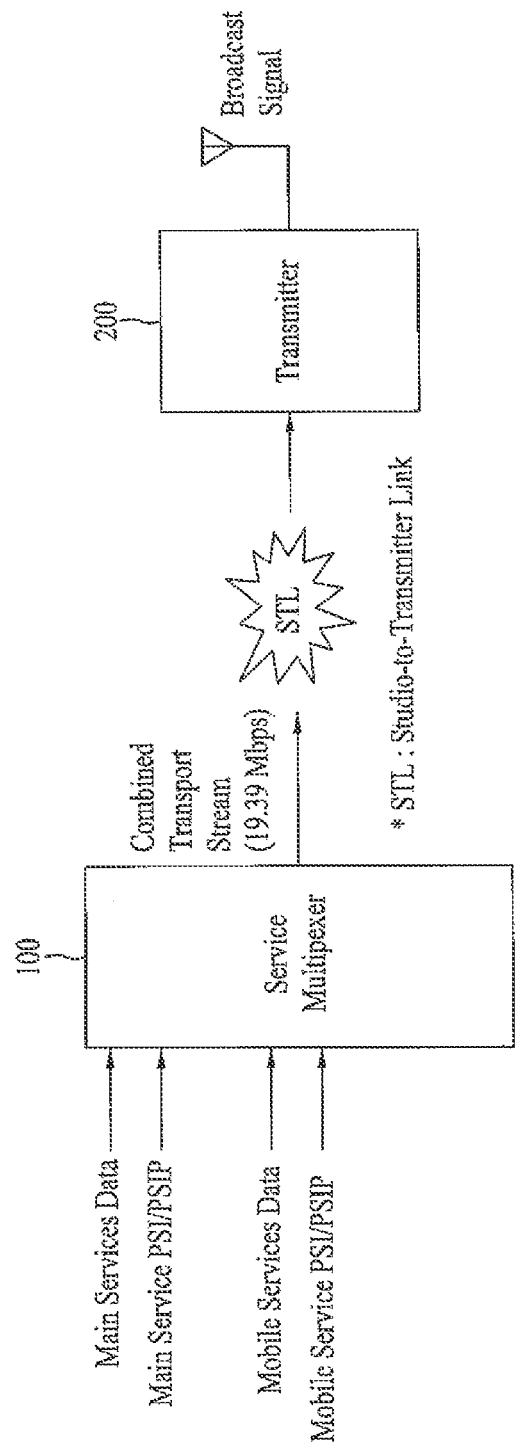
FIG. 13 illustrates a block diagram showing a general structure of a digital broadcast transmitting system according to an embodiment of the present invention.

FIG. 13 illustrates a block diagram showing a general structure of a digital broadcast transmitting system according to an embodiment of the present invention.

Herein, the digital broadcast transmitting includes a service multiplexer 100 and a transmitter 200. Herein, the service multiplexer 100 is located in the studio of each broadcast station, and the transmitter 200 is located in a site placed at a predetermined distance from the studio. The transmitter 200 may be located in a plurality of different locations. Also, for example, the plurality of transmitters may share the same frequency. And, in this case, the plurality of transmitters receives the same signal. Accordingly, in the receiving system, a channel equalizer may compensate signal distortion, which is caused by a reflected wave, so as to recover the original signal. In another example, the plurality of transmitters may have different frequencies with respect to the same channel.

A variety of methods may be used for data communication each of the transmitters, which are located in remote positions, and the service multiplexer. For example, an interface standard such as a synchronous serial interface for transport of MPEG-2 data (SMPTE-310M). In the SMPTE-310M interface standard, a constant data rate is decided as an output data rate of the service multiplexer. For example, in case of the 8VSB mode, the output data rate is 19.39 Mbps, and, in case of the 16VSB mode, the output data rate is 38.78 Mbps. Furthermore, in the conventional 8VSB mode transmitting system, a transport stream (TS) packet having a data rate of approximately 19.39 Mbps may be transmitted through a single physical channel. Also, in the transmitting system according to the present invention provided with backward compatibility with the conventional transmitting system, additional encoding is performed on the mobile service data. Thereafter, the additionally encoded mobile service data are multiplexed with the main service data to a TS packet form, which is then transmitted. At this point, the data rate of the multiplexed TS packet is approximately 19.39 Mbps.

At this point, the service multiplexer 100 receives at least one type of mobile service data and program specific information/program and system information protocol (PSI/PSIP) table data for each mobile service so as to encapsulate the received data to each TS packet. Also, the service multiplexer 100 receives at least one type of main service data and PSI/PSIP table data for each main service and encapsulates the received data to a transport stream (TS) packet. Subsequently, the TS packets are multiplexed according to a predetermined multiplexing rule and outputs the multiplexed packets to the transmitter 200.

Service Multiplexer

Figure 14:
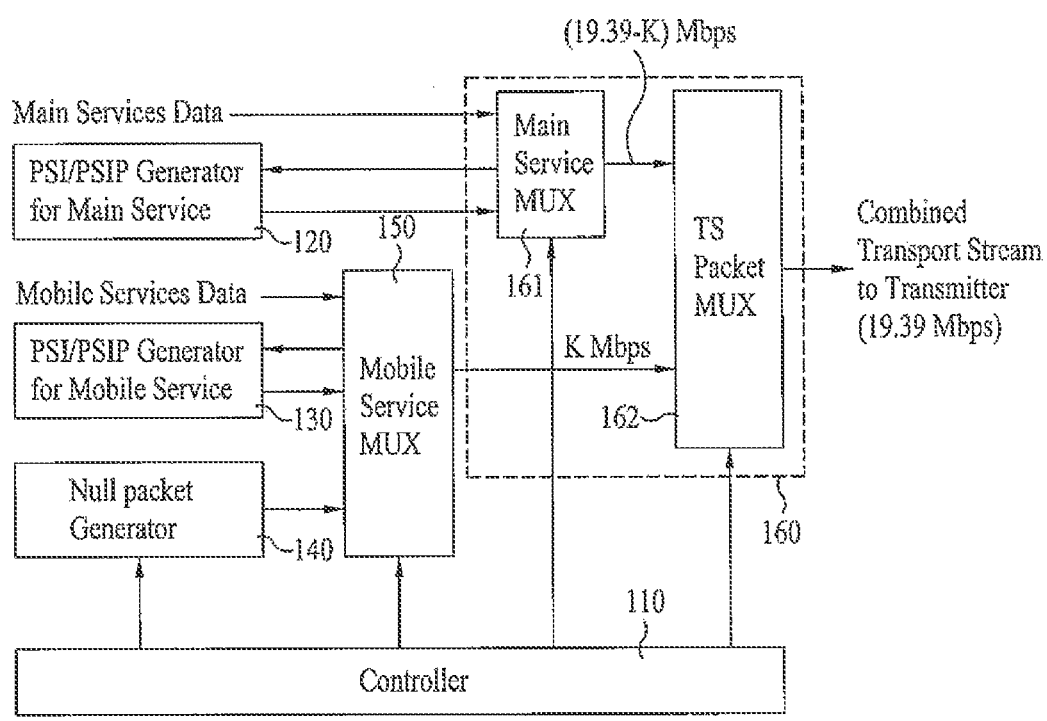
FIG. 14 illustrates a block diagram showing an example of a service multiplexer.

FIG. 14 illustrates a block diagram showing an example of the service multiplexer. The service multiplexer includes a controller 110 for controlling the overall operations of the service multiplexer, a PSI/PSIP generator 120 for the main service, a PSI/PSIP generator 130 for the mobile service, a null packet generator 140, a mobile service multiplexer 150, and a transport multiplexer 160.

The transport multiplexer 160 may include a main service multiplexer 161 and a transport stream (TS) packet multiplexer 162.

Referring to FIG. 14, at least one type of compression encoded main service data and the PSI/PSIP table data generated from the PSI/PSIP generator 120 for the main service are inputted to the main service multiplexer 161 of the transport multiplexer 160. The main service multiplexer 161 encapsulates each of the inputted main service data and PSI/PSIP table data to MPEG-2 TS packet forms. Then, the MPEG-2 TS packets are multiplexed and outputted to the TS packet multiplexer 162. Herein, the data packet being outputted from the main service multiplexer 161 will be referred to as a main service data packet for simplicity.

Thereafter, at least one type of the compression encoded mobile service data and the PSI/PSIP table data generated from the PSI/PSIP generator 130 for the mobile service are inputted to the mobile service multiplexer 150.

The mobile service multiplexer 150 encapsulates each of the inputted mobile service data and PSI/PSIP table data to MPEG-2 TS packet forms. Then, the MPEG-2 TS packets are multiplexed and outputted to the TS packet multiplexer 162. Herein, the data packet being outputted from the mobile service multiplexer 150 will be referred to as a mobile service data packet for simplicity.

At this point, the transmitter 200 requires identification information in order to identify and process the main service data packet and the mobile service data packet. Herein, the identification information may use values pre-decided in accordance with an agreement between the transmitting system and the receiving system, or may be configured of a separate set of data, or may modify predetermined location value with in the corresponding data packet.

As an example of the present invention, a different packet identifier (PID) may be assigned to identify each of the main service data packet and the mobile service data packet.

In another example, by modifying a synchronization data byte within a header of the mobile service data, the service data packet may be identified by using the synchronization data byte value of the corresponding service data packet. For example, the synchronization byte of the main service data packet directly outputs the value decided by the ISO/IEC13818-1 standard (i.e., 0x47) without any modification. The synchronization byte of the mobile service data packet modifies and outputs the value, thereby identifying the main service data packet and the mobile service data packet. Conversely, the synchronization byte of the main service data packet is modified and outputted, whereas the synchronization byte of the mobile service data packet is directly outputted without being modified, thereby enabling the main service data packet and the mobile service data packet to be identified.

A plurality of methods may be applied in the method of modifying the synchronization byte. For example, each bit of the synchronization byte may be inversed, or only a portion of the synchronization byte may be inversed.

As described above, any type of identification information may be used to identify the main service data packet and the mobile service data packet. Therefore, the scope of the present invention is not limited only to the example set forth in the description of the present invention.

Meanwhile, a transport multiplexer used in the conventional digital broadcasting system may be used as the transport multiplexer 160 according to the present invention. More specifically, in order to multiplex the mobile service data and the main service data and to transmit the multiplexed data, the data rate of the main service is limited to a data rate of (19.39-K) Mbps. Then, K Mbps, which corresponds to the remaining data rate, is assigned as the data rate of the mobile service. Thus, the transport multiplexer which is already being used may be used as it is without any modification.

Herein, the transport multiplexer 160 multiplexes the main service data packet being outputted from the main service multiplexer 161 and the mobile service data packet being outputted from the mobile service multiplexer 150. Thereafter, the transport multiplexer 160 transmits the multiplexed data packets to the transmitter 200.

However, in some cases, the output data rate of the mobile service multiplexer 150 may not be equal to K Mbps. In this case, the mobile service multiplexer 150 multiplexes and outputs null data packets generated from the null packet generator 140 so that the output data rate can reach K Mbps. More specifically, in order to match the output data rate of the mobile service multiplexer 150 to a constant data rate, the null packet generator 140 generates null data packets, which are then outputted to the mobile service multiplexer 150.

For example, when the service multiplexer 100 assigns K Mbps of the 19.39 Mbps to the mobile service data, and when the remaining (19.39-K) Mbps is, therefore, assigned to the main service data, the data rate of the mobile service data that are multiplexed by the service multiplexer 100 actually becomes lower than K Mbps. This is because, in case of the mobile service data, the pre-processor of the transmitting system performs additional encoding, thereby increasing the amount of data. Eventually, the data rate of the mobile service data, which may be transmitted from the service multiplexer 100, becomes smaller than K Mbps.

For example, since the pre-processor of the transmitter performs an encoding process on the mobile service data at a coding rate of at least ½, the amount of the data outputted from the pre-processor is increased to more than twice the amount of the data initially inputted to the pre-processor. Therefore, the sum of the data rate of the main service data and the data rate of the mobile service data, both being multiplexed by the service multiplexer 100, becomes either equal to or smaller than 19.39 Mbps.

Therefore, in order to match the data rate of the data that are finally outputted from the service multiplexer 100 to a constant data rate (e.g., 19.39 Mbps), an amount of null data packets corresponding to the amount of lacking data rate is generated from the null packet generator 140 and outputted to the mobile service multiplexer 150.

Accordingly, the mobile service multiplexer 150 encapsulates each of the mobile service data and the PSI/PSIP table data that are being inputted to a MPEG-2 TS packet form.

Then, the above-described TS packets are multiplexed with the null data packets and, then, outputted to the TS packet multiplexer 162.

Thereafter, the TS packet multiplexer 162 multiplexes the main service data packet being outputted from the main service multiplexer 161 and the mobile service data packet being outputted from the mobile service multiplexer 150 and transmits the multiplexed data packets to the transmitter 200 at a data rate of 19.39 Mbps.

According to an embodiment of the present invention, the mobile service multiplexer 150 receives the null data packets. However, this is merely exemplary and does not limit the scope of the present invention. In other words, according to another embodiment of the present invention, the TS packet multiplexer 162 may receive the null data packets, so as to match the data rate of the finally outputted data to a constant data rate. Herein, the output path and multiplexing rule of the null data packet is controlled by the controller 110. The controller 110 controls the multiplexing processed performed by the mobile service multiplexer 150, the main service multiplexer 161 of the transport multiplexer 160, and the TS packet multiplexer 162, and also controls the null data packet generation of the null packet generator 140. At this point, the transmitter 200 discards the null data packets transmitted from the service multiplexer 100 instead of transmitting the null data packets.

Further, in order to allow the transmitter 200 to discard the null data packets transmitted from the service multiplexer 100 instead of transmitting them, identification information for identifying the null data packet is required. Herein, the identification information may use values pre-decided in accordance with an agreement between the transmitting system and the receiving system. For example, the value of the synchronization byte within the header of the null data packet may be modified so as to be used as the identification information. Alternatively, a transport_error_indicator flag may also be used as the identification information.

In the description of the present invention, an example of using the transport_error_indicator flag as the identification information will be given to describe an embodiment of the present invention. In this case, the transport_error_indicator flag of the null data packet is set to '1', and the transport_error_indicator flag of the remaining data packets are reset to '0', so as to identify the null data packet. More specifically, when the null packet generator 140 generates the null data packets, if the transport_error_indicator flag from the header field of the null data packet is set to '1' and then transmitted, the null data packet may be identified and, therefore, be discarded. In the present invention, any type of identification information for identifying the null data packets may be used. Therefore, the scope of the present invention is not limited only to the examples set forth in the description of the present invention.

According to another embodiment of the present invention, a transmission parameter may be included in at least a portion of the null data packet, or at least one table or an operations and maintenance (OM) packet (or OMP) of the PSI/PSIP table for the mobile service. In this case, the transmitter 200 extracts the transmission parameter and outputs the extracted transmission parameter to the corresponding block and also transmits the extracted parameter to the receiving system if required. More specifically, a packet referred to as an OMP is defined for the purpose of operating and managing the transmitting system. For example, the OMP is configured in accordance with the MPEG-2 TS packet format, and the corresponding PID is given the value of 0x1FFA. The OMP is configured of a 4-byte header and a 184-byte payload. Herein, among the 184 bytes, the first byte corresponds to an OM_type field, which indicates the type of the OM packet.

In the present invention, the transmission parameter may be transmitted in the form of an OMP. And, in this case, among the values of the reserved fields within the OM_type field, a pre-arranged value is used, thereby indicating that the transmission parameter is being transmitted to the transmitter 200 in the form of an OMP. More specifically, the transmitter 200 may find (or identify) the OMP by referring to the PID. Also, by parsing the OM_type field within the OMP, the transmitter 200 can verify whether a transmission parameter is included after the OM_type field of the corresponding packet. The transmission parameter corresponds to supplemental data required for processing mobile service data from the transmitting system and the receiving system.

The transmission parameter corresponds to supplemental data required for processing mobile service data from the transmitting system and the receiving system. Herein, the transmission parameter may include data group information, region information within the data group, block information, RS frame information, super frame information, MPH frame information, parade information, ensemble information, information associated with serial concatenated convolution code (SCCC), and RS code information. The significance of some information within the transmission parameters has already been described in detail. Descriptions of other information that have not yet been described will be in detail in a later process.

The transmission parameter may also include information on how signals of a symbol domain are encoded in order to transmit the mobile service data, and multiplexing information on how the main service data and the mobile service data or various types of mobile service data are multiplexed.

The information included in the transmission parameter are merely exemplary to facilitate the understanding of the present invention. And, the adding and deleting of the information included in the transmission parameter may be easily modified and changed by anyone skilled in the art. Therefore, the present invention is not limited to the examples proposed in the description set forth herein.

Furthermore, the transmission parameters may be provided from the service multiplexer 100 to the transmitter 200. Alternatively, the transmission parameters may also be set up by an internal controller (not shown) within the transmitter 200 or received from an external source.

Transmitter

Figure 15:
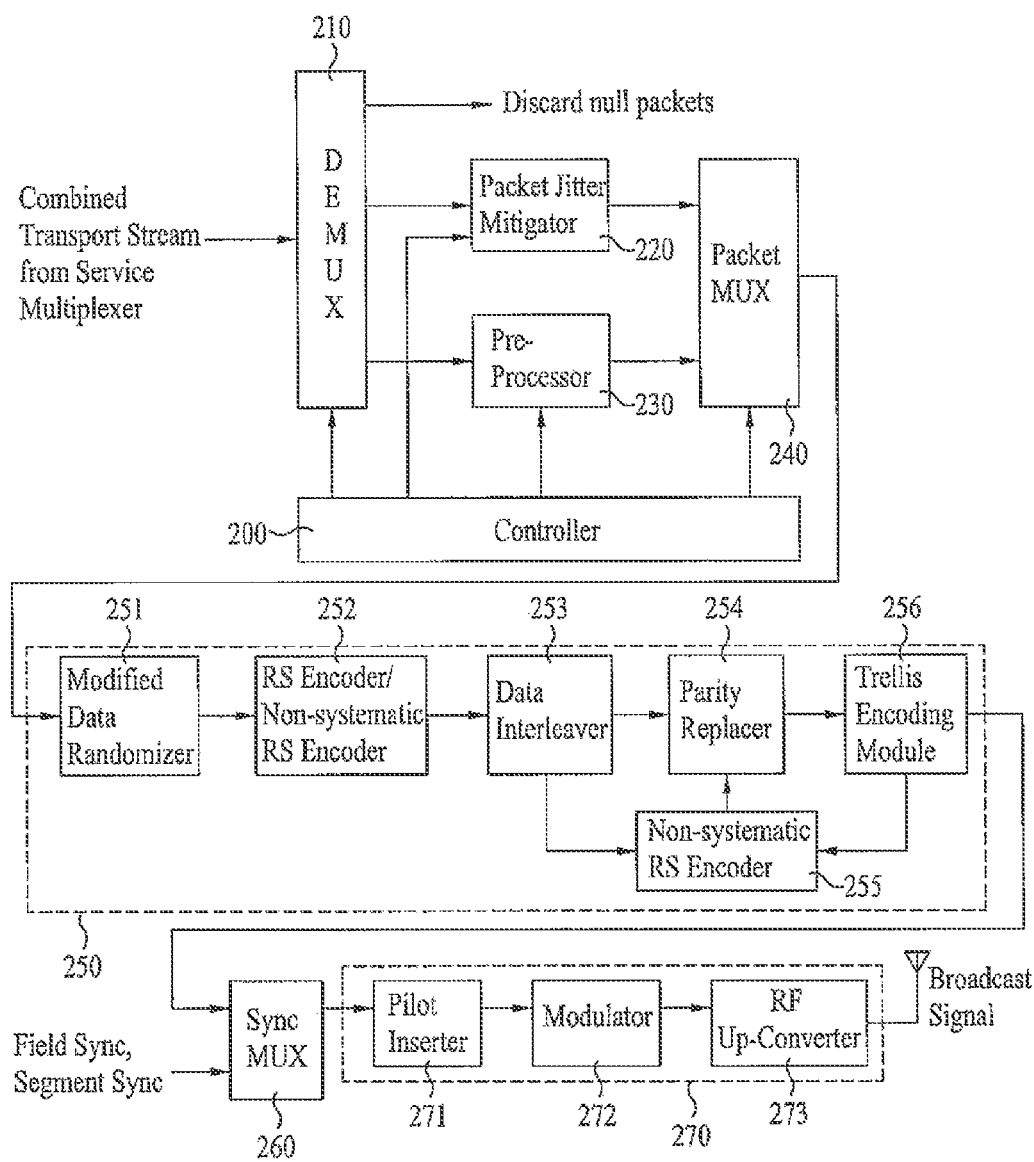
FIG. 15 illustrates a block diagram showing an example of a transmitter according to an embodiment of the present invention.

FIG. 15 illustrates a block diagram showing an example of the transmitter 200 according to an embodiment of the present invention. Herein, the transmitter 200 includes a controller 200, a demultiplexer 210, a packet jitter mitigator 220, a pre-processor 230, a packet multiplexer 240, a post-processor 250, a synchronization (sync) multiplexer 260, and a transmission unit 270. Herein, when a data packet is received from the service multiplexer 100, the demultiplexer 210 should identify whether the received data packet corresponds to a main service data packet, a mobile service data packet, or a null data packet. For example, the demultiplexer 210 uses the PID within the received data packet so as to identify the main service data packet and the mobile service data packet. Then, the demultiplexer 210 uses a transport_error_indicator field to identify the null data packet. The main service data packet identified by the demultiplexer 210 is outputted to the packet jitter mitigator 220, the mobile service data packet is outputted to the pre-processor 230, and the null data packet is discarded. If a transmission parameter is included in the null data packet, then the transmission parameter is first extracted and outputted to the corresponding block. Thereafter, the null data packet is discarded.

The pre-processor 230 performs an additional encoding process of the mobile service data included in the service data packet, which is demultiplexed and outputted from the demultiplexer 210. The pre-processor 230 also performs a process of configuring a data group so that the data group may be positioned at a specific place in accordance with the purpose of the data, which are to be transmitted on a transmission frame. This is to enable the mobile service data to respond swiftly and strongly against noise and channel changes. The pre-processor 230 may also refer to the transmission parameter when performing the additional encoding process. Also, the pre-processor 230 groups a plurality of mobile service data packets to configure a data group. Thereafter, known data, mobile service data, RS parity data, and MPEG header are allocated to pre-determined regions within the data group.

Pre-Processor within Transmitter

Figure 16:
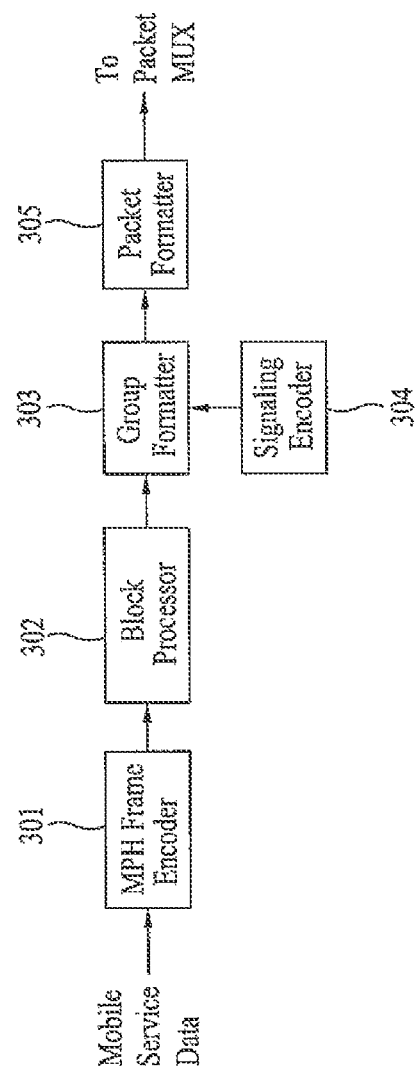
FIG. 16 illustrates a block diagram showing an example of a pre-processor according to the present invention.

FIG. 16 illustrates a block diagram showing the structure of a pre-processor 230 according to the present invention. Herein, the pre-processor 230 includes an MPH frame encoder 301, a block processor 302, a group formatter 303, a signaling encoder 304, and a packet formatter 305. The MPH frame encoder 301, which is included in the pre-processor 230 having the above-described structure, data-randomizes the mobile service data that are inputted to the demultiplexer 210, thereby creating a RS frame. Then, the MPH frame encoder 301 performs an encoding process for error correction in RS frame units. The MPH frame encoder 301 may include at least one RS frame encoder. More specifically, RS frame encoders may be provided in parallel, wherein the number of RS frame encoders is equal to the number of parades within the MPH frame. As described above, the MPH frame is a basic time cycle period for transmitting at least one parade. Also, each parade consists of one or two RS frames.

Figure 17:
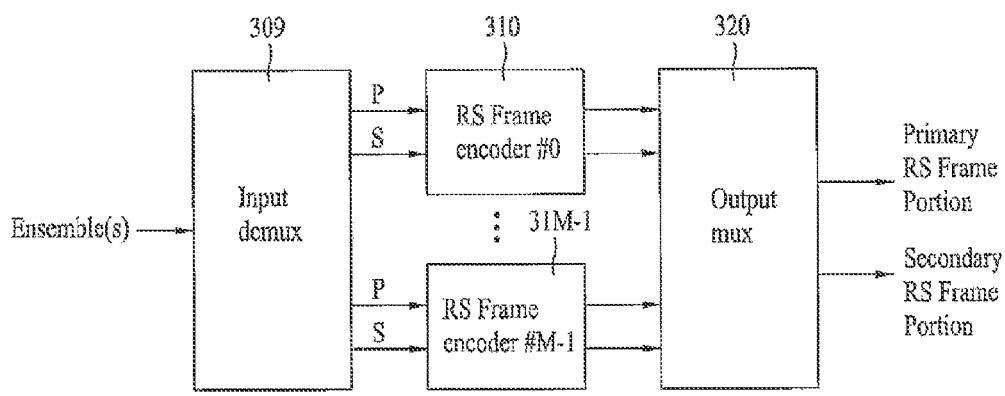
FIG. 17 illustrates a conceptual block diagram of the MPH frame encoder according to an embodiment of the present invention.

FIG. 17 illustrates a conceptual block diagram of the MPH frame encoder 301 according to an embodiment of the present invention. The MPH frame encoder 301 includes an input demultiplexer (DEMUX) 309, M number of RS frame encoders 310 to 31M−1, and an output multiplexer (MUX) 320. Herein, M represent the number of parades included in one MPH frame. The input demultiplexer (DEMUX) 309 splits input ensembles. Then, the split input ensembles decide the RS frame to which the ensembles are to be inputted. Thereafter, the inputted ensembles are outputted to the respective RS frame. At this point, an ensemble may be mapped to each RS frame encoder or parade. For example, when one parade configures one RS frame, the ensembles, RS frames, and parades may each be mapped to be in a one-to-one (1:1) correspondence with one another. More specifically, the data in one ensemble configure a RS frame. And, a RS frame is divided into a plurality of data groups. Based upon the RS frame mode of Table 1, the data within one RS frame may be assigned either to all of regions A/B/C/D within multiple data groups, or to at least one of regions A/B and regions C/D within multiple data groups.

When the RS frame mode value is equal to '01', i.e., when the data of the primary RS frame are assigned to regions A/B of the corresponding data group and data of the secondary RS frame are assigned to regions C/D of the corresponding data group, each RS frame encoder creates a primary RS frame and a secondary RS frame for each parade. Conversely, when the RS frame mode value is equal to '00', when the data of the primary RS frame are assigned to all of regions A/B/C/D, each RS frame encoder creates a RS frame (i.e., a primary RS frame) for each parade. Also, each RS frame encoder divides each RS frame into several portions. Each portion of the RS frame is equivalent to a data amount that can be transmitted by a data group.

The output multiplexer (MUX) 320 multiplexes portions within M number of RS frame encoders 310 to 310M−1 are multiplexed and then outputted to the block processor 302. For example, if one parade transmits two RS frames, portions of primary RS frames within M number of RS frame encoders 310 to 310M−1 are multiplexed and outputted. Thereafter, portions of secondary RS frames within M number of RS frame encoders 310 to 310M−1 are multiplexed and transmitted. The input demultiplexer (DEMUX) 309 and the output multiplexer (MUX) 320 operate based upon the control of the control unit 200. The control unit 200 may provide necessary (or required) FEC modes to each RS frame encoder. The FEC mode includes the RS code mode, which will be described in detail in a later process.

Figure 18:
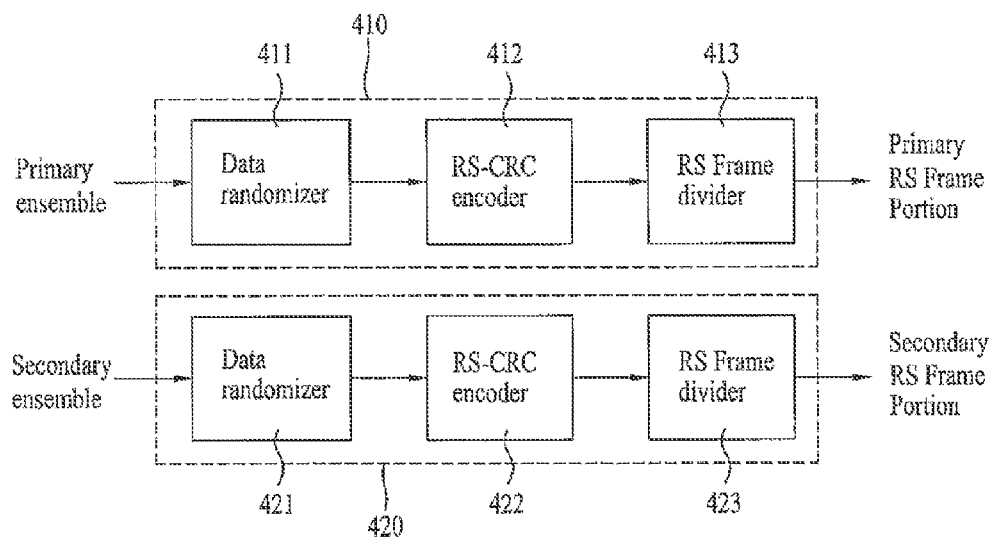
FIG. 18 illustrates a detailed block diagram of an RS frame encoder among a plurality of RS frame encoders within an MPH frame encoder.

FIG. 18 illustrates a detailed block diagram of an RS frame encoder among a plurality of RS frame encoders within an MPH frame encoder. One RS frame encoder may include a primary encoder 410 and a secondary encoder 420. Herein, the secondary encoder 420 may or may not operate based upon the RS frame mode. For example, when the RS frame mode value is equal to '00', as shown in Table 1, the secondary encoder 420 does not operate. The primary encoder 410 may include a data randomizer 411, a Reed-Solomon-cyclic redundancy check (RS-CRC) encoder (412), and a RS frame divider 413. And, the secondary encoder 420 may also include a data randomizer 421, a RS-CRC encoder (422), and a RS frame divider 423.

More specifically, the data randomizer 411 of the primary encoder 410 receives mobile service data of a primary ensemble outputted from the output demultiplexer (DEMUX) 309. Then, after randomizing the received mobile service data, the data randomizer 411 outputs the randomized data to the RS-CRC encoder 412. At this point, since the data randomizer 411 performs the randomizing process on the mobile service data, the randomizing process that is to be performed by the data randomizer 251 of the post-processor 250 on the mobile service data may be omitted. The data randomizer 411 may also discard the synchronization byte within the mobile service data packet and perform the randomizing process. This is an option that may be chosen by the system designer. In the example given in the present invention, the randomizing process is performed without discarding the synchronization byte within the corresponding mobile service data packet.

The RS-CRC encoder 412 uses at least one of a Reed-Solomon (RS) code and a cyclic redundancy check (CRC) code, so as to perform forward error collection (FEC) encoding on the randomized primary ensemble, thereby forming a primary RS frame. Therefore, the RS-CRC encoder 412 outputs the newly formed primary RS frame to the RS frame divider 413. The RS-CRC encoder 412 groups a plurality of mobile service data packets that is randomized and inputted, so as to create a RS frame. Then, the RS-CRC encoder 412 performs at least one of an error correction encoding process and an error detection encoding process in RS frame units. Accordingly, robustness may be provided to the mobile service data, thereby scattering group error that may occur during changes in a frequency environment, thereby enabling the mobile service data to respond to the frequency environment, which is extremely vulnerable and liable to frequent changes. Also, the RS-CRC encoder 412 groups a plurality of RS frame so as to create a super frame, thereby performing a row permutation process in super frame units. The row permutation process may also be referred to as a "row interleaving process". Hereinafter, the process will be referred to as "row permutation" for simplicity.

More specifically, when the RS-CRC encoder 412 performs the process of permuting each row of the super frame in accordance with a pre-determined rule, the position of the rows within the super frame before and after the row permutation process is changed. If the row permutation process is performed by super frame units, and even though the section having a plurality of errors occurring therein becomes very long, and even though the number of errors included in the RS frame, which is to be decoded, exceeds the extent of being able to be corrected, the errors become dispersed within the entire super frame. Thus, the decoding ability is even more enhanced as compared to a single RS frame.

At this point, as an example of the present invention, RS-encoding is applied for the error correction encoding process, and a cyclic redundancy check (CRC) encoding is applied for the error detection process in the RS-CRC encoder 412. When performing the RS-encoding, parity data that are used for the error correction are generated. And, when performing the CRC encoding, CRC data that are used for the error detection are generated. The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability of the receiving system. Herein, the RS-CRC encoder 412 refers to a pre-determined transmission parameter provided by the control unit 200 and/or a transmission parameter provided from the service multiplexer 100 so as to perform operations including RS frame configuration, RS encoding, CRC encoding, super frame configuration, and row permutation in super frame units.

Figure 19:
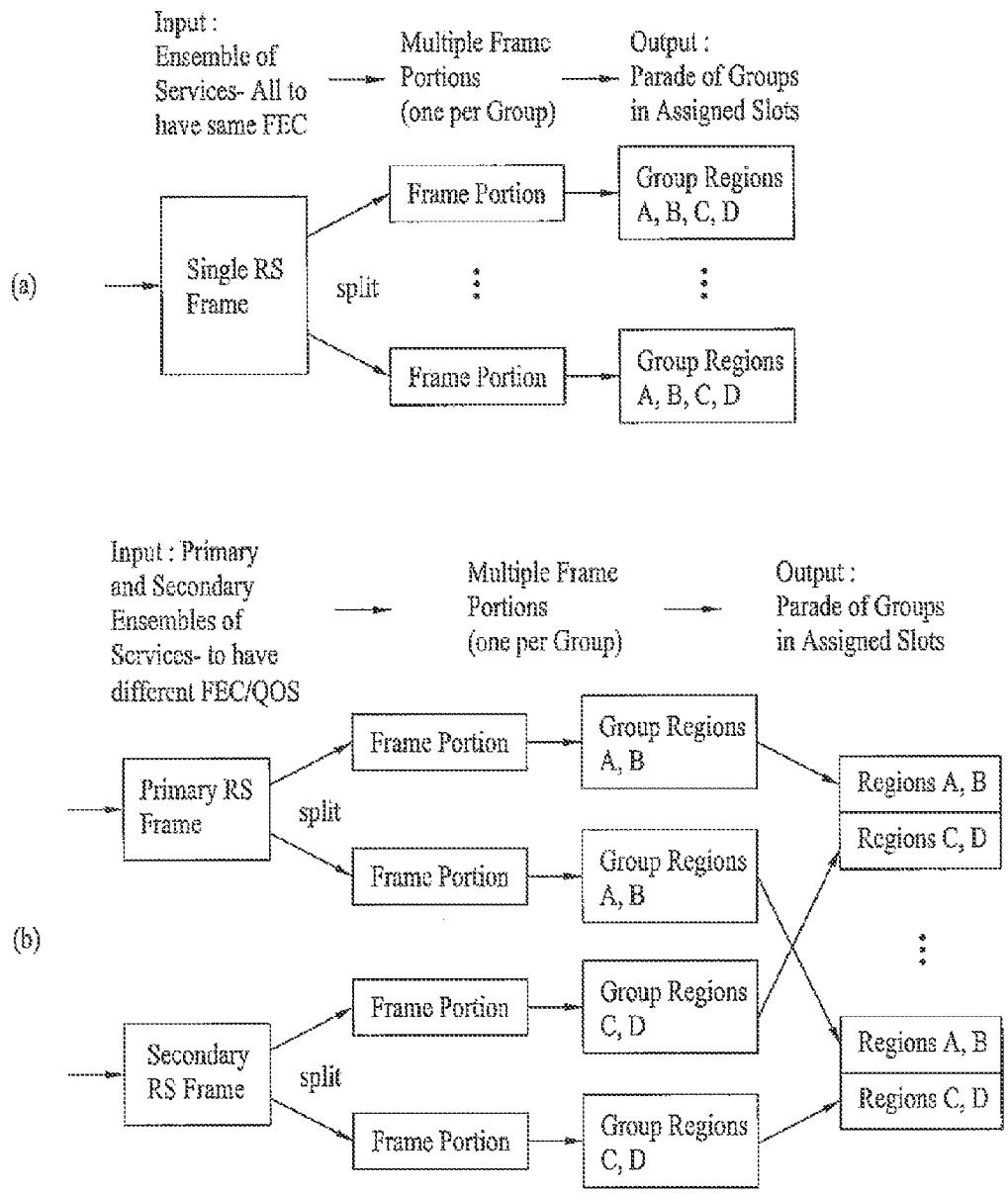
FIG. 19(a) and FIG. 19(b) illustrate a process of one or two RS frame being divided into several portions, based upon an RS frame mode value, and a process of each portion being assigned to a corresponding region within the respective data group.

FIG. 19 illustrates a process of one or two RS frame being divided into several portions, based upon an RS frame mode value, and a process of each portion being assigned to a corresponding region within the respective data group. More specifically, FIG. 19(*a*) shows an example of the RS frame mode value being equal to '00'. Herein, only the primary encoder 410 of FIG. 18 operates, thereby forming one RS frame for one parade. Then, the RS frame is divided into several portions, and the data of each portion are assigned to regions A/B/C/D within the respective data group. FIG. 19(*b*) shows an example of the RS frame mode value being equal to '01'. Herein, both the primary encoder 410 and the secondary encoder 420 of FIG. 18 operate, thereby forming two RS frames for one parade, i.e., one primary RS frame and one secondary RS frame. Then, the primary RS frame is divided into several portions, and the secondary RS frame is divided into several portions. At this point, the data of each portion of the primary RS frame are assigned to regions A/B within the respective data group. And, the data of each portion of the secondary RS frame are assigned to regions C/D within the respective data group.

Detailed Description of the RS Frame

Figure 20:
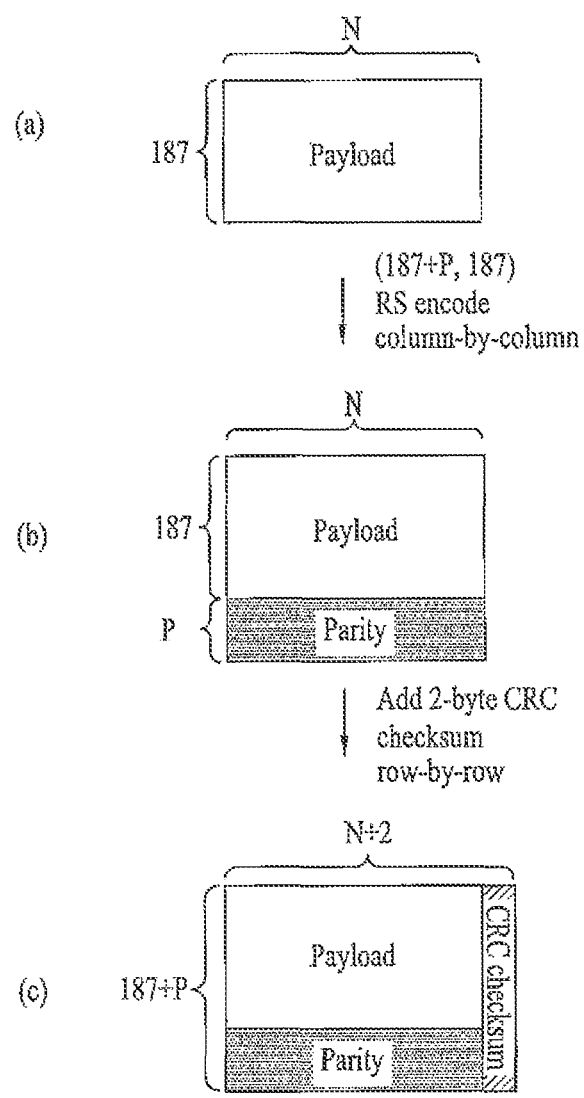
FIG. 20(a) to FIG. 20(c) illustrate error correction encoding and error detection encoding processes according to an embodiment of the present invention.

FIG. 20(*a*) illustrates an example of an RS frame being generated from the RS-CRC encoder 412 according to the present invention. According to this embodiment, in the RS frame, the length of a column (i.e., number of rows) is set to 187 bytes, and the length of a row (i.e., number of column) is set to N bytes. At this point, the value of N, which corresponds to the number of columns within an RS frame, can be decided according to Equation 2.

$$N = \left\lfloor \frac{5 \times NoG \times PL}{187 + P} \right\rfloor - 2 \qquad \text{Equation 2}$$

Herein, NoG indicates the number of data groups assigned to a sub-frame. PL represents the number of SCCC payload data bytes assigned to a data group. And, P signifies the number of RS parity data bytes added to each column of the RS frame. Finally, $\lfloor X \rfloor$ is the greatest integer that is equal to or smaller than X.

More specifically, in Equation 2, PL corresponds to the length of an RS frame portion. The value of PL is equivalent to the number of SCCC payload data bytes that are assigned to the corresponding data group. Herein, the value of PL may vary depending upon the RS frame mode, SCCC block mode, and SCCC outer code mode. Table 2 to Table 5 below respectively show examples of PL values, which vary in accordance with the RS frame mode, SCCC block mode, and SCCC outer code mode. The SCCC block mode and the SCCC outer code mode will be described in detail in a later process.

TABLE 2

| SCCC outer code mode | | | | |
|---|---|---|---|---|
| for Region A | for Region B | for Region C | for Region D | PL |
| 00 | 00 | 00 | 00 | 9624 |
| 00 | 00 | 00 | 01 | 9372 |
| 00 | 00 | 01 | 00 | 8886 |
| 00 | 00 | 01 | 01 | 8634 |
| 00 | 01 | 00 | 00 | 8403 |
| 00 | 01 | 00 | 01 | 8151 |
| 00 | 01 | 01 | 00 | 7665 |
| 00 | 01 | 01 | 01 | 7413 |
| 01 | 00 | 00 | 00 | 7023 |
| 01 | 00 | 00 | 01 | 6771 |
| 01 | 00 | 01 | 00 | 6285 |
| 01 | 00 | 01 | 01 | 6033 |
| 01 | 01 | 00 | 00 | 5802 |
| 01 | 01 | 00 | 01 | 5550 |
| 01 | 01 | 01 | 00 | 5064 |
| 01 | 01 | 01 | 01 | 4812 |
| Others | | | | Reserved |

Table 2 shows an example of the PL values for each data group within an RS frame, wherein each PL value varies depending upon the SCCC outer code mode, when the RS frame mode value is equal to '00', and when the SCCC block mode value is equal to '00'. For example, when it is assumed that each SCCC outer code mode value of regions A/B/C/D within the data group is equal to '00' (i.e., the block processor 302 of a later block performs encoding at a coding rate of ½), the PL value within each data group of the corresponding RS frame may be equal to 9624 bytes. More specifically, 9624 bytes of mobile service data within one RS frame may be assigned to regions A/B/C/D of the corresponding data group.

TABLE 3

| SCCC outer code mode | PL |
|---|---|
| 00 | 9624 |
| 01 | 4812 |
| Others | Reserved |

Table 3 shows an example of the PL values for each data group within an RS frame, wherein each PL value varies depending upon the SCCC outer code mode, when the RS frame mode value is equal to '00', and when the SCCC block mode value is equal to '01'.

TABLE 4

| SCCC outer code mode | | |
|---|---|---|
| for Region A | for Region B | PL |
| 00 | 00 | 7644 |
| 00 | 01 | 6423 |
| 01 | 00 | 5043 |
| 01 | 01 | 3822 |
| Others | | Reserved |

Table 4 shows an example of the PL values for each data group within a primary RS frame, wherein each PL value varies depending upon the SCCC outer code mode, when the RS frame mode value is equal to '01', and when the SCCC block mode value is equal to '00'. For example, when each SCCC outer code mode value of regions A/B is equal to '00', 7644 bytes of mobile service data within a primary RS frame may be assigned to regions A/B of the corresponding data group.

TABLE 5

| SCCC outer code mode | | |
|---|---|---|
| for Region C | for Region D | PL |
| 00 | 00 | 1980 |
| 00 | 01 | 1728 |
| 01 | 00 | 1242 |
| 01 | 01 | 990 |
| Others | | Reserved |

Table 5 shows an example of the PL values for each data group within a secondary RS frame, wherein each PL value varies depending upon the SCCC outer code mode, when the RS frame mode value is equal to '01', and when the SCCC block mode value is equal to '00'. For example, when each SCCC outer code mode value of regions C/D is equal to '00', 1980 bytes of mobile service data within a secondary RS frame may be assigned to regions C/D of the corresponding data group.

According to the embodiment of the present invention, the value of N is equal to or greater than 187 (i.e., N≥187). More specifically, the RS frame of FIG. 20(a) has the size of N(row)×187(column) bytes. More specifically, the RS-CRC encoder 412 first divides the inputted mobile service data bytes to units of a predetermined length. The predetermined length is decided by the system designer. And, in the example of the present invention, the predetermined length is equal to 187 bytes, and, therefore, the 187-byte unit will be referred to as a "packet" for simplicity. For example, the inputted mobile service data may correspond either to an MPEG transport stream (TS) packet configured of 188-byte units or to an IP datagram. Alternatively, the IP datagram may be encapsulated to a TS packet of 188-byte units and, then, inputted.

When the mobile service data that are being inputted correspond to a MPEG transport packet stream configured of 188-byte units, the first synchronization byte is removed so as to configure a 187-byte unit. Then, N number of packets are grouped to form an RS frame. Herein, the synchronization byte is removed because each mobile service data packet has the same value. Meanwhile, when the input mobile service data of the RS frame do not correspond to the MPEG TS packet format, the mobile service data are inputted N number of times in 187-byte units without being processed with the removing of the MPEG synchronization byte, thereby creating a RS frame.

In addition, when the input data format of the RS frame supports both the input data corresponding to the MPEG TS packet and the input data not corresponding to the MPEG TS packet, such information may be included in a transmission parameter transmitted from the service multiplexer 100, thereby being sent to the transmitter 200. Accordingly, the RS-CRC encoder 412 of the transmitter 200 receives this information to be able to control whether or not to perform the process of removing the MPEG synchronization byte. Also, the transmitter provides such information to the receiving system so as to control the process of inserting the MPEG synchronization byte that is to be performed by the RS frame decoder of the receiving system. Herein, the process of removing the synchronization byte may be performed during a randomizing process of the data randomizer 411 in an earlier process. In this case, the process of the removing the synchronization byte by the RS-CRC encoder 412 may be omitted.

Moreover, when adding synchronization bytes from the receiving system, the process may be performed by the data derandomizer instead of the RS frame decoder. Therefore, if a removable fixed byte (e.g., synchronization byte) does not exist within the mobile service data packet that is being inputted to the RS-CRC encoder 412, or if the mobile service data that are being inputted are not configured in a packet format, the mobile service data that are being inputted are divided into 187-byte units, thereby configuring a packet for each 187-byte unit.

Subsequently, N number of packets configured of 187 bytes is grouped to configure a RS frame. At this point, the RS frame is configured as a RS frame having the size of N(row)× 187(column) bytes, in which 187-byte packets are sequentially inputted in a row direction. More specifically, each of the N number of columns included in the RS frame includes 187 bytes. When the RS frame is created, as shown in FIG. 20(a), the RS-CRC encoder 412 performs a (Nc,Kc)-RS encoding process on each column, so as to generate Nc–Kc (=P) number of parity bytes. Then, the RS-CRC encoder 412 adds the newly generated P number of parity bytes after the very last byte of the corresponding column, thereby creating a column of (187+P) bytes. Herein, as shown in FIG. 20(a), Kc is equal to 187 (i.e., Kc=187), and Nc is equal to 187+P (i.e., Nc=187+P). Herein, the value of P may vary depending upon the RS code mode. Table 6 below shows an example of an RS code mode, as one of the RS encoding information.

TABLE 6

| RS code mode | RS code | Number of Parity Bytes (P) |
|---|---|---|
| 00 | (211, 187) | 24 |
| 01 | (223, 187) | 36 |
| 10 | (235, 187) | 48 |
| 11 | Reserved | Reserved |

Table 6 shows an example of 2 bits being assigned in order to indicate the RS code mode. The RS code mode represents the number of parity bytes corresponding to the RS frame. For example, when the RS code mode value is equal to '10', (235,187)-RS-encoding is performed on the RS frame of FIG. 20(a), so as to generate 48 parity data bytes. Thereafter, the 48 parity bytes are added after the last data byte of the corresponding column, thereby creating a column of 235 data bytes. When the RS frame mode value is equal to '00' in Table 1 (i.e., when the RS frame mode indicates a single RS frame), only the RS code mode of the corresponding RS frame is indicated. However, when the RS frame mode value is equal to '01' in Table 1 (i.e., when the RS frame mode indicates multiple RS frames), the RS code mode corresponding to a primary RS frame and a secondary RS frame. More specifically, it is preferable that the RS code mode is independently applied to the primary RS frame and the secondary RS frame.

When such RS encoding process is performed on all N number of columns, a RS frame having the size of N(row)×(187+P)(column) bytes may be created, as shown in FIG. 20(b). Each row of the RS frame is configured of N bytes. However, depending upon channel conditions between the transmitting system and the receiving system, error may be included in the RS frame. When errors occur as described above, CRC data (or CRC code or CRC checksum) may be used on each row unit in order to verify whether error exists in each row unit. The RS-CRC encoder 412 may perform CRC encoding on the mobile service data being RS encoded so as to create (or generate) the CRC data. The CRC data being generated by CRC encoding may be used to indicate whether the mobile service data have been damaged while being transmitted through the channel.

The present invention may also use different error detection encoding methods other than the CRC encoding method. Alternatively, the present invention may use the error correction encoding method to enhance the overall error correction ability of the receiving system. FIG. 20(c) illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 3 below corresponds to an exemplary equation for generating a 2-byte CRC checksum for each row being configured of N number of bytes.

$$g(x)=x^{16}+x^{12}+x^5+1 \qquad \text{Equation 3}$$

The process of adding a 2-byte checksum in each row is only exemplary. Therefore, the present invention is not limited only to the example proposed in the description set forth herein. As described above, when the process of RS encoding and CRC encoding are completed, the (N×187)-byte RS frame is expanded to a (N+2)×(187+P)-byte RS frame. Based upon an error correction scenario of a RS frame expanded as described above, the data bytes within the RS frame are transmitted through a channel in a row direction. At this point, when a large number of errors occur during a limited period of transmission time, errors also occur in a row direction within the RS frame being processed with a decoding process in the receiving system. However, in the perspective of RS encoding performed in a column direction, the errors are shown as being scattered. Therefore, error correction may be performed more effectively. At this point, a method of increasing the number of parity data bytes (P) may be used in order to perform a more intense error correction process. However, using this method may lead to a decrease in transmission efficiency. Therefore, a mutually advantageous method is required. Furthermore, when performing the decoding process, an erasure decoding process may be used to enhance the error correction performance.

Additionally, the RS-CRC encoder 412 according to the present invention also performs a row permutation (or interleaving) process in super frame units in order to further enhance the error correction performance when error correction the RS frame. FIG. 21(a) to FIG. 21(d) illustrates an example of performing a row permutation process in super frame units according to the present invention. More specifically, G number of RS frames RS-CRC-encoded is grouped to form a super frame, as shown in FIG. 21(a). At this point, since each RS frame is formed of (N+2)×(187+P) number of bytes, one super frame is configured to have the size of (N+2)×(187+P)×G bytes.

When a row permutation process permuting each row of the super frame configured as described above is performed based upon a pre-determined permutation rule, the positions of the rows prior to and after being permuted (or interleaved) within the super frame may be altered. More specifically, the $i^{th}$ row of the super frame prior to the interleaving process, as shown in FIG. 21(b), is positioned in the $j^{th}$ row of the same super frame after the row permutation process, as shown in FIG. 21(c). The above-described relation between i and j can be easily understood with reference to a permutation rule as shown in Equation 4 below.

$$j=G(i \bmod(187+P))+\lfloor i/(187+P)\rfloor$$

$$i=(187+P)(j \bmod G)+\lfloor j/G \rfloor \qquad \text{Equation 4}$$

where $0 \le i, j \le (187+P)G-1$; or
where $0 \le i, j < (187+P)G$

Herein, each row of the super frame is configured of (N+2) number of data bytes even after being row-permuted in super frame units.

When all row permutation processes in super frame units are completed, the super frame is once again divided into G number of row-permuted RS frames, as shown in FIG. 21(d), and then provided to the RS frame divider 413. Herein, the number of RS parity bytes and the number of columns should be equally provided in each of the RS frames, which configure a super frame. As described in the error correction scenario of a RS frame, in case of the super frame, a section having a large number of error occurring therein is so long that, even when one RS frame that is to be decoded includes an excessive number of errors (i.e., to an extent that the errors cannot be corrected), such errors are scattered throughout the entire super frame. Therefore, in comparison with a single RS frame, the decoding performance of the super frame is more enhanced.

The above description of the present invention corresponds to the processes of forming (or creating) and encoding an RS frame, when a data group is divided into regions A/B/C/D, and when data of an RS frame are assigned to all of regions A/B/C/D within the corresponding data group. More specifically, the above description corresponds to an embodiment of the present invention, wherein one RS frame is transmitted using one parade. In this embodiment, the secondary encoder 420 does not operate (or is not active).

Meanwhile, 2 RS frames are transmitting using one parade, the data of the primary RS frame may be assigned to regions A/B within the data group and be transmitted, and the data of the secondary RS frame may be assigned to regions C/D within the data group and be transmitted. At this point, the primary encoder 410 receives the mobile service data that are to be assigned to regions A/B within the data group, so as to form the primary RS frame, thereby performing RS-encoding and CRC-encoding. Similarly, the secondary encoder 420 receives the mobile service data that are to be assigned to regions C/D within the data group, so as to form the secondary RS frame, thereby performing RS-encoding and CRC-encoding. More specifically, the primary RS frame and the secondary RS frame are created independently.

FIG. 22 illustrates examples of receiving the mobile service data that are to be assigned to regions A/B within the data group, so as to form the primary RS frame, and receives the mobile service data that are to be assigned to regions C/D within the data group, so as to form the secondary RS frame, thereby performing error correction encoding and error detection encoding on each of the first and secondary RS frames. More specifically, FIG. 22(a) illustrates an example of the RS-CRC encoder 412 of the primary encoder 410 receiving mobile service data of the primary ensemble that are to be assigned to regions A/B within the corresponding data group, so as to create an RS frame having the size of N1(row)×187(column). Then, in this example, the primary encoder 410 performs RS-encoding on each column of the RS frame created as described above, thereby adding P1 number of parity data bytes in each column. Finally, the primary encoder 410 performs CRC-encoding on each row, thereby adding a 2-byte checksum in each row.

FIG. 22(b) illustrates an example of the RS-CRC encoder 422 of the secondary encoder 420 receiving mobile service data of the secondary ensemble that are to be assigned to regions C/D within the corresponding data group, so as to create an RS frame having the size of N2(row)×187(column). Then, in this example, the secondary encoder 420 performs RS-encoding on each column of the RS frame created as described above, thereby adding P2 number of parity data bytes in each column. Finally, the secondary encoder 420 performs CRC-encoding on each row, thereby adding a 2-byte checksum in each row. At this point, each of the RS-CRC encoders 412 and 422 may refer to a pre-determined transmission parameter provided by the control unit 200 and/or a transmission parameter provided from the service multiplexer 100, the RS-CRC encoders 412 and 422 may be informed of RS frame information (including RS frame mode), RS encoding information (including RS code mode), SCCC information (including SCCC block information and SCCC outer code mode), data group information, and region information within a data group. The RS-CRC encoders 412 and 422 may refer to the transmission parameters for the purpose of RS frame configuration, error correction encoding, error detection encoding. Furthermore, the transmission parameters should also be transmitted to the receiving system so that the receiving system can perform a normal decoding process.

The data of the primary RS frame, which is encoded by RS frame units and row-permuted by super frame units from the RS-CRC encoder 412 of the primary encoder 410, are outputted to the RS frame divider 413. If the secondary encoder 420 also operates in the embodiment of the present invention, the data of the secondary RS frame, which is encoded by RS frame units and row-permuted by super frame units from the RS-CRC encoder 422 of the secondary encoder 420, are outputted to the RS frame divider 423. The RS frame divider 413 of the primary encoder 410 divides the primary RS frame into several portions, which are then outputted to the output multiplexer (MUX) 320. Each portion of the primary RS frame is equivalent to a data amount that can be transmitted by one data group. Similarly, the RS frame divider 423 of the secondary encoder 420 divides the secondary RS frame into several portions, which are then outputted to the output multiplexer (MUX) 320.

Hereinafter, the RS frame divider 413 of the primary RS encoder 410 will now be described in detail. Also, in order to simplify the description of the present invention, it is assumed that an RS frame having the size of N(row)×187(column), as shown in FIG. 20(a) to FIG. 20(c), that P number of parity data bytes are added to each column by RS-encoding the RS frame, and that a 2-byte checksum is added to each row by CRC-encoding the RS frame. Accordingly, the RS frame divider 413 divides (or partitions) the encoded RS frame having the size of (N+2)(row)×187(column) into several portions, each having the size of PL (wherein PL corresponds to the length of the RS frame portion).

At this point, as shown in Table 2 to Table 5, the value of PL may vary depending upon the RS frame mode, SCCC block mode, and SCCC outer coder mode. Also, the total number of data bytes of the RS-encoded and CRC-encoded RS frame is equal to or smaller than 5×NoG×PL. In this case, the RS frame is divided (or partitioned) into ((5×NoG)−1) number of portions each having the size of PL and one portion having a size equal to smaller than PL. More specifically, with the exception of the last portion of the RS frame, each of the remaining portions of the RS frame has an equal size of PL. If the size of the last portion is smaller than PL, a stuffing byte (or dummy byte) may be inserted in order to fill (or replace) the lacking number of data bytes, thereby enabling the last portion of the RS frame to also be equal to PL. Each portion of an RS frame corresponds to the amount of data that are to be SCCC-encoded and mapped into a single data group of a parade.

FIG. 23(a) and FIG. 23(b) respectively illustrate examples of adding S number of stuffing bytes, when an RS frame having the size of (N+2)(row)×(187+P)(column) is divided into 5×NoG number of portions, each having the size of PL. More specifically, the RS-encoded and CRC-encoded RS frame, shown in FIG. 23(a), is divided into several portions, as shown in FIG. 23(b). The number of divided portions at the RS frame is equal to (5×NoG). Particularly, the first ((5×NoG)−1) number of portions each has the size of PL, and the last portion of the RS frame may be equal to or smaller than PL. If the size of the last portion is smaller than PL, a stuffing byte (or dummy byte) may be inserted in order to fill (or replace) the lacking number of data bytes, as shown in Equation 5 below, thereby enabling the last portion of the RS frame to also be equal to PL.

$$S = (5 \times NoG \times PL) - ((N+2) \times (187+P)) \qquad \text{Equation 5}$$

Herein, each portion including data having the size of PL passes through the output multiplexer 320 of the MPH frame encoder 301, which is then outputted to the block processor 302.

At this point, the mapping order of the RS frame portions to a parade of data groups in not identical with the group assignment order defined in Equation 1. When given the group positions of a parade in an MPH frame, the SCCC-encoded RS frame portions will be mapped in a time order (i.e., in a left-to-right direction). For example, as shown in FIG. 11, data groups of the $2^{nd}$ parade (Parade #1) are first assigned (or allocated) to the $13^{th}$ slot (Slot #12) and then assigned to the $3^{rd}$ slot (Slot #2). However, when the data are actually placed in the assigned slots, the data are placed in a time sequence (or time order, i.e., in a left-to-right direction). More specifically, the $1^{st}$ data group of Parade #1 is placed in Slot #2, and the $2^{nd}$ data group of Parade #1 is placed in Slot #12.

Block Processor

Meanwhile, the block processor 302 performs an SCCC outer encoding process on the output of the MPH frame encoder 301. More specifically, the block processor 302 receives the data of each error correction encoded portion. Then, the block processor 302 encodes the data once again at a coding rate of 1/H (wherein H is an integer equal to or greater than 2 (i.e., H≥2)), thereby outputting the 1/H-rate encoded data to the group formatter 303. According to the embodiment of the present invention, the input data are encoded either at a coding rate of ½ (also referred to as "½-rate encoding") or at a coding rate of ¼ (also referred to as "¼-rate encoding"). The data of each portion outputted from the MPH frame encoder 301 may include at least one of pure mobile service data, RS parity data, CRC data, and stuffing data. However, in a broader meaning, the data included in each portion may correspond to data for mobile services. Therefore, the data included in each portion will all be considered as mobile service data and described accordingly.

The group formatter 303 inserts the mobile service data SCCC-outer-encoded and outputted from the block processor 302 in the corresponding region within the data group, which is formed in accordance with a pre-defined rule. Also, in association with the data deinterleaving process, the group formatter 303 inserts various place holders (or known data place holders) in the corresponding region within the data group. Thereafter, the group formatter 303 deinterleaves the data within the data group and the place holders.

According to the present invention, with reference to data after being data-interleaved, as shown in FIG. 5, a data groups is configured of 10 MPH blocks (B1 to B10) and divided into 4 regions (A, B, C, and D). Also, as shown in FIG. 5, when it is assumed that the data group is divided into a plurality of hierarchical regions, as described above, the block processor 302 may encode the mobile service data, which are to be inserted to each region based upon the characteristic of each hierarchical region, at different coding rates. For example, the block processor 302 may encode the mobile service data, which are to be inserted in region A/B within the corresponding data group, at a coding rate of ½. Then, the group formatter 303 may insert the ½-rate encoded mobile service data to region A/B. Also, the block processor 302 may encode the mobile service data, which are to be inserted in region C/D within the corresponding data group, at a coding rate of ¼ having higher (or stronger) error correction ability than the ½-coding rate. Thereafter, the group formatter 303 may insert the ½-rate encoded mobile service data to region C/D. In another example, the block processor 302 may encode the mobile service data, which are to be inserted in region C/D, at a coding rate having higher error correction ability than the ¼-coding rate. Then, the group formatter 303 may either insert the encoded mobile service data to region C/D, as described above, or leave the data in a reserved region for future usage.

According to another embodiment of the present invention, the block processor 302 may perform a 1/H-rate encoding process in SCCC block units. Herein, the SCCC block includes at least one MPH block. At this point, when 1/H-rate encoding is performed in MPH block units, the MPH blocks (B1 to B10) and the SCCC block (SCB1 to SCB10) become identical to one another (i.e., SCB1=B1, SCB2=B2, SCB3=B3, SCB4=B4, SCB5=B5, SCB6=B6, SCB7=B7, SCB8=B8, SCB9=B9, and SCB10=B10). For example, the MPH block 1 (B1) may be encoded at the coding rate of ½, the MPH block 2 (B2) may be encoded at the coding rate of ¼, and the MPH block 3 (B3) may be encoded at the coding rate of ½. The coding rates are applied respectively to the remaining MPH blocks.

Alternatively, a plurality of MPH blocks within regions A, B, C, and D may be grouped into one SCCC block, thereby being encoded at a coding rate of 1/H in SCCC block units. Accordingly, the receiving performance of region C/D may be enhanced. For example, MPH block 1 (B1) to MPH block 5 (B5) may be grouped into one SCCC block and then encoded at a coding rate of ½. Thereafter, the group formatter 303 may insert the ½-rate encoded mobile service data to a section starting from MPH block 1 (B1) to MPH block 5 (B5). Furthermore, MPH block 6 (B6) to MPH block 10 (B10) may be grouped into one SCCC block and then encoded at a coding rate of ¼. Thereafter, the group formatter 303 may insert the ¼-rate encoded mobile service data to another section starting from MPH block 6 (B6) to MPH block 10 (B10). In this case, one data group may consist of two SCCC blocks.

According to another embodiment of the present invention, one SCCC block may be formed by grouping two MPH blocks. For example, MPH block 1 (B1) and MPH block 6 (B6) may be grouped into one SCCC block (SCB1). Similarly, MPH block 2 (B2) and MPH block 7 (B7) may be grouped into another SCCC block (SCB2). Also, MPH block 3 (B3) and MPH block 8 (B8) may be grouped into another SCCC block (SCB3). And, MPH block 4 (B4) and MPH block 9 (B9) may be grouped into another SCCC block (SCB4). Furthermore, MPH block 5 (B5) and MPH block 10 (B10) may be grouped into another SCCC block (SCB5). In the above-described example, the data group may consist of 10 MPH blocks and 5 SCCC blocks. Accordingly, in a data (or signal) receiving environment undergoing frequent and severe channel changes, the receiving performance of regions C and D, which is relatively more deteriorated than the receiving performance of region A, may be reinforced. Furthermore, since the number of mobile service data symbols increases more and more from region A to region D, the error correction encoding performance becomes more and more deteriorated. Therefore, when grouping a plurality of MPH block to form one SCCC block, such deterioration in the error correction encoding performance may be reduced.

As described-above, when the block processor 302 performs encoding at a 1/H-coding rate, information associated with SCCC should be transmitted to the receiving system in order to accurately recover the mobile service data. Table 7 below shows an example of a SCCC block mode, which indicating the relation between an MPH block and an SCCC block, among diverse SCCC block information.

TABLE 7

| SCCC Block Mode Description SCB | 00 One MPH Block per SCCC Block SCB input, MPH Block | 01 Two MPH Blocks per SCCC Block SCB input, MPH Blocks | 10 Reserved | 11 Reserved |
|---|---|---|---|---|
| SCB1 | B1 | B1 + B6 | | |
| SCB2 | B2 | B2 + B7 | | |
| SCB3 | B3 | B3 + B8 | | |
| SCB4 | B4 | B4 + B9 | | |
| SCB5 | B5 | B5 + B10 | | |
| SCB6 | B6 | — | | |
| SCB7 | B7 | — | | |
| SCB8 | B8 | — | | |
| SCB9 | B9 | — | | |
| SCB10 | B10 | — | | |

More specifically, Table 4 shows an example of 2 bits being allocated in order to indicate the SCCC block mode. For example, when the SCCC block mode value is equal to '00', this indicates that the SCCC block and the MPH block are identical to one another. Also, when the SCCC block mode value is equal to '01', this indicates that each SCCC block is configured of 2 MPH blocks.

As described above, if one data group is configured of 2 SCCC blocks, although it is not indicated in Table 7, this information may also be indicated as the SCCC block mode. For example, when the SCCC block mode value is equal to '10', this indicates that each SCCC block is configured of 5 MPH blocks and that one data group is configured of 2 SCCC blocks. Herein, the number of MPH blocks included in an SCCC block and the position of each MPH block may vary depending upon the settings made by the system designer. Therefore, the present invention will not be limited to the examples given herein. Accordingly, the SCCC mode information may also be expanded.

An example of a coding rate information of the SCCC block, i.e., SCCC outer code mode, is shown in Table 8 below.

TABLE 8

| SCCC outer code mode (2 bits) | Description |
|---|---|
| 00 | Outer code rate of SCCC block is ½ rate |
| 01 | Outer code rate of SCCC block is ¼ rate |
| 10 | Reserved |
| 11 | Reserved |

More specifically, Table 8 shows an example of 2 bits being allocated in order to indicate the coding rate information of the SCCC block. For example, when the SCCC outer code mode value is equal to '00', this indicates that the coding rate of the corresponding SCCC block is ½. And, when the SCCC outer code mode value is equal to '01', this indicates that the coding rate of the corresponding SCCC block is ¼.

If the SCCC block mode value of Table 7 indicates '00', the SCCC outer code mode may indicate the coding rate of each MPH block with respect to each MPH block. In this case, since it is assumed that one data group includes 10 MPH blocks and that 2 bits are allocated for each SCCC block mode, a total of 20 bits are required for indicating the SCCC block modes of the 10 MPH modes. In another example, when the SCCC block mode value of Table 7 indicates '00', the SCCC outer code mode may indicate the coding rate of each region with respect to each region within the data group. In this case, since it is assumed that one data group includes 4 regions (i.e., regions A, B, C, and D) and that 2 bits are allocated for each SCCC block mode, a total of 8 bits are required for indicating the SCCC block modes of the 4 regions. In another example, when the SCCC block mode value of Table 7 is equal to '01', each of the regions A, B, C, and D within the data group has the same SCCC outer code mode.

Meanwhile, an example of an SCCC output block length (SOBL) for each SCCC block, when the SCCC block mode value is equal to '00', is shown in Table 9 below.

TABLE 9

| SCCC Block | SOBL | SIBL ||
|---|---|---|---|
| | | ½ rate | ¼ rate |
| SCB1 (B1) | 528 | 264 | 132 |
| SCB2 (B2) | 1536 | 768 | 384 |
| SCB3 (B3) | 2376 | 1188 | 594 |
| SCB4 (B4) | 2388 | 1194 | 597 |
| SCB5 (B5) | 2772 | 1386 | 693 |
| SCB6 (B6) | 2472 | 1236 | 618 |
| SCB7 (B7) | 2772 | 1386 | 693 |
| SCB8 (B8) | 2508 | 1254 | 627 |
| SCB9 (B9) | 1416 | 708 | 354 |
| SCB10 (B10) | 480 | 240 | 120 |

More specifically, when given the SCCC output block length (SOBL) for each SCCC block, an SCCC input block length (SIBL) for each corresponding SCCC block may be decided based upon the outer coding rate of each SCCC block. The SOBL is equivalent to the number of SCCC output (or outer-encoded) bytes for each SCCC block. And, the SIBL is equivalent to the number of SCCC input (or payload) bytes for each SCCC block. Table 10 below shows an example of the SOBL and SIBL for each SCCC block, when the SCCC block mode value is equal to '01'.

TABLE 10

| SCCC Block | SOBL | SIBL ||
|---|---|---|---|
| | | ½ rate | ¼ rate |
| SCB1 (B1 + B6) | 528 | 264 | 132 |
| SCB2 (B2 + B7) | 1536 | 768 | 384 |
| SCB3 (B3 + B8) | 2376 | 1188 | 594 |
| SCB4 (B4 + B9) | 2388 | 1194 | 597 |
| SCB5 (B5 + B10) | 2772 | 1386 | 693 |

Figure 24:
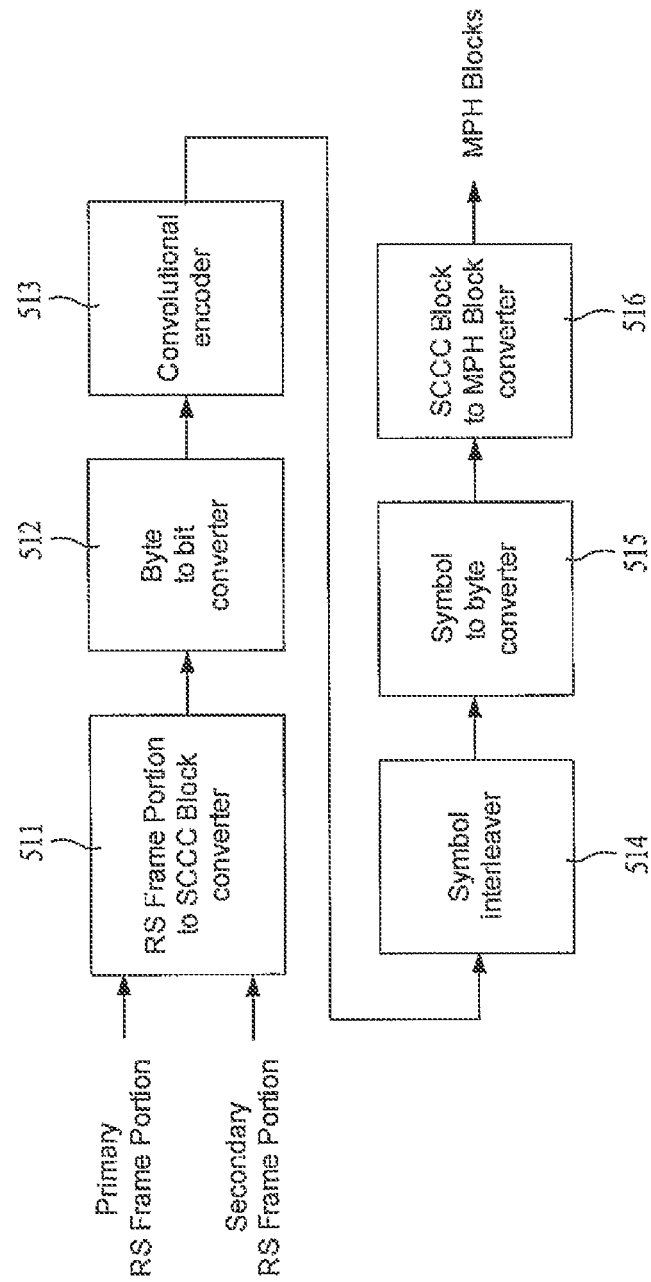
FIG. 24 illustrates a block diagram of a block processor according to an embodiment of the present invention.

In order to do so, as shown in FIG. 24, the block processor 302 includes a RS frame portion-SCCC block converter 511, a byte-bit converter 512, a convolution encoder 513, a symbol interleaver 514, a symbol-byte converter 515, and an SCCC block-MPH block converter 516. The convolutional encoder 513 and the symbol interleaver 514 are virtually concatenated with the trellis encoding module in the post-processor in order to configure an SCCC block. More specifically, the RS frame portion-SCCC block converter 511 divides the RS frame portions, which are being inputted, into multiple SCCC blocks using the SIBL of Table 9 and Table 10 based upon the RS code mode, SCCC block mode, and SCCC outer code mode. Herein, the MPH frame encoder 301 may output only primary RS frame portions or both primary RS frame portions and secondary RS frame portions in accordance with the RS frame mode.

When the RS Frame mode is set to '00', a portion of the primary RS Frame equal to the amount of data, which are to be SCCC outer encoded and mapped to 10 MPH blocks (B1 to B10) of a data group, will be provided to the block processor 302. When the SCCC block mode value is equal to '00', then the primary RS frame portion will be split into 10 SCCC Blocks according to Table 9. Alternatively, when the SCCC block mode value is equal to '01', then the primary RS frame will be split into 5 SCCC blocks according to Table 10.

When the RS frame mode value is equal to '01', then the block processor 302 may receive two RS frame portions. The RS frame mode value of '01' will not be used with the SCCC block mode value of '01'. The first portion from the primary RS frame will be SCCC-outer-encoded as SCCC Blocks SCB3, SCB4, SCB5, SCB6, SCB7, and SCB8 by the block processor 302. The SCCC Blocks S3 and S8 will be mapped to region B and the SCCC blocks SCB4, SCB5, SCB6, and SCB7 shall be mapped to region A by the group formatter 303. The second portion from the secondary RS frame will also be SCCC-outer-encoded, as SCB1, SCB2, SCB9, and SCB10, by the block processor 302. The group formatter 303 will map the SCCC blocks SCB1 and SCB10 to region D as the MPH blocks B1 and B10, respectively. Similarly, the SCCC blocks SCB2 and SCB9 will be mapped to region C as the MPH blocks B2 and B9.

The byte-bit converter 512 identifies the mobile service data bytes of each SCCC block outputted from the RS frame portion-SCCC block converter 511 as data bits, which are then outputted to the convolution encoder 513. The convolution encoder 513 performs one of ½-rate encoding and ¼-rate encoding on the inputted mobile service data bits.

Figure 25:
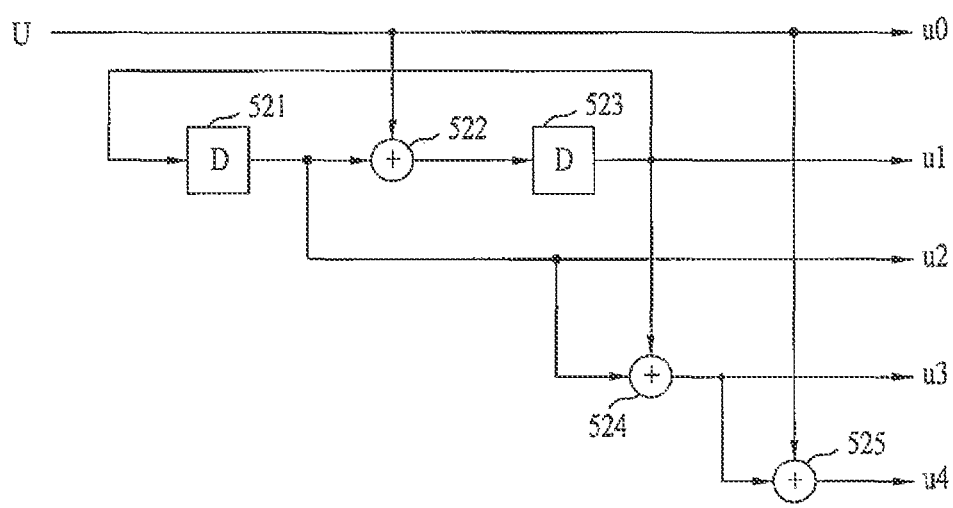
FIG. 25 illustrates a detailed block diagram of a convolution encoder of the block processor of FIG. 24.

FIG. 25 illustrates a detailed block diagram of the convolution encoder 513. The convolution encoder 513 includes two delay units 521 and 523 and three adders 522, 524, and 525. Herein, the convolution encoder 513 encodes an input data bit U and outputs the coded bit U to 5 bits (u0 to u4). At this point, the input data bit U is directly outputted as uppermost bit u0 and simultaneously encoded as lower bit u1u2u3u4 and then outputted. More specifically, the input data bit U is directly outputted as the uppermost bit u0 and simultaneously outputted to the first and third adders 522 and 525.

The first adder 522 adds the input data bit U and the output bit of the first delay unit 521 and, then, outputs the added bit to the second delay unit 523. Then, the data bit delayed by a pre-determined time (e.g., by 1 clock) in the second delay unit 523 is outputted as a lower bit u1 and simultaneously fed-back to the first delay unit 521. The first delay unit 521 delays the data bit fed-back from the second delay unit 523 by a pre-determined time (e.g., by 1 clock). Then, the first delay unit 521 outputs the delayed data bit as a lower bit u2 and, at the same time, outputs the fed-back data to the first adder 522 and the second adder 524. The second adder 524 adds the data bits outputted from the first and second delay units 521 and 523 and outputs the added data bits as a lower bit u3. The third adder 525 adds the input data bit U and the output of the second delay unit 523 and outputs the added data bit as a lower bit u4.

At this point, the first and second delay units 521 and 523 are reset to '0', at the starting point of each SCCC block. The convolution encoder 513 of FIG. 25 may be used as a ½-rate encoder or a ¼-rate encoder. More specifically, when a portion of the output bit of the convolution encoder 513, shown in FIG. 25, is selected and outputted, the convolution encoder 513 may be used as one of a ½-rate encoder and a ¼-rate encoder. Table 11 below shown an example of output symbols of the convolution encoder 513.

TABLE 11

| | | ¼ rate | |
|---|---|---|---|
| Region | ½ rate | SCCC block mode = '00' | SCCC block mode = '01' |
| A, B | (u0, u1) | (u0, u2), (u1, u3) | (u0, u2), (u1, u4) |
| C, D | | (u0, u1), (u3, u4) | |

For example, at the ½-coding rate, 1 output symbol (i.e., u0 and u1 bits) may be selected and outputted. And, at the ¼-coding rate, depending upon the SCCC block mode, 2 output symbols (i.e., 4 bits) may be selected and outputted. For example, when the SCCC block mode value is equal to '01', and when an output symbol configured of u0 and u2 and another output symbol configured of u1 and u4 are selected and outputted, a ¼-rate coding result may be obtained.

The mobile service data encoded at the coding rate of ½ or ¼ by the convolution encoder 513 are outputted to the symbol interleaver 514. The symbol interleaver 514 performs block interleaving, in symbol units, on the output data symbol of the convolution encoder 513. More specifically, the symbol interleaver 514 is a type of block interleaver. Any interleaver performing structural rearrangement (or realignment) may be applied as the symbol interleaver 514 of the block processor. However, in the present invention, a variable length symbol interleaver that can be applied even when a plurality of lengths is provided for the symbol, so that its order may be rearranged, may also be used.

FIG. 26 illustrates a symbol interleaver according to an embodiment of the present invention. Particularly, FIG. 26 illustrates an example of the symbol interleaver when B=2112 and L=4096. Herein, B indicates a block length in symbols that are outputted for symbol interleaving from the convolution encoder 513. And, L represents a block length in symbols that are actually interleaved by the symbol interleaver 514. At this point, the block length in symbols B inputted to the symbol interleaver 514 is equivalent to 4×SOBL. More specifically, since one symbol is configured of 2 bits, the value of B may be set to be equal to 4×SOBL.

In the present invention, when performing the symbol-interleaving process, the conditions of $L=2^m$ (wherein m is an integer) and of $L \geq B$ should be satisfied. If there is a difference in value between B and L, (L−B) number of null (or dummy) symbols is added, thereby creating an interleaving pattern, as shown in P'(i) of FIG. 26. Therefore, B becomes a block size of the actual symbols that are inputted to the symbol interleaver 514 in order to be interleaved. L becomes an interleaving unit when the interleaving process is performed by an interleaving pattern created from the symbol interleaver 514.

Equation 6 shown below describes the process of sequentially receiving B number of symbols, the order of which is to be rearranged, and obtaining an L value satisfying the conditions of $L=2^m$ (wherein m is an integer) and of $L \geq B$, thereby creating the interleaving so as to realign (or rearrange) the symbol order.

In relation to all places, wherein $0 \leq i \leq B-1$, $$P'(i) = \{89 \times i \times (i+1)/2\} \bmod L \qquad \text{Equation 6}$$

Herein, $L \geq B$, $L=2^m$, wherein m is an integer.

As shown in P'(i) of FIG. 26, the order of B number of input symbols and (L−B) number of null symbols is rearranged by using the above-mentioned Equation 6. Then, as shown in P(i) of FIG. 26, the null byte places are removed, so as to rearrange the order. Starting with the lowest value of i, the P(i) are shifted to the left in order to fill the empty entry locations. Thereafter, the symbols of the aligned interleaving pattern P(i) are outputted to the symbol-byte converter 515 in order. Herein, the symbol-byte converter 515 converts to bytes the mobile service data symbols, having the rearranging of the symbol order completed and then outputted in accordance with the rearranged order, and thereafter outputs the converted bytes to the SCCC block-MPH block converter 516. The SCCC block-MPH block converter 516 converts the symbol-interleaved SCCC blocks to MPH blocks, which are then outputted to the group formatter 303.

If the SCCC block mode value is equal to '00', the SCCC block is mapped at a one-to-one (1:1) correspondence with each MPH block within the data group. In another example, if the SCCC block mode value is equal to '01', each SCCC block is mapped with two MPH blocks within the data group. For example, the SCCC block SCB1 is mapped with (B1, B6), the SCCC block SCB2 is mapped with (B2, B7), the SCCC block SCB3 is mapped with (B3, B8), the SCCC block SCB4 is mapped with (B4, B9), and the SCCC block SOBS is mapped with (B5, B10). The MPH block that is outputted from the SCCC block-MPH block converter 516 is configured of mobile service data and FEC redundancy. In the present invention, the mobile service data as well as the FEC redundancy of the MPH block will be collectively considered as mobile service data.

Group Formatter

The group formatter 303 inserts data of MPH blocks outputted from the block processor 302 to the corresponding MPH blocks within the data group, which is formed in accordance with a pre-defined rule. Also, in association with the data-deinterleaving process, the group formatter 303 inserts various place holders (or known data place holders) in the corresponding region within the data group. More specifically, apart from the encoded mobile service data outputted from the block processor 302, the group formatter 303 also inserts MPEG header place holders, non-systematic RS parity place holders, main service data place holders, which are associated with the data deinterleaving in a later process, as shown in FIG. 5.

Herein, the main service data place holders are inserted because the mobile service data bytes and the main service data bytes are alternately mixed with one another in regions B to D based upon the input of the data deinterleaver, as shown in FIG. 5. For example, based upon the data outputted after data deinterleaving, the place holder for the MPEG header may be allocated at the very beginning of each packet. Also, in order to configure an intended group format, dummy bytes may also be inserted. Furthermore, the group formatter 303 inserts place holders for initializing the trellis encoding module 256 in the corresponding regions. For example, the initialization data place holders may be inserted in the beginning of the known data sequence. Additionally, the group formatter 303 may also insert signaling information, which are encoded and outputted from the signaling encoder 304, in corresponding regions within the data group. At this point, reference may be made to the signaling information when the group formatter 303 inserts each data type and respective place holders in the data group. The process of encoding the signaling information and inserting the encoded signaling information to the data group will be described in detail in a later process.

Figure 27:
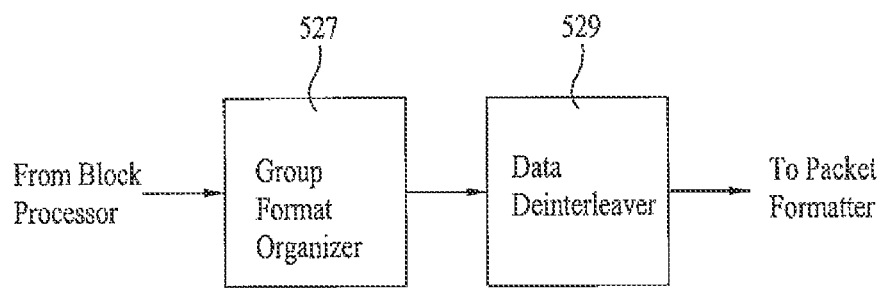
FIG. 27 illustrates a block diagram of a group formatter according to an embodiment of the present invention.

After inserting each data type and respective place holders in the data group, the group formatter 303 may deinterleave the data and respective place holders, which have been inserted in the data group, as an inverse process of the data interleaver, thereby outputting the deinterleaved data and respective place holders to the packet formatter 305. More specifically, when the data and respective place holders within the data group, which is configured (or structured) as shown in FIG. 5, are deinterleaved by the group formatter 303 and outputted to the packet formatter 305, the structure of the data group may be identical to the structure shown in FIG. 7. In order to do so, the group formatter 303 may include a group format organizer 527, and a data deinterleaver 529, as shown in FIG. 27. The group format organizer 527 inserts data and respective place holders in the corresponding regions within the data group, as described above. And, the data deinterleaver 529 deinterleaves the inserted data and respective place holders as an inverse process of the data interleaver.

The packet formatter 305 removes the main service data place holders and the RS parity place holders that were allocated for the deinterleaving process from the deinterleaved data being inputted. Then, the packet formatter 305 groups the remaining portion and inserts the 3-byte MPEG header place holder in an MPEG header having a null packet PID (or an unused PID from the main service data packet). Furthermore, the packet formatter 305 adds a synchronization data byte at the beginning of each 187-byte data packet. Also, when the group formatter 303 inserts known data place holders, the packet formatter 303 may insert actual known data in the known data place holders, or may directly output the known data place holders without any modification in order to make replacement insertion in a later process. Thereafter, the packet formatter 305 identifies the data within the packet-formatted data group, as described above, as a 188-byte unit mobile service data packet (i.e., MPEG TS packet), which is then provided to the packet multiplexer 240.

Based upon the control of the control unit 200, the packet multiplexer 240 multiplexes the data group packet-formatted and outputted from the packet formatter 306 and the main service data packet outputted from the packet jitter mitigator 220. Then, the packet multiplexer 240 outputs the multiplexed data packets to the data randomizer 251 of the post-processor 250. More specifically, the control unit 200 controls the time-multiplexing of the packet multiplexer 240. If the packet multiplexer 240 receives 118 mobile service data packets from the packet formatter 305, 37 mobile service data packets are placed before a place for inserting VSB field synchronization. Then, the remaining 81 mobile service data packets are placed after the place for inserting VSB field synchronization. The multiplexing method may be adjusted by diverse variables of the system design. The multiplexing method and multiplexing rule of the packet multiplexer 240 will be described in more detail in a later process.

Also, since a data group including mobile service data in-between the data bytes of the main service data is multiplexed (or allocated) during the packet multiplexing process, the shifting of the chronological position (or place) of the main service data packet becomes relative. Also, a system object decoder (i.e., MPEG decoder) for processing the main service data of the receiving system, receives and decodes only the main service data and recognizes the mobile service data packet as a null data packet.

Therefore, when the system object decoder of the receiving system receives a main service data packet that is multiplexed with the data group, a packet jitter occurs.

At this point, since a multiple-level buffer for the video data exists in the system object decoder and the size of the buffer is relatively large, the packet jitter generated from the packet multiplexer 240 does not cause any serious problem in case of the video data. However, since the size of the buffer for the audio data in the object decoder is relatively small, the packet jitter may cause considerable problem. More specifically, due to the packet jitter, an overflow or underflow may occur in the buffer for the main service data of the receiving system (e.g., the buffer for the audio data). Therefore, the packet jitter mitigator 220 re-adjusts the relative position of the main service data packet so that the overflow or underflow does not occur in the system object decoder.

In the present invention, examples of repositioning places for the audio data packets within the main service data in order to minimize the influence on the operations of the audio buffer will be described in detail. The packet jitter mitigator 220 repositions the audio data packets in the main service data section so that the audio data packets of the main service data can be as equally and uniformly aligned and positioned as possible. Additionally, when the positions of the main service data packets are relatively re-adjusted, associated program clock reference (PCR) values may also be modified accordingly. The PCR value corresponds to a time reference value for synchronizing the time of the MPEG decoder. Herein, the PCR value is inserted in a specific region of a TS packet and then transmitted.

In the example of the present invention, the packet jitter mitigator 220 also performs the operation of modifying the PCR value. The output of the packet jitter mitigator 220 is inputted to the packet multiplexer 240. As described above, the packet multiplexer 240 multiplexes the main service data packet outputted from the packet jitter mitigator 220 with the mobile service data packet outputted from the pre-processor 230 into a parade in accordance with a pre-determined multiplexing rule. Then, the packet multiplexer 240 outputs the multiplexed data packets to the data randomizer 251 of the post-processor 250.

If the inputted data correspond to the main service data packet, the data randomizer 251 performs the same randomizing process as that of the conventional randomizer. More specifically, the synchronization byte within the main service data packet is deleted. Then, the remaining 187 data bytes are randomized by using a pseudo random byte generated from the data randomizer 251. Thereafter, the randomized data are outputted to the RS encoder/non-systematic RS encoder 252.

On the other hand, if the inputted data correspond to the mobile service data packet, the data randomizer 251 may randomize only a portion of the data packet. For example, if it is assumed that a randomizing process has already been performed in advance on the mobile service data packet by the pre-processor 230, the data randomizer 251 deletes the synchronization byte from the 4-byte MPEG header included in the mobile service data packet and, then, performs the randomizing process only on the remaining 3 data bytes of the MPEG header. Thereafter, the randomized data bytes are outputted to the RS encoder/non-systematic RS encoder 252. More specifically, the randomizing process is not performed on the remaining portion of the mobile service data excluding the MPEG header. In other words, the remaining portion of the mobile service data packet is directly outputted to the RS encoder/non-systematic RS encoder 252 without being randomized. Also, the data randomizer 251 may or may not perform a randomizing process on the known data (or known data place holders) and the initialization data place holders included in the mobile service data packet.

The RS encoder/non-systematic RS encoder 252 performs an RS encoding process on the data being randomized by the data randomizer 251 or on the data bypassing the data randomizer 251, so as to add 20 bytes of RS parity data. Thereafter, the processed data are outputted to the data interleaver 253. Herein, if the inputted data correspond to the main service data packet, the RS encoder/non-systematic RS encoder 252 performs the same systematic RS encoding process as that of the conventional broadcasting system, thereby adding the 20-byte RS parity data at the end of the 187-byte data. Alternatively, if the inputted data correspond to the mobile service data packet, the RS encoder/non-systematic RS encoder 252 performs a non-systematic RS encoding process. At this point, the 20-byte RS parity data obtained from the non-systematic RS encoding process are inserted in a pre-decided parity byte place within the mobile service data packet.

The data interleaver 253 corresponds to a byte unit convolutional interleaver. The output of the data interleaver 253 is inputted to the parity replacer 254 and to the non-systematic RS encoder 255. Meanwhile, a process of initializing a memory within the trellis encoding module 256 is primarily required in order to decide the output data of the trellis encoding module 256, which is located after the parity replacer 254, as the known data pre-defined according to an agreement between the receiving system and the transmitting system. More specifically, the memory of the trellis encoding module 256 should first be initialized before the received known data sequence is trellis-encoded. At this point, the beginning portion of the known data sequence that is received corresponds to the initialization data place holder and not to the actual known data. Herein, the initialization data place holder has been included in the data by the group formatter within the pre-processor 230 in an earlier process. Therefore, the process of generating initialization data and replacing the initialization data place holder of the corresponding memory with the generated initialization data are required to be performed immediately before the inputted known data sequence is trellis-encoded.

Additionally, a value of the trellis memory initialization data is decided and generated based upon a memory status of the trellis encoding module 256. Further, due to the newly replaced initialization data, a process of newly calculating the RS parity and replacing the RS parity, which is outputted from the data interleaver 253, with the newly calculated RS parity is required. Therefore, the non-systematic RS encoder 255 receives the mobile service data packet including the initialization data place holders, which are to be replaced with the actual initialization data, from the data interleaver 253 and also receives the initialization data from the trellis encoding module 256.

Among the inputted mobile service data packet, the initialization data place holders are replaced with the initialization data, and the RS parity data that are added to the mobile service data packet are removed and processed with non-systematic RS encoding. Thereafter, the new RS parity obtained by performing the non-systematic RS encoding process is outputted to the parity replacer 255. Accordingly, the parity replacer 255 selects the output of the data interleaver 253 as the data within the mobile service data packet, and the parity replacer 255 selects the output of the non-systematic RS encoder 255 as the RS parity. The selected data are then outputted to the trellis encoding module 256.

Meanwhile, if the main service data packet is inputted or if the mobile service data packet, which does not include any initialization data place holders that are to be replaced, is inputted, the parity replacer 254 selects the data and RS parity that are outputted from the data interleaver 253. Then, the parity replacer 254 directly outputs the selected data to the trellis encoding module 256 without any modification. The trellis encoding module 256 converts the byte-unit data to symbol units and performs a 12-way interleaving process so as to trellis-encode the received data. Thereafter, the processed data are outputted to the synchronization multiplexer 260.

Figure 28:
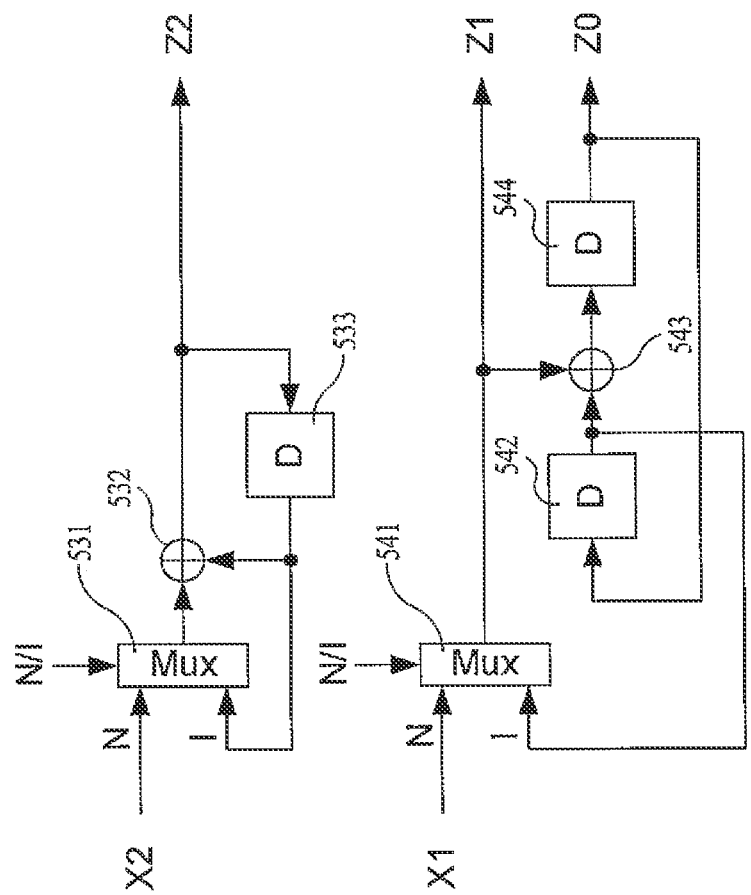
FIG. 28 illustrates a detailed diagram of one of 12 trellis encoders included in the trellis encoding module of FIG. 15.

FIG. 28 illustrates a detailed diagram of one of 12 trellis encoders included in the trellis encoding module 256. Herein, the trellis encoder includes first and second multiplexers 531 and 541, first and second adders 532 and 542, and first to third memories 533, 542, and 544. More specifically, the first to third memories 533, 542, and 544 are initialized by a set of trellis initialization data inserted in an initialization data place holder by the parity replacer 254 and, then, outputted. More specifically, when the first two 2-bit symbols, which are converted from each trellis initialization data byte, are inputted, the input bits of the trellis encoder will be replaced by the memory values of the trellis encoder, as shown in FIG. 28.

Since 2 symbols (i.e., 4 bits) are required for trellis initialization, the last 2 symbols (i.e., 4 bits) from the trellis initialization bytes are not used for trellis initialization and are considered as a symbol from a known data byte and processed accordingly. When the trellis encoder is in the initialization mode, the input comes from an internal trellis status (or state) and not from the parity replacer 254. When the trellis encoder is in the normal mode, the input symbol provided from the parity replacer 254 will be processed. The trellis encoder provides the converted (or modified) input data for trellis initialization to the non-systematic RS encoder 255.

More specifically, when a selection signal designates a normal mode, the first multiplexer 531 selects an upper bit X2 of the input symbol. And, when a selection signal designates an initialization mode, the first multiplexer 531 selects the output of the first memory 533 and outputs the selected output data to the first adder 532. The first adder 532 adds the output of the first multiplexer 531 and the output of the first memory 533, thereby outputting the added result to the first memory 533 and, at the same time, as a most significant (or uppermost) bit Z2. The first memory 533 delays the output data of the first adder 532 by 1 clock, thereby outputting the delayed data to the first multiplexer 531 and the first adder 532.

Meanwhile, when a selection signal designates a normal mode, the second multiplexer 541 selects a lower bit X1 of the input symbol. And, when a selection signal designates an initialization mode, the second multiplexer 541 selects the output of the second memory 542, thereby outputting the selected result to the second adder 543 and, at the same time, as a lower bit Z1. The second adder 543 adds the output of the second multiplexer 541 and the output of the second memory 542, thereby outputting the added result to the third memory 544. The third memory 544 delays the output data of the second adder 543 by 1 clock, thereby outputting the delayed data to the second memory 542 and, at the same time, as a least significant (or lowermost) bit Z0. The second memory 542 delays the output data of the third memory 544 by 1 clock, thereby outputting the delayed data to the second adder 543 and the second multiplexer 541.

The synchronization multiplexer 260 inserts a field synchronization signal and a segment synchronization signal to the data outputted from the trellis encoding module 256 and, then, outputs the processed data to the pilot inserter 271 of the transmission unit 270. Herein, the data having a pilot inserted therein by the pilot inserter 271 are modulated by the modulator 272 in accordance with a pre-determined modulating method (e.g., a VSB method). Thereafter, the modulated data are transmitted to each receiving system though the radio frequency (RF) up-converter 273.

Multiplexing Method of Packet Multiplexer 240

Data of the error correction encoded and 1/H-rate encoded primary RS frame (i.e., when the RS frame mode value is equal to '00') or primary/secondary RS frame (i.e., when the RS frame mode value is equal to '01'), are divided into a plurality of data groups by the group formatter 303. Then, the divided data portions are assigned to at least one of regions A to D of each data group or to an MPH block among the MPH blocks B1 to B10, thereby being deinterleaved. Then, the deinterleaved data group passes through the packet formatter 305, thereby being multiplexed with the main service data by the packet multiplexer 240 based upon a de-decided multiplexing rule. The packet multiplexer 240 multiplexes a plurality of consecutive data groups, so that the data groups are assigned to be spaced as far apart from one another as possible within the sub-frame. For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively.

As described-above, in the assignment of the plurality of consecutive data groups, a plurality of parades are multiplexed and outputted so as to be spaced as far apart from one another as possible within a sub-MPH frame. For example, the method of assigning data groups and the method of assigning parades may be identically applied to all sub-frames for each MPH frame or differently applied to each MPH frame.

FIG. 10 illustrates an example of a plurality of data groups included in a single parade, wherein the number of data groups included in a sub-frame is equal to '3', and wherein the data groups are assigned to an MPH frame by the packet multiplexer 240. Referring to FIG. 10, 3 data groups are sequentially assigned to a sub-frame at a cycle period of 4 slots. Accordingly, when this process is equally performed in the 5 sub-frames included in the corresponding MPH frame, 15 data groups are assigned to a single MPH frame. Herein, the 15 data groups correspond to data groups included in a parade.

When data groups of a parade are assigned as shown in FIG. 10, the packet multiplexer 240 may either assign main service data to each data group, or assign data groups corresponding to different parades between each data group. More specifically, the packet multiplexer 240 may assign data groups corresponding to multiple parades to one MPH frame. Basically, the method of assigning data groups corresponding to multiple parades is very similar to the method of assigning data groups corresponding to a single parade. In other words, the packet multiplexer 240 may assign data groups included in other parades to an MPH frame according to a cycle period of 4 slots. At this point, data groups of a different parade may be sequentially assigned to the respective slots in a circular method. Herein, the data groups are assigned to slots starting from the ones to which data groups of the previous parade have not yet been assigned. For example, when it is assumed that data groups corresponding to a parade are assigned as shown in FIG. 10, data groups corresponding to the next parade may be assigned to a sub-frame starting either from the $12^{th}$ slot of a sub-frame.

FIG. 11 illustrates an example of assigning and transmitting 3 parades (Parade #0, Parade #1, and Parade #2) to an MPH frame. For example, when the $1^{st}$ parade (Parade #0) includes 3 data groups for each sub-frame, the packet multiplexer 240 may obtain the positions of each data groups within the sub-frames by substituting values '0' to '2' for i in Equation 1. More specifically, the data groups of the $1^{st}$ parade (Parade #0) are sequentially assigned to the $1^{st}$, $5^{th}$, and $9^{th}$ slots (Slot #0, Slot #4, and Slot #8) within the sub-frame. Also, when the $2^{nd}$ parade includes 2 data groups for each sub-frame, the packet multiplexer 240 may obtain the positions of each data groups within the sub-frames by substituting values '3' and '4' for i in Equation 1. More specifically, the data groups of the $2^{nd}$ parade (Parade #1) are sequentially assigned to the $2^{nd}$ and $12^{th}$ slots (Slot #3 and Slot #11) within the sub-frame. Finally, when the $3^{rd}$ parade includes 2 data groups for each sub-frame, the packet multiplexer 240 may obtain the positions of each data groups within the sub-frames by substituting values '5' and '6' for i in Equation 1. More specifically, the data groups of the $3^{rd}$ parade (Parade #2) are sequentially assigned and outputted to the $7^{th}$ and $11^{th}$ slots (Slot #6 and Slot #10) within the sub-frame.

As described above, the packet multiplexer 240 may multiplex and output data groups of multiple parades to a single MPH frame, and, in each sub-frame, the multiplexing process of the data groups may be performed serially with a group space of 4 slots from left to right. Therefore, a number of groups of one parade per sub-frame (NOG) may correspond to any one integer from '1' to '8'. Herein, since one MPH frame includes 5 sub-frames, the total number of data groups within a parade that can be allocated to an MPH frame may correspond to any one multiple of '5' ranging from '5' to '40'.

Processing Signaling Information

Figure 29:
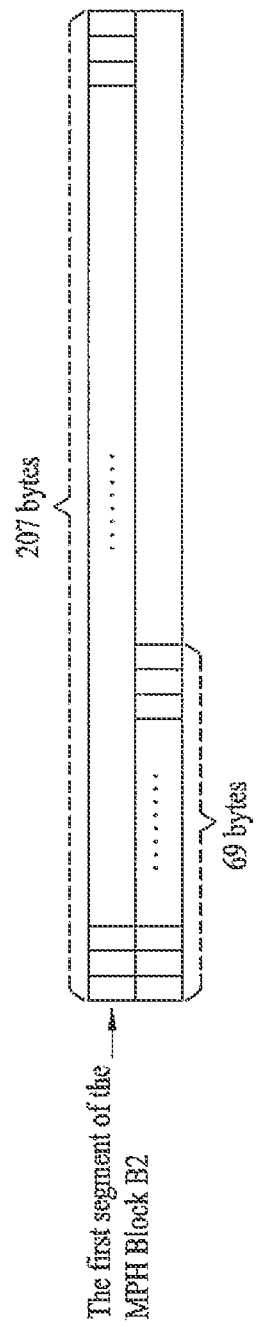
FIG. 29 illustrates an example of assigning signaling information area according to an embodiment of the present invention.

The present invention assigns signaling information areas for inserting signaling information to some areas within each data group. FIG. 29 illustrates an example of assigning signaling information areas for inserting signaling information starting from the $1^{st}$ segment of the $4^{th}$ MPH block (B4) to a portion of the $2^{nd}$ segment. More specifically, 276(=207+69) bytes of the $4^{th}$ MPH block (B4) in each data group are assigned as the signaling information area. In other words, the signaling information area consists of 207 bytes of the $1^{st}$ segment and the first 69 bytes of the $2^{nd}$ segment of the $4^{th}$ MPH block (B4). For example, the $1^{st}$ segment of the $4^{th}$ MPH block (B4) corresponds to the $17^{th}$ or $173^{rd}$ segment of a VSB field. The signaling information that is to be inserted in the signaling information area is FEC-encoded by the signaling encoder 304, thereby inputted to the group formatter 303.

The group formatter 303 inserts the signaling information, which is FEC-encoded and outputted by the signaling encoder 304, in the signaling information area within the data group. Herein, the signaling information may be identified by two different types of signaling channels: a transmission parameter channel (TPC) and a fast information channel (FIC). Herein, the TPC information corresponds to signaling information including transmission parameters, such as RS frame-associated information, SCCC-associated information, and MPH frame-associated information. However, the signaling information presented herein is merely exemplary. And, since the adding or deleting of signaling information included in the TPC may be easily adjusted and modified by one skilled in the art, the present invention will, therefore, not be limited to the examples set forth herein. Furthermore, the FIC is provided to enable a fast service acquisition of data receivers, and the FIC includes cross layer information between the physical layer and the upper layer(s).

Figure 30:
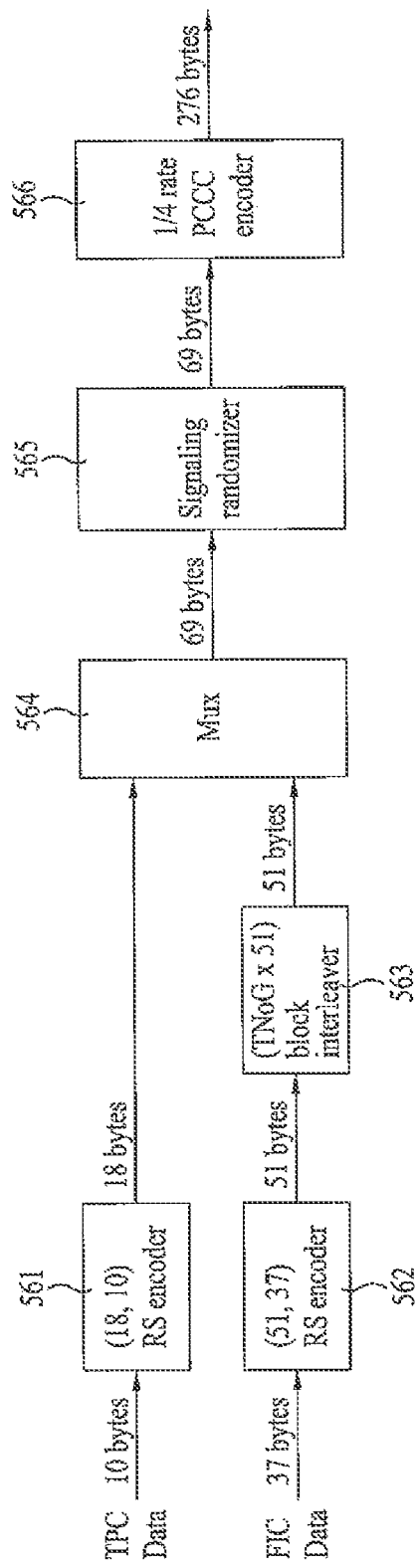
FIG. 30 illustrates a detailed block diagram of a signaling encoder according to the present invention.

FIG. 30 illustrates a detailed block diagram of the signaling encoder 304 according to the present invention. Referring to FIG. 30, the signaling encoder 304 includes a TPC encoder 561, an FIC encoder 562, a block interleaver 563, a multiplexer 564, a signaling randomizer 565, and a PCCC encoder 566. The TPC encoder 561 receives 10-bytes of TPC data and performs (18,10)-RS encoding on the 10-bytes of TPC data, thereby adding 8 bytes of parity data to the 10 bytes of TPC data. The 18 bytes of RS-encoded TPC data are outputted to the multiplexer 564. The FIC encoder 562 receives 37-bytes of FIC data and performs (51,37)-RS encoding on the 37-bytes of FIC data, thereby adding 14 bytes of parity data to the 37 bytes of FIC data. Thereafter, the 51 bytes of RS-encoded FIC data are inputted to the block interleaver 563, thereby being interleaved in predetermined block units.

Herein, the block interleaver 563 corresponds to a variable length block interleaver. The block interleaver 563 interleaves the FIC data within each sub-frame in TNoG(column)×51 (row) block units and then outputs the interleaved data to the multiplexer 564. Herein, the TNoG corresponds to the total number of data groups being assigned to all sub-frames within an MPH frame. The block interleaver 563 is synchronized with the first set of FIC data in each sub-frame. The block interleaver 563 writes 51 bytes of incoming (or inputted) RS codewords in a row direction (i.e., row-by-row) and left-to-right and up-to-down directions and reads 51 bytes of RS codewords in a column direction (i.e., column-by-column) and left-to-right and up-to-down directions, thereby outputting the RS codewords.

The multiplexer 564 multiplexes the RS-encoded TPC data from the TPC encoder 561 and the block-interleaved FIC data from the block interleaver 563 along a time axis. Then, the multiplexer 564 outputs 69 bytes of the multiplexed data to the signaling randomizer 565. The signaling randomizer 565 randomizes the multiplexed data and outputs the randomized data to the PCCC encoder 566. The signaling randomizer 565 may use the same generator polynomial of the randomizer used for mobile service data. Also, initialization occurs in each data group. The PCCC encoder 566 corresponds to an inner encoder performing PCCC-encoding on the randomized data (i.e., signaling information data). The PCCC encoder 566 may include 6 even component encoders and 6 odd component encoders.

FIG. 31 illustrates an example of a syntax structure of TPC data being inputted to the TPC encoder 561. The TPC data are inserted in the signaling information area of each data group and then transmitted. The TPC data may include a sub-frame_number field, a slot_number field, a parade_id field, a starting_group_number (SGN) field, a number_of_groups (NoG) field, a parade_repetition_cycle (PRC) field, an RS_frame_mode field, an RS_code_mode_primary field, an RS_code_mode_secondary field, an SCCC_block_mode field, an SCCC_outer_code_mode_A field, an SCCC_outer_code_mode_B field, an SCCC_outer_code_mode_C field, an SCCC_outer_code_mode_D field, an FIC_version field, a parade_continuity_counter field, and a TNoG field.

The Sub-Frame_number field corresponds to the current Sub-Frame number within the MPH frame, which is transmitted for MPH frame synchronization. The value of the Sub-Frame_number field may range from 0 to 4. The Slot_number field indicates the current slot number within the sub-frame, which is transmitted for MPH frame synchronization. Also, the value of the Sub-Frame_number field may range from 0 to 15. The Parade_id field identifies the parade to which this group belongs. The value of this field may be any 7-bit value. Each parade in a MPH transmission shall have a unique Parade_id field.

Communication of the Parade_id between the physical layer and the management layer may be performed by means of an Ensemble_id field formed by adding one bit to the left of the Parade_id field. If the Ensemble_id field is used for the primary Ensemble delivered through this parade, the added MSB shall be equal to '0'. Otherwise, if the Ensemble_id field is used for the secondary ensemble, the added MSB shall be equal to '1'. Assignment of the Parade_id field values may occur at a convenient level of the system, usually in the management layer. The starting_group_number (SGN) field shall be the first Slot_number for a parade to which this group belongs, as determined by Equation 1 (i.e., after the Slot numbers for all preceding parades have been calculated). The SGN and NoG shall be used according to Equation 1 to obtain the slot numbers to be allocated to a parade within the sub-frame.

The number_of_Groups (NoG) field shall be the number of groups in a sub-frame assigned to the parade to which this group belongs, minus 1, e.g., NoG=0 implies that one group is allocated (or assigned) to this parade in a sub-frame. The value of NoG may range from 0 to 7. This limits the amount of data that a parade may take from the main (legacy) service data, and consequently the maximum data that can be carried by one parade. The slot numbers assigned to the corresponding Parade can be calculated from SGN and NoG, using Equation 1. By taking each parade in sequence, the specific slots for each parade will be determined, and consequently the SGN for each succeeding parade. For example, if for a specific parade SGN=3 and NoG=3 (010b for 3-bit field of NoG), substituting i=3, 4, and 5 in Equation 1 provides slot numbers 12, 2, and 6. The Parade_repetition_cycle (PRC) field corresponds to the cycle time over which the parade is transmitted, minus 1, specified in units of MPH frames, as described in Table 12.

TABLE 12

| PRC | Description |
| --- | --- |
| 000 | This parade shall be transmitted once every MPH frame. |
| 001 | This parade shall be transmitted once every 2 MPH frames. |
| 010 | This parade shall be transmitted once every 3 MPH frames. |
| 011 | This parade shall be transmitted once every 4 MPH frames. |
| 100 | This parade shall be transmitted once every 5 MPH frames. |
| 101 | This parade shall be transmitted once every 6 MPH frames. |
| 110 | This parade shall be transmitted once every 7 MPH frames. |
| 111 | Reserved |

The RS_Frame_mode field shall be as defined in Table 1. The RS_code_mode_primary field shall be the RS code mode for the primary RS frame. Herein, the RS code mode is defined in Table 6. The RS_code_mode_secondary field shall be the RS code mode for the secondary RS frame. Herein, the RS code mode is defined in Table 6. The SCCC_Block_mode field shall be as defined in Table 7. The SCCC_outer_code_mode_A field corresponds to the SCCC outer code mode for Region A. The SCCC outer code mode is defined in Table 8. The SCCC_outer_code_mode_B field corresponds to the SCCC outer code mode for Region B. The SCCC_outer_code_mode_C field corresponds be the SCCC outer code mode for Region C. And, the SCCC_outer_code_mode_D field corresponds to the SCCC outer code mode for Region D.

The FIC_version field may be supplied by the management layer (which also supplies the FIC data). The Parade_continuity_counter field counter may increase from 0 to 15 and then repeat its cycle. This counter shall increment by 1 every (PRC+1) MPH frames. For example, as shown in Table 12, PRC=011 (decimal 3) implies that Parade_continuity_counter increases every fourth MPH frame. The TNoG field may be identical for all sub-frames in an MPH Frame. However, the information included in the TPC data presented herein is merely exemplary. And, since the adding or deleting of information included in the TPC may be easily adjusted and modified by one skilled in the art, the present invention will, therefore, not be limited to the examples set forth herein.

Since the TPC parameters (excluding the Sub-Frame_number field and the Slot_number field) for each parade do not change their values during an MPH frame, the same information is repeatedly transmitted through all MPH groups belonging to the corresponding parade during an MPH frame. This allows very robust and reliable reception of the TPC data. Because the Sub-Frame_number and the Slot_number are increasing counter values, they also are robust due to the transmission of regularly expected values.

Furthermore, the FIC information is provided to enable a fast service acquisition of data receivers, and the FIC information includes cross layer information between the physical layer and the upper layer(s).

FIG. 32 illustrates an example of a transmission scenario of the TPC data and the FIC data. The values of the Sub-Frame_number field, Slot_number field, Parade_id field, Parade_repetition_cycle field, and Parade_continuity_counter field may corresponds to the current MPH frame throughout the 5 sub-frames within a specific MPH frame. Some of TPC parameters and FIC data are signaled in advance. The SGN, NoG and all FEC modes may have values corresponding to the current MPH frame in the first two sub-frames. The SGN, NoG and all FEC modes may have values corresponding to the frame in which the parade next appears throughout the $3^{rd}$, $4^{th}$ and $5^{th}$ sub-frames of the current MPH frame. This enables the MPH receivers to receive (or acquire) the transmission parameters in advance very reliably.

For example, when Parade_repetition_cycle='000', the values of the $3^{rd}$, $4^{th}$, and $5^{th}$ sub-frames of the current MPH frame correspond to the next MPH frame. Also, when Parade_repetition_cycle='011', the values of the $3^{rd}$, $4^{th}$, and $5^{th}$ sub-frames of the current MPH frame correspond to the $4^{th}$ MPH frame and beyond. The FIC_version field and the FIC_data field may have values that apply to the current MPH Frame during the $1^{st}$ sub-frame and the $2^{nd}$ sub-frame, and they shall have values corresponding to the MPH frame immediately following the current MPH frame during the $3^{rd}$, $4^{th}$, and $5^{th}$ sub-frames of the current MPH frame.

Figure 33:
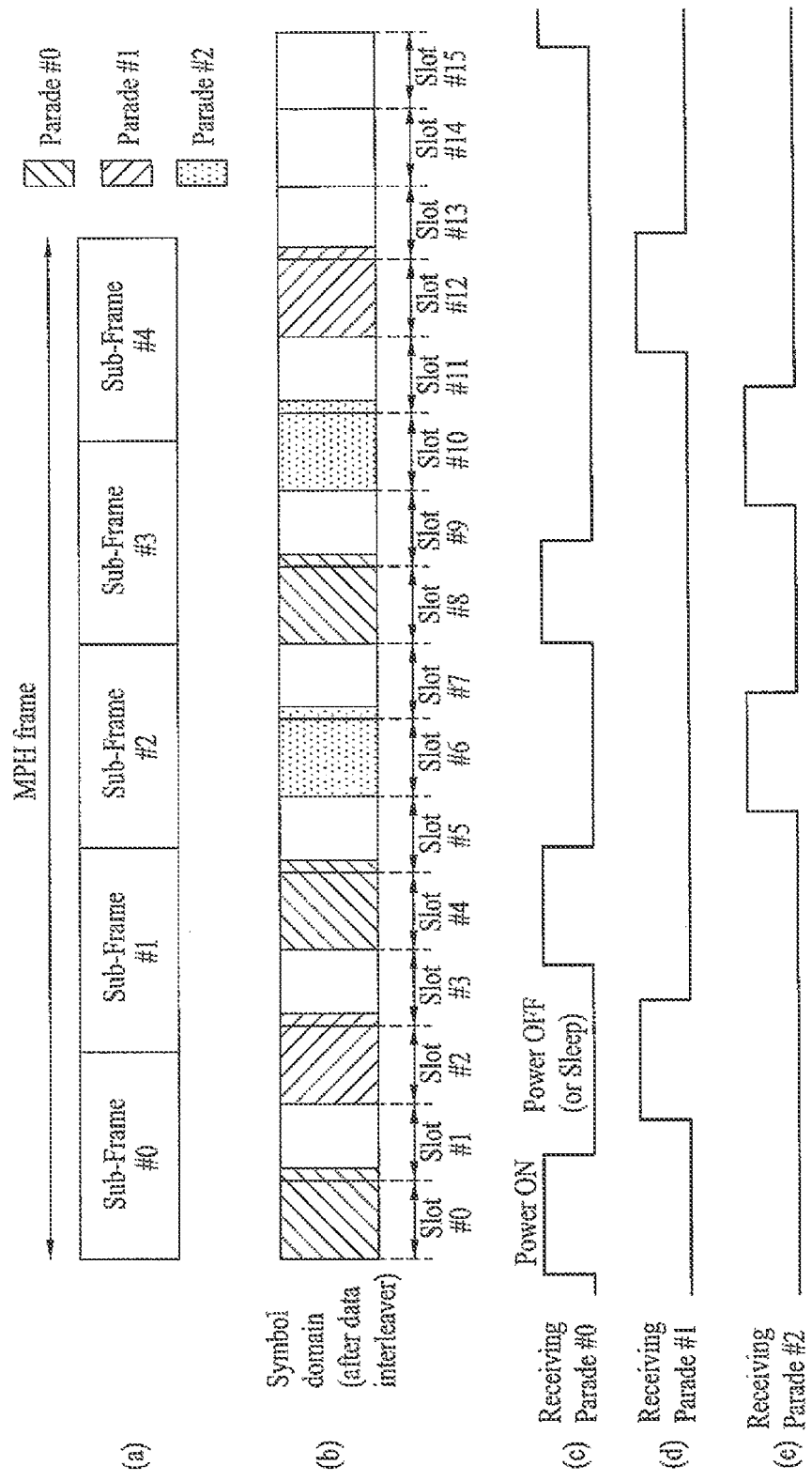
FIG. 33(a) to FIG. 33(e) illustrate an example of a transmission scenario of the TPC data and the FIC data level according to the present invention.

Meanwhile, the receiving system may turn the power on only during a slot to which the data group of the designated (or desired) parade is assigned, and the receiving system may turn the power off during the remaining slots, thereby reducing power consumption of the receiving system. Such characteristic is particularly useful in portable or mobile receivers, which require low power consumption. For example, it is assumed that data groups of a $1^{st}$ parade with NOG=3, a $2^{nd}$ parade with NOG=2, and a $3^{rd}$ parade with NOG=3 are assigned to one MPH frame, as shown in FIG. 33. It is also assumed that the user has selected a mobile service included in the $1^{st}$ parade using the keypad provided on the remote controller or terminal. In this case, the receiving system turns the power on only during a slot that data groups of the $1^{st}$ parade is assigned, as shown in FIG. 33, and turns the power off during the remaining slots, thereby reducing power consumption, as described above. At this point, the power is required to be turned on briefly earlier than the slot to which the actual designated data group is assigned (or allocated). This is to enable the tuner or demodulator to converge in advance.

Assignment of Known Data (or Training Signal)

Figure 34:
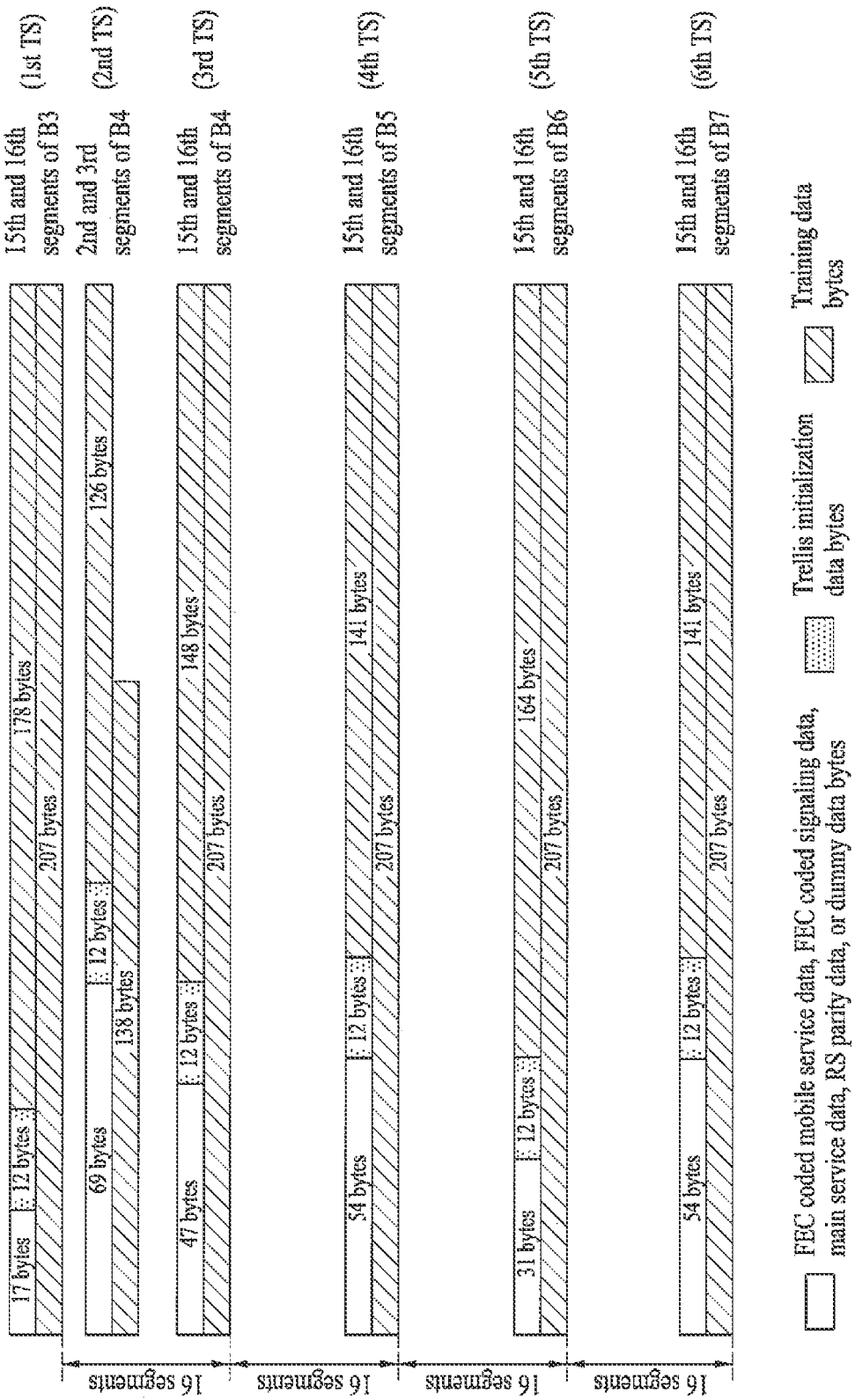
FIG. 34 illustrates an example of a training sequence at the byte level according to the present invention.

In addition to the payload data, the MPH transmission system inserts long and regularly spaced training sequences into each group. The regularity is an especially useful feature since it provides the greatest possible benefit for a given number of training symbols in high-Doppler rate conditions. The length of the training sequences is also chosen to allow fast acquisition of the channel during bursted power-saving operation of the demodulator. Each group contains 6 training sequences. The training sequences are specified before trellis-encoding. The training sequences are then trellis-encoded and these trellis-encoded sequences also are known sequences. This is because the trellis encoder memories are initialized to pre-determined values at the beginning of each sequence. The form of the 6 training sequences at the byte level (before trellis-encoding) is shown in FIG. 34. This is the arrangement of the training sequence at the group formatter 303.

The $1^{st}$ training sequence is located at the last 2 segments of the $3^{rd}$ MPH block (B3). The $2^{nd}$ training sequence may be inserted at the $2^{nd}$ and $3^{rd}$ segments of the $4^{th}$ MPH block (B4). The $2^{nd}$ training sequence is next to the signaling area, as shown in FIG. 5. Then, the $3^{rd}$ training sequence, the $4^{th}$ training sequence, the $5^{th}$ training sequence, and the $6^{th}$ training sequence may be placed at the last 2 segments of the $4^{th}$, $5^{th}$, $6^{th}$, and $7^{th}$ MPH blocks (B4, B5, B6, and B7), respectively. As shown in FIG. 34, the $1^{st}$ training sequence, the $3^{rd}$ training sequence, the $4^{th}$ training sequence, the $5^{th}$ training sequence, and the $6^{th}$ training sequence are spaced 16 segments apart from one another. Referring to FIG. 34, the dotted area indicates trellis initialization data bytes, the lined area indicates training data bytes, and the white area includes other bytes such as the FEC-coded MPH service data bytes, FEC-coded signaling data, main service data bytes, RS parity data bytes (for backwards compatibility with legacy ATSC receivers) and/or dummy data bytes.

Figure 35:
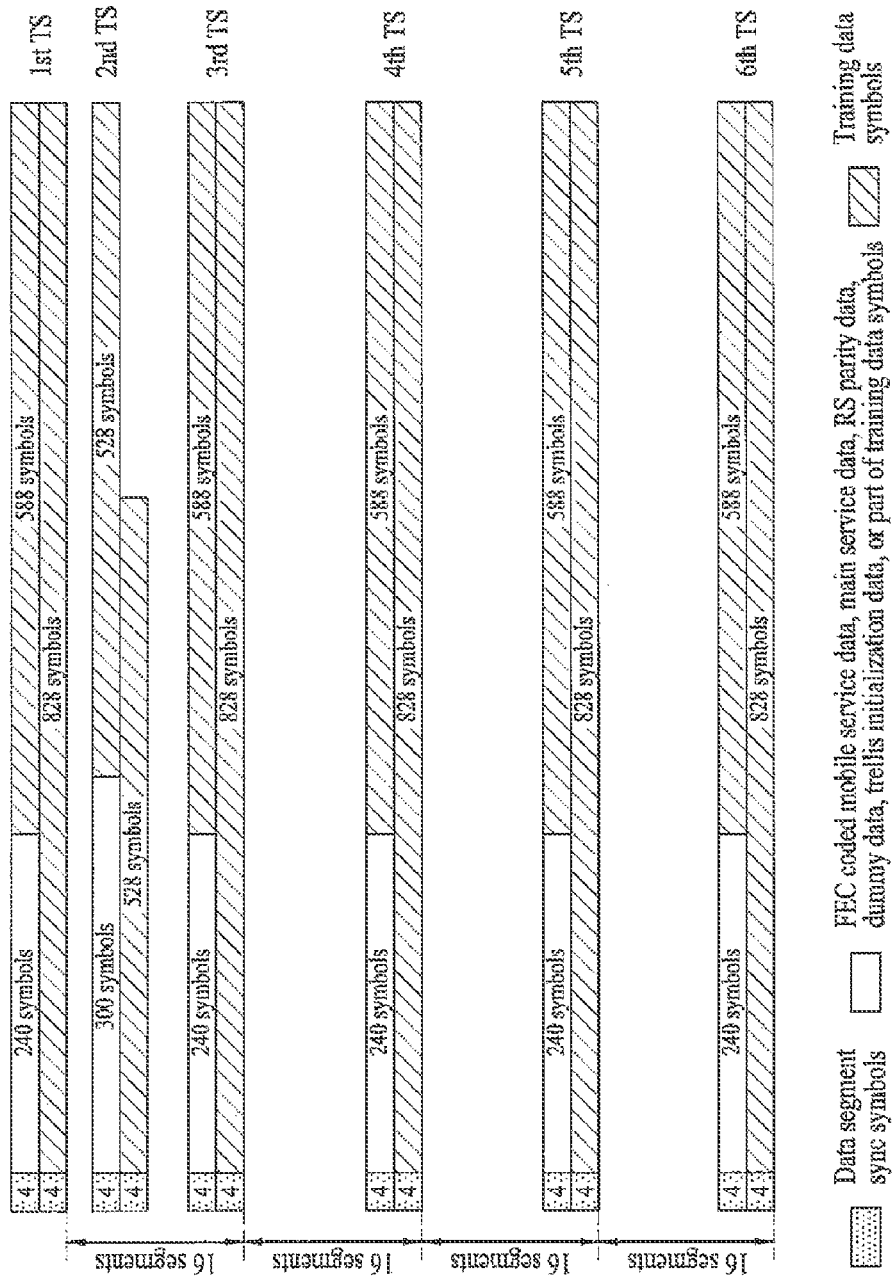
FIG. 35 illustrates an example of a training sequence at the symbol according to the present invention.

FIG. 35 illustrates the training sequences (at the symbol level) after trellis-encoding by the trellis encoder. Referring to FIG. 35, the dotted area indicates data segment sync symbols, the lined area indicates training data symbols, and the white area includes other symbols, such as FEC-coded mobile service data symbols, FEC-coded signaling data, main service data symbols, RS parity data symbols (for backwards compatibility with legacy ATSC receivers), dummy data symbols, trellis initialization data symbols, and/or the first part of the training sequence data symbols. Due to the intra-segment interleaving of the trellis encoder, various types of data symbols will be mixed in the white area.

After the trellis-encoding process, the last 1416 (=588+828) symbols of the $1^{st}$ training sequence, the $3^{rd}$ training sequence, the $4^{th}$ training sequence, the $5^{th}$ training sequence, and the $6^{th}$ training sequence commonly share the same data pattern. Including the data segment synchronization symbols in the middle of and after each sequence, the total length of each common training pattern is 1424 symbols. The $2^{nd}$ training sequence has a first 528-symbol sequence and a second 528-symbol sequence that have the same data pattern. More specifically, the 528-symbol sequence is repeated after the 4-symbol data segment synchronization signal. At the end of each training sequence, the memory contents of the twelve modified trellis encoders shall be set to zero (0).

Demodulating Unit within Receiving System

Figure 36:
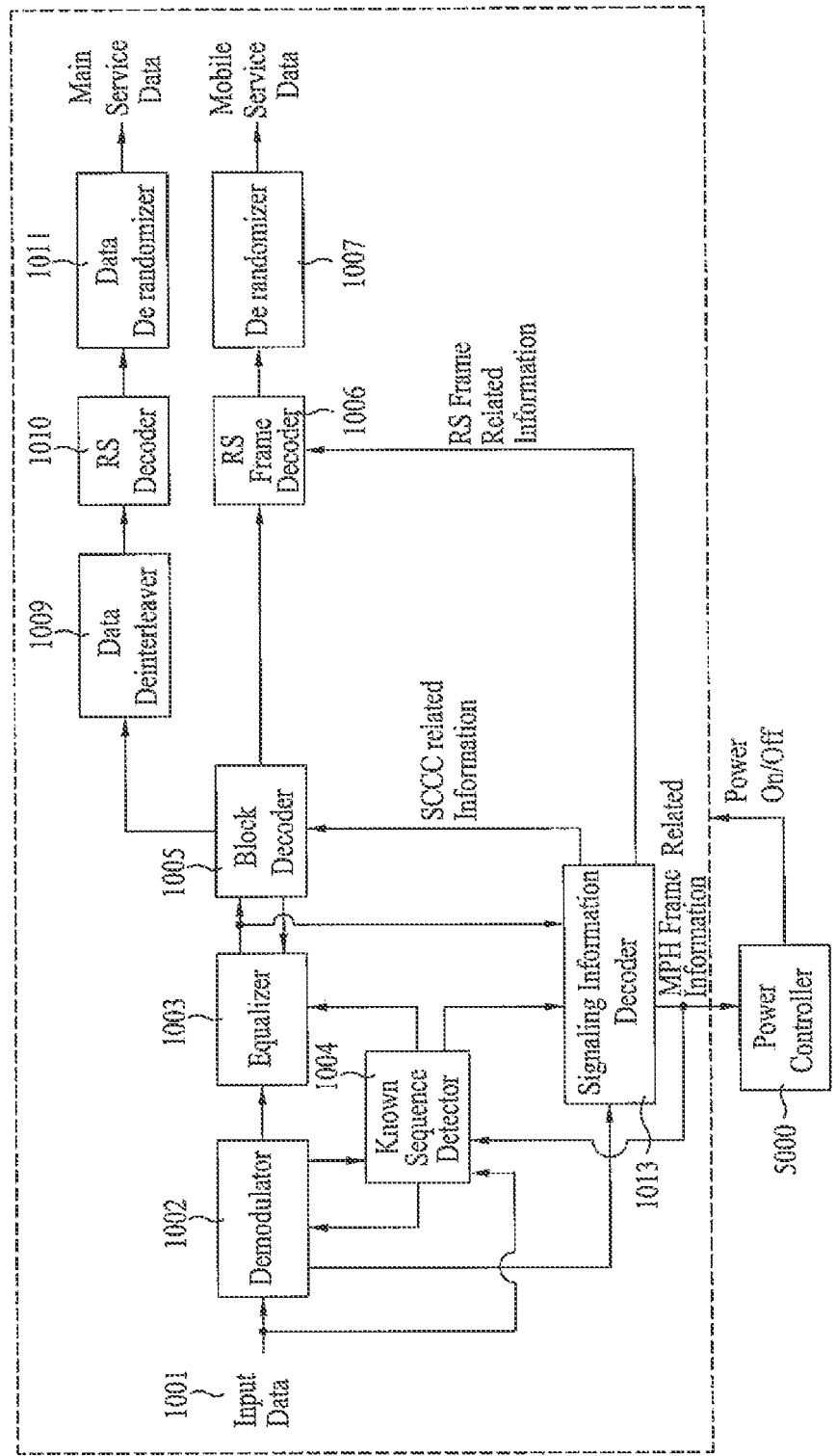
FIG. 36 illustrates a block diagram of a demodulating unit in a receiving system according to the present invention.

FIG. 36 illustrates an example of a demodulating unit in a digital broadcast receiving system according to the present invention. The demodulating unit of FIG. 36 uses known data information, which is inserted in the mobile service data section and, then, transmitted by the transmitting system, so as to perform carrier synchronization recovery, frame synchronization recovery, and channel equalization, thereby enhancing the receiving performance. Also the demodulating unit may turn the power on only during a slot to which the data group of the designated (or desired) parade is assigned, thereby reducing power consumption of the receiving system.

Referring to FIG. 36, the demodulating unit includes a demodulator 1002, an equalizer 1003, a known sequence detector 1004, a block decoder 1005, a RS frame decoder 1006, a derandomizer 1007. The demodulating unit may further include a data deinterleaver 1009, a RS decoder 1010, and a data derandomizer 1011. The demodulating unit may further include a signaling information decoder 1013. The receiving system also may further include a power controller 5000 for controlling power supply of the demodulating unit.

Herein, for simplicity of the description of the present invention, the RS frame decoder 1006, and the derandomizer 1007 will be collectively referred to as a mobile service data processing unit. And, the data deinterleaver 1009, the RS decoder 1010, and the data derandomizer 1011 will be collectively referred to as a main service data processing unit. More specifically, a frequency of a particular channel tuned by a tuner down converts to an intermediate frequency (IF) signal. Then, the down-converted data 1001 outputs the down-converted IF signal to the demodulator 1002 and the known sequence detector 1004. At this point, the down-converted data 1001 is inputted to the demodulator 1002 and the known sequence detector 1004 via analog/digital converter ADC (not shown). The ADC converts pass-band analog IF signal into pass-band digital IF signal.

The demodulator 1002 performs self gain control, carrier recovery, and timing recovery processes on the inputted pass-band digital IF signal, thereby modifying the IF signal to a base-band signal. Then, the demodulator 1002 outputs the newly created base-band signal to the equalizer 1003 and the known sequence detector 1004. The equalizer 1003 compensates the distortion of the channel included in the demodulated signal and then outputs the error-compensated signal to the block decoder 1005.

At this point, the known sequence detector 1004 detects the known sequence place inserted by the transmitting end from the input/output data of the demodulator 1002 (i.e., the data prior to the demodulation process or the data after the demodulation process). Thereafter, the place information along with the symbol sequence of the known data, which are generated from the detected place, is outputted to the demodulator 1002 and the equalizer 1003. Also, the known data detector 1004 outputs a set of information to the block decoder 1005. This set of information is used to allow the block decoder 1005 of the receiving system to identify the mobile service data that are processed with additional encoding from the transmitting system and the main service data that are not processed with additional encoding. In addition, although the connection status is not shown in FIG. 36, the information detected from the known data detector 1004 may be used throughout the entire receiving system and may also be used in the RS frame decoder 1006.

The demodulator 1002 uses the known data symbol sequence during the timing and/or carrier recovery, thereby enhancing the demodulating performance. Similarly, the equalizer 1003 uses the known data so as to enhance the equalizing performance. Moreover, the decoding result of the block decoder 1005 may be fed-back to the equalizer 1003, thereby enhancing the equalizing performance.

Power On/Off Control

The data demodulated in the demodulator 1002 or the data equalized in the channel equalizer 1003 is inputted to the signaling information decoder 1013. The known data information detected in the known sequence detector 1004 is inputted to the signaling information decoder 1013.

The signaling information decoder 1013 extracts and decodes signaling information from the inputted data, the decoded signaling information provides to blocks requiring the signaling information. For example, the SCCC-associated information may output to the block decoder 1005, and the RS frame-associated information may output to the RS frame decoder 1006. The MPH frame-associated information may output to the known sequence detector 1004 and the power controller 5000.

Herein, the RS frame-associated information may include RS frame mode information and RS code mode information. The SCCC-associated information may include SCCC block mode information and SCCC outer code mode information. The MPH frame-associated information may include sub-frame count information, slot count information, parade_id information, SGN information, NoG information, and so on, as shown in FIG. 32.

More specifically, the signaling information between first known data area and second known data area can know by using known data information being outputted in the known sequence detector 1004. Therefore, the signaling information decoder 1013 may extract and decode signaling information from the data being outputted in the demodulator 1002 or the channel equalizer 1003.

The power controller 5000 is inputted the MPH frame-associated information from the signaling information decoder 1013, and controls power of the tuner and the demodulating unit.

According to the embodiment of the present invention, the power controller 5000 turns the power on only during a slot to which a slot of the parade including user-selected mobile service is assigned. The power controller 5000 then turns the power off during the remaining slots.

For example, it is assumed that data groups of a $1^{st}$ parade with NOG=3, a $2^{nd}$ parade with NOG=2, and a $3^{rd}$ parade with NOG=3 are assigned to one MPH frame, as shown in FIG. 33. It is also assumed that the user has selected a mobile service included in the $1^{st}$ parade using the keypad provided on the remote controller or terminal. In this case, the power controller 5000 turns the power on only during a slot that data groups of the $1^{st}$ parade is assigned, as shown in FIG. 33, and turns the power off during the remaining slots, thereby reducing power consumption.

Demodulator and Known Sequence Detector

At this point, the transmitting system may receive a data frame (or VSB frame) including a data group which known data sequence (or training sequence) is periodically inserted therein. Herein, the data group is divided into regions A to D, as shown in FIG. 5. More specifically, in the example of the present invention, each region A, B, C, and D are further divided into MPH blocks B4 to B7, MPH blocks B3 and B8, MPH blocks B2 and B9, MPH blocks B1 and B10, respectively.

Figure 37:
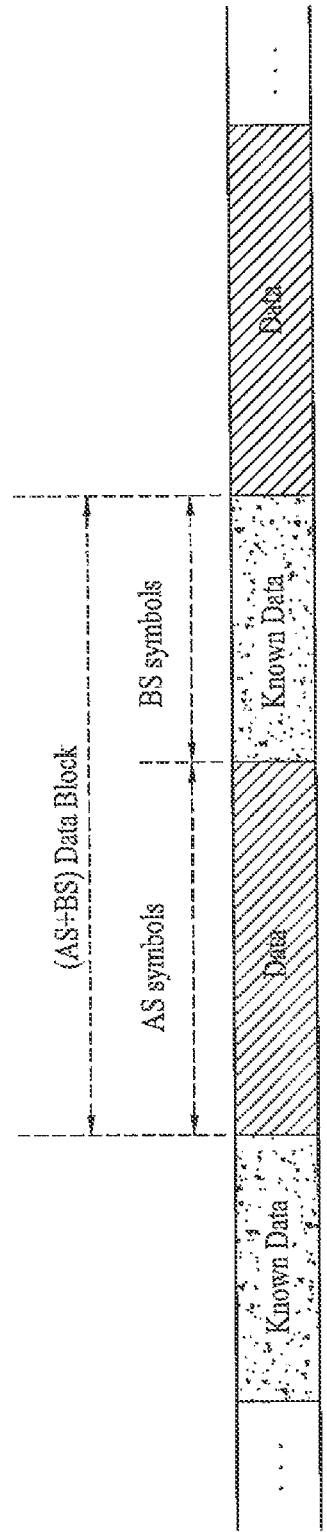
FIG. 37 illustrates a data structure showing an example of known data being periodically inserted in valid data according to the present invention.

FIG. 37 illustrates an example of known data sequence being periodically inserted and transmitted in-between actual data by the transmitting system. Referring to FIG. 37, AS represents the number of valid data symbols, and BS represents the number of known data symbols. Therefore, BS number of known data symbols are inserted and transmitted at a period of (AS+BS) symbols. Herein, AS may correspond to mobile service data, main service data, or a combination of mobile service data and main service data. In order to be differentiated from the known data, data corresponding to AS will hereinafter be referred to as valid data.

Referring to FIG. 37, known data sequence having the same pattern are included in each known data section that is being periodically inserted. Herein, the length of the known data sequence having identical data patterns may be either equal to or different from the length of the entire (or total) known data sequence of the corresponding known data section (or block). If the two lengths are different from one another, the length of the entire known data sequence should be longer than the length of the known data sequence having identical data patterns. In this case, the same known data sequences are included in the entire known data sequence. The known sequence detector 1004 detects the position of the known data being periodically inserted and transmitted as described above. At the same time, the known sequence detector 1004 may also estimate initial frequency offset during the process of detecting known data. In this case, the demodulator 1002 may estimate with more accuracy carrier frequency offset from the information on the known data position (or known sequence position indicator) and initial frequency offset estimation value, thereby compensating the estimated initial frequency offset.

Figure 38:
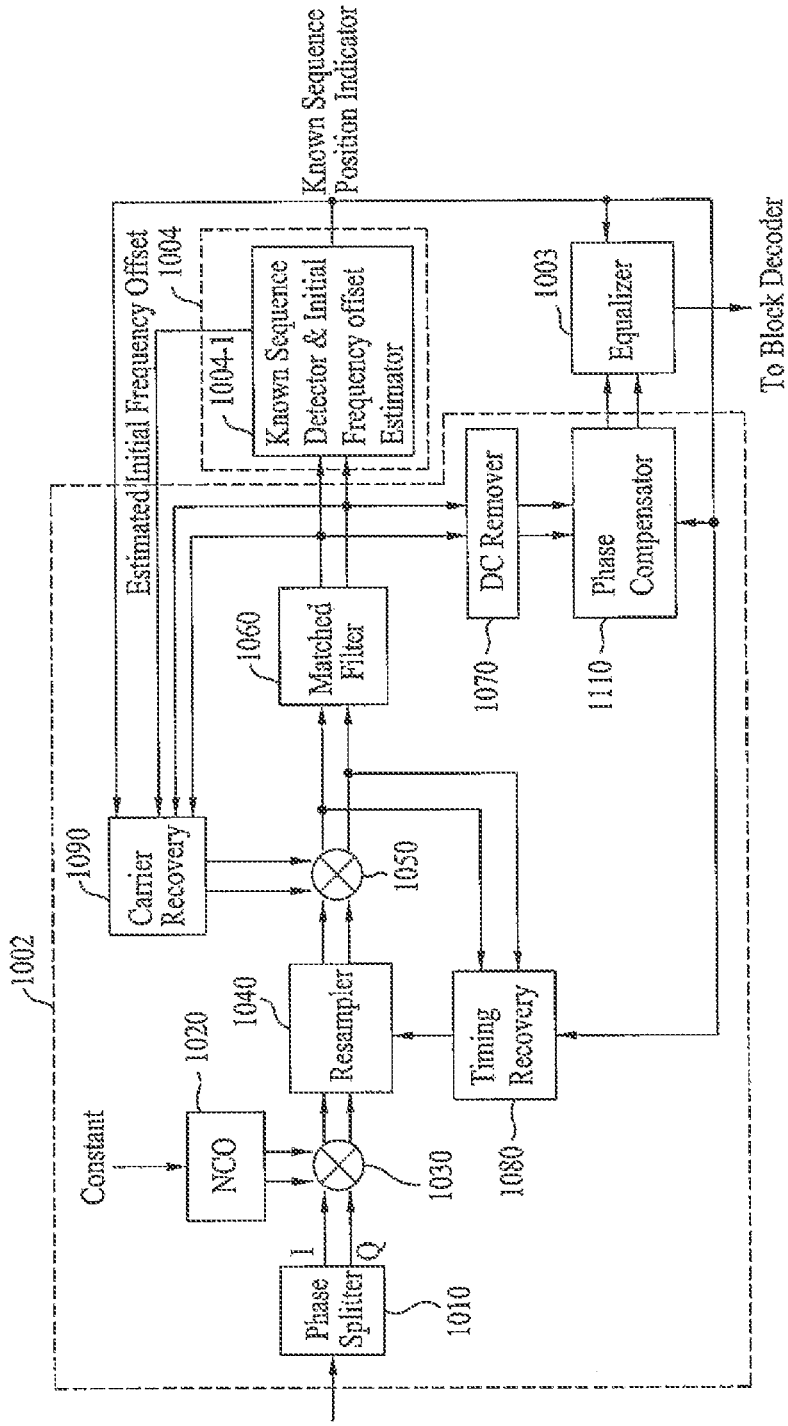
FIG. 38 illustrates a block diagram showing a structure of a demodulator of the demodulating unit shown in FIG. 36.

FIG. 38 illustrates a detailed block diagram of a demodulator according to the present invention. Referring to FIG. 38, the demodulator includes a phase splitter 1010, a numerically controlled oscillator (NCO) 1020, a first multiplier 1030, a resampler 1040, a second multiplier 1050, a matched filter 1060, a DC remover 1070, a timing recovery unit 1080, a carrier recovery unit 1090, and a phase compensator 1110. Herein, the known sequence detector 1004 includes a known sequence detector and initial frequency offset estimator 1004-1 for estimating known data information and initial frequency offset. Also referring to FIG. 38, the phase splitter 1010 receives a pass band digital signal and splits the received signal into a pass band digital signal of a real number element and a pass band digital signal of an imaginary number element both having a phase of 90 degrees between one another. In other words, the pass band digital signal is split into complex signals. The split portions of the pass band digital signal are then outputted to the first multiplier 1030. Herein, the real number signal outputted from the phase splitter 1010 will be referred to as an 'I' signal, and the imaginary number signal outputted from the phase splitter 1010 will be referred to as a 'Q' signal, for simplicity of the description of the present invention.

The first multiplier 1030 multiplies the I and Q pass band digital signals, which are outputted from the phase splitter 1010, to a complex signal having a frequency proportional to a constant being outputted from the NCO 1020, thereby changing the I and Q pass band digital signals to baseband digital complex signals. Then, the baseband digital signals of the first multiplier 1030 are inputted to the resampler 1040. The resampler 1040 resamples the signals being outputted from the first multiplier 1030 so that the signal corresponds to the timing clock provided by the timing recovery unit 1080. Thereafter, the resampler 1040 outputs the resampled signals to the second multiplier 1050.

For example, when the analog/digital converter uses a 25 MHz fixed oscillator, the baseband digital signal having a frequency of 25 MHz, which is created by passing through the analog/digital converter, the phase splitter 1010, and the first multiplier 1030, is processed with an interpolation process by the resampler 1040. Thus, the interpolated signal is recovered to a baseband digital signal having a frequency twice that of the receiving signal of a symbol clock (i.e., a frequency of 21.524476 MHz). Alternatively, if the analog/digital converter uses the timing clock of the timing recovery unit 1080 as the sampling frequency (i.e., if the analog/digital converter uses a variable frequency) in order to perform an A/D conversion process, the resampler 1040 is not required and may be omitted.

The second multiplier 1050 multiplies an output frequency of the carrier recovery unit 1090 with the output of the resampler 1040 so as to compensate any remaining carrier included in the output signal of the resampler 1040. Thereafter, the compensated carrier is outputted to the matched filter 1060 and the timing recovery unit 1080. The signal matched-filtered by the matched filter 1060 is inputted to the DC remover 1070, the known sequence detector and initial frequency offset estimator 1004-1, and the carrier recovery unit 1090.

The known sequence detector and initial frequency offset estimator 1004-1 detects the place (or position) of the known data sequences that are being periodically or non-periodically transmitted. Simultaneously, the known sequence detector and initial frequency offset estimator 1004-1 estimates an initial frequency offset during the known sequence detection process. More specifically, while the transmission data frame is being received, as shown in FIG. 5, the known sequence detector and initial frequency offset estimator 1004-1 detects the position (or place) of the known data included in the transmission data frame. Then, the known sequence detector and initial frequency offset estimator 1004-1 outputs the detected information on the known data place (i.e., a known sequence position indicator) to the timing recovery unit 1080, the carrier recovery unit 1090, and the phase compensator 1110 of the demodulator 1002 and the equalizer 1003. Furthermore, the known sequence detector and initial frequency offset estimator 1004-1 estimates the initial frequency offset, which is then outputted to the carrier recovery unit 1090. At this point, the known sequence detector and initial frequency offset estimator 1004-1 may either receive the output of the matched filter 1060 or receive the output of the resampler 1040. This may be optionally decided depending upon the design of the system designer.

The timing recovery unit 1080 uses the output of the second multiplier 1050 and the known sequence position indicator detected from the known sequence detector and initial frequency offset estimator 1004-1, so as to detect the timing error and, then, to output a sampling clock being in proportion with the detected timing error to the resampler 1040, thereby adjusting the sampling timing of the resampler 1040. At this point, the timing recovery unit 1080 may receive the output of the matched filter 1060 instead of the output of the second multiplier 1050. This may also be optionally decided depending upon the design of the system designer.

Meanwhile, the DC remover 1070 removes a pilot tone signal (i.e., DC signal), which has been inserted by the transmitting system, from the matched-filtered signal. Thereafter, the DC remover 1070 outputs the processed signal to the phase compensator 1110. The phase compensator 1110 uses the data having the DC removed by the DC remover 1070 and the known sequence position indicator detected by the known sequence detector and initial frequency offset estimator 1004-1 to estimate the frequency offset and, then, to compensate the phase change included in the output of the DC remover 1070. The data having its phase change compensated are inputted to the equalizer 1003. Herein, the phase compensator 1110 is optional. If the phase compensator 1110 is not provided, then the output of the DC remover 1070 is inputted to the equalizer 1003 instead.

Figure 39:
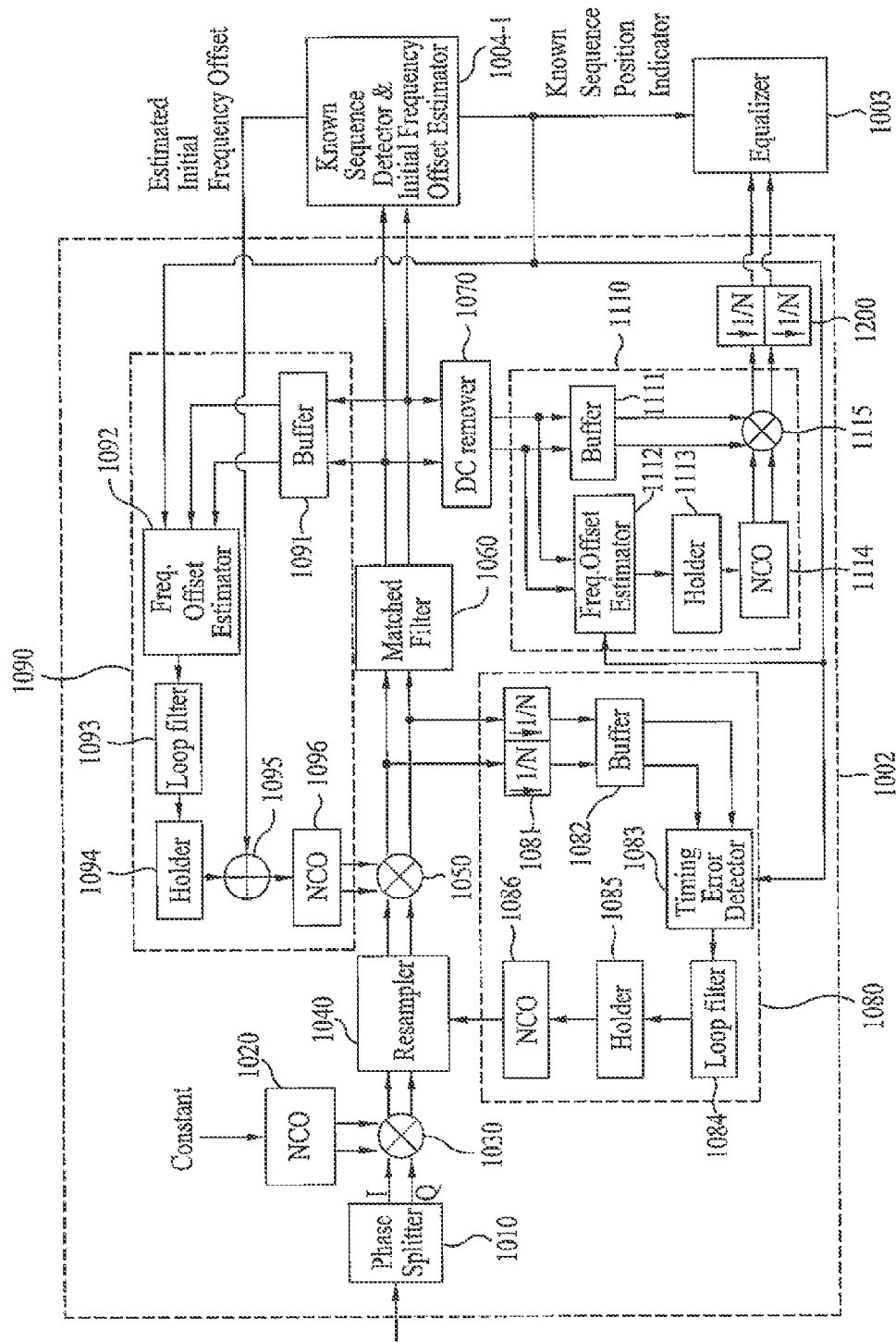
FIG. 39 illustrates a detailed block diagram of the demodulator shown in FIG. 38.

FIG. 39 includes detailed block diagrams of the timing recovery unit 1080, the carrier recovery unit 1090, and the phase compensator 1110 of the demodulator. According to an embodiment of the present invention, the carrier recovery unit 1090 includes a buffer 1091, a frequency offset estimator 1092, a loop filter 1093, a holder 1094, an adder 1095, and a NCO 1096. Herein, a decimator may be included before the buffer 1091. The timing recovery unit 1080 includes a decimator 1081, a buffer 1082, a timing error detector 1083, a loop filter 1084, a holder 1085, and a NCO 1086. Finally, the phase compensator 1110 includes a buffer 1111, a frequency offset estimator 1112, a holder 1113, a NCO 1114, and a multiplier 1115. Furthermore, a decimator 1200 may be included between the phase compensator 1110 and the equalizer 1003. The decimator 1200 may be outputted in front of the DC remover 1070 instead of at the outputting end of the phase compensator 1110.

Herein, the decimators correspond to components required when a signal being inputted to the demodulator is oversampled to N times by the analog/digital converter. More specifically, the integer N represents the sampling rate of the received signal. For example, when the input signal is oversampled to 2 times (i.e., when N=2) by the analog/digital converter, this indicates that two samples are included in one symbol. In this case, each of the decimators corresponds to a ½ decimator. Depending upon whether or not the oversampling process of the received signal has been performed, the signal may bypass the decimators.

Meanwhile, the output of the second multiplier 1050 is temporarily stored in the decimator 1081 and the buffer 1082 both included in the timing recovery unit 1080. Subsequently, the temporarily stored output data are inputted to the timing error detector 1083 through the decimator 1081 and the buffer 1082. Assuming that the output of the second multiplier 1050 is oversampled to N times its initial state, the decimator 1081 decimates the output of the second multiplier 1050 at a decimation rate of 1/N. Then, the 1/N-decimated data are inputted to the buffer 1082. In other words, the decimator 1081 performs decimation on the input signal in accordance with a VSB symbol cycle. Furthermore, the decimator 1081 may also receive the output of the matched filter 1060 instead of the output of the second multiplier 1050. The timing error detector 1083 uses the data prior to or after being processed with matched-filtering and the known sequence position indicator outputted from the known sequence detector and initial frequency offset estimator 1004-1 in order to detect a timing error. Thereafter, the detected timing error is outputted to the loop filter 1084. Accordingly, the detected timing error information is obtained once during each repetition cycle of the known data sequence.

For example, if a known data sequence having the same pattern is periodically inserted and transmitted, as shown in FIG. 37, the timing error detector 1083 may use the known data in order to detect the timing error. There exists a plurality of methods for detecting timing error by using the known data. In the example of the present invention, the timing error may be detected by using a correlation characteristic between the known data and the received data in the time domain, the known data being already known in accordance with a pre-arranged agreement between the transmitting system and the receiving system. The timing error may also be detected by using the correlation characteristic of the two known data types being received in the frequency domain. Thus, the detected timing error is outputted. In another example, a spectral lining method may be applied in order to detect the timing error. Herein, the spectral lining method corresponds to a method of detecting timing error by using sidebands of the spectrum included in the received signal.

The loop filter 1084 filters the timing error detected by the timing error detector 1083 and, then, outputs the filtered timing error to the holder 1085. The holder 1085 holds (or maintains) the timing error filtered and outputted from the loop filter 1084 during a pre-determined known data sequence cycle period and outputs the processed timing error to the NCO 1086. Herein, the order of positioning of the loop filter 1084 and the holder 1085 may be switched with one another. In additionally, the function of the holder 1085 may be included in the loop filter 1084, and, accordingly, the holder 1085 may be omitted. The NCO 1086 accumulates the timing error outputted from the holder 1085. Thereafter, the NCO 1086 outputs the phase element (i.e., a sampling clock) of the accumulated timing error to the resampler 1040, thereby adjusting the sampling timing of the resampler 1040.

Meanwhile, the buffer 1091 of the carrier recovery unit 1090 may receive either the data inputted to the matched filter 1060 or the data outputted from the matched filter 1060 and, then, temporarily store the received data. Thereafter, the temporarily stored data are outputted to the frequency offset estimator 1092. If a decimator is provided in front of the buffer 1091, the input data or output data of the matched filter 1060 are decimated by the decimator at a decimation rate of 1/N. Thereafter, the decimated data are outputted to the buffer 1091. For example, when the input data or output data of the matched filter 1060 are oversampled to 2 times (i.e., when N=2), this indicates that the input data or output data of the matched filter 1060 are decimated at a rate of ½ by the decimator 1081 and then outputted to the buffer 1091. More specifically, when a decimator is provided in front of the buffer 1091, the carrier recovery unit 1090 operates in symbol units. Alternatively, if a decimator is not provided, the carrier recovery unit 1090 operates in oversampling units.

The frequency offset estimator 1092 uses the input data or output data of the matched filter 1060 and the known sequence position indicator outputted from the known sequence detector and initial frequency offset estimator 1004-1 in order to estimate the frequency offset. Then, the estimated frequency offset is outputted to the loop filter 1093. Therefore, the estimated frequency offset value is obtained once every repetition period of the known data sequence. The loop filter 1093 performs low pass filtering on the frequency offset value estimated by the frequency offset estimator 1092 and outputs the low pass-filtered frequency offset value to the holder 1094. The holder 1094 holds (or maintains) the low pass-filtered frequency offset value during a pre-determined known data sequence cycle period and outputs the frequency offset value to the adder 1095. Herein, the positions of the loop filter 1093 and the holder 1094 may be switched from one to the other. Furthermore, the function of the holder 1085 may be included in the loop filter 1093, and, accordingly, the holder 1094 may be omitted.

The adder 1095 adds the value of the initial frequency offset estimated by the known sequence detector and initial frequency offset estimator 1004-1 to the frequency offset value outputted from the loop filter 1093 (or the holder 1094).

Thereafter, the added offset value is outputted to the NCO 1096. Herein, if the adder 1095 is designed to also receive the constant being inputted to the NCO 1020, the NCO 1020 and the first multiplier 1030 may be omitted. In this case, the second multiplier 1050 may simultaneously perform changing signals to baseband signals and removing remaining carrier.

The NCO 1096 generates a complex signal corresponding to the frequency offset outputted from the adder 1095, which is then outputted to the second multiplier 1050. Herein, the NCO 1096 may include a ROM. In this case, the NCO 1096 generates a compensation frequency corresponding to the frequency offset being outputted from the adder 1095. Then, the NCO 1096 reads a complex cosine corresponding to the compensation frequency from the ROM, which is then outputted to the second multiplier 1050. The second multiplier 1050 multiplies the output of the NCO 1094 included in the carrier recovery unit 1090 to the output of the resampler 1040, so as to remove the carrier offset included in the output signal of the resampler 1040.

Figure 40:
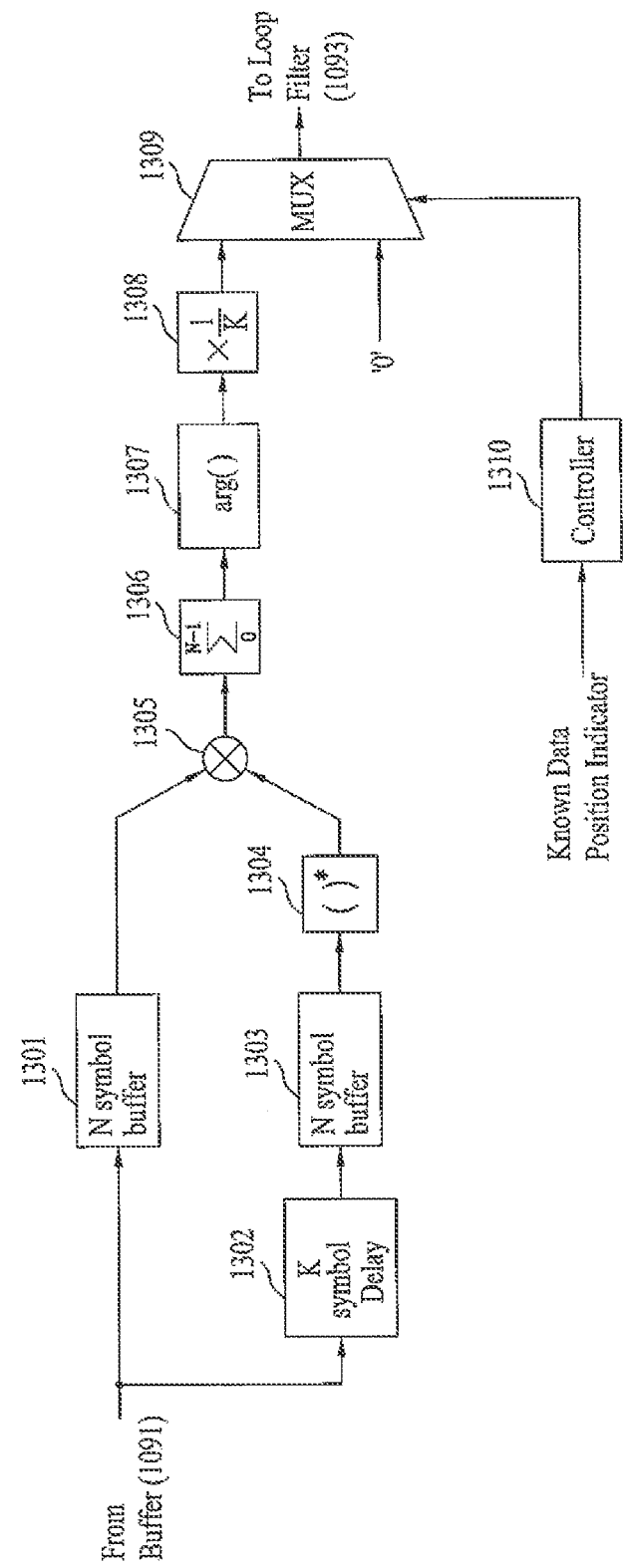
FIG. 40 illustrates a block diagram of a frequency offset estimator according to an embodiment of the present invention.

FIG. 40 illustrates a detailed block diagram of the frequency offset estimator 1092 of the carrier recovery unit 1090 according to an embodiment of the present invention. Herein, the frequency offset estimator 1092 operates in accordance with the known sequence position indicator detected from the known sequence detector and initial frequency offset estimator 1004-1. At this point, if the input data or output data of the matched filter 1060 are inputted through the decimator, the frequency offset estimator 1092 operates in symbol units. Alternatively, if a decimator is not provided, the frequency offset estimator 1092 operates in oversampling units. In the example given in the description of the present invention, the frequency offset estimator 1092 operates in symbol units. Referring to FIG. 40, the frequency offset estimator 1092 includes a controller 1310, a first N symbol buffer 1301, a K symbol delay 1302, a second N symbol buffer 1303, a conjugator 1304, a multiplier 1305, an accumulator 1306, a phase detector 1307, a multiplier 1308, and a multiplexer 1309. The frequency offset estimator 1092 having the above-described structure, as shown in FIG. 40, will now be described in detail with respect to an operation example during a known data section.

The first N symbol buffer 1301 may store a maximum of N number of symbol being inputted thereto. The symbol data that are temporarily stored in the first N symbol buffer 1301 are then inputted to the multiplier 1305. At the same time, the inputted symbol is inputted to the K symbol delay 1302 so as to be delayed by K symbols. Thereafter, the delayed symbol passes through the second N symbol buffer 1303 so as to be conjugated by the conjugator 1304. Thereafter, the conjugated symbol is inputted to the multiplier 1305. The multiplier 1305 multiplies the output of the first N symbol buffer 1301 and the output of the conjugator 1304. Then, the multiplier 1305 outputs the multiplied result to the accumulator 1306. Subsequently, the accumulator 1306 accumulates the output of the multiplier 1305 during N symbol periods, thereby outputted the accumulated result to the phase detector 1307.

The phase detector 1307 extracts the corresponding phase information from the output of the accumulator 1306, which is then outputted to the multiplier 1308. The multiplier 1308 then divides the phase information by K, thereby outputting the divided result to the multiplexer 1309. Herein, the result of the phase information divided by becomes the frequency offset estimation value. More specifically, at the point where the input of the known data ends or at a desired point, the frequency offset estimator 1092 accumulates during an N symbol period multiplication of the complex conjugate of N number of the input data stored in the first N symbol buffer 1301 and the complex conjugate of the N number of the input data that are delayed by K symbols and stored in the second N symbol buffer 1303. Thereafter, the accumulated value is divided by K, thereby extracting the frequency offset estimation value.

Based upon a control signal of the controller 1310, the multiplexer 1309 selects either the output of the multiplier 1308 or '0' and, then, outputs the selected result as the final frequency offset estimation value. The controller 1310 receives the known data sequence position indicator from the known sequence detector and initial frequency offset estimator 1004-1 in order to control the output of the multiplexer 1309. More specifically, the controller 1310 determines based upon the known data sequence position indicator whether the frequency offset estimation value being outputted from the multiplier 1308 is valid. If the controller 1310 determines that the frequency offset estimation value is valid, the multiplexer 1309 selects the output of the multiplier 1308. Alternatively, if the controller 1310 determines that the frequency offset estimation value is invalid, the controller 1310 generates a control signal so that the multiplexer 1309 selects '0'. At this point, it is preferable that the input signals stored in the first N symbol buffer 1301 and in the second N symbol buffer 1303 correspond to signals each being transmitted by the same known data and passing through almost the same channel. Otherwise, due to the influence of the transmission channel, the frequency offset estimating performance may be largely deteriorated.

Further, the values N and K of the frequency offset estimator 1092 (shown in FIG. 40) may be diversely decided. This is because a particular portion of the known data that are identically repeated may be used herein. For example, when the data having the structure described in FIG. 37 are being transmitted, N may be set as BS (i.e., N=BS), and K may be set as (AS+BS) (i.e., K=AS+BS)). The frequency offset estimation value range of the frequency offset estimator 1092 is decided in accordance with the value K. If the value K is large, then the frequency offset estimation value range becomes smaller. Alternatively, if the value K is small, then the frequency offset estimation value range becomes larger. Therefore, when the data having the structure of FIG. 37 is transmitted, and if the repetition cycle (AS+BS) of the known data is long, then the frequency offset estimation value range becomes smaller.

In this case, even if the initial frequency offset is estimated by the known sequence detector and initial frequency offset estimator 1004-1, and if the estimated value is compensated by the second multiplier 1050, the remaining frequency offset after being compensated will exceed the estimation range of the frequency offset estimator 1092. In order to overcome such problems, the known data sequence that is regularly transmitted may be configured of a repetition of a same data portion by using a cyclic extension process. For example, if the known data sequence shown in FIG. 37 is configured of two identical portions having the length of BS/2, then the N and K values of the frequency offset estimator 1092 (shown in FIG. 40) may be respectively set as B/2 and B/2 (i.e., N=BS/2 and K=BS/2). In this case, the estimation value range may become larger than when using repeated known data.

Meanwhile, the known sequence detector and initial frequency offset estimator 1004-1 detects the place (o position) of the known data sequences that are being periodically or non-periodically transmitted. Simultaneously, the known sequence detector and initial frequency offset estimator 1004-1 estimates an initial frequency offset during the known sequence detection process. The known data sequence position indicator detected by the known sequence detector and initial frequency offset estimator 1004-1 is outputted to the timing recovery unit 1080, the carrier recovery unit 1090, and the phase compensator 1110 of the demodulator 1002, and to the equalizer 1003. Thereafter, the estimated initial frequency offset is outputted to the carrier recovery unit 1090. At this point, the known sequence detector and initial frequency offset estimator 1004-1 may either receive the output of the matched filter 1060 or receive the output of the resampler 1040. This may be optionally decided depending upon the design of the system designer. Herein, the frequency offset estimator shown in FIG. 40 may be directly applied in the known sequence detector and initial frequency offset estimator 1004-1 or in the phase compensator 1110 of the frequency offset estimator.

Figure 41:
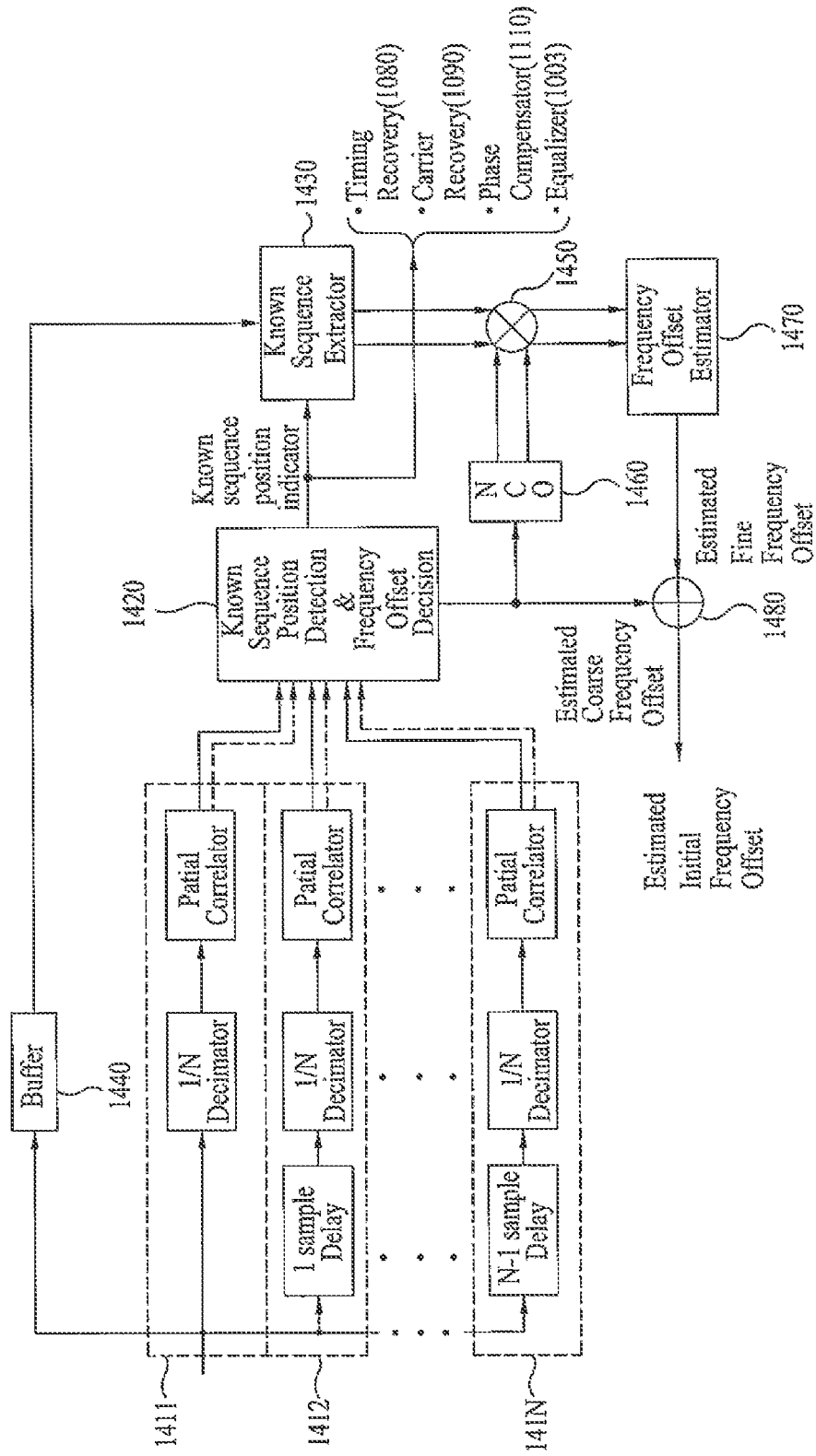
FIG. 41 illustrates a block diagram of a known data detector and initial frequency offset estimator according to the present invention.

FIG. 41 illustrates a detailed block diagram showing a known sequence detector and initial frequency offset estimator according to an embodiment of the present invention. More specifically, FIG. 41 illustrates an example of an initial frequency offset being estimated along with the known sequence position indicator. Herein, FIG. 41 shows an example of an inputted signal being oversampled to N times of its initial state. In other words, N represents the sampling rate of a received signal. Referring to FIG. 41, the known sequence detector and initial frequency offset estimator includes N number of partial correlators 1411 to 141N configured in parallel, a known data place detector and frequency offset decider 1420, a known data extractor 1430, a buffer 1440, a multiplier 1450, a NCO 1460, a frequency offset estimator 1470, and an adder 1480. Herein, the first partial correlator 1411 consists of a 1/N decimator, and a partial correlator. The second partial correlator 1412 consists of a 1 sample delay, a 1/N decimator, and a partial correlator. And, the $N^{th}$ partial correlator 141N consists of a N−1 sample delay, a 1/N decimator, and a partial correlator. These are used to match (or identify) the phase of each of the samples within the oversampled symbol with the phase of the original (or initial) symbol, and to decimate the samples of the remaining phases, thereby performing partial correlation on each sample. More specifically, the input signal is decimated at a rate of 1/N for each sampling phase, so as to pass through each partial correlator.

For example, when the input signal is oversampled to 2 times (i.e., when N=2), this indicates that two samples are included in one signal. In this case, two partial correlators (e.g., 1411 and 1412) are required, and each 1/N decimator becomes a ½ decimator. At this point, the 1/N decimator of the first partial correlator 1411 decimates (or removes), among the input samples, the samples located in-between symbol places (or positions). Then, the corresponding 1/N decimator outputs the decimated sample to the partial correlator. Furthermore, the 1 sample delay of the second partial correlator 1412 delays the input sample by 1 sample (i.e., performs a 1 sample delay on the input sample) and outputs the delayed input sample to the 1/N decimator. Subsequently, among the samples inputted from the 1 sample delay, the 1/N decimator of the second partial correlator 1412 decimates (or removes) the samples located in-between symbol places (or positions). Thereafter, the corresponding 1/N decimator outputs the decimated sample to the partial correlator.

After each predetermined period of the VSB symbol, each of the partial correlators outputs a correlation value and an estimation value of the coarse frequency offset estimated at that particular moment to the known data place detector and frequency offset decider 1420. The known data place detector and frequency offset decider 1420 stores the output of the partial correlators corresponding to each sampling phase during a data group cycle or a pre-decided cycle. Thereafter, the known data place detector and frequency offset decider 1420 decides a position (or place) corresponding to the highest correlation value, among the stored values, as the place (or position) for receiving the known data. Simultaneously, the known data place detector and frequency offset decider 1420 finally decides the estimation value of the frequency offset estimated at the moment corresponding to the highest correlation value as the coarse frequency offset value of the receiving system. At this point, the known sequence position indicator is inputted to the known data extractor 1430, the timing recovery unit 1080, the carrier recovery unit 1090, the phase compensator 1110, and the equalizer 1003, and the coarse frequency offset is inputted to the adder 1480 and the NCO 1460.

In the meantime, while the N numbers of partial correlators 1411 to 141N detect the known data place (or known sequence position) and estimate the coarse frequency offset, the buffer 1440 temporarily stores the received data and outputs the temporarily stored data to the known data extractor 1430. The known data extractor 1430 uses the known sequence position indicator, which is outputted from the known data place detector and frequency offset decider 1420, so as to extract the known data from the output of the buffer 1440. Thereafter, the known data extractor 1430 outputs the extracted data to the multiplier 1450. The NCO 1460 generates a complex signal corresponding to the coarse frequency offset being outputted from the known data place detector and frequency offset decider 1420. Then, the NCO 1460 outputs the generated complex signal to the multiplier 1450.

The multiplier 1450 multiplies the complex signal of the NCO 1460 to the known data being outputted from the known data extractor 1430, thereby outputting the known data having the coarse frequency offset compensated to the frequency offset estimator 1470. The frequency offset estimator 1470 estimates a fine frequency offset from the known data having the coarse frequency offset compensated. Subsequently, the frequency offset estimator 1470 outputs the estimated fine frequency offset to the adder 1480. The adder 1480 adds the coarse frequency offset to the fine frequency offset. Thereafter, the adder 1480 decides the added result as a final initial frequency offset, which is then outputted to the adder 1095 of the carrier recovery unit 1090 included in the demodulator 1002. More specifically, during the process of acquiring initial synchronization, the present invention may estimate and use the coarse frequency offset as well as the fine frequency offset, thereby enhancing the estimation performance of the initial frequency offset.

It is assumed that the known data is inserted within the data group and then transmitted, as shown in FIG. 5. Then, the known sequence detector and initial frequency offset estimator 1004-1 may use the known data that have been additionally inserted between the A1 area and the A2 area, so as to estimate the initial frequency offset. The known position indicator, which was periodically inserted within the A area estimated by the known sequence detector and initial frequency offset estimator 1004-1, is inputted to the timing error detector 1083 of the timing error recovery unit 1080, to the frequency offset estimator 1092 of the carrier recovery unit 1090, to the frequency offset estimator 1112 of the phase compensator 1110, and to the equalizer 1003.

Figure 42:
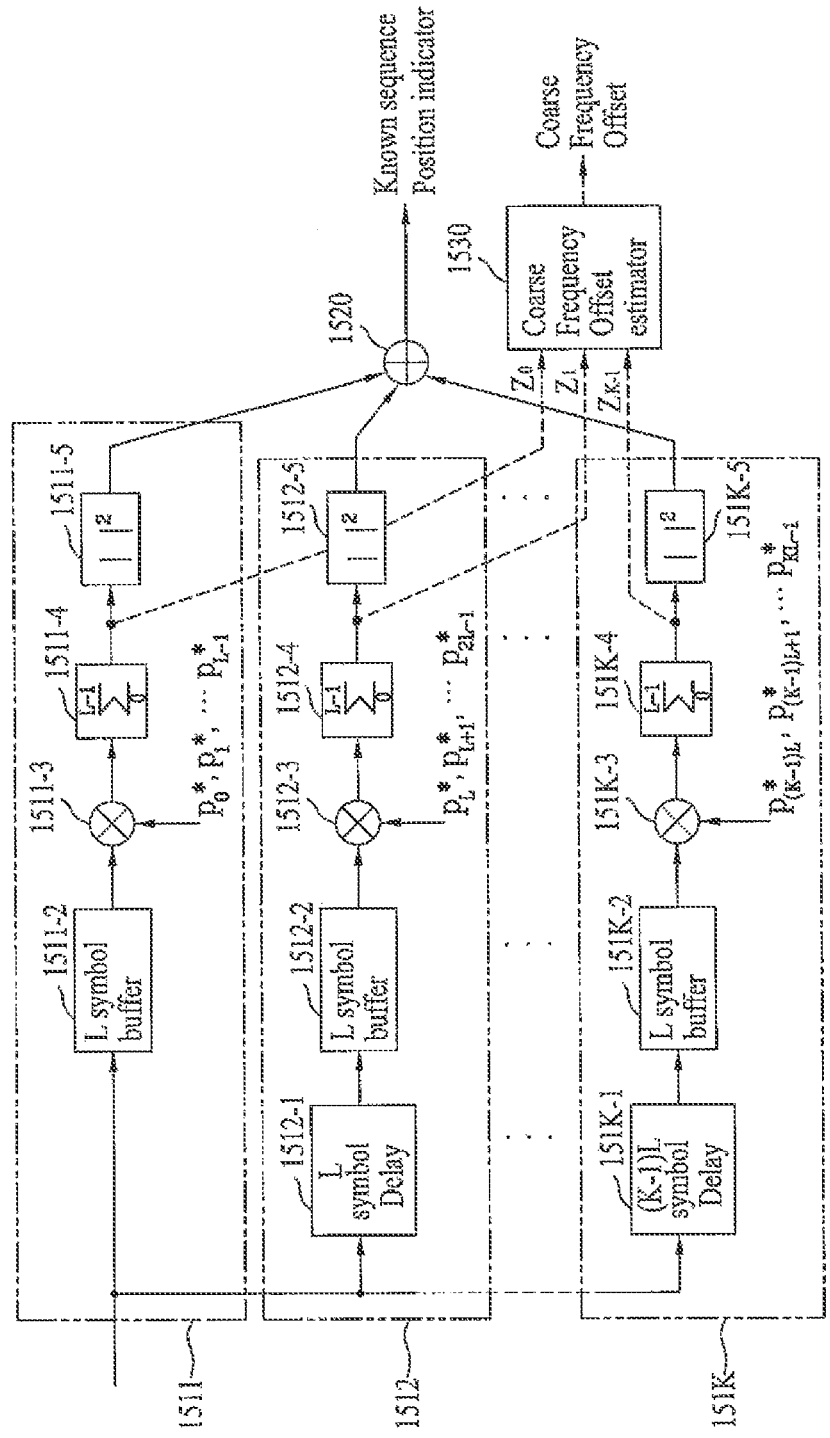
FIG. 42 illustrates a block diagram of a partial correlator shown in FIG. 41.

FIG. 42 illustrates a block diagram showing the structure of one of the partial correlators shown in FIG. 41. During the step of detecting known data, since a frequency offset is included in the received signal, each partial correlator divides the known data, which is known according to an agreement between the transmitting system and the receiving system, to K number of parts each having an L symbol length, thereby correlating each divided part with the corresponding part of the received signal. In order to do so, each partial correlator includes K number of phase and size detector 1511 to 151K each formed in parallel, an adder 1520, and a coarse frequency offset estimator 1530.

The first phase and size detector 1511 includes an L symbol buffer 1511-2, a multiplier 1511-3, an accumulator 1511-4, and a squarer 1511-5. Herein, the first phase and size detector 1511 calculates the correlation value of the known data having a first L symbol length among the K number of sections. Also, the second phase and size detector 1512 includes an L symbol delay 1512-1, an L symbol buffer 1512-2, a multiplier 1512-3, an accumulator 1512-4, and a squarer 1512-5. Herein, the second phase and size detector 1512 calculates the correlation value of the known data having a second L symbol length among the K number of sections. Finally, the $N^{th}$ phase and size detector 151K includes a (K−1)L symbol delay 151K-1, an L symbol buffer 151K-2, a multiplier 151K-3, an accumulator 151K-4, and a squarer 151K-5. Herein, the $N^{th}$ phase and size detector 151K calculates the correlation value of the known data having an $N^{th}$ L symbol length among the K number of sections.

Referring to FIG. 42, $\{P_0, P_1, \ldots, P_{KL-1}\}$ each being multiplied with the received signal in the multiplier represents the known data known by both the transmitting system and the receiving system (i.e., the reference known data generated from the receiving system). And, * represents a complex conjugate. For example, in the first phase and size detector 1511, the signal outputted from the 1/N decimator of the first partial correlator 1411, shown in FIG. 41, is temporarily stored in the L symbol buffer 1511-2 of the first phase and size detector 1511 and then inputted to the multiplier 1511-3. The multiplier 1511-3 multiplies the output of the L symbol buffer 1511-2 with the complex conjugate of the known data parts $P_0, P_1, \ldots, P_{KL-1}$, each having a first L symbol length among the known K number of sections. Then, the multiplied result is outputted to the accumulator 1511-4. During the L symbol period, the accumulator 1511-4 accumulates the output of the multiplier 1511-3 and, then, outputs the accumulated value to the squarer 1511-5 and the coarse frequency offset estimator 1530. The output of the accumulator 1511-4 is a correlation value having a phase and a size. Accordingly, the squarer 1511-5 calculates an absolute value of the output of the multiplier 1511-4 and squares the calculated absolute value, thereby obtaining the size of the correlation value. The obtained size is then inputted to the adder 1520.

The adder 1520 adds the output of the squares corresponding to each size and phase detector 1511 to 151K. Then, the adder 1520 outputs the added result to the known data place detector and frequency offset decider 1420. Also, the coarse frequency offset estimator 1530 receives the output of the accumulator corresponding to each size and phase detector 1511 to 151K, so as to estimate the coarse frequency offset at each corresponding sampling phase. Thereafter, the coarse frequency offset estimator 1530 outputs the estimated offset value to the known data place detector and frequency offset decider 1420.

When the K number of inputs that are outputted from the accumulator of each phase and size detector 1511 to 151K are each referred to as $\{Z_0, Z_1, \ldots, Z_{K-1}\}$, the output of the coarse frequency offset estimator 1530 may be obtained by using Equation 7 shown below.

$$\omega_0 = \frac{1}{L}\arg\left\{\sum_{n=1}^{K-1}\left(\frac{Z_n}{|Z_n|}\right)\left(\frac{Z_{n-1}}{|Z_{n-1}|}\right)^*\right\} \quad \text{Equation 7}$$

The known data place detector and frequency offset decider 1420 stores the output of the partial correlator corresponding to each sampling phase during an enhanced data group cycle or a pre-decided cycle. Then, among the stored correlation values, the known data place detector and frequency offset decider 1420 decides the place (or position) corresponding to the highest correlation value as the place for receiving the known data.

Furthermore, the known data place detector and frequency offset decider 1420 decides the estimated value of the frequency offset taken (or estimated) at the point of the highest correlation value as the coarse frequency offset value of the receiving system. For example, if the output of the partial correlator corresponding to the second partial correlator 1412 is the highest value, the place corresponding to the highest value is decided as the known data place. Thereafter, the coarse frequency offset estimated by the second partial correlator 1412 is decided as the final coarse frequency offset, which is then outputted to the demodulator 1002.

Meanwhile, the output of the second multiplier 1050 is temporarily stored in the decimator 1081 and the buffer 1082 both included in the timing recovery unit 1080. Subsequently, the temporarily stored output data are inputted to the timing error detector 1083 through the decimator 1081 and the buffer 1082. Assuming that the output of the second multiplier 1050 is oversampled to N times its initial state, the decimator 1081 decimates the output of the second multiplier 1050 at a decimation rate of 1/N. Then, the 1/N-decimated data are inputted to the buffer 1082. In other words, the decimator 1081 performs decimation on the input signal in accordance with a VSB symbol cycle. Furthermore, the decimator 1081 may also receive the output of the matched filter 1060 instead of the output of the second multiplier 1050.

The timing error detector 1083 uses the data prior to or after being processed with matched-filtering and the known sequence position indicator outputted from the known data detector and initial frequency offset estimator 1004-1 in order to detect a timing error. Thereafter, the detected timing error is outputted to the loop filter 1084. Accordingly, the detected timing error information is obtained once during each repetition cycle of the known data sequence.

For example, if a known data sequence having the same pattern is periodically inserted and transmitted, as shown in FIG. 37, the timing error detector 1083 may use the known data in order to detect the timing error. There exists a plurality of methods for detecting timing error by using the known data.

In the example of the present invention, the timing error may be detected by using a correlation characteristic between the known data and the received data in the time domain, the known data being already known in accordance with a pre-arranged agreement between the transmitting system and the receiving system. The timing error may also be detected by using the correlation characteristic of the two known data types being received in the frequency domain. Thus, the detected timing error is outputted. In another example, a spectral lining method may be applied in order to detect the timing error. Herein, the spectral lining method corresponds to a method of detecting timing error by using sidebands of the spectrum included in the received signal.

The loop filter 1084 filters the timing error detected by the timing error detector 1083 and, then, outputs the filtered timing error to the holder 1085.

The holder 1085 holds (or maintains) the timing error filtered and outputted from the loop filter 1084 during a predetermined known data sequence cycle period and outputs the processed timing error to the NCO 1086. Herein, the order of positioning of the loop filter 1084 and the holder 1085 may be switched with one another. In additionally, the function of the holder 1085 may be included in the loop filter 1084, and, accordingly, the holder 1085 may be omitted.

The NCO 1086 accumulates the timing error outputted from the holder 1085. Thereafter, the NCO 1086 outputs the phase element (i.e., a sampling clock) of the accumulated timing error to the resampler 1040, thereby adjusting the sampling timing of the resampler 1040.

Figure 43:
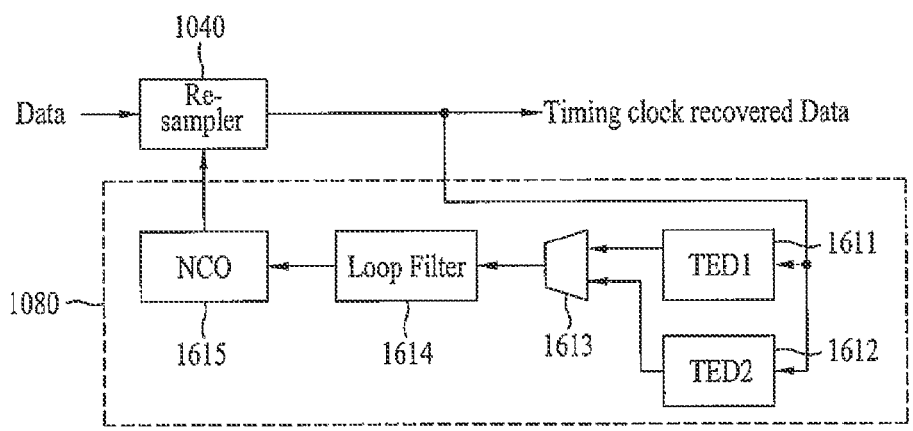
FIG. 43 illustrates a second example of the timing recovery unit according to the present invention.

FIG. 43 illustrates an example of the timing recovery unit included in the demodulator 1002 shown in FIG. 36. Referring to FIG. 43, the timing recovery unit 1080 includes a first timing error detector 1611, a second timing error detector 1612, a multiplexer 1613, a loop-filter 1614, and an NCO 1615. The timing recovery unit 1080 would be beneficial when the input signal is divided into a first area in which known data having a predetermined length are inserted at predetermined position(s) and a second area that includes no known data. Assuming that the first timing error detector 1611 detects a first timing error using a sideband of a spectrum of an input signal and the second timing error detector 1612 detects a second timing error using the known data, the multiplexer 1613 can output the first timing error for the first area and can output the second timing error for the second area. The multiplexer 1613 may output both of the first and second timing errors for the first area in which the known data are inserted. By using the known data a more reliable timing error can be detected and the performance of the timing recovery unit 1080 can be enhanced.

Figure 44:
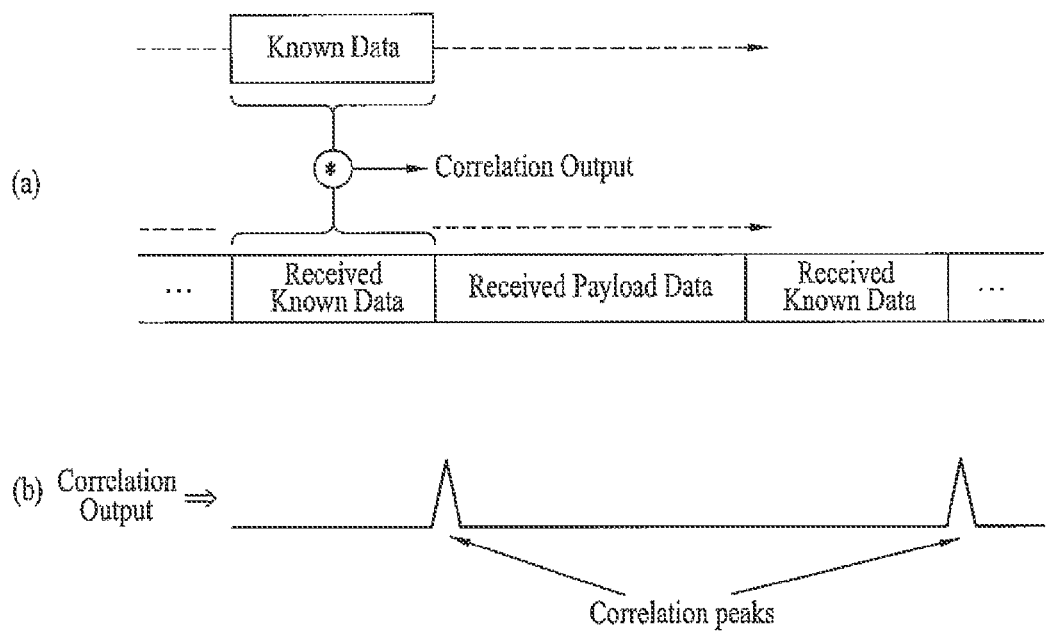
FIG. 44(a) and FIG. 44(b) illustrate examples of detecting timing error in a time domain.

This disclosure describes two ways of detecting a timing error. One way is to detect a timing error using correlation in the time domain between known data pre-known to a transmitting system and a receiving system (reference known data) and the known data actually received by the receiving system, and the other way is to detect a timing error using correlation in the frequency domain between two known data actually received by the receiving system. In FIG. 44, a timing error is detected by calculating correlation between the reference known data pre-known to and generated by the receiving system and the known data actually received. In FIG. 44, correlation between an entire portion of the reference know data sequence and an entire portion of the received known data sequence is calculated. The correlation output has a peak value at the end of each known data sequence actually received.

Figure 45:
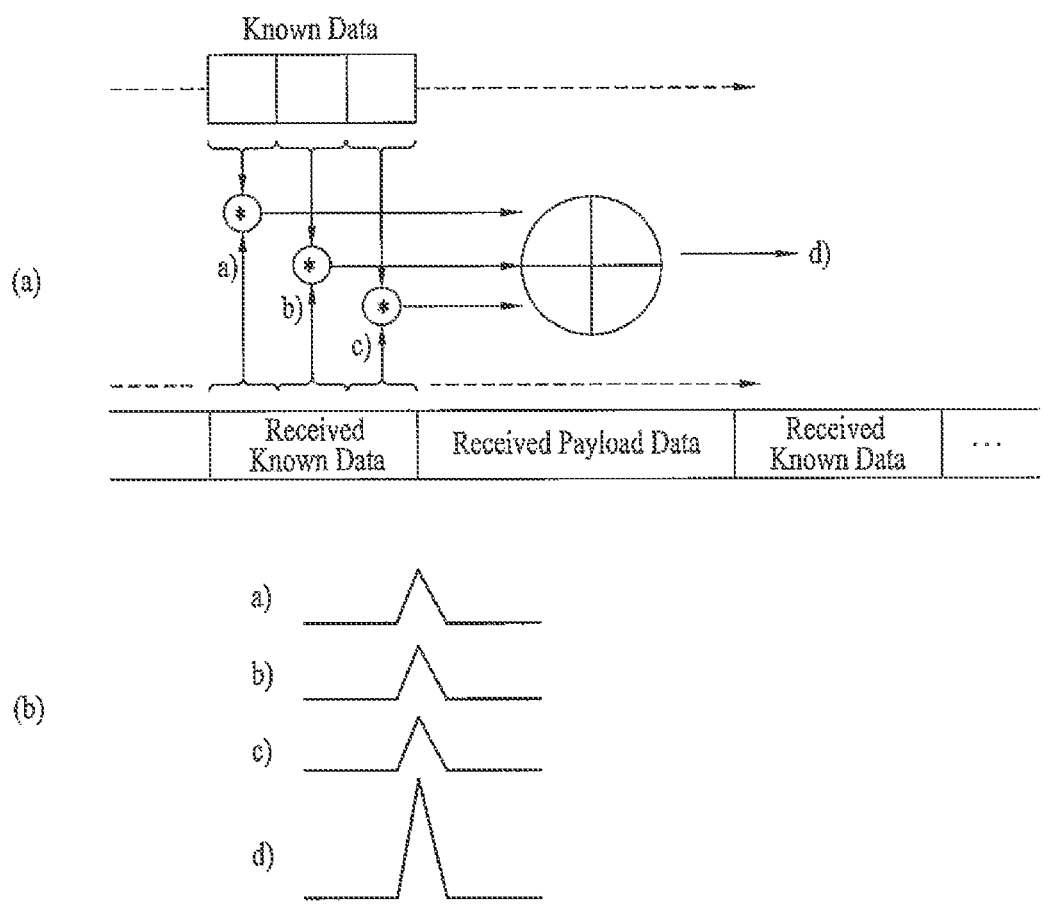
FIG. 45(a) and FIG. 45(b) illustrate other examples of detecting timing error in a time domain.

In FIG. 45, a timing error is detected by calculating correlation values between divided portions of the reference known data sequence and divided portions of the received known data sequence, respectively. The correlation output has a peak value at the end of each divided portion of the received known data sequence. The correlation values may be added as a total correlation value as shown FIG. 45, and the total correlation value can be used to calculate the timing error. When an entire portion of the received known data is used for correlation calculation, the timing error can be obtained for each data block. If the correlation level of the entire portion of the known data sequence is low, a more precise correlation can be obtained by using divided portions of the known data sequence as shown in FIG. 45.

The use of a final correlation value which is obtained based upon a plurality of correlation values of divided portions of a received known data sequence may reduce the carrier frequency error. In addition, the process time for the timing recovery can be greatly reduced when the plurality of correlation values are used to calculate the timing error. For example, when the reference known data sequence which is pre-known to the transmitting system and receiving system is divided into K portions, K correlation values between the K portions of the reference known data sequence and the corresponding divided portions of the received known data sequence can be calculated, or any combination(s) of the correlation values can be used. Therefore, the period of the timing error detection can be reduced when the divided portions of the known data sequence are used instead of the entire portion of the sequence.

Figure 46:
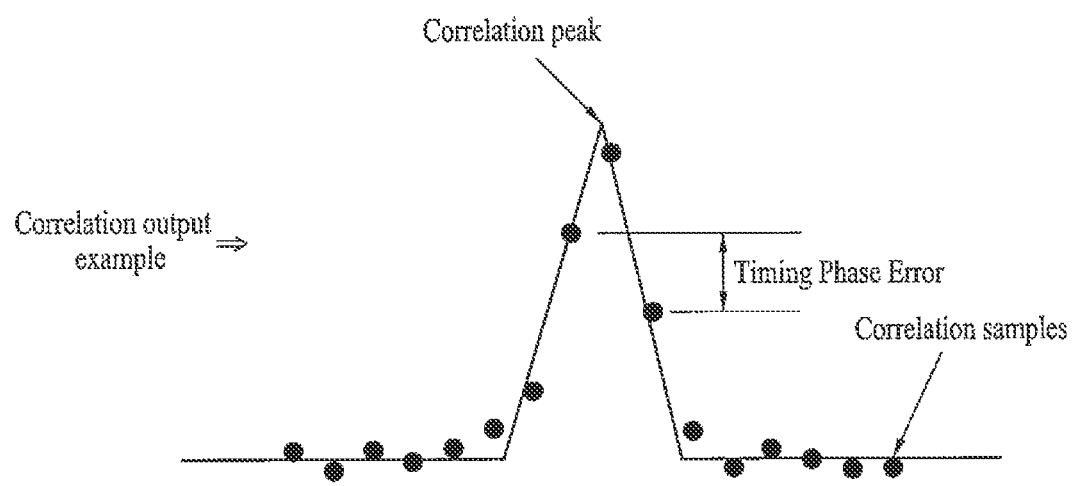
FIG. 46 illustrates an example of detecting timing error using correlation values of FIG. 44 and FIG. 45.

The timing error can be calculated from the peak value of the correlation values. The timing error is obtained for each data block if an entire portion of the known data sequence is used as shown in FIG. 46. On the other hand, if K divided portions of the known data sequence are used for correlation calculation, K correlation values and corresponding peak values can be obtained. This indicates that the timing error can be detected K times.

A method of detecting a timing error using the correlation between the reference known data and the received known data shown will now be described in more detail. FIG. 46 illustrates correlation values between the reference known data and the received known data. The correlation values correspond to data samples sampled at a rate two times greater than the symbol clock. When the random data effect is minimized and there is no timing clock error, the correlation values between the reference known data and the received known data are symmetrical. However, if a timing phase error exists, the correlation values adjacent to the peak value are not symmetrical as shown in FIG. 46. Therefore, the timing error can be obtained by using a difference (timing phase error shown in FIG. 46) between the correlation values before and after the peak value.

Figure 47:
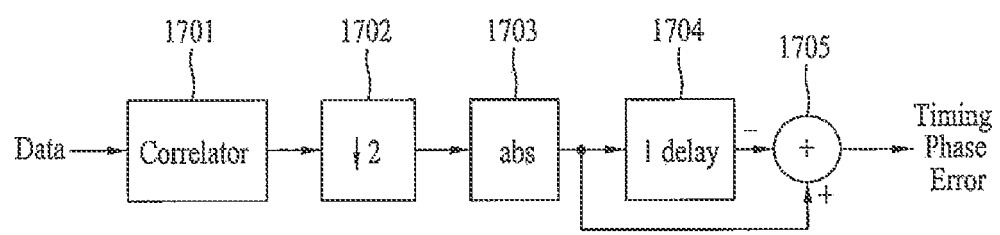
FIG. 47 illustrates an example of a timing error detector according to the present invention.

FIG. 47 illustrates an example of the timing error detector shown in FIG. 43. The timing error detector includes a correlator 1701, a down sampler 1702, an absolute value calculator 1703, a delay 1704, and a subtractor 1705. The correlator 1701 receives a known data sequence sampled at a rate at least two times higher than the symbol clock frequency and calculates the correlation values between the received known data sequence and a reference known data sequence. The down sampler 1702 performs down sampling on the correlation values and obtains samples having a symbol frequency. For example, if the data inputted to the correlator 1701 is pre-sampled at a sampling rate of 2, then the down sampler 1702 performs down sampling at a rate of ½ to obtain samples having the symbol frequency. The absolute value calculator 1703 calculates absolute values (or square values) of the down-sampled correlation values. These absolute values are inputted to the delay 1704 and the subtractor 1705. The delay 1704 delays the absolute values for a symbol and the subtractor then outputs a timing error by subtracting the delayed absolute value from the values outputted from the absolute value calculator 1703.

The arrangement of the correlator 1701, the down sampler 1702, the absolute value calculator 1703, and the delay 1704, and the subtractor 1705 shown in FIG. 47 can be modified. For example, the timing phase error can be calculated in the order of the down sampler 1702, the correlator 1701, and the absolute value calculator 1703, or in the order of the correlator 1701, the absolute value calculator 1703, and the down sampler 1702.

Figure 48:
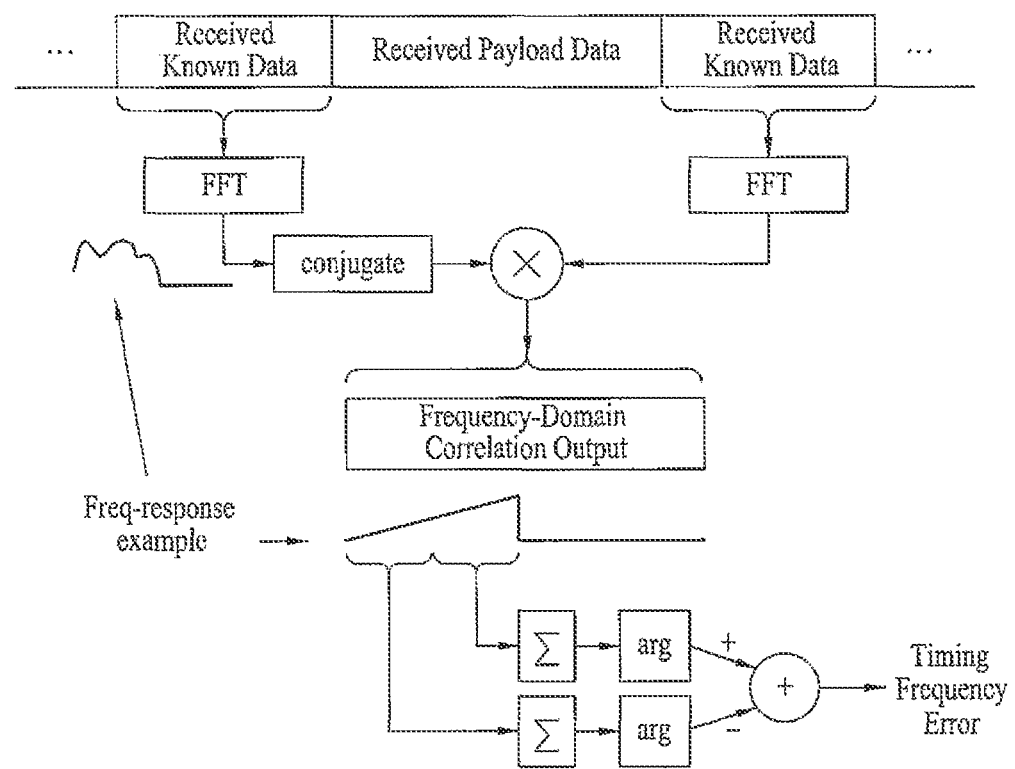
FIG. 48 illustrates an example of detecting timing error in a frequency domain according to an embodiment of the present invention.

The timing error can also be obtained using the frequency characteristic of the known data. When there is a timing frequency error, a phase of the input signal increases at a fixed slope as the frequency of the signal increases and this slope is different for current and next data block. Therefore, the timing error can be calculated based on the frequency characteristic of two different known data blocks. In FIG. 48, a current known data sequence (right) and a previous known data sequence (left) are converted into first and second frequency domain signals, respectively, using a Fast Fourier Transform (FFT) algorithm. The conjugate value of the first frequency domain signal is then multiplied with the second frequency domain signal in order to obtain the correlation value between two frequency domain signals. In other words, the correlation between the frequency value of the previous known data sequence and the frequency value of the current known data sequence is used to detect a phase change between the known data blocks for each frequency. In this way the phase distortion of a channel can be eliminated.

The frequency response of a complex VSB signal does not have a full symmetric distribution as shown in FIG. 46. Rather, its distribution is a left or right half of the distribution and the frequency domain correlation values also have a half distribution. In order to the phase difference between the frequency domain correlation values, the frequency domain having the correlation values can be divided into two sub-areas and a phase of a combined correlation value in each sub-area can be obtained. Thereafter, the difference between the phases of sub-areas can be used to calculate a timing frequency error. When a phase of a combined correlation values is used for each frequency, the magnitude of each correlation value is proportional to reliability and a phase component of each correlation value is reflected to the final phase component in proportion to the magnitude.

Figure 49:
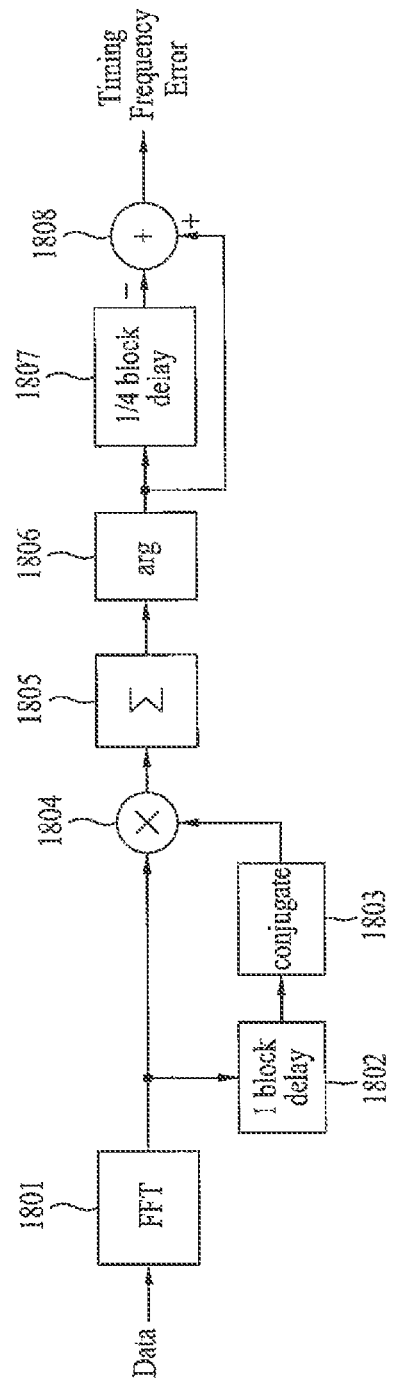
FIG. 49 illustrates another example of a timing error detector according to the present invention.

FIG. 49 illustrates another example of the timing error detector shown in FIG. 43. The timing error detector shown in FIG. 49 includes a Fast Fourier Transform (FFT) unit 1801, a first delay 1802, a conjugator 1803, a multiplier 1804, an accumulator (adder) 1805, a phase detector 1806, a second delay 1807, and a subtractor 1808. The first delay 1802 delays for one data block and the second delay 1807 delays for ¼ data block. One data block includes a frequency response of a sequence of N known data symbol sequences. When a known data region is known and the data symbols are received, the FFT unit 1801 converts complex values of consecutive N known data symbol sequences into complex values in the frequency domain. The first delay 1802 delays the frequency domain complex values for a time corresponding to one data block, and the conjugator 1803 generate conjugate values of the delayed complex values. The multiplier 1804 multiplies the current block of known data outputted from the FFT unit 1801 with the previous block of known data outputted from the conjugator 1803. The output of the multiplier 1804 represents frequency region correlation values within a known data block.

Since the complex VSB data exist only on a half of the frequency domain, the accumulator 1805 divides a data region in the known data block into two sub-regions, and accumulates correlation values for each sub-region. The phase detector 1806 detects a phase of the accumulated correlation value for each sub-region. The second delay 1807 delays the detected phase for a time corresponding to a ¼ data block. The subtractor 1808 obtains a phase difference between the delayed phase and the phase outputted from the accumulator 1806 and outputs the phase difference as a timing frequency error.

In the method of calculating a timing error by using a peak of correlation between the reference known data and the received known data in the time domain, the contribution of the correlation values may affect a channel when the channel is a multi path channel. However, this can be greatly eliminated if the timing error is obtained using the correlation between two received known data. In addition, the timing error can be detected using an entire portion of the known data sequence inserted by the transmitting system, or it can be detected using a portion of the known data sequence which is robust to random or noise data.

Meanwhile, the DC remover 1070 removes pilot tone signal (i.e., DC signal), which has been inserted by the transmitting system, from the matched-filtered signal. Thereafter, the DC remover 1070 outputs the processed signal to the phase compensator 1110.

Figure 50:
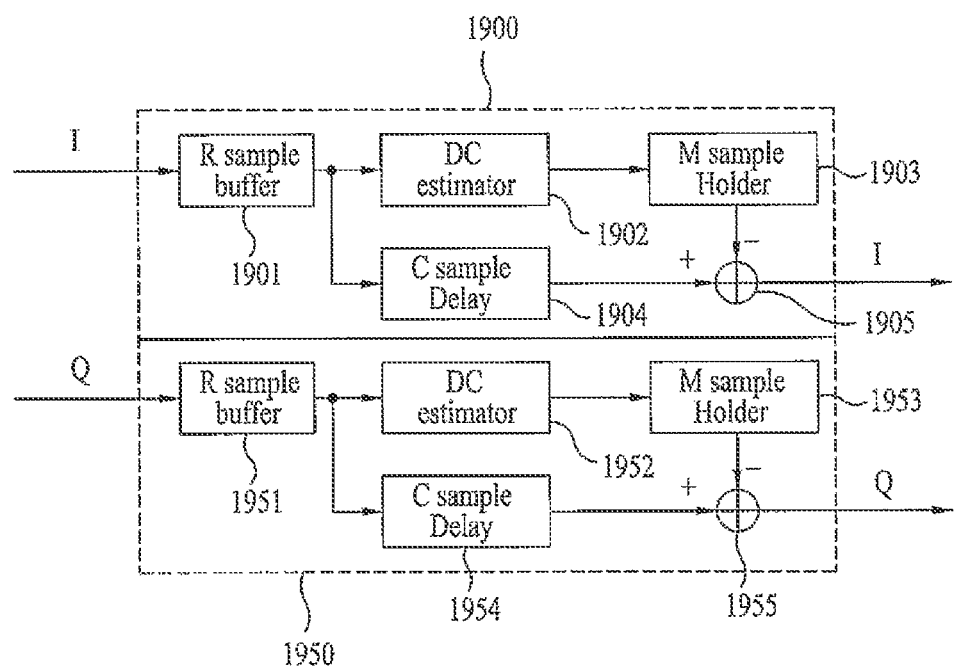
FIG. 50 illustrates a block diagram of a DC remover according to an embodiment of the present invention.

FIG. 50 illustrates a detailed block diagram of a DC remover according to an embodiment of the present invention. Herein, identical signal processing processes are performed on each of a real number element (or in-phase (I)) and an imaginary number element (or a quadrature (Q)) of the inputted complex signal, thereby estimating and removing the DC value of each element. In order to do so, the DC remover shown in FIG. 50 includes a first DC estimator and remover 1900 and a second DC estimator and remover 1950. Herein, the first DC estimator and remover 1900 includes an R sample buffer 1901, a DC estimator 1902, an M sample holder 1903, a C sample delay 1904, and a subtractor 1905. Herein, the first DC estimator and remover 1900 estimates and removes the DC of the real number element (i.e., an in-phase DC). Furthermore, the second DC estimator and remover 1950 includes an R sample buffer 1951, a DC estimator 1952, an M sample holder 1953, a C sample delay 1954, and a subtractor 1955. The second DC estimator and remover 1950 estimates and removes the DC of the imaginary number element (i.e., a quadrature DC). In the present invention, the first DC estimator and remover 1900 and the second DC estimator and remover 1950 may receive different input signals. However, each DC estimator and remover 1900 and 1950 has the same structure. Therefore, a detailed description of the first DC estimator and remover 1900 will be presented herein, and the second DC estimator and remover 1950 will be omitted for simplicity.

More specifically, the in-phase signal matched-filtered by the matched filter 1060 is inputted to the R sample buffer 1901 of the first DC estimator and remover 1900 within the DC remover 1070 and is then stored. The R sample buffer 1901 is a buffer having the length of R sample. Herein, the output of the R sample buffer 1901 is inputted to the DC estimator 1902 and the C sample delay 1904. The DC estimator 1902 uses the data having the length of R sample, which are outputted from the buffer 1901, so as to estimate the DC value by using Equation 8 shown below.

$$y[n] = \frac{1}{R} \sum_{k=0}^{R-1} x[k + M * n] \qquad \text{Equation 8}$$

In the above-described Equation 8, x[n] represents the inputted sample data stored in the buffer 1901. And, y[n] indicates the DC estimation value. More specifically, the DC estimator 1902 accumulates R number of sample data stored in the buffer 1901 and estimates the DC value by dividing the accumulated value by R. At this point, the stored input sample data set is shifted as much as M sample. Herein, the DC estimation value is outputted once every M samples.

Figure 51:
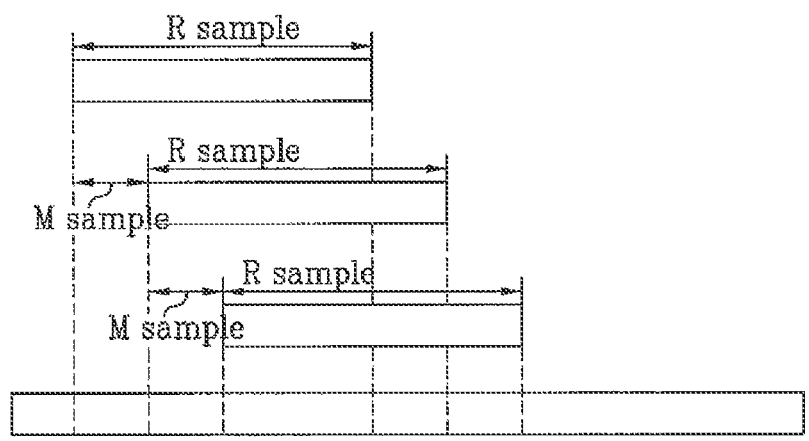
FIG. 51 illustrates an example of shifting sample data inputted to a DC estimator shown in FIG. 50.

FIG. 51 illustrates a shifting of the input sample data used for DC estimation. For example, when M is equal to 1 (i.e., M=1), the DC estimator 1902 estimates the DC value each time a sample is shifted to the buffer 1901. Accordingly, each estimated result is outputted for each sample. If M is equal to R (i.e., M=R), the DC estimator 1902 estimates the DC value each time R number of samples are shifted to the buffer 1901. Accordingly, each estimated result is outputted for each cycle of R samples. Therefore, in this case, the DC estimator 1902 corresponds to a DC estimator that operates in a block unit of R samples. Herein, any value within the range of 1 and R may correspond to the value M.

As described above, since the output of the DC estimator 1902 is outputted after each cycle of M samples, the M sample holder 1903 holds the DC value estimated from the DC estimator 1902 for a period of M samples. Then, the estimated DC value is outputted to the subtractor 1905. Also, the C sample delay 1904 delays the input sample data stored in the buffer 1901 by C samples, which are then outputted to the subtractor 1905. The subtractor 1905 subtracts the output of the M sample holder 1903 from the output of the C sample delay 1904. Thereafter, the subtractor 1905 outputs the signal having the in-phase DC removed.

Herein, the C sample delay 1904 decides which portion of the input sample data is to be compensated with the output of the DC estimator 1902. More specifically, the DC estimator and remover 1900 may be divided into a DC estimator 1902 for estimating the DC and the subtractor for compensating the input sample data within the estimated DC value. At this point, the C sample delay 1904 decides which portion of the input sample data is to be compensated with the estimated DC value. For example, when C is equal to 0 (i.e., C=0), the beginning of the R samples is compensated with the estimated DC value obtained by using R samples. Alternatively, when C is equal to R (i.e., C=R), the end of the R samples is compensated with the estimated DC value obtained by using R samples. Similarly, the data having the DC removed are inputted to the buffer 1111 and the frequency offset estimator 1112 of the phase compensator 1110.

Figure 52:
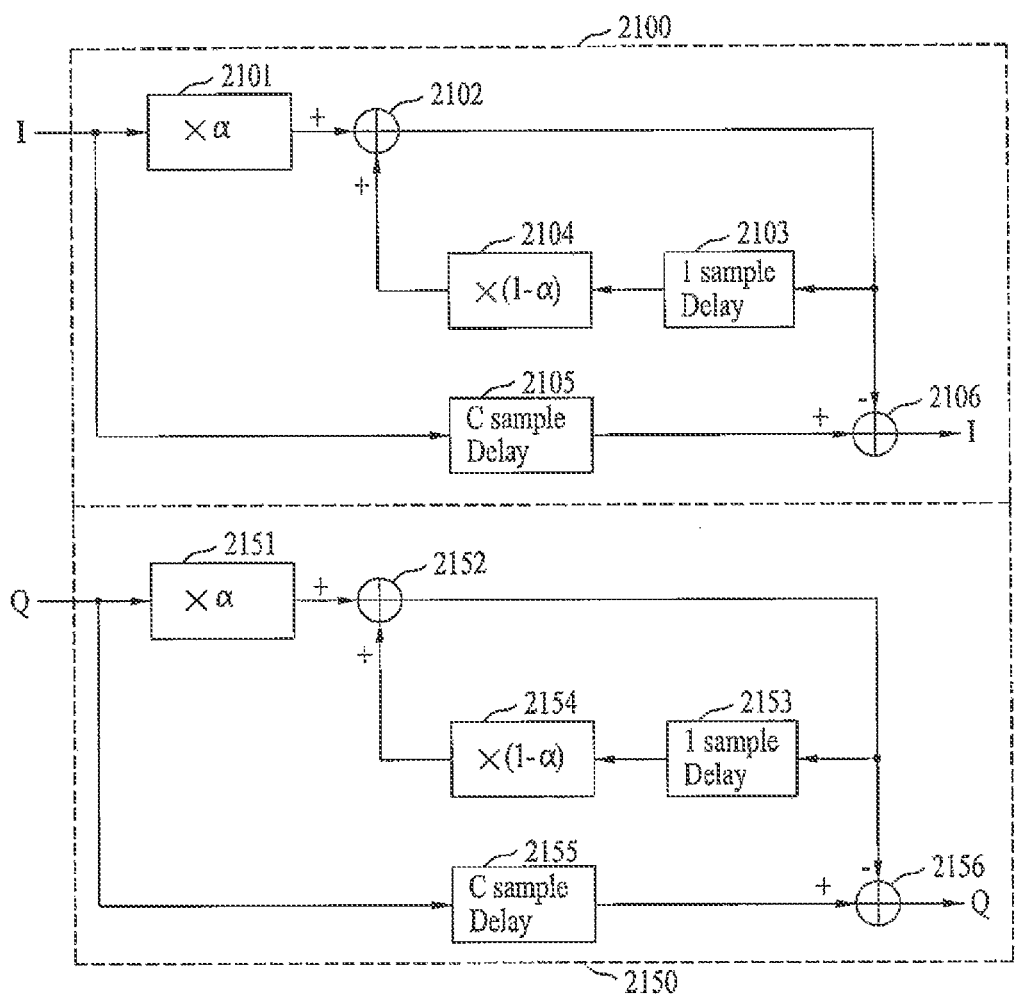
FIG. 52 illustrates a block diagram of a DC remover according to another embodiment of the present invention.

Meanwhile, FIG. 52 illustrates a detailed block diagram of a DC remover according to another embodiment of the present invention. Herein, identical signal processing processes are performed on each of a real number element (or in-phase (I)) and an imaginary number element (or a quadrature (Q)) of the inputted complex signal, thereby estimating and removing the DC value of each element. In order to do so, the DC remover shown in FIG. 52 includes a first DC estimator and remover 2100 and a second DC estimator and remover 2150. FIG. 52 corresponds to an infinite impulse response (IIR) structure.

Herein, the first DC estimator and remover 2100 includes a multiplier 2101, an adder 2102, a 1 sample delay 2103, a multiplier 2104, a C sample delay 2105, and a subtractor 2106. Also, the second DC estimator and remover 2150 includes a multiplier 2151, an adder 2152, a 1 sample delay 2153, a multiplier 2154, a C sample delay 2155, and a subtractor 2156. In the present invention, the first DC estimator and remover 2100 and the second DC estimator and remover 2150 may receive different input signals. However, each DC estimator and remover 2100 and 2150 has the same structure. Therefore, a detailed description of the first DC estimator and remover 2100 will be presented herein, and the second DC estimator and remover 2150 will be omitted for simplicity.

More specifically, the in-phase signal matched-filtered by the matched filter 1060 is inputted to the multiplier 2101 and the C sample delay 2105 of the first DC estimator and remover 2100 within the DC remover 1070. The multiplier 2101 multiplies a pre-determined constant α to the in-phase signal that is being inputted. Then, the multiplier 2101 outputs the multiplied result to the adder 2102. The adder 2102 adds the output of the multiplier 2101 to the output of the multiplier 2104 that is being fed-back. Thereafter, the adder 2102 outputs the added result to the 1 sample delay 2103 and the subtractor 2106. More specifically, the output of the adder 2102 corresponds to the estimated in-phase DC value.

The 1 sample delay 2103 delays the estimated DC value by 1 sample and outputs the DC value delayed by 1 sample to the multiplier 2104. The multiplier 2104 multiplies a pre-determined constant (1−α) to the DC value delayed by 1 sample. Then, the multiplier 2104 feeds-back the multiplied result to the adder 2102.

Subsequently, the C sample delay 2105 delays the in-phase sample data by C samples and, then, outputs the delayed in-phase sample data to the subtractor 2106. The subtractor 2106 subtracts the output of the adder 2102 from the output of the C sample delay 2105, thereby outputting the signal having the in-phase DC removed therefrom.

Similarly, the data having the DC removed are inputted to the buffer 1111 and the frequency offset estimator 1112 of the phase compensator 1110 of FIG. 39.

The frequency offset estimator 1112 uses the known sequence position indicator outputted from the known sequence detector and initial frequency offset estimator 1004-1 in order to estimate the frequency offset from the known data sequence that is being inputted, the known data sequence having the DC removed by the DC remover 1070. Then, the frequency offset estimator 1112 outputs the estimated frequency offset to the holder 1113. Similarly, the frequency offset estimation value is obtained at each repetition cycle of the known data sequence.

Therefore, the holder 1113 holds the frequency offset estimation value during a cycle period of the known data sequence and then outputs the frequency offset estimation value to the NCO 1114. The NCO 1114 generates a complex signal corresponding to the frequency offset held by the holder 1113 and outputs the generated complex signal to the multiplier 1115.

The multiplier 1115 multiplies the complex signal outputted from the NCO 1114 to the data being delayed by a set period of time in the buffer 1111, thereby compensating the phase change included in the delayed data. The data having the phase change compensated by the multiplier 1115 pass through the decimator 1200 so as to be inputted to the equalizer 1003. At this point, since the frequency offset estimated by the frequency offset estimator 1112 of the phase compensator 1110 does not pass through the loop filter, the estimated frequency offset indicates the phase difference between the known data sequences. In other words, the estimated frequency offset indicates a phase offset.

Channel Equalizer

The demodulated data using the known data in the demodulator 1002 is inputted to the channel equalizer 1003. The demodulated data is inputted to the known sequence detector 1004.

The equalizer 1003 may perform channel equalization by using a plurality of methods. An example of estimating a channel impulse response (CIR) so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and/or the field synchronization data, so as to estimate the CIR, the present invention may be able to perform channel equalization with more stability.

Herein, the data group that is inputted for the equalization process is divided into regions A to D, as shown in FIG. 5. More specifically, in the example of the present invention, each region A, B, C, and D are further divided into MPH blocks B4 to B7, MPH blocks B3 and B8, MPH blocks B2 and B9, MPH blocks B1 and B10, respectively.

More specifically, a data group can be assigned and transmitted a maximum the number of 4 in a VSB frame in the transmitting system. In this case, all data group do not include field synchronization data. In the present invention, the data group including the field synchronization data performs channel-equalization using the field synchronization data and known data. And the data group not including the field synchronization data performs channel-equalization using the known data. For example, the data of the MPH block B3 including the field synchronization data performs channel-equalization using the CIR calculated from the field synchronization data area and the CIR calculated from the first known data area. Also, the data of the MPH blocks B1 and B2 performs channel-equalization using the CIR calculated from the field synchronization data area and the CIR calculated from the first known data area. Meanwhile, the data of the MPH blocks B4 to B6 not including the field synchronization data performs channel-equalization using CIRS calculated from the first known data area and the third known data area.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(Q) of a function F(x) at a particular point Q and a value F(S) of the function F(x) at another particular point S are known, extrapolation refers to estimating a function value of a point outside of the section between points Q and S. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

Figure 53:
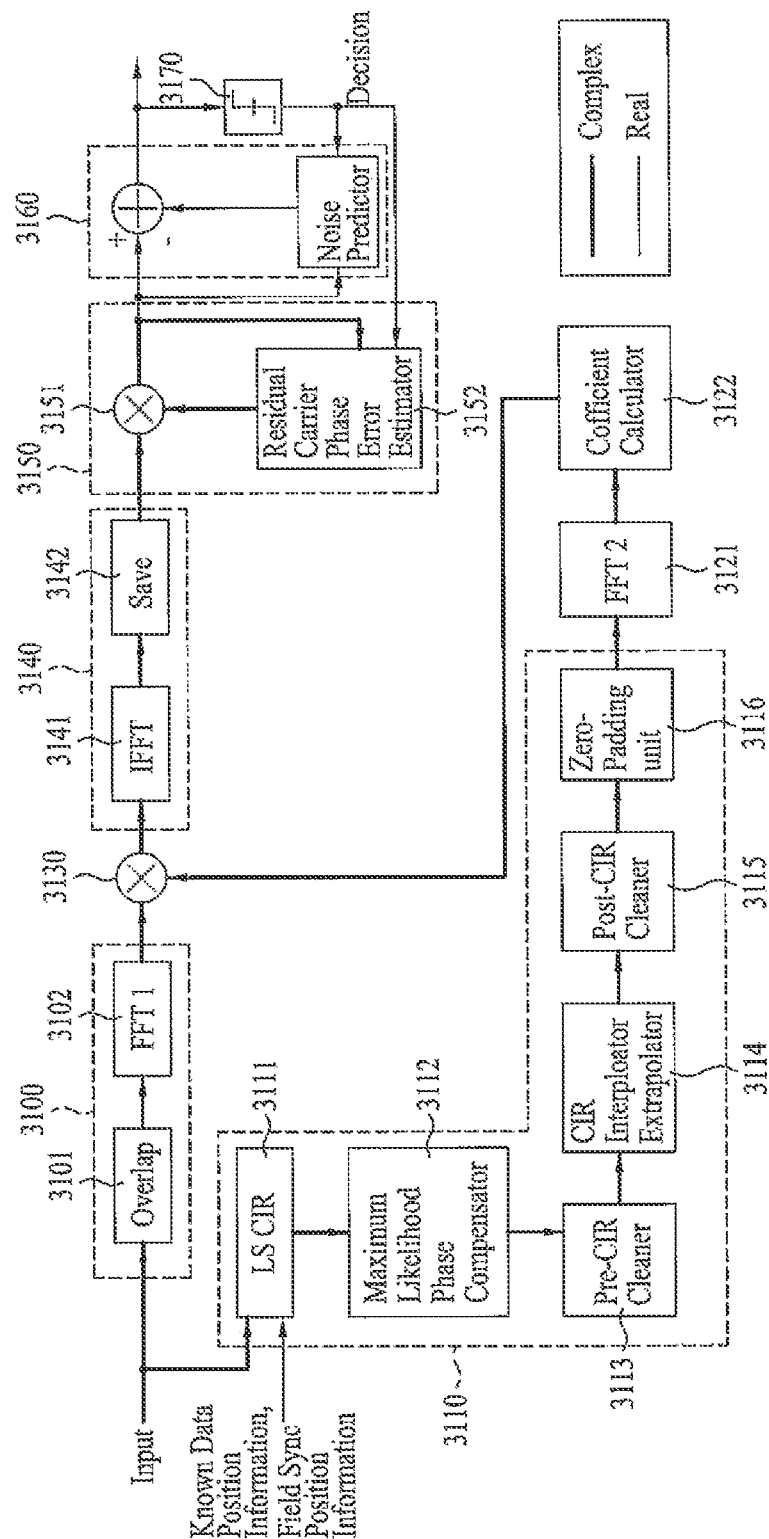
FIG. 53 illustrates a block diagram of another example of a channel equalizer according to the present invention.

FIG. 53 illustrates a block diagram of a channel equalizer according to another embodiment of the present invention. Herein, by estimating and compensating a remaining carrier phase error from a channel-equalized signal, the receiving system of the present invention may be enhanced. Referring to FIG. 53, the channel equalizer includes a first frequency domain converter 3100, a channel estimator 3110, a second frequency domain converter 3121, a coefficient calculator 3122, a distortion compensator 3130, a time domain converter 3140, a remaining carrier phase error remover 3150, a noise canceller (NC) 3160, and a decision unit 3170.

Herein, the first frequency domain converter 3100 includes an overlap unit 3101 overlapping inputted data, and a fast fourier transform (FFT) unit 3102 converting the data outputted from the overlap unit 3101 to frequency domain data.

The channel estimator 3110 includes a CIR estimator, a phase compensator 3112, a pre-CIR cleaner 3113, CIR interpolator/extrapolator 3114, a post-CIR cleaner, and a zero-padding unit.

The second frequency domain converter 3121 includes a fast fourier transform (FFT) unit converting the CIR being outputted from the channel estimator 3110 to frequency domain CIR.

The time domain converter 3140 includes an IFFT unit 3141 converting the data having the distortion compensated by the distortion compensator 3130 to time domain data, and a save unit 3142 extracting only valid data from the data outputted from the IFFT unit 3141.

The remaining carrier phase error remover 3150 includes an error compensator 3151 removing the remaining carrier phase error included in the channel equalized data, and a remaining carrier phase error estimator 3152 using the channel equalized data and the decision data of the decision unit 3170 so as to estimate the remaining carrier phase error, thereby outputting the estimated error to the error compensator 3151. Herein, any device performing complex number multiplication may be used as the distortion compensator 3130 and the error compensator 3151.

At this point, since the received data correspond to data modulated to VSB type data, 8-level scattered data exist only in the real number element. Therefore, referring to FIG. 53, all of the signals used in the noise canceller 3160 and the decision unit 3170 correspond to real number (or in-phase) signals. However, in order to estimate and compensate the remaining carrier phase error and the phase noise, both real number (in-phase) element and imaginary number (quadrature) element are required. Therefore, the remaining carrier phase error remover 3150 receives and uses the quadrature element as well as the in-phase element. Generally, prior to performing the channel equalization process, the demodulator 902 within the receiving system performs frequency and phase recovery of the carrier. However, if a remaining carrier phase error that is not sufficiently compensated is inputted to the channel equalizer, the performance of the channel equalizer may be deteriorated. Particularly, in a dynamic channel environment, the remaining carrier phase error may be larger than in a static channel environment due to the frequent and sudden channel changes. Eventually, this acts as an important factor that deteriorates the receiving performance of the present invention.

Furthermore, a local oscillator (not shown) included in the receiving system should preferably include a single frequency element. However, the local oscillator actually includes the desired frequency elements as well as other frequency elements. Such unwanted (or undesired) frequency elements are referred to as phase noise of the local oscillator. Such phase noise also deteriorates the receiving performance of the present invention. It is difficult to compensate such remaining carrier phase error and phase noise from the general channel equalizer. Therefore, the present invention may enhance the channel equaling performance by including a carrier recovery loop (i.e., a remaining carrier phase error remover 3150) in the channel equalizer, as shown in FIG. 53, in order to remove the remaining carrier phase error and the phase noise.

More specifically, the receiving data demodulated in FIG. 53 are overlapped by the overlap unit 3101 of the first frequency domain converter 3100 at a pre-determined overlapping ratio, which are then outputted to the FFT unit 3102. The FFT unit 3102 converts the overlapped time domain data to overlapped frequency domain data through by processing the data with FFT. Then, the converted data are outputted to the distortion compensator 3130.

The distortion compensator 3130 performs a complex number multiplication on the overlapped frequency domain data outputted from the FFT unit 3102 included in the first frequency domain converter 3100 and the equalization coefficient calculated from the coefficient calculator 3122, thereby compensating the channel distortion of the overlapped data outputted from the FFT unit 3102. Thereafter, the compensated data are outputted to the IFFT unit 3141 of the time domain converter 3140. The IFFT unit 3141 performs IFFT on the overlapped data having the channel distortion compensated, thereby converting the overlapped data to time domain data, which are then outputted to the error compensator 3151 of the remaining carrier phase error remover 3150.

The error compensator 3151 multiplies a signal compensating the estimated remaining carrier phase error and phase noise with the valid data extracted from the time domain. Thus, the error compensator 3151 removes the remaining carrier phase error and phase noise included in the valid data.

The data having the remaining carrier phase error compensated by the error compensator 3151 are outputted to the remaining carrier phase error estimator 3152 in order to estimate the remaining carrier phase error and phase noise and, at the same time, outputted to the noise canceller 3160 in order to remove (or cancel) the noise.

The remaining carrier phase error estimator 3152 uses the output data of the error compensator 3151 and the decision data of the decision unit 3170 to estimate the remaining carrier phase error and phase noise. Thereafter, the remaining carrier phase error estimator 3152 outputs a signal for compensating the estimated remaining carrier phase error and phase noise to the error compensator 3151. In this embodiment of the present invention, an inverse number of the estimated remaining carrier phase error and phase noise is outputted as the signal for compensating the remaining carrier phase error and phase noise.

Figure 54:
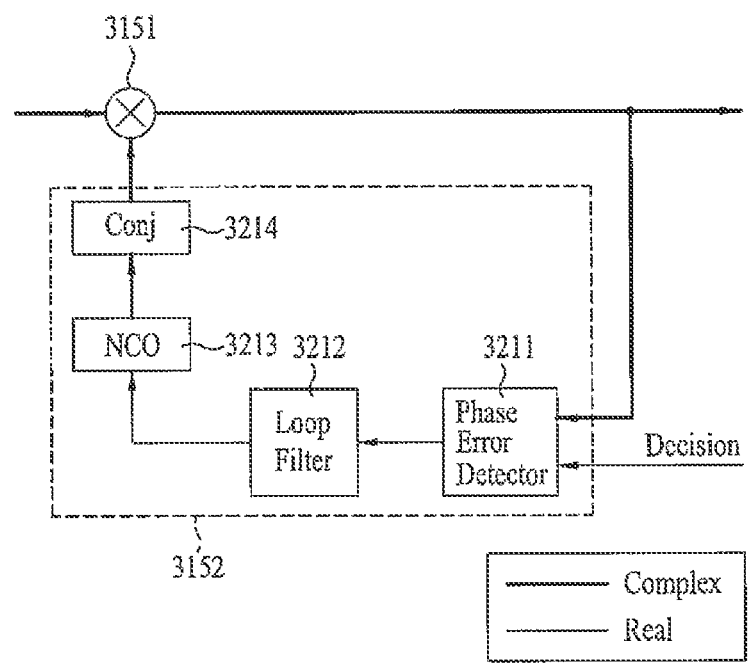
FIG. 54 illustrates a detailed block diagram of an example of a remaining carrier phase error estimator according to the present invention.

FIG. 54 illustrates a detailed block diagram of the remaining carrier phase error estimator 3152 according to an embodiment of the present invention. Herein, the remaining carrier phase error estimator 3152 includes a phase error detector 3211, a loop filter 3212, a numerically controlled oscillator (NCO) 3213, and a conjugator 3214. Referring to FIG. 54, the decision data, the output of the phase error detector 3211, and the output of the loop filter 3212 are all real number signals. And, the output of the error compensator 3151, the output of the NCO 3213, and the output of the conjugator 3214 are all complex number signals.

The phase error detector 3211 receives the output data of the error compensator 3151 and the decision data of the decision unit 3170 in order to estimate the remaining carrier phase error and phase noise. Then, the phase error detector 3211 outputs the estimated remaining carrier phase error and phase noise to the loop filter.

The loop filter 3212 then filters the remaining carrier phase error and phase noise, thereby outputting the filtered result to the NCO 3213. The NCO 3213 generates a cosine corresponding to the filtered remaining carrier phase error and phase noise, which is then outputted to the conjugator 3214.

The conjugator 3214 calculates the conjugate value of the cosine wave generated by the NCO 3213. Thereafter, the calculated conjugate value is outputted to the error compensator 3151. At this point, the output data of the conjugator 3214 becomes the inverse number of the signal compensating the remaining carrier phase error and phase noise. In other words, the output data of the conjugator 3214 becomes the inverse number of the remaining carrier phase error and phase noise.

The error compensator 3151 performs complex number multiplication on the equalized data outputted from the time domain converter 3140 and the signal outputted from the conjugator 3214 and compensating the remaining carrier phase error and phase noise, thereby removing the remaining carrier phase error and phase noise included in the equalized data. Meanwhile, the phase error detector 3211 may estimate the remaining carrier phase error and phase noise by using diverse methods and structures. According to this embodiment of the present invention, the remaining carrier phase error and phase noise are estimated by using a decision-directed method.

If the remaining carrier phase error and phase noise are not included in the channel-equalized data, the decision-directed phase error detector according to the present invention uses the fact that only real number values exist in the correlation values between the channel-equalized data and the decision data. More specifically, if the remaining carrier phase error and phase noise are not included, and when the input data of the phase error detector 3211 are referred to as $x_i+jx_q$, the correlation value between the input data of the phase error detector 3211 and the decision data may be obtained by using Equation 9 shown below:

$$E\{(x_i+jx_q)(\hat{x}_i+j\hat{x}_q)^*\} \qquad \text{Equation 9}$$

At this point, there is no correlation between $x_i$ and $x_q$. Therefore, the correlation value between $x_i$ and $x_q$ is equal to 0. Accordingly, if the remaining carrier phase error and phase noise are not included, only the real number values exist herein. However, if the remaining carrier phase error and phase noise are included, the real number element is shown in the imaginary number value, and the imaginary number element is shown in the real number value. Thus, in this case, the imaginary number element is shown in the correlation value. Therefore, it can be assumed that the imaginary number portion of the correlation value is in proportion with the remaining carrier phase error and phase noise. Accordingly, as shown in Equation 10 below, the imaginary number of the correlation value may be used as the remaining carrier phase error and phase noise.

$$\text{Phase Error} = \text{imag}\{(x_i+jx_q)(\hat{x}_i+j\hat{x}_q)^*\}$$

$$\text{Phase Error} = x_q\hat{x}_i - x_i\hat{x}_q \qquad \text{Equation 10}$$

Figure 55:
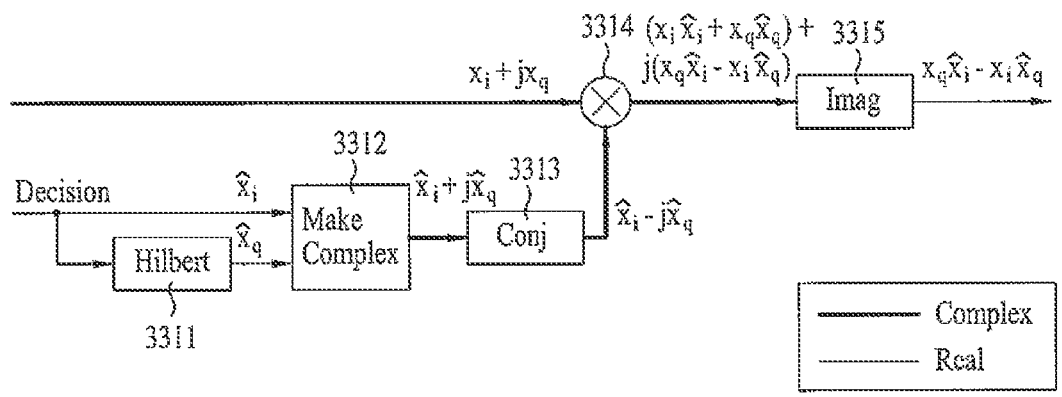
FIG. 55 illustrates a block diagram of a phase error detector obtaining a remaining carrier phase error and phase noise according to the present invention.

FIG. 55 illustrates a block diagram of a phase error detector 3211 obtaining the remaining carrier phase error and phase noise. Herein, the phase error detector 3211 includes a Hilbert converter 3311, a complex number configurator 3312, a conjugator 3313, a multiplier 3314, and a phase error output 3315. More specifically, the Hilbert converter 3311 creates an imaginary number decision data $\hat{x}_q$ by performing a Hilbert conversion on the decision value $\hat{x}_i$ of the decision unit 3170. The generated imaginary number decision value is then outputted to the complex number configurator 3312. The complex number configurator 3312 uses the decision data $\hat{x}_i$ and $\hat{x}_q$ to configure the complex number decision data $\hat{x}_i+j\hat{x}_q$, which are then outputted to the conjugator 3313. The conjugator 3313 conjugates the output of the complex number configurator 3312, thereby outputting the conjugated value to the multiplier 3314. The multiplier 3314 performs a complex number multiplication on the output data of the error compensator 3151 and the output data $\hat{x}_i-j\hat{x}_q$ of the conjugator 3313, thereby obtaining the correlation between the output data $x_i+jx_q$ of the error compensator 3151 and the decision value $\hat{x}_i-j\hat{x}_q$ of the decision unit 3170. The correlation data obtained from the multiplier 3314 are then inputted to the phase error output 3315. The phase error output 3315 outputs the imaginary number portion $x_q\hat{x}_i-x_i\hat{x}_q$ of the correlation data outputted from the multiplier 3314 as the remaining carrier phase error and phase noise.

The phase error detector shown in FIG. 55 is an example of a plurality of phase error detecting methods. Therefore, other types of phase error detectors may be used in the present invention. Therefore, the present invention is not limited only to the examples and embodiments presented in the description of the present invention. Furthermore, according to another embodiment of the present invention, at least 2 phase error detectors are combined so as to detect the remaining carrier phase error and phase noise.

Accordingly, the output of the remaining carrier phase error remover 3150 having the detected remaining carrier phase error and phase noise removed as described above, is configured of an addition of the original (or initial) signal having the channel equalization, the remaining carrier phase error and phase noise, and the signal corresponding to a white noise being amplified to a colored noise during the channel equalization.

Therefore, the noise canceller 3160 receives the output data of the remaining carrier phase error remover 3150 and the decision data of the decision unit 3170, thereby estimating the colored noise. Then, the noise canceller 3160 subtracts the estimated colored noise from the data having the remaining carrier phase error and phase noise removed therefrom, thereby removing the noise amplified during the equalization process.

In order to do so, the noise canceller 3160 includes a subtractor and a noise predictor. More specifically, the subtractor subtracts the noise predicted by the noise predictor from the output data of the residual carrier phase error estimator 3150. Then, the subtractor outputs the signal from which amplified noise is cancelled (or removed) for data recovery and, simultaneously, outputs the same signal to the decision unit 3170. The noise predictor calculates a noise element by subtracting the output of the decision unit 3170 from the signal having residual carrier phase error removed therefrom by the residual carrier phase error estimator 3150. Thereafter, the noise predictor uses the calculated noise element as input data of a filter included in the noise predictor. Also, the noise predictor uses the filter (not shown) in order to predict any color noise element included in the output symbol of the residual carrier phase error estimator 3150. Accordingly, the noise predictor outputs the predicted color noise element to the subtractor.

The data having the noise removed (or cancelled) by the noise canceller 3160 are outputted for the data decoding process and, at the same time, outputted to the decision unit 3170.

The decision unit 3170 selects one of a plurality of predetermined decision data sets (e.g., 8 decision data sets) that is most approximate to the output data of the noise canceller 3160, thereby outputting the selected data to the remaining carrier phase error estimator 3152 and the noise canceller 3160.

Meanwhile, the received data are inputted to the overlap unit 3101 of the first frequency domain converter 3100 included in the channel equalizer and, at the same time, inputted to the CIR estimator 3111 of the channel estimator 3110.

The CIR estimator 3111 uses a training sequence, for example, data being inputted during the known data section and the known data in order to estimate the CIR, thereby outputting the estimated CIR to the phase compensator 3112. If the data to be channel-equalizing is the data within the data group including field synchronization data, the training sequence using in the CIR estimator 3111 may become the field synchronization data and known data. Meanwhile, if the data to be channel-equalizing is the data within the data group not including field synchronization data, the training sequence using in the CIR estimator 3111 may become only the known data.

For example, the CIR estimator 3111 estimates CIR using the known data correspond to reference known data generated during the known data section by the receiving system in accordance with an agreement between the receiving system and the transmitting system. For this, the CIR estimator 3111 is provided known data position information from the known sequence detector 1004. Also the CIR estimator 3111 may be provided field synchronization position information from the known sequence detector 1004.

Furthermore, in this embodiment of the present invention, the CIR estimator 3111 estimates the CIR by using the least square (LS) method.

The LS estimation method calculates a cross correlation value p between the known data that have passed through the channel during the known data section and the known data that are already known by the receiving end. Then, a cross correlation matrix R of the known data is calculated. Subsequently, a matrix operation is performed on $R^{-1} \cdot p$ so that the cross correlation portion within the cross correlation value p between the received data and the initial known data, thereby estimating the CIR of the transmission channel.

The phase compensator 3112 compensates the phase change of the estimated CIR. Then, the phase compensator 3112 outputs the compensated CIR to the linear interpolator 3113. At this point, the phase compensator 3112 may compensate the phase change of the estimated CIR by using a maximum likelihood method.

More specifically, the remaining carrier phase error and phase noise that are included in the demodulated received data and, therefore, being inputted change the phase of the CIR estimated by the CIR estimator 3111 at a cycle period of one known data sequence. At this point, if the phase change of the inputted CIR, which is to be used for the linear interpolation process, is not performed in a linear form due to a high rate of the phase change, the channel equalizing performance of the present invention may be deteriorated when the channel is compensated by calculating the equalization coefficient from the CIR, which is estimated by a linear interpolation method.

Therefore, the present invention removes (or cancels) the amount of phase change of the CIR estimated by the CIR estimator 3111 so that the distortion compensator 3130 allows the remaining carrier phase error and phase noise to bypass the distortion compensator 3130 without being compensated. Accordingly, the remaining carrier phase error and phase noise are compensated by the remaining carrier phase error remover 3150.

For this, the present invention removes (or cancels) the amount of phase change of the CIR estimated by the phase compensator 3112 by using a maximum likelihood method.

The basic idea of the maximum likelihood method relates to estimating a phase element mutually (or commonly) existing in all CIR elements, then to multiply the estimated CIR with an inverse number of the mutual (or common) phase element, so that the channel equalizer, and most particularly, the distortion compensator 3130 does not compensate the mutual phase element.

More specifically, when the mutual phase element is referred to as θ, the phase of the newly estimated CIR is rotated by θ as compared to the previously estimated CIR. When the CIR of a point t is referred to as $h_i(t)$, the maximum likelihood phase compensation method obtains a phase $\theta_{ML}$ corresponding to when $h_i(t)$ is rotated by θ, the squared value of the difference between the CIR of $h_i(t)$ and the CIR of $h_i(t+1)$, i.e., the CIR of a point (t+1), becomes a minimum value. Herein, when i represents a tap of the estimated CIR, and when N represents a number of taps of the CIR being estimated by the CIR estimator 3111, the value of $\theta_{ML}$ is equal to or greater than 0 and equal to or less than N−1. This value may be calculated by using Equation 11 shown below:

$$\theta_{ML} = \min_{\theta} \sum_{i=0}^{N-1} |h_i(t)e^{j\theta} - h_i(t+1)|^2 \qquad \text{Equation 11}$$

Herein, in light of the maximum likelihood method, the mutual phase element $\theta_{ML}$ is equal to the value of θ, when the right side of Equation 11 being differentiated with respect to θ is equal to 0. The above-described condition is shown in Equation 12 below:

$$\begin{aligned}
\frac{d}{d\theta} &= \sum_{i=0}^{N-1} |h_i(t)e^{j\theta} - h_i(t+1)|^2 \qquad \text{Equation 12}\\
&= \frac{d}{d\theta} \sum_{i=0}^{N-1} (h_i(t)e^{j\theta} - h_i(t+1))(h_i(t)e^{j\theta} - h_i(t+1))^*\\
&= \frac{d}{d\theta} \sum_{i=0}^{N-1} \left\{ \begin{array}{c} |h_i(t)|^2 + |h_{i+1}(t)|^2 - h_i(t)h_i^*(t+1)e^{j\theta} - \\ h_i^*(t)h_i(t+1)e^{-j\theta} \end{array} \right\}\\
&= \sum_{i=0}^{N-1} \{jh_i^*(t)h_i(t+1)e^{-j\theta} - jh_i^*(t)h_i(t+1)e^{j\theta}\}\\
&= j\sum_{i=0}^{N-1} 2\text{Im}\{h_i^*(t)h_i(t+1)e^{-j\theta}\} = 0
\end{aligned}$$

The above Equation 12 may be simplified as shown in Equation 13 below:

$$\text{Im}\left\{e^{-j\theta} \sum_{i=0}^{N-1} \{h_i^*(t)h_i(t+1)\}\right\} = 0 \qquad \text{Equation 13}$$

$$\theta_{ML} = \arg\left(\sum_{i=0}^{N-1} h_i^*(t)h_i(t+1)\right)$$

More specifically, Equation 13 corresponds to the $\theta_{ML}$ value that is to be estimated by the argument of the correlation value between $h_i(t)$ and $h_i(t+1)$.

Figure 56:
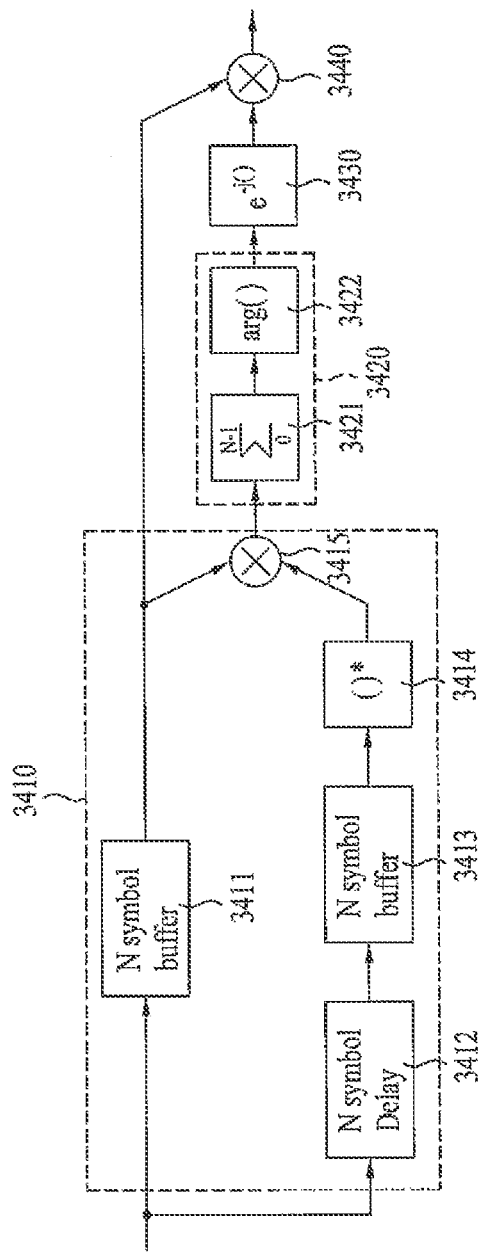
FIG. 56 illustrates a phase compensator according to an embodiment of the present invention.

FIG. 56 illustrates a phase compensator according to an embodiment of the present invention, wherein the mutual phase element $\theta_{ML}$ is calculated as described above, and wherein the estimated phase element is compensated at the estimated CIR. Referring to FIG. 56, the phase compensator includes a correlation calculator 3410, a phase change estimator 3420, a compensation signal generator 3430, and a multiplier 3440.

The correlation calculator 3410 includes a first N symbol buffer 3411, an N symbol delay 3412, a second N symbol buffer 3413, a conjugator 3414, and a multiplier 3415. More specifically, the first N symbol buffer 3411 included in the correlation calculator 3410 is capable of storing the data being inputted from the CIR estimator 3111 in symbol units to a maximum limit of N number of symbols. The symbol data being temporarily stored in the first N symbol buffer 3411 are then inputted to the multiplier 3415 included in the correlation calculator 3410 and to the multiplier 3440.

At the same time, the symbol data being outputted from the CIR estimator 3111 are delayed by N symbols from the N symbol delay 3412. Then, the delayed symbol data pass through the second N symbol buffer 3413 and inputted to the conjugator 3414, so as to be conjugated and then inputted to the multiplier 3415.

The multiplier 3415 multiplies the output of the first N symbol buffer 3411 and the output of the conjugator 3414. Then, the multiplier 3415 outputs the multiplied result to an accumulator 3421 included in the phase change estimator 3420.

More specifically, the correlation calculator 3410 calculates a correlation between a current CIR $h_i(t+1)$ having the length of N and a previous CIR $h_i(t)$ also having the length of N. Then, the correlation calculator 3410 outputs the calculated correlation value to the accumulator 3421 of the phase change estimator 3420.

The accumulator 3421 accumulates the correlation values outputted from the multiplier 3415 during an N symbol period. Then, the accumulator 3421 outputs the accumulated value to the phase detector 3422. The phase detector 3422 then calculates a mutual phase element $\theta_{ML}$ from the output of the accumulator 3421 as shown in the above-described Equation 11. Thereafter, the calculated $\theta_{ML}$ value is outputted to the compensation signal generator 3430.

The compensation signal generator 3430 outputs a complex signal $e^{-j\theta_{ML}}$ having a phase opposite to that of the detected phase as the phase compensation signal to the multiplier 3440. The multiplier 3440 multiplies the current CIR $h_i(t+1)$ being outputted from the first N symbol buffer 3411 with the phase compensation signal $e^{-j\theta_{ML}}$, thereby removing the amount of phase change of the estimated CIR.

The CIR having its phase change compensated, as described above, passes through a first cleaner (or pre-CIR cleaner) 3113 or bypasses the first cleaner 3113, thereby being inputted to a CIR calculator (or CIR interpolator-extrapolator) 3114. The CIR interpolator-extrapolator 3114 either interpolates or extrapolates an estimated CIR, which is then outputted to a second cleaner (or post-CIR cleaner) 3115. Herein, the estimated CIR corresponds to a CIR having its phase change compensated. The first cleaner 3113 may or may not operate depending upon whether the CIR interpolator-extrapolator 3114 interpolates or extrapolates the estimated CIR. For example, if the CIR interpolator-extrapolator 3114 interpolates the estimated CIR, the first cleaner 3113 does not operate. Conversely, if the CIR interpolator-extrapolator 3114 extrapolates the estimated CIR, the first cleaner 3113 operates.

More specifically, the CIR estimated from the known data includes a channel element that is to be obtained as well as a jitter element caused by noise. Since such jitter element deteriorates the performance of the equalizer, it preferable that a coefficient calculator 3122 removes the jitter element before using the estimated CIR. Therefore, according to the embodiment of the present invention, each of the first and second cleaners 3113 and 3115 removes a portion of the estimated CIR having a power level lower than the predetermined threshold value (i.e., so that the estimated CIR becomes equal to '0'). Herein, this removal process will be referred to as a "CIR cleaning" process.

The CIR interpolator-extrapolator 3114 performs CIR interpolation by multiplying a CIR estimated from the CIR estimator 3112 by a coefficient and by multiplying a CIR having its phase change compensated from the phase compensator (or maximum likelihood phase compensator) 3112 by another coefficient, thereby adding the multiplied values. At this point, some of the noise elements of the CIR may be added to one another, thereby being cancelled. Therefore, when the CIR interpolator-extrapolator 3114 performs CIR interpolation, the original (or initial) CIR having noise elements remaining therein. In other words, when the CIR interpolator-extrapolator 3114 performs CIR interpolation, an estimated CIR having its phase change compensated by the phase compensator 3112 bypasses the first cleaner 3113 and is inputted to the CIR interpolator-extrapolator 3114. Subsequently, the second cleaner 3115 cleans the CIR interpolated by the CIR interpolator-extrapolator 3114.

Conversely, the CIR interpolator-extrapolator 3114 performs CIR extrapolation by using a difference value between two CIRs, each having its phase change compensated by the phase compensator 3112, so as to estimate a CIR positioned outside of the two CIRs. Therefore, in this case, the noise element is rather amplified. Accordingly, when the CIR interpolator-extrapolator 3114 performs CIR extrapolation, the CIR cleaned by the first cleaner 3113 is used. More specifically, when the CIR interpolator-extrapolator 3114 performs CIR extrapolation, the extrapolated CIR passes through the second cleaner 3115, thereby being inputted to the zero-padding unit 3116.

Meanwhile, when a second frequency domain converter (or fast fourier transform (FFT2)) 3121 converts the CIR, which has been cleaned and outputted from the second cleaner 3115, to a frequency domain, the length and of the inputted CIR and the FFT size may not match (or be identical to one another). In other words, the CIR length may be smaller than the FFT size. In this case, the zero-padding unit 3116 adds a number of zeros '0's corresponding to the difference between the FFT size and the CIR length to the inputted CIR, thereby outputting the processed CIR to the second frequency domain converter (FFT2) 3121. Herein, the zero-padded CIR may correspond to one of the interpolated CIR, extrapolated CIR, and the CIR estimated in the known data section.

The second frequency domain converter 3121 performs FFT on the CIR being outputted from the zero padding unit 3116, thereby converting the CIR to a frequency domain CIR. Then, the second frequency domain converter 3121 outputs the converted CIR to the coefficient calculator 3122.

The coefficient calculator 3122 uses the frequency domain CIR being outputted from the second frequency domain converter 3121 to calculate the equalization coefficient. Then, the coefficient calculator 3122 outputs the calculated coefficient to the distortion compensator 3130. Herein, for example, the coefficient calculator 3122 calculates a channel equalization coefficient of the frequency domain that can provide minimum mean square error (MMSE) from the CIR of the frequency domain, which is outputted to the distortion compensator 3130.

The distortion compensator 3130 performs a complex number multiplication on the overlapped data of the frequency domain being outputted from the FFT unit 3102 of the first frequency domain converter 3100 and the equalization coefficient calculated by the coefficient calculator 3122, thereby compensating the channel distortion of the overlapped data being outputted from the FFT unit 3102.

Figure 57:
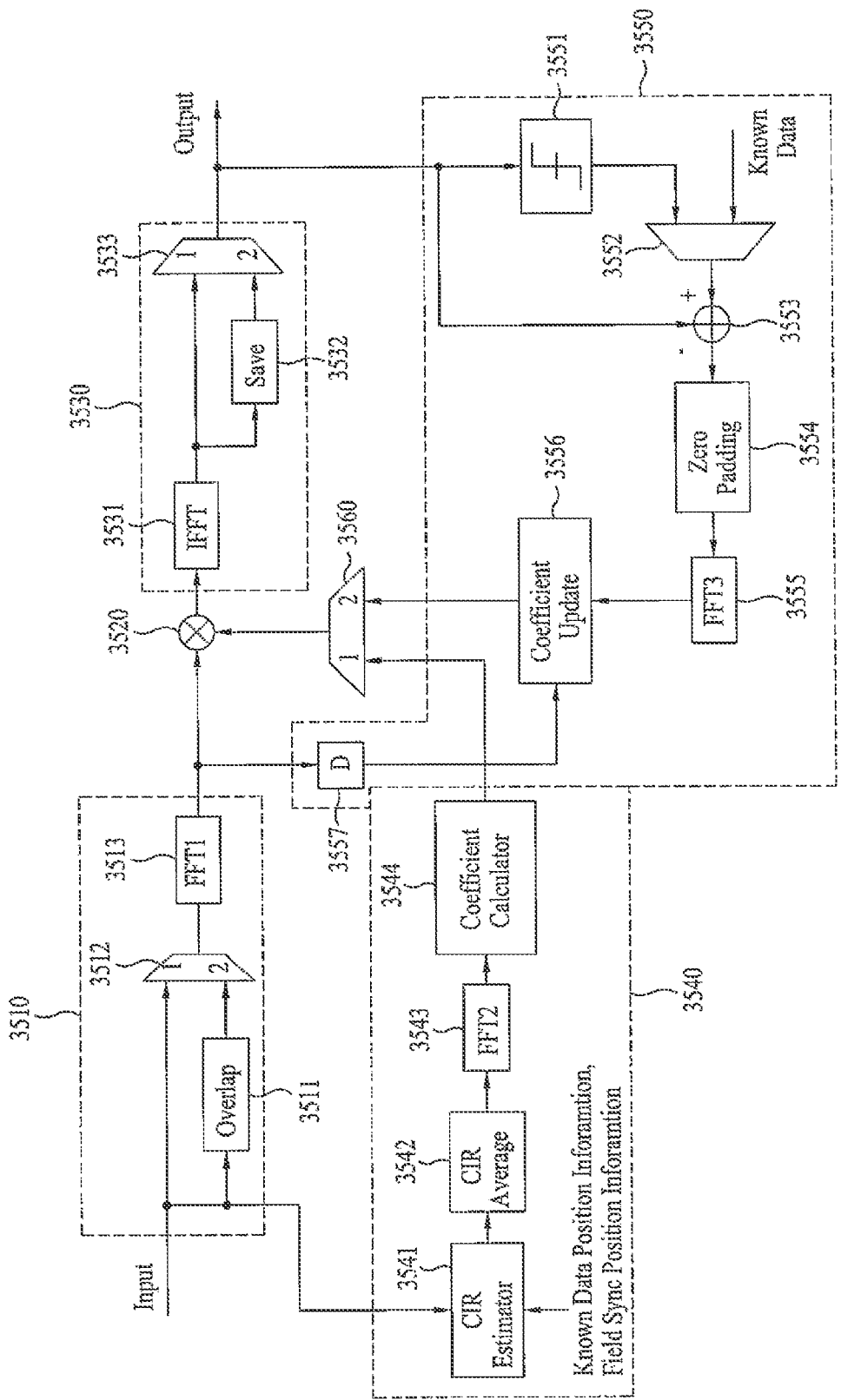
FIG. 57 illustrates a block diagram of another example of a channel equalizer according to the present invention.

FIG. 57 illustrates a block diagram of a channel equalizer according to another embodiment of the present invention. In other words, FIG. 57 illustrates a block diagram showing another example of a channel equalizer by using different CIR estimation and application methods in accordance with regions A, B, C, and D, when the data group is divided into the structure shown in FIG. 5.

More specifically, as shown in FIG. 5, known data that are sufficiently are being periodically transmitted in regions A/B (i.e., MPH blocks B3 to B8). Therefore, an indirect equalizing method using the CIR may be used herein. However, in regions C/D (i.e., MPH blocks B1, B2, B9, and B10), the known data are neither able to be transmitted at a sufficiently long length nor able to be periodically and equally transmitted. Therefore, it is inadequate to estimate the CIR by using the known data. Accordingly, in regions C/D, a direct equalizing method in which an error is obtained from the output of the equalizer, so as to update the coefficient.

The examples presented in the embodiments of the present invention shown in FIG. 57 include a method of performing indirect channel equalization by using a cyclic prefix on the data of regions A/B, and a method of performing direct channel equalization by using an overlap & save method on the data of regions C/D.

Accordingly, referring to FIG. 57, the frequency domain channel equalizer includes a frequency domain converter 3510, a distortion compensator 3520, a time domain converter 3530, a first coefficient calculating unit 3540, a second coefficient calculating unit 3550, and a coefficient selector 3560.

Herein, the frequency domain converter 3510 includes an overlap unit 3511, a select unit 3512, and a first FFT unit 3513.

The time domain converter 3530 includes an IFFT unit 3531, a save unit 3532, and a select unit 3533.

The first coefficient calculating unit 3540 includes a CIR estimator 3541, an average calculator 3542, and second FFT unit 3543, and a coefficient calculator 3544.

The second coefficient calculating unit 3550 includes a decision unit 3551, a select unit 3552, a subtractor 3553, a zero-padding unit 3554, a third FFT unit 3555, a coefficient updater 3556, and a delay unit 3557.

Also, a multiplexer (MUX), which selects data that are currently being inputted as the input data depending upon whether the data correspond to regions A/B or to regions C/D, may be used as the select unit 3512 of the frequency domain converter 3510, the select unit 3533 of the time domain converter 3530, and the coefficient selector 3560.

In the channel equalizer having the above-described structure, as shown in FIG. 57, if the data being inputted correspond to the data of regions A/B, the select unit 3512 of the frequency domain converter 3510 selects the input data and not the output data of the overlap unit 3511. In the same case, the select unit 3533 of the time domain converter 3530 selects the output data of the IFFT unit 3531 and not the output data of the save unit 3532. The coefficient selector 3560 selects the equalization coefficient being outputted from the first coefficient calculating unit 3540.

Conversely, if the data being inputted correspond to the data of regions C/D, the select unit 3512 of the frequency domain converter 3510 selects the output data of the overlap unit 3511 and not the input data. In the same case, the select unit 3533 of the time domain converter 3530 selects the output data of the save unit 3532 and not the output data of the IFFT unit 3531. The coefficient selector 3560 selects the equalization coefficient being outputted from the second coefficient calculating unit 3550.

More specifically, the received data are inputted to the overlap unit 3511 and select unit 3512 of the frequency domain converter 3510, and to the first coefficient calculating unit 3540. If the inputted data correspond to the data of regions A/B, the select unit 3512 selects the received data, which are then outputted to the first FFT unit 3513. On the other hand, if the inputted data correspond to the data of regions C/D, the select unit 3512 selects the data that are overlapped by the overlap unit 3513 and are, then, outputted to the first FFT unit 3513. The first FFT unit 3513 performs FFT on the time domain data that are outputted from the select unit 3512, thereby converting the time domain data to frequency domain data. Then, the converted data are outputted to the distortion compensator 3520 and the delay unit 3557 of the second coefficient calculating unit 3550.

The distortion compensator 3520 performs complex multiplication on frequency domain data outputted from the first FFT unit 3513 and the equalization coefficient outputted from the coefficient selector 3560, thereby compensating the channel distortion detected in the data that are being outputted from the first FFT unit 3513.

Thereafter, the distortion-compensated data are outputted to the IFFT unit 3531 of the time domain converter 3530. The IFFT unit 3531 of the time domain converter 3530 performs IFFT on the channel-distortion-compensated data, thereby converting the compensated data to time domain data. The converted data are then outputted to the save unit 3532 and the select unit 3533. If the inputted data correspond to the data of regions A/B, the select unit 3533 selects the output data of the IFFT unit 3531. On the other hand, if the inputted data correspond to regions C/D, the select unit 3533 selects the valid data extracted from the save unit 3532. Thereafter, the selected data are outputted to be decoded and, simultaneously, outputted to the second coefficient calculating unit 3550.

The CIR estimator 3541 of the first coefficient calculating unit 3540 uses the data being received during the known data section and the known data of the known data section, the known data being already known by the receiving system in accordance with an agreement between the receiving system and the transmitting system, in order to estimate the CIR. Subsequently, the estimated CIR is outputted to the average calculator 3542. The average calculator 3542 calculates an average value of the CIRs that are being inputted consecutively. Then, the calculated average value is outputted to the second FFT unit 3543. For example, referring to FIG. 37, the average value of the CIR value estimated at point T1 and the CIR value estimated at point T2 is used for the channel equalization process of the general data existing between point T1 and point T2. Accordingly, the calculated average value is outputted to the second FFT unit 3543.

The second FFT unit 3543 performs FFT on the CIR of the time domain that is being inputted, so as to convert the inputted CIR to a frequency domain CIR. Thereafter, the converted frequency domain CIR is outputted to the coefficient calculator 3544. The coefficient calculator 3544 calculates a frequency domain equalization coefficient that satisfies the condition of using the CIR of the frequency domain so as to minimize the mean square error. The calculated equalizer coefficient of the frequency domain is then outputted to the coefficient calculator 3560.

The decision unit 3551 of the second coefficient calculating unit 3550 selects one of a plurality of decision values (e.g., 8 decision values) that is most approximate to the equalized data and outputs the selected decision value to the select unit 3552. Herein, a multiplexer may be used as the select unit 3552. In a general data section, the select unit 3552 selects the decision value of the decision unit 3551. Alternatively, in a known data section, the select unit 3552 selects the known data and outputs the selected known data to the subtractor 3553. The subtractor 3553 subtracts the output of the select unit 3533 included in the time domain converter 3530 from the output of the select unit 652 so as to calculate (or obtain) an error value. Thereafter, the calculated error value is outputted to the zero-padding unit 3554.

The zero-padding unit 3554 adds (or inserts) the same amount of zeros (0) corresponding to the overlapped amount of the received data in the inputted error. Then, the error extended with zeros (0) is outputted to the third FFT unit 3555. The third FFT unit 3555 converts the error of the time domain having zeros (0) added (or inserted) therein, to the error of the frequency domain. Thereafter, the converted error is outputted to the coefficient update unit 3556. The coefficient update unit 3556 uses the received data of the frequency domain that have been delayed by the delay unit 3557 and the error of the frequency domain so as to update the previous equalization coefficient. Thereafter, the updated equalization coefficient is outputted to the coefficient selector 3560.

At this point, the updated equalization coefficient is stored so as that it can be used as a previous equalization coefficient in a later process. If the input data correspond to the data of regions A/B, the coefficient selector 3560 selects the equalization coefficient calculated from the first coefficient calculating unit 3540. On the other hand, if the input data correspond to the data of regions C/D, the coefficient selector 3560 selects the equalization coefficient updated by the second coefficient calculating unit 3550. Thereafter, the selected equalization coefficient is outputted to the distortion compensator 3520.

Figure 58:
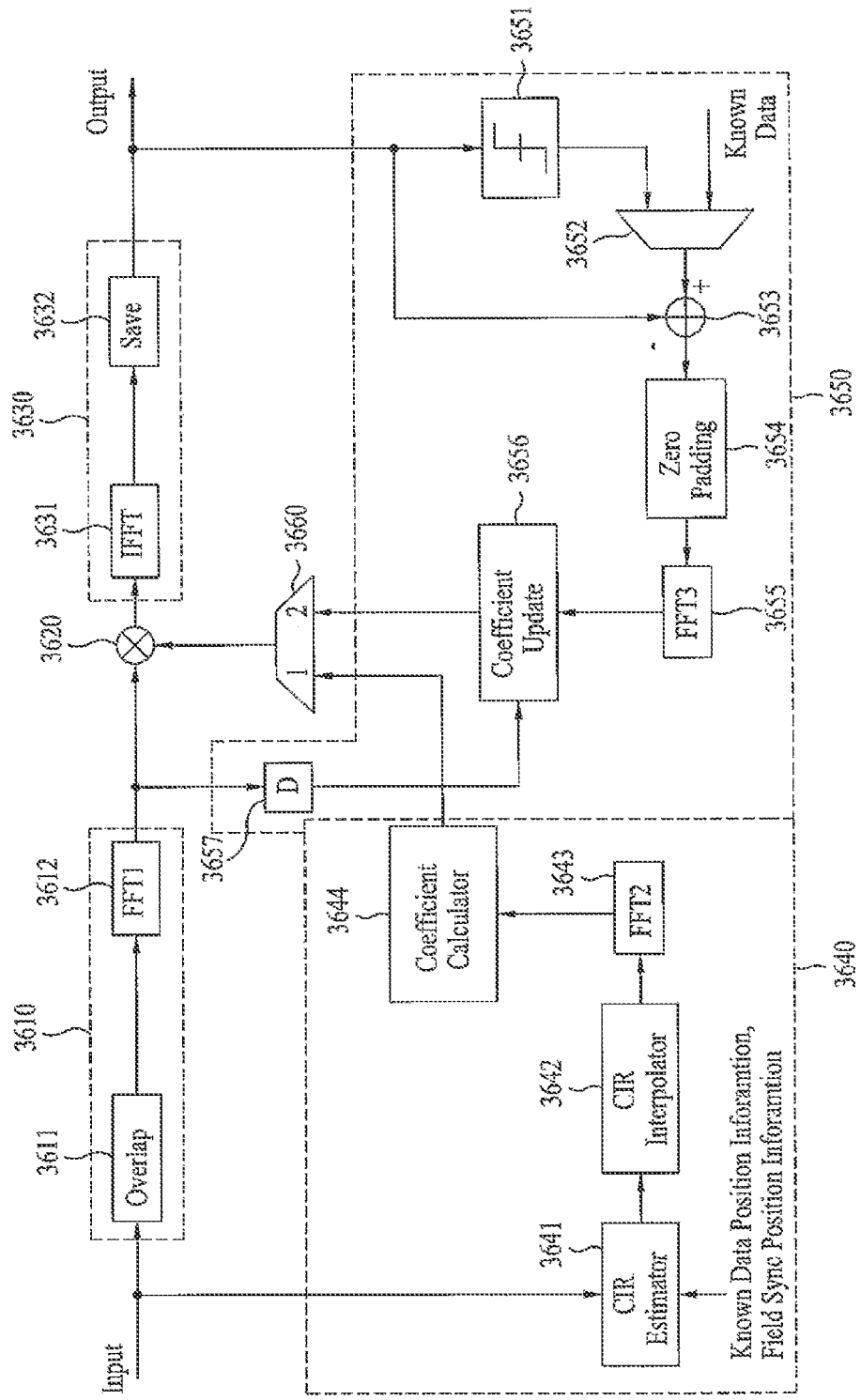
FIG. 58 illustrates a block diagram of another example of a channel equalizer according to the present invention.

FIG. 58 illustrates a block diagram of a channel equalizer according to another embodiment of the present invention. In other words, FIG. 58 illustrates a block diagram showing another example of a channel equalizer by using different CIR estimation and application methods in accordance with regions A, B, C, and D, when the data group is divided into the structure shown in FIG. 5. In this example, a method of performing indirect channel equalization by using an overlap & save method on the data of regions A/B, and a method of performing direct channel equalization by using an overlap & save method on the data of regions C/D are illustrated.

Accordingly, referring to FIG. 58, the frequency domain channel equalizer includes a frequency domain converter 3610, a distortion compensator 3620, a time domain converter 3630, a first coefficient calculating unit 3640, a second coefficient calculating unit 3650, and a coefficient selector 3660.

Herein, the frequency domain converter 3610 includes an overlap unit 3611 and a first FFT unit 3612.

The time domain converter 3630 includes an IFFT unit 3631 and a save unit 3632.

The first coefficient calculating unit 3640 includes a CIR estimator 3641, an interpolator 3642, a second FFT unit 3643, and a coefficient calculator 3644.

The second coefficient calculating unit 3650 includes a decision unit 3651, a select unit 3652, a subtractor 3653, a zero-padding unit 3654, a third FFT unit 3655, a coefficient updater 3656, and a delay unit 3657.

Also, a multiplexer (MUX), which selects data that are currently being inputted as the input data depending upon whether the data correspond to regions A/B or to regions C/D, may be used as the coefficient selector 3660. More specifically, if the input data correspond to the data of regions A/B, the coefficient selector 3660 selects the equalization coefficient calculated from the first coefficient calculating unit 3640. On the other hand, if the input data correspond to the data of regions C/D, the coefficient selector 3660 selects the equalization coefficient updated by the second coefficient calculating unit 3650.

In the channel equalizer having the above-described structure, as shown in FIG. 58, the received data are inputted to the overlap unit 3611 of the frequency domain converter 3610 and to the first coefficient calculating unit 3640. The overlap unit 3611 overlaps the input data to a pre-determined overlapping ratio and outputs the overlapped data to the first FFT unit 3612. The first FFT unit 3612 performs FFT on the overlapped time domain data, thereby converting the overlapped time domain data to overlapped frequency domain data. Then, the converted data are outputted to the distortion compensator 3620 and the delay unit 3657 of the second coefficient calculating unit 3650.

The distortion compensator 3620 performs complex multiplication on the overlapped frequency domain data outputted from the first FFT unit 3612 and the equalization coefficient outputted from the coefficient selector 3660, thereby compensating the channel distortion detected in the overlapped data that are being outputted from the first FFT unit 3612. Thereafter, the distortion-compensated data are outputted to the IFFT unit 3631 of the time domain converter 3630. The IFFT unit 3631 of the time domain converter 3630 performs IFFT on the distortion-compensated data, thereby converting the compensated data to overlapped time domain data. The converted overlapped data are then outputted to the save unit 3632. The save unit 3632 extracts only the valid data from the overlapped time domain data, which are then outputted for data decoding and, at the same time, outputted to the second coefficient calculating unit 3650 in order to update the coefficient.

The CIR estimator 3641 of the first coefficient calculating unit 3640 uses the data received during the known data section and the known data in order to estimate the CIR. Subsequently, the estimated CIR is outputted to the interpolator 3642. The interpolator 3642 uses the inputted CIR to estimate the CIRs (i.e., CIRs of the region that does not include the known data) corresponding to the points located between the estimated CIRs according to a predetermined interpolation method. Thereafter, the estimated result is outputted to the second FFT unit 3643. The second FFT unit 3643 performs FFT on the inputted CIR, so as to convert the inputted CIR to a frequency domain CIR. Thereafter, the converted frequency domain CIR is outputted to the coefficient calculator 3644. The coefficient calculator 3644 calculates a frequency domain equalization coefficient that satisfies the condition of using the CIR of the frequency domain so as to minimize the mean square error. The calculated equalizer coefficient of the frequency domain is then outputted to the coefficient calculator 3660.

The structure and operations of the second coefficient calculating unit 3650 is identical to those of the second coefficient calculating unit 3550 shown in FIG. 57. Therefore, the description of the same will be omitted for simplicity.

If the input data correspond to the data of regions A/B, the coefficient selector 3660 selects the equalization coefficient calculated from the first coefficient calculating unit 3640. On the other hand, if the input data correspond to the data of regions C/D, the coefficient selector 3660 selects the equalization coefficient updated by the second coefficient calculating unit 3650. Thereafter, the selected equalization coefficient is outputted to the distortion compensator 3620.

Figure 59:
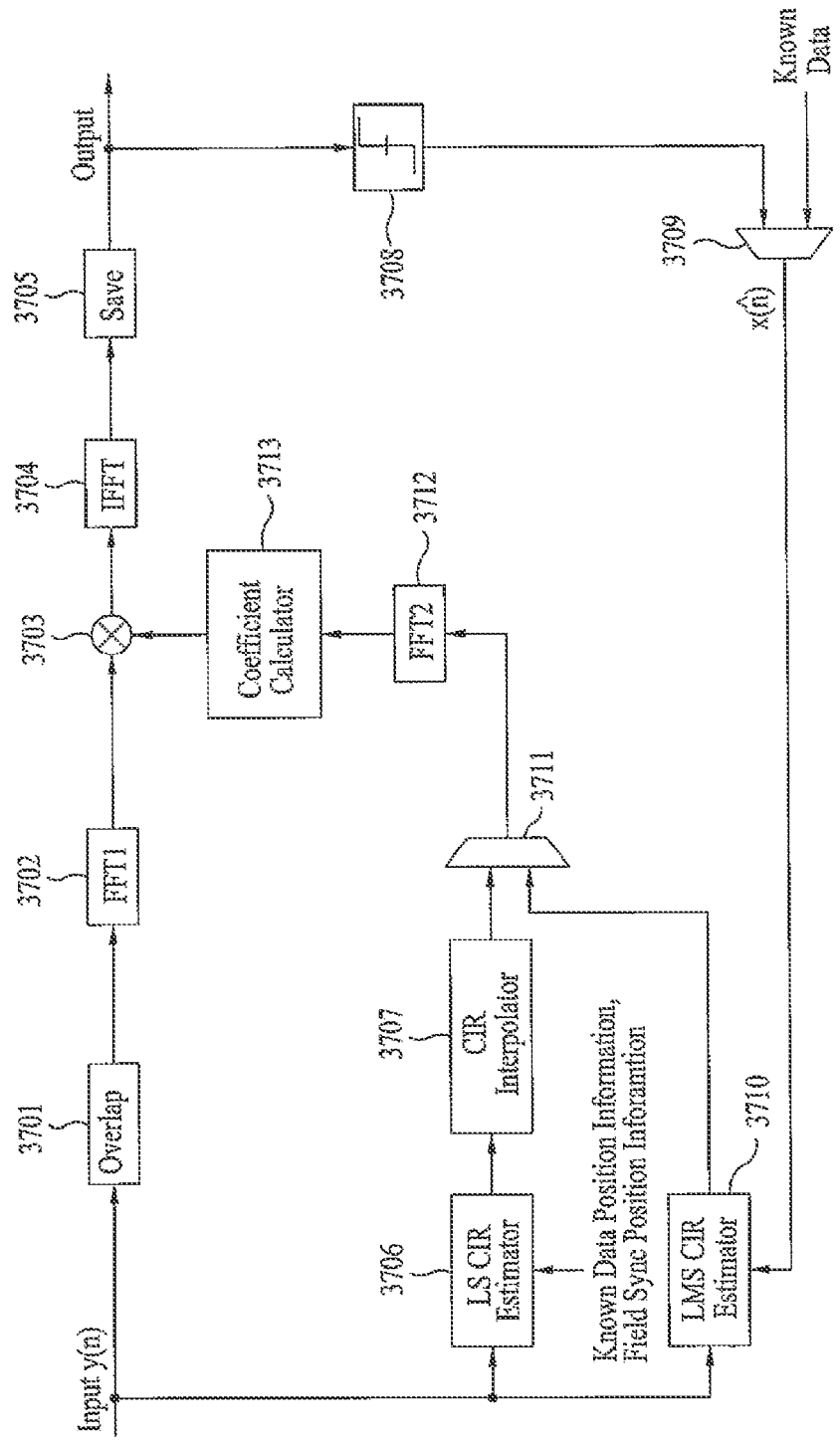
FIG. 59 illustrates a block diagram of another example of a channel equalizer according to the present invention.

FIG. 59 illustrates a block diagram of a channel equalizer according to another embodiment of the present invention. In other words, FIG. 59 illustrates a block diagram showing another example of a channel equalizer by using different CIR estimation and application methods in accordance with regions A, B, C, and D, when the data group is divided into the structure shown in FIG. 5. For example, in regions A/B, the present invention uses the known data in order to estimate the CIR by using a least square (LS) method, thereby performing the channel equalization process. On the other hand, in regions C/D, the present invention estimates the CIR by using a least mean square (LMS) method, thereby performing the channel equalization process. More specifically, since the periodic known data do not exist in regions C/D, as in regions A/B, the same channel equalization process as that of regions A/B cannot be performed in regions C/D. Therefore, the channel equalization process may only be performed by using the LMS method.

Referring to FIG. 59, the channel equalizer includes an overlap unit 3701, a first fast fourier transform (FFT) unit 3702, a distortion compensator 3703, an inverse fast fourier transform (IFFT) unit 3704, a save unit 3705, a first CIR estimator 3706, a CIR interpolator 3707, a decision unit 3708, a second CIR estimator 3710, a selection unit 3711, a second FFT unit 3712, and a coefficient calculator 3713. Herein, any device performed complex number multiplication may be used as the distortion compensator 3703. In the channel equalizer having the above-described structure, as shown in FIG. 59, the overlap unit 3701 overlaps the data being inputted to the channel equalizer to a predetermined overlapping ratio and then outputs the overlapped data to the first FFT unit 3702. The first FFT unit 3702 converts (or transforms) the overlapped data of the time domain to overlapped data of the frequency domain by using fast fourier transform (FFT). Then, the converted data are outputted to the distortion compensator 3703.

The distortion converter 3703 performs complex multiplication on the equalization coefficient calculated from the coefficient calculator 3713 and the overlapped data of the frequency domain, thereby compensating the channel distortion of the overlapped data being outputted from the first FFT unit 3702. Thereafter, the distortion-compensated data are outputted to the IFFT unit 3704. The IFFT unit 3704 performs inverse fast fourier transform (IFFT) on the distortion-compensated overlapped data, so as to convert the corresponding data back to data (i.e., overlapped data) of the time domain. Subsequently, the converted data are outputted to the save unit 3705. The save unit 3705 extracts only the valid data from the overlapped data of the time domain. Then, the save unit 3705 outputs the extracted valid data for a data decoding process and, at the same time, outputs the extracted valid data to the decision unit 3708 for a channel estimation process.

The decision unit 3708 selects one of a plurality of decision values (e.g., 8 decision values) that is most approximate to the equalized data and outputs the selected decision value to the select unit 3709. Herein, a multiplexer may be used as the select unit 3709. In a general data section, the select unit 3709 selects the decision value of the decision unit 3708. Alternatively, in a known data section, the select unit 3709 selects the known data and outputs the selected known data to the second CIR estimator 3710.

Meanwhile, the first CIR estimator 3706 uses the data that are being inputted in the known data section and the known data so as to estimate the CIR.

Thereafter, the first CIR estimator 3706 outputs the estimated CIR to the CIR interpolator 3707. Herein, the known data correspond to reference known data created during the known data section by the receiving system in accordance to an agreement between the transmitting system and the receiving system. At this point, according to an embodiment of the present invention, the first CIR estimator 3706 uses the LS method to estimate the CIR. The LS estimation method calculates a cross correlation value p between the known data that have passed through the channel during the known data section and the known data that are already known by the receiving end. Then, a cross correlation matrix R of the known data is calculated. Subsequently, a matrix operation is performed on $R^{-1} \cdot p$ so that the cross correlation portion within the cross correlation value p between the received data and the initial known data, thereby estimating the CIR of the transmission channel.

The CIR interpolator 3707 receives the CIR from the first CIR estimator 3706. And, in the section between two sets of known data, the CIR is interpolated in accordance with a pre-determined interpolation method. Then, the interpolated CIR is outputted. At this point, the pre-determined interpolation method corresponds to a method of estimating a particular set of data at an unknown point by using a set of data known by a particular function. For example, such method includes a linear interpolation method. The linear interpolation method is only one of the most simple interpolation methods. A variety of other interpolation methods may be used instead of the above-described linear interpolation method. It is apparent that the present invention is not limited only to the example set forth in the description of the present invention. More specifically, the CIR interpolator 3707 uses the CIR that is being inputted in order to estimate the CIR of the section that does not include any known data by using the pre-determined interpolation method. Thereafter, the estimated CIR is outputted to the select unit 3711.

The second CIR estimator 3710 uses the input data of the channel equalizer and the output data of the select unit 3709 in order to estimate the CIR. Then, the second CIR estimator 3710 outputs the estimated CIR to the select unit 3711. At this point, according to an embodiment of the present invention, the CIR is estimated by using the LMS method. The LMS estimation method will be described in detail in a later process.

In regions A/B (i.e., MPH blocks B3 to B8), the select unit 3711 selects the CIR outputted from the CIR interpolator 3707. And, in regions C/D (i.e., MPH blocks B1, B2, B9, and B10), the select unit 3711 selects the CIR outputted from the second CIR estimator 3710. Thereafter, the select unit 3711 outputs the selected CIR to the second FFT unit 3712.

The second FFT unit 3712 converts the CIR that is being inputted to a CIR of the frequency domain, which is then outputted to the coefficient calculator 3713. The coefficient calculator 3713 uses the CIR of the frequency domain that is being inputted, so as to calculate the equalization coefficient and to output the calculated equalization coefficient to the distortion compensator 3703. At this point, the coefficient calculator 3713 calculates a channel equalization coefficient of the frequency domain that can provide minimum mean square error (MMSE) from the CIR of the frequency domain. At this point, the second CIR estimator 3710 may use the CIR estimated in regions A/B as the CIR at the beginning of regions C/D. For example, the CIR value of MPH block B8 may be used as the CIR value at the beginning of the MPH block B9. Accordingly, the convergence speed of regions C/D may be reduced.

The basic principle of estimating the CIR by using the LMS method in the second CIR estimator 3710 corresponds to receiving the output of an unknown transmission channel and to updating (or renewing) the coefficient of an adaptive filter (not shown) so that the difference value between the output value of the unknown channel and the output value of the adaptive filter is minimized. More specifically, the coefficient value of the adaptive filter is renewed so that the input data of the channel equalizer is equal to the output value of the adaptive filter (not shown) included in the second CIR estimator 3710. Thereafter, the filter coefficient is outputted as the CIR after each FFT cycle.

Referring to FIG. 60, the second CIR estimator 3710 includes a delay unit T, a multiplier, and a coefficient renewal unit for each tab. Herein, the delay unit T sequentially delays the output data $\hat{x}(n)$ of the select unit 3709. The multiplier multiplies respective output data outputted from each delay unit T with error data e(n). The coefficient renewal unit renews the coefficient by using the output corresponding to each multiplier. Herein, the multipliers that are being provided as many as the number of tabs will be referred to as a first multiplying unit for simplicity. Furthermore, the second CIR estimator 3710 further includes a plurality of multipliers each multiplying the output data of the select unit 3709 and the output data of the delay unit T (wherein the output data of the last delay unit are excluded) with the output data corresponding to each respective coefficient renewal unit. These multipliers are also provided as many as the number of tabs. This group of multipliers will be referred to as a second multiplying unit for simplicity.

The second CIR estimator 3710 further includes an adder and a subtractor. Herein, the adder adds all of the data outputted from each multipliers included in the second multiplier unit. Then, the added value is outputted as the estimation value $\hat{y}(n)$ of the data inputted to the channel equalizer. The subtractor calculates the difference between the output data $\hat{y}(n)$ of the adder and the input data y(n) of the channel equalizer. Thereafter, the calculated difference value is outputted as the error data e(n). Referring to FIG. 60, in a general data section, the decision value of the equalized data is inputted to the first delay unit included in the second CIR estimator 3710 and to the first multiplier included in the second multiplier. In the known data section, the known data are inputted to the first delay unit included in the second CIR estimator 3710 and to the first multiplier included in the second multiplier unit. The input data $\hat{x}(n)$ are sequentially delayed by passing through a number of serially connected delay units T, the number corresponding to the number of tabs. The output data of each delay unit T and the error data e(n) are multiplied by each corresponding multiplier included in the first multiplier unit. Thereafter, the coefficients are renewed by each respective coefficient renewal unit.

Each coefficient that is renewed by the corresponding coefficient renewal unit is multiplied with the input data the output data $\hat{x}(n)$ and also with the output data of each delay unit T with the exception of the last delay. Thereafter, the multiplied value is inputted to the adder. The adder then adds all of the output data outputted from the second multiplier unit and outputs the added value to the subtractor as the estimation value $\hat{y}(n)$ of the input data of the channel equalizer. The subtractor calculates a difference value between the estimation value $\hat{y}(n)$ and the input data y(n) of the channel equalizer. The difference value is then outputted to each multiplier of the first multiplier unit as the error data e(n). At this point, the error data e(n) is outputted to each multiplier of the first multiplier unit by passing through each respective delay unit T. As described above, the coefficient of the adaptive filter is continuously renewed. And, the output of each coefficient renewal unit is outputted as the CIR of the second CIR estimator 3710 after each FFT cycle.

Block Decoder

Meanwhile, if the data being inputted to the block decoder 1005, after being channel-equalized by the equalizer 1003, correspond to the data having both block encoding and trellis encoding performed thereon (i.e., the data within the RS frame, the signaling information data, etc.) by the transmitting system, trellis decoding and block decoding processes are performed on the inputted data as inverse processes of the transmitting system. Alternatively, if the data being inputted to the block decoder 1005 correspond to the data having only trellis encoding performed thereon (i.e., the main service data), and not the block encoding, only the trellis decoding process is performed on the inputted data as the inverse process of the transmitting system.

The trellis decoded and block decoded data by the block decoder 1005 are then outputted to the RS frame decoder 1006. More specifically, the block decoder 1005 removes the known data, data used for trellis initialization, and signaling information data, MPEG header, which have been inserted in the data group, and the RS parity data, which have been added by the RS encoder/non-systematic RS encoder or non-systematic RS encoder of the transmitting system. Then, the block decoder 1005 outputs the processed data to the RS frame decoder 1006. Herein, the removal of the data may be performed before the block decoding process, or may be performed during or after the block decoding process.

Meanwhile, the data trellis-decoded by the block decoder 1005 are outputted to the data deinterleaver 1009. At this point, the data being trellis-decoded by the block decoder 1005 and outputted to the data deinterleaver 1009 may not only include the main service data but may also include the data within the RS frame and the signaling information. Furthermore, the RS parity data that are added by the transmitting system after the pre-processor 230 may also be included in the data being outputted to the data deinterleaver 1009.

According to another embodiment of the present invention, data that are not processed with block decoding and only processed with trellis encoding by the transmitting system may directly bypass the block decoder 1005 so as to be outputted to the data deinterleaver 1009. In this case, a trellis decoder should be provided before the data deinterleaver 1009. More specifically, if the inputted data correspond to the data having only trellis encoding performed thereon and not block encoding, the block decoder 1005 performs Viterbi (or trellis) decoding on the inputted data so as to output a hard decision value or to perform a hard-decision on a soft decision value, thereby outputting the result.

Meanwhile, if the inputted data correspond to the data having both block encoding process and trellis encoding process performed thereon, the block decoder 1005 outputs a soft decision value with respect to the inputted data.

In other words, if the inputted data correspond to data being processed with block encoding by the block processor 302 and being processed with trellis encoding by the trellis encoding module 256, in the transmitting system, the block decoder 1005 performs a decoding process and a trellis decoding process on the inputted data as inverse processes of the transmitting system. At this point, the RS frame encoder of the pre-processor included in the transmitting system may be viewed as an outer (or external) encoder. And, the trellis encoder may be viewed as an inner (or internal) encoder.

When decoding such concatenated codes, in order to allow the block decoder 1005 to maximize its performance of decoding externally encoded data, the decoder of the internal code should output a soft decision value.

Figure 61:
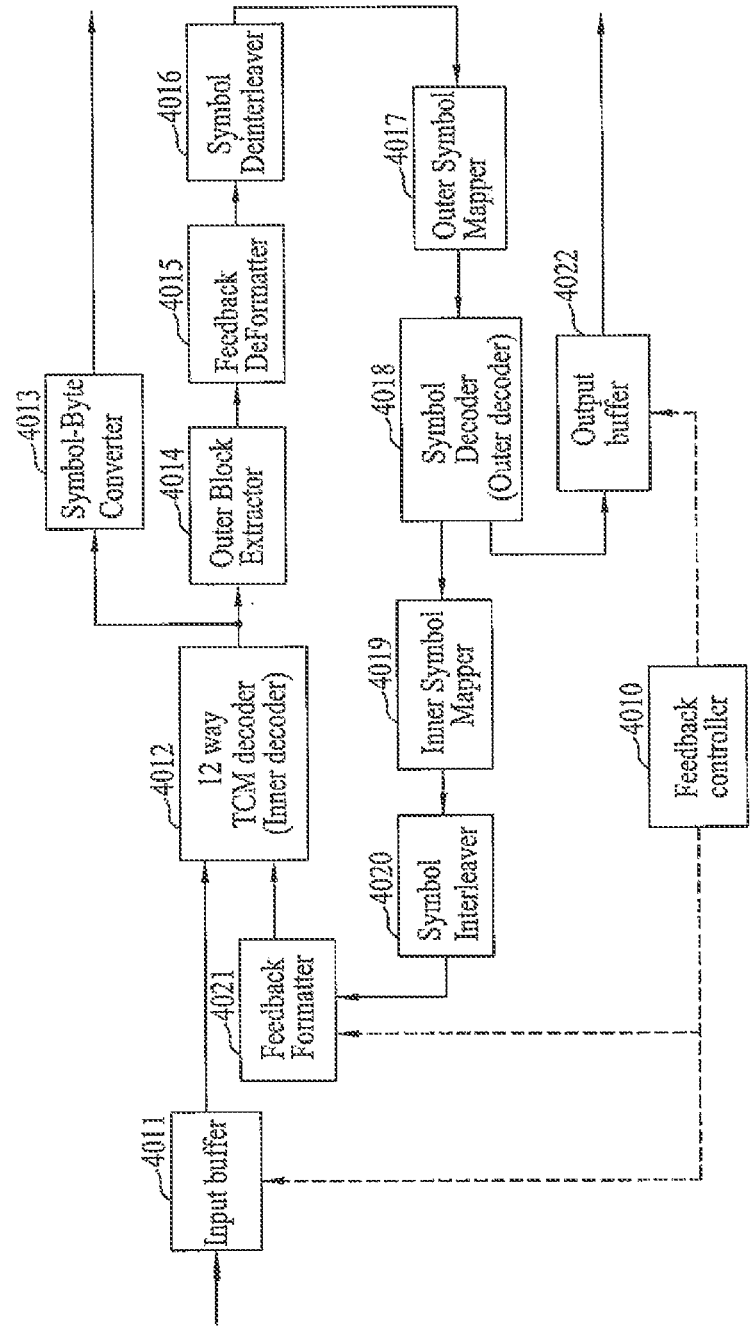
FIG. 61 illustrates a block diagram of an example of a block decoder according to the present invention.

FIG. 61 illustrates a detailed block diagram of the block decoder 1005 according to an embodiment of the present invention. Referring to FIG. 61, the block decoder 1005 includes a feedback controller 4010, an input buffer 4011, a trellis decoding unit (or 12-way trellis coded modulation (TCM) decoder or inner decoder) 4012, a symbol-byte converter 4013, an outer block extractor 4014, a feedback deformatter 4015, a symbol deinterleaver 4016, an outer symbol mapper 4017, a symbol decoder 4018, an inner symbol mapper 4019, a symbol interleaver 4020, a feedback formatter 4021, and an output buffer 4022. Herein, just as in the transmitting system, the trellis decoding unit 4012 may be viewed as an inner (or internal) decoder. And, the symbol decoder 4018 may be viewed as an outer (or external) decoder.

The input buffer 4011 temporarily stores the mobile service data symbols being channel-equalized and outputted from the equalizer 1003. (Herein, the mobile service data symbols may include symbols corresponding to the signaling information, RS parity data symbols and CRC data symbols added during the encoding process of the RS frame.) Thereafter, the input buffer 4011 repeatedly outputs the stored symbols for M number of times to the trellis decoding unit 4012 in a turbo block (TDL) size required for the turbo decoding process.

The turbo decoding length (TDL) may also be referred to as a turbo block. Herein, a TDL should include at least one SCCCC block size. Therefore, as defined in FIG. 5, when it is assumed that one MPH block is a 16-segment unit, and that a combination of 10 MPH blocks form one SCCC block, a TDL should be equal to or larger than the maximum possible combination size. For example, when it is assumed that 2 MPH blocks form one SCCC block, the TDL may be equal to or larger than 32 segments (i.e., 828*32=26496 symbols). Herein, M indicates a number of repetitions for turbo-decoding pre-decided by the feed-back controller 4010.

Also, M represents a number of repetitions of the turbo decoding process, the number being predetermined by the feedback controller 4010.

Additionally, among the values of symbols being channel-equalized and outputted from the equalizer 1003, the input symbol values corresponding to a section having no mobile service data symbols (including RS parity data symbols during RS frame encoding and CRC data symbols) included therein, bypass the input buffer 4011 without being stored. More specifically, since trellis-encoding is performed on input symbol values of a section wherein SCCC block-encoding has not been performed, the input buffer 4011 inputs the inputted symbol values of the corresponding section directly to the trellis encoding module 4012 without performing any storage, repetition, and output processes. The storage, repetition, and output processes of the input buffer 4011 are controlled by the feedback controller 4010. Herein, the feedback controller 4010 refers to SCCC-associated information (e.g., SCCC block mode and SCCC outer code mode), which are outputted from the signaling information decoding unit 1013, in order to control the storage and output processes of the input buffer 4011.

The trellis decoding unit 4012 includes a 12-way TCM decoder. Herein, the trellis decoding unit 4012 performs 12-way trellis decoding as inverse processes of the 12-way trellis encoder.

More specifically, the trellis decoding unit 4012 receives a number of output symbols of the input buffer 4011 and soft-decision values of the feedback formatter 4021 equivalent to each TDL, so as to perform the TCM decoding process.

At this point, based upon the control of the feedback controller 4010, the soft-decision values outputted from the feedback formatter 4021 are matched with a number of mobile service data symbol places so as to be in a one-to-one (1:1) correspondence. Herein, the number of mobile service data symbol places is equivalent to the TDL being outputted from the input buffer 4011.

More specifically, the mobile service data being outputted from the input buffer 4011 are matched with the turbo decoded data being inputted, so that each respective data place can correspond with one another. Thereafter, the matched data are outputted to the trellis decoding unit 4012. For example, if the turbo decoded data correspond to the third symbol within the turbo block, the corresponding symbol (or data) is matched with the third symbol included in the turbo block, which is outputted from the input buffer 4011. Subsequently, the matched symbol (or data) is outputted to the trellis decoding unit 4012.

In order to do so, while the regressive turbo decoding is in process, the feedback controller 4010 controls the input buffer 4011 so that the input buffer 4011 stores the corresponding turbo block data. Also, by delaying data (or symbols), the soft decision value (e.g., LLR) of the symbol outputted from the symbol interleaver 4020 and the symbol of the input buffer 4011 corresponding to the same place (or position) within the block of the output symbol are matched with one another to be in a one-to-one correspondence. Thereafter, the matched symbols are controlled so that they can be inputted to the TCM decoder through the respective path. This process is repeated for a predetermined number of turbo decoding cycle periods. Then, the data of the next turbo block are outputted from the input buffer 4011, thereby repeating the turbo decoding process.

The output of the trellis decoding unit 4012 signifies a degree of reliability of the transmission bits configuring each symbol. For example, in the transmitting system, since the input data of the trellis encoding module correspond to two bits as one symbol, a log likelihood ratio (LLR) between the likelihood of a bit having the value of '1' and the likelihood of the bit having the value of '0' may be respectively outputted (in bit units) to the upper bit and the lower bit. Herein, the log likelihood ratio corresponds to a log value for the ratio between the likelihood of a bit having the value of '1' and the likelihood of the bit having the value of '0'. Alternatively, a LLR for the likelihood of 2 bits (i.e., one symbol) being equal to "00", "01", "10", and "11" may be respectively outputted (in symbol units) to all 4 combinations of bits (i.e., 00, 01, 10, 11). Consequently, this becomes the soft decision value that indicates the degree of reliability of the transmission bits configuring each symbol. A maximum a posteriori probability (MAP) or a soft-out Viterbi algorithm (SOVA) may be used as a decoding algorithm of each TCM decoder within the trellis decoding unit 4012.

The output of the trellis decoding unit 4012 is inputted to the symbol-byte converter 4013 and the outer block extractor 4014.

The symbol-byte converter 4013 performs a hard-decision process of the soft decision value that is trellis decoded and outputted from the trellis decoding unit 4012. Thereafter, the symbol-byte converter 4013 groups 4 symbols into byte units, which are then outputted to the data deinterleaver 1009 of FIG. 36. More specifically, the symbol-byte converter 4013 performs hard-decision in bit units on the soft decision value of the symbol outputted from the trellis decoding unit 4012. Therefore, the data processed with hard-decision and outputted in bit units from the symbol-byte converter 4013 not only include main service data, but may also include mobile service data, known data, RS parity data, and MPEG headers.

Among the soft decision values of TDL size of the trellis decoding unit 4012, the outer block extractor 4014 identifies the soft decision values of B size of corresponding to the mobile service data symbols (wherein symbols corresponding to signaling information, RS parity data symbols that are added during the encoding of the RS frame, and CRC data symbols are included) and outputs the identified soft decision values to the feedback deformatter 4015.

The feedback deformatter 4015 changes the processing order of the soft decision values corresponding to the mobile service data symbols. This is an inverse process of an initial change in the processing order of the mobile service data symbols, which are generated during an intermediate step, wherein the output symbols outputted from the block processor 302 of the transmitting system are being inputted to the trellis encoding module 256 (e.g., when the symbols pass through the group formatter, the data deinterleaver, the packet formatter, and the data interleaver). Thereafter, the feedback deformatter 1015 performs reordering of the process order of soft decision values corresponding to the mobile service data symbols and, then, outputs the processed mobile service data symbols to the symbol deinterleaver 4016.

This is because a plurality of blocks exist between the block processor 302 and the trellis encoding module 256, and because, due to these blocks, the order of the mobile service data symbols being outputted from the block processor 302 and the order of the mobile service data symbols being inputted to the trellis encoding module 256 are not identical to one another. Therefore, the feedback deformatter 4015 reorders (or rearranges) the order of the mobile service data symbols being outputted from the outer block extractor 4014, so that the order of the mobile service data symbols being inputted to the symbol deinterleaver 4016 matches the order of the mobile service data symbols outputted from the block processor 302 of the transmitting system. The reordering process may be embodied as one of software, middleware, and hardware.

Figure 62:
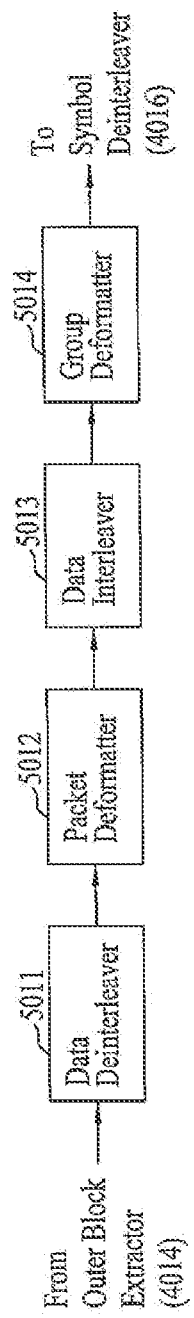
FIG. 62 illustrates a block diagram of an example of a feedback deformatter according to the present invention.

FIG. 62 illustrates a detailed block view of the feedback deformatter 4015 according to an embodiment of the present invention. Herein, the feedback deformatter 4015 includes a data deinterleaver 5011, a packet deformatter 5012, a data interleaver 5013, and a group deformatter 5014. Referring to FIG. 62, the soft decision value of the mobile service data symbol, which is extracted by the outer block extractor 4014, is outputted directly to the data deinterleaver 5011 of the feedback deformatter 4015 without modification. However, data place holders (or null data) are inserted in data places (e.g., main service data places, known data places, signaling information places, RS parity data places, and MPEG header places), which are removed by the outer block extractor 4014, thereby being outputted to the data deinterleaver 5011 of the feedback deformatter 4015.

The data deinterleaver 5011 performs an inverse process of the data interleaver 253 included in the transmitting system. More specifically, the data deinterleaver 5011 deinterleaves the inputted data and outputs the deinterleaved data to the packet deformatter 5012. The packet deformatter 5012 performs an inverse process of the packet formatter 305. More specifically, among the data that are deinterleaved and outputted from the data deinterleaver 5011, the packet deformatter 5012 removes the place holder corresponding to the MPEG header, which had been inserted to the packet formatter 305. The output of the packet deformatter 5012 is inputted to the data interleaver 5013, and the data interleaver 5013 interleaves the data being inputted, as an inverse process of the data deinterleaver 529 included in the transmitting system. Accordingly, data having a data structure as shown in FIG. 5, are outputted to the group deformatter 5014.

The data deformatter 5014 performs an inverse process of the group formatter 303 included in the transmitting system. More specifically, the group formatter 5014 removes the place holders corresponding to the main service data, known data, signaling information data, and RS parity data. Then, the group formatter 5014 outputs only the reordered (or rearranged) mobile service data symbols to the symbol deinterleaver 4016. According to another embodiment of the present invention, when the feedback deformatter 4015 is embodied using a memory map, the process of inserting and removing place holder to and from data places removed by the outer block extractor 4014 may be omitted.

The symbol deinterleaver 4016 performs deinterleaving on the mobile service data symbols having their processing orders changed and outputted from the feedback deformatter 4015, as an inverse process of the symbol interleaving process of the symbol interleaver 514 included in the transmitting system. The size of the block used by the symbol deinterleaver 4016 during the deinterleaving process is identical to interleaving size of an actual symbol (i.e., B) of the symbol interleaver 514, which is included in the transmitting system. This is because the turbo decoding process is performed between the trellis decoding unit 4012 and the symbol decoder 4018. Both the input and output of the symbol deinterleaver 4016 correspond to soft decision values, and the deinterleaved soft decision values are outputted to the outer symbol mapper 4017.

The operations of the outer symbol mapper 4017 may vary depending upon the structure and coding rate of the convolution encoder 513 included in the transmitting system. For example, when data are ½-rate encoded by the convolution encoder 513 and then transmitted, the outer symbol mapper 4017 directly outputs the input data without modification. In another example, when data are ¼-rate encoded by the convolution encoder 513 and then transmitted, the outer symbol mapper 4017 converts the input data so that it can match the input data format of the symbol decoder 4018. For this, the outer symbol mapper 4017 may be inputted SCCC-associated information (i.e., SCCC block mode and SCCC outer code mode) from the signaling information decoder 1013. Then, the outer symbol mapper 4017 outputs the converted data to the symbol decoder 4018.

The symbol decoder 4018 (i.e., the outer decoder) receives the data outputted from the outer symbol mapper 4017 and performs symbol decoding as an inverse process of the convolution encoder 513 included in the transmitting system. At this point, two different soft decision values are outputted from the symbol decoder 4018. One of the outputted soft decision values corresponds to a soft decision value matching the output symbol of the convolution encoder 513 (hereinafter referred to as a "first decision value"). The other one of the outputted soft decision values corresponds to a soft decision value matching the input bit of the convolution encoder 513 (hereinafter referred to as a "second decision value").

More specifically, the first decision value represents a degree of reliability the output symbol (i.e., 2 bits) of the convolution encoder 513. Herein, the first soft decision value may output (in bit units) a LLR between the likelihood of 1 bit being equal to '1' and the likelihood of 1 bit being equal to '0' with respect to each of the upper bit and lower bit, which configures a symbol. Alternatively, the first soft decision value may also output (in symbol units) a LLR for the likelihood of 2 bits being equal to "00", "01", "10", and "11" with respect to all possible combinations. The first soft decision value is fed-back to the trellis decoding unit 4012 through the inner symbol mapper 4019, the symbol interleaver 4020, and the feedback formatter 4021. On the other hand, the second soft decision value indicates a degree of reliability the input bit of the convolution encoder 513 included in the transmitting system. Herein, the second soft decision value is represented as the LLR between the likelihood of 1 bit being equal to '1' and the likelihood of 1 bit being equal to '0'. Thereafter, the second soft decision value is outputted to the outer buffer 4022. In this case, a maximum a posteriori probability (MAP) or a soft-out Viterbi algorithm (SOVA) may be used as the decoding algorithm of the symbol decoder 4018.

The first soft decision value that is outputted from the symbol decoder 4018 is inputted to the inner symbol mapper 4019. The inner symbol mapper 4019 converts the first soft decision value to a data format corresponding the input data of the trellis decoding unit 4012. Thereafter, the inner symbol mapper 4019 outputs the converted soft decision value to the symbol interleaver 4020. The operations of the inner symbol mapper 4019 may also vary depending upon the structure and coding rate of the convolution encoder 513 included in the transmitting system.

The symbol interleaver 4020 performs symbol interleaving, as shown in FIG. 26, on the first soft decision value that is outputted from the inner symbol mapper 4019. Then, the symbol interleaver 4020 outputs the symbol-interleaved first soft decision value to the feedback formatter 4021. Herein, the output of the symbol interleaver 4020 also corresponds to a soft decision value.

With respect to the changed processing order of the soft decision values corresponding to the symbols that are generated during an intermediate step, wherein the output symbols outputted from the block processor 302 of the transmitting system are being inputted to the trellis encoding module (e.g., when the symbols pass through the group formatter, the data deinterleaver, the packet formatter, the RS encoder, and the data interleaver), the feedback formatter 4021 alters (or changes) the order of the output values outputted from the symbol interleaver 4020. Subsequently, the feedback formatter 4020 outputs values to the trellis decoding unit 4012 in the changed order. The reordering process of the feedback formatter 4021 may configure at least one of software, hardware, and middleware. For example, the feedback formatter 4021 may configure to be performed as an inverse process of FIG. 62.

The soft decision values outputted from the symbol interleaver 4020 are matched with the positions of mobile service data symbols each having the size of TDL, which are outputted from the input buffer 4011, so as to be in a one-to-one correspondence. Thereafter, the soft decision values matched with the respective symbol position are inputted to the trellis decoding unit 4012. At this point, since the main service data symbols or the RS parity data symbols and known data symbols of the main service data do not correspond to the mobile service data symbols, the feedback formatter 4021 inserts null data in the corresponding positions, thereby outputting the processed data to the trellis decoding unit 4012. Additionally, each time the symbols having the size of TDL are turbo decoded, no value is fed-back by the symbol interleaver 4020 starting from the beginning of the first decoding process. Therefore, the feedback formatter 4021 is controlled by the feedback controller 4010, thereby inserting null data into all symbol positions including a mobile service data symbol. Then, the processed data are outputted to the trellis decoding unit 4012.

The output buffer 4022 receives the second soft decision value from the symbol decoder 4018 based upon the control of the feedback controller 4010. Then, the output buffer 4022 temporarily stores the received second soft decision value. Thereafter, the output buffer 4022 outputs the second soft decision value to the RS frame decoder 10006. For example, the output buffer 4022 overwrites the second soft decision value of the symbol decoder 4018 until the turbo decoding process is performed for M number of times. Then, once all M number of turbo decoding processes is performed for a single TDL, the corresponding second soft decision value is outputted to the RS frame decoder 1006.

The feedback controller 4010 controls the number of turbo decoding and turbo decoding repetition processes of the overall block decoder, shown in FIG. 61. More specifically, once the turbo decoding process has been repeated for a predetermined number of times, the second soft decision value of the symbol decoder 4018 is outputted to the RS frame decoder 1006 through the output buffer 4022. Thus, the block decoding process of a turbo block is completed. In the description of the present invention, this process is referred to as a regressive turbo decoding process for simplicity.

At this point, the number of regressive turbo decoding rounds between the trellis decoding unit 4012 and the symbol decoder 4018 may be defined while taking into account hardware complexity and error correction performance. Accordingly, if the number of rounds increases, the error correction performance may be enhanced. However, this may lead to a disadvantageous of the hardware becoming more complicated (or complex).

Meanwhile, the data deinterleaver 1009, the RS decoder 1010, and the data derandomizer 1011 correspond to blocks required for receiving the main service data. Therefore, the above-mentioned blocks may not be necessary (or required) in the structure of a digital broadcast receiving system for receiving mobile service data only.

The data deinterleaver 1009 performs an inverse process of the data interleaver included in the transmitting system. In other words, the data deinterleaver 1009 deinterleaves the main service data outputted from the block decoder 1005 and outputs the deinterleaved main service data to the RS decoder 1010. The data being inputted to the data deinterleaver 1009 include main service data, as well as mobile service data, known data, RS parity data, and an MPEG header. At this point, among the inputted data, only the main service data and the RS parity data added to the main service data packet may be outputted to the RS decoder 1010. Also, all data outputted after the data derandomizer 1011 may all be removed with the exception for the main service data. In the embodiment of the present invention, only the main service data and the RS parity data added to the main service data packet are inputted to the RS decoder 1010.

The RS decoder 1010 performs a systematic RS decoding process on the deinterleaved data and outputs the processed data to the data derandomizer 1011.

The data derandomizer 1011 receives the output of the RS decoder 1010 and generates a pseudo random data byte identical to that of the randomizer included in the digital broadcast transmitting system. Thereafter, the data derandomizer 1011 performs a bitwise exclusive OR (XOR) operation on the generated pseudo random data byte, thereby inserting the MPEG synchronization bytes to the beginning of each packet so as to output the data in 188-byte main service data packet units.

RS Frame Decoder

The data outputted from the block decoder 1005 are in portion units. More specifically, in the transmitting system, the RS frame is divided into several portions, and the mobile service data of each portion are assigned either to regions A/B/C/D within the data group or to any one of regions A/B and regions C/D, thereby being transmitted to the receiving system. Therefore, the RS frame decoder 1006 groups several portions included in a parade so as to form an RS frame. Alternatively, the RS frame decoder 1006 may also group several portions included in a parade so as to form two RS frames. Thereafter, error correction decoding is performed in RS frame units.

Figure 63:
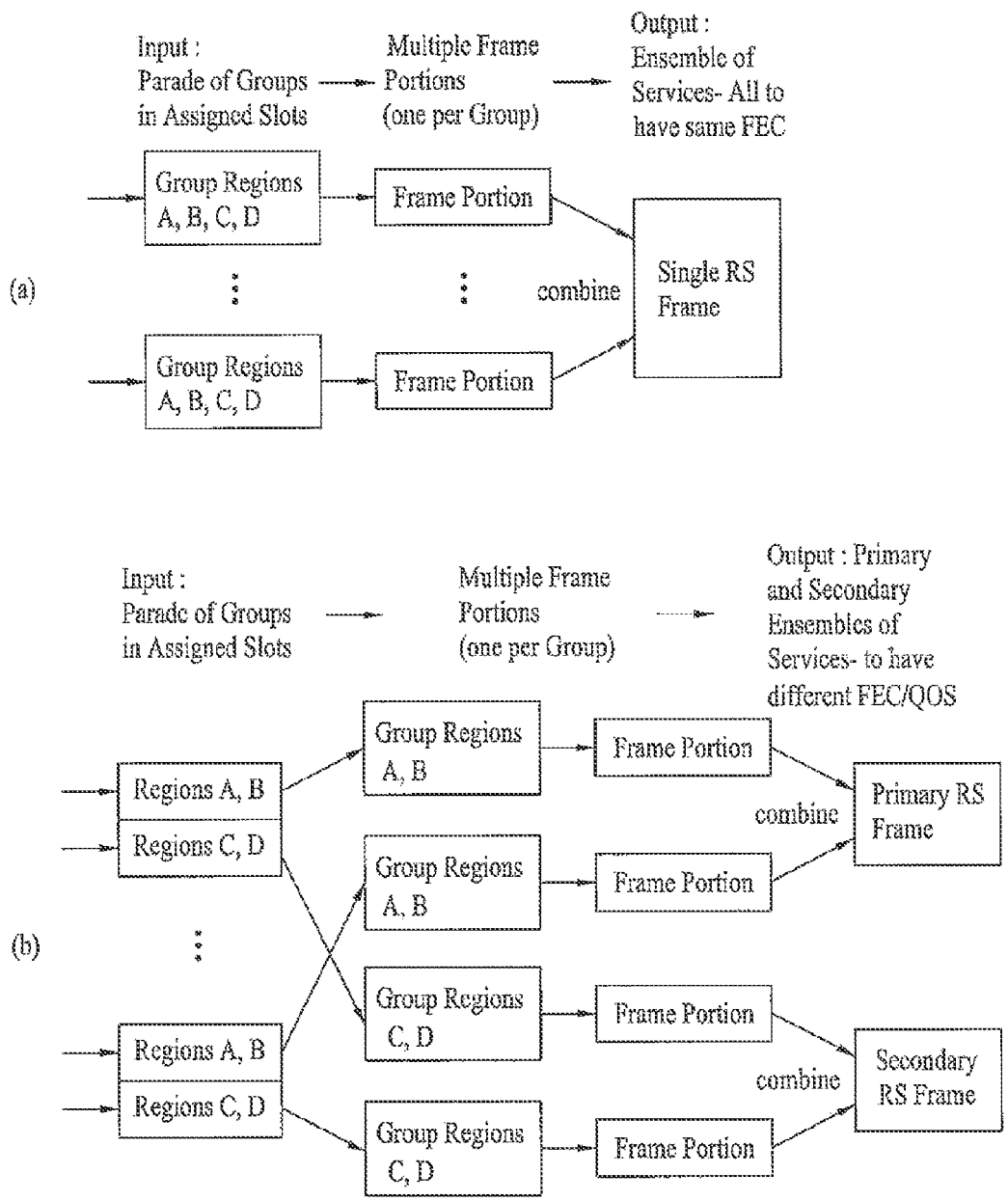

For example, when the RS frame mode value is equal to '00', then one parade transmits one RS frame. At this point, one RS frame is divided into several portions, and the mobile service data of each portion are assigned to regions A/B/C/D of the corresponding data group, thereby being transmitted. In this case, the MPH frame decoder 1006 extracts mobile service data from regions A/B/C/D of the corresponding data group, as shown in FIG. 63($a$). Subsequently, the MPH frame decoder 1006 may perform the process of forming (or creating) a portion on a plurality of data group within a parade, thereby forming several portions. Then, the several portions of mobile service data may be grouped to form an RS frame. Herein, if stuffing bytes are added to the last portion, the RS frame may be formed after removing the stuffing byte.

In another example, when the RS frame mode value is equal to '01', then one parade transmits two RS frames (i.e., a primary RS frame and a secondary RS frame). At this point, a primary RS frame is divided into several primary portions, and the mobile service data of each primary portion are assigned to regions A/B of the corresponding data group, thereby being transmitted. Also, a secondary RS frame is divided into several secondary portions, and the mobile service data of each secondary portion are assigned to regions C/D of the corresponding data group, thereby being transmitted.

In this case, the MPH frame decoder 1006 extracts mobile service data from regions A/B of the corresponding data group, as shown in FIG. 63($b$). Subsequently, the MPH frame decoder 1006 may perform the process of forming (or creating) a primary portion on a plurality of data group within a parade, thereby forming several primary portions. Then, the several primary portions of mobile service data may be grouped to form a primary RS frame. Herein, if stuffing bytes are added to the last primary portion, the primary RS frame may be formed after removing the stuffing byte. Also, the MPH frame decoder 1006 extracts mobile service data from regions C/D of the corresponding data group. Subsequently, the MPH frame decoder 1006 may perform the process of forming (or creating) a secondary portion on a plurality of data group within a parade, thereby forming several secondary portions. Then, the several secondary portions of mobile service data may be grouped to form a secondary RS frame. Herein, if stuffing bytes are added to the last secondary portion, the secondary RS frame may be formed after removing the stuffing byte.

More specifically, the RS frame decoder 1006 receives the RS-encoded and/or CRC-encoded mobile service data of each portion from the block decoder 1005. Then, the RS frame decoder 1006 groups several portions, which are inputted based upon RS frame-associated information outputted from the signaling information decoder 1013, thereby performing error correction. By referring to the RS frame mode value included in the RS frame-associated information, the RS frame decoder 1006 may form an RS frame and may also be informed of the number of RS code parity data bytes and the code size. Herein, the RS code is used to configure (or form) the RS frame. The RS frame decoder 1006 also refers to the RS frame-associated information in order to perform an inverse process of the RS frame encoder, which is included in the transmitting system, thereby correcting the errors within the RS frame. Thereafter, the RS frame decoder 1006 adds 1 MPEG synchronization data byte to the error-correction mobile service data packet. In an earlier process, the 1 MPEG synchronization data byte was removed from the mobile service data packet during the RS frame encoding process. Finally, the RS frame decoder 1006 outputs the processed mobile service data packet to the derandomizer 1007.

Figure 64:
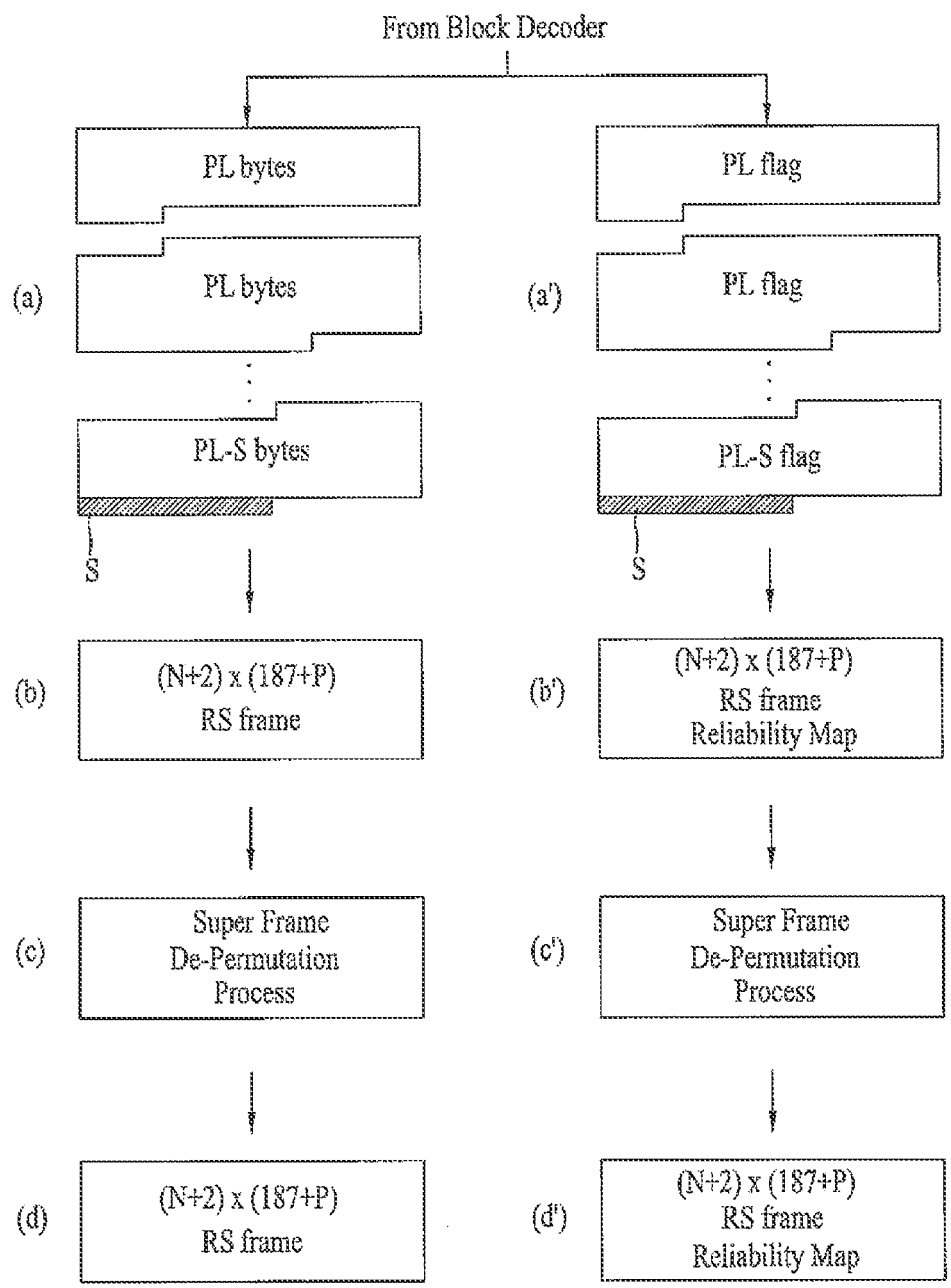

FIG. 64 illustrates, when the RS frame mode value is equal to '00', an exemplary process of grouping several portion being transmitted to a parade, thereby forming an RS frame and an RS frame reliability map, and an exemplary process of performing a row de-permutation process in super frame units as an inverse process of the transmitting system, thereby re-distinguishing (or identifying) the row-de-permuted RS frame and RS frame reliability map. More specifically, the RS frame decoder 1006 receives and groups a plurality of mobile service data bytes, so as to form an RS frame. According to the present invention, in transmitting system, the mobile service data correspond to data RS-encoded in RS frame units and also correspond to data row-permuted in super frame units. At this point, the mobile service data may already be error correction encoded (e.g., CRC-encoded). Alternatively, the error correction encoding process may be omitted.

Figure 23:
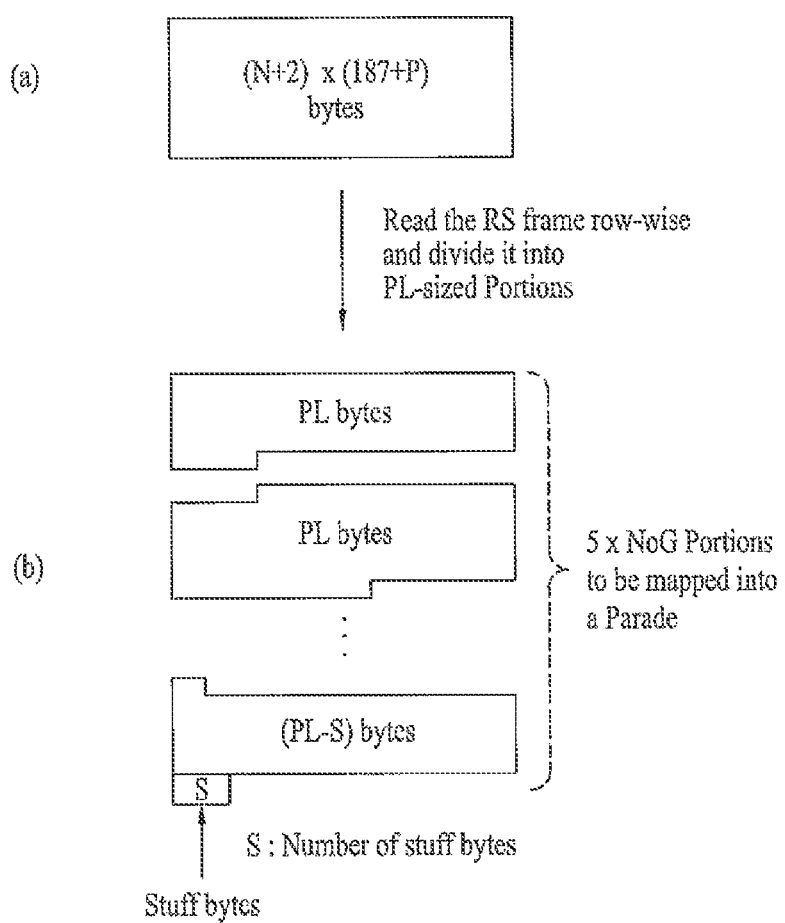
FIG. 23(a) and FIG. 23(b) illustrate an exemplary process of dividing an RS frame for configuring a data group according to the present invention.

It is assumed that, in the transmitting system, an RS frame having the size of (N+2)×(187+P) bytes is divided into M number of portions, and that the M number of mobile service data portions are assigned and transmitted to regions A/B/C/D in M number of data groups, respectively. In this case, in the receiving system, each mobile service data portion is grouped, as shown in FIG. 64(*a*), thereby forming an RS frame having the size of (N+2)×(187+P) bytes. At this point, when stuffing bytes (S) are added to at least one portion included in the corresponding RS frame and then transmitted, the stuffing bytes are removed, thereby configuring an RS frame and an RS frame reliability map. For example, as shown in FIG. 23, when S number of stuffing bytes are added to the corresponding portion, the S number of stuffing bytes are removed, thereby configuring the RS frame and the RS frame reliability map.

Herein, when it is assumed that the block decoder 1005 outputs a soft decision value for the decoding result, the RS frame decoder 1006 may decide the '0' and '1' of the corresponding bit by using the codes of the soft decision value. 8 bits that are each decided as described above are grouped to create 1 data byte. If the above-described process is performed on all soft decision values of several portions (or data groups) included in a parade, the RS frame having the size of (N+2)×(187+P) bytes may be configured.

Additionally, the present invention uses the soft decision value not only to configure the RS frame but also to configure a reliability map.

Herein, the reliability map indicates the reliability of the corresponding data byte, which is configured by grouping 8 bits, the 8 bits being decided by the codes of the soft decision value.

For example, when the absolute value of the soft decision value exceeds a pre-determined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure one data byte, is determined to be unreliable, the corresponding data byte is marked on the reliability map as an unreliable data byte.

Herein, determining the reliability of one data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the one data byte are determined to be reliable (i.e., when the absolute value of the soft decision values of all 8 bits included in the one data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of (N+2)×(187+P) bytes, the reliability map is also configured to have the size of (N+2)×(187+P) bytes. FIG. 64(*a*') and FIG. 64(*b*') respectively illustrate the process steps of configuring the reliability map according to the present invention.

Figure 21:
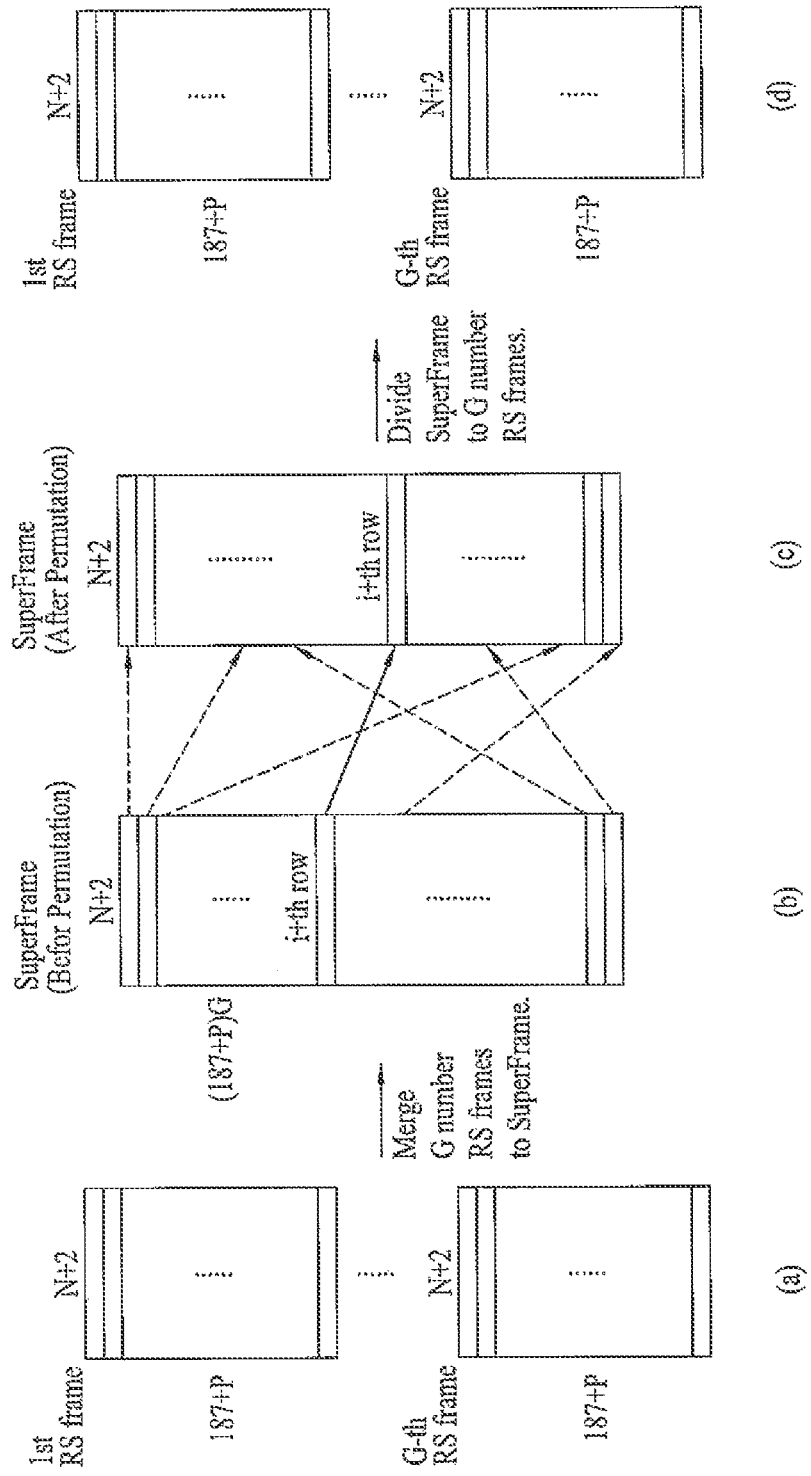
FIG. 21(a) to FIG. 21(d) illustrate an example of performing a row permutation (or interleaving) process in super frame units according to the present invention.

At this point, the RS frame of FIG. 64(*b*) and the RS frame reliability map of FIG. 64(*b*') are interleaved in super frame units (as shown in FIG. 21). Therefore, the RS frame and the RS frame reliability maps are grouped to create a super frame and a super frame reliability map. Subsequently, as shown in FIG. 64(*c*) and FIG. 64(*c*'), a de-permutation (or deinterleaving) process is performed in super frame units on the RS frame and the RS frame reliability maps, as an inverse process of the transmitting system. Then, when the de-permutation process is performed in super frame units, the processed data are divided into de-permuted (or deinterleaved) RS frames having the size of (N+2)×(187+P) bytes and de-permuted RS frame reliability maps having the size of (N+2)×(187+P) bytes, as shown in FIG. 64(*d*) and FIG. 64(*d*'). Subsequently, the RS frame reliability map is used on the divided RS frames so as to perform error correction.

Figure 65:
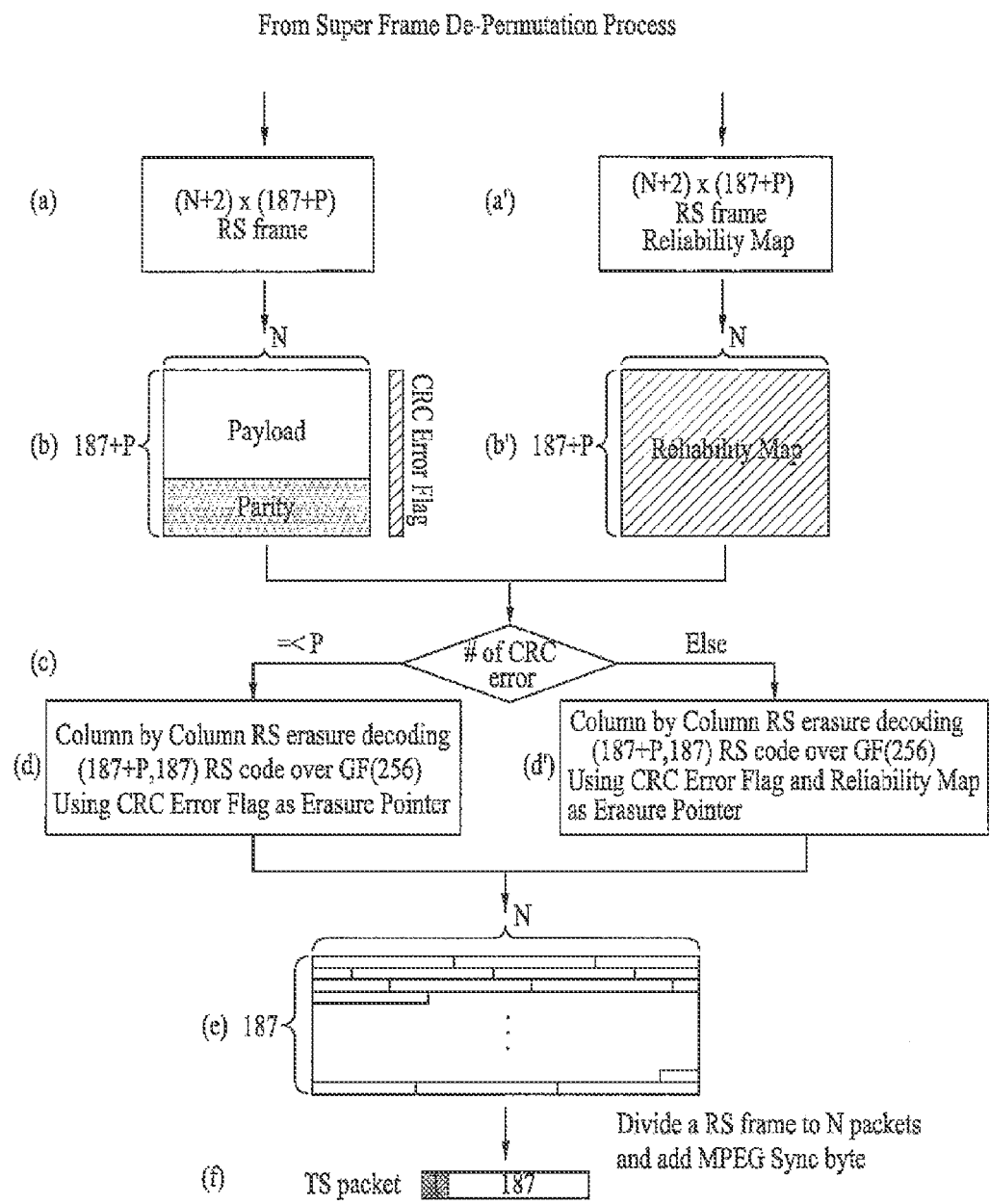

FIG. 65 illustrates example of the error correction processed according to embodiments of the present invention. FIG. 65 illustrates an example of performing an error correction process when the transmitting system has performed both RS encoding and CRC encoding processes on the RS frame.

As shown in FIG. 65(*a*) and FIG. 65(*a*'), when the RS frame having the size of (N+2)×(187+P) bytes and the RS frame reliability map having the size of (N+2)×(187+P) bytes are created, a CRC syndrome checking process is performed on the created RS frame, thereby verifying whether any error has occurred in each row. Subsequently, as shown in FIG. 65(*b*), a 2-byte checksum is removed to configure an RS frame having the size of N×(187+P) bytes. Herein, the presence (or existence) of an error is indicated on an error flag corresponding to each row. Similarly, since the portion of the reliability map corresponding to the CRC checksum has hardly any applicability, this portion is removed so that only N×(187+P) number of the reliability information bytes remain, as shown in FIG. 65(*b*').

After performing the CRC syndrome checking process, as described above, a RS decoding process is performed in a column direction. Herein, a RS erasure correction process may be performed in accordance with the number of CRC error flags. More specifically, as shown in FIG. 65(c), the CRC error flag corresponding to each row within the RS frame is verified. Thereafter, the RS frame decoder 1006 determines whether the number of rows having a CRC error occurring therein is equal to or smaller than the maximum number of errors on which the RS erasure correction may be performed, when performing the RS decoding process in a column direction. The maximum number of errors corresponds to P number of parity bytes inserted when performing the RS encoding process. In the embodiment of the present invention, it is assumed that 48 parity bytes have been added to each column (i.e., P=48).

If the number of rows having the CRC errors occurring therein is smaller than or equal to the maximum number of errors (i.e., 48 errors according to this embodiment) that can be corrected by the RS erasure decoding process, a (235,187)-RS erasure decoding process is performed in a column direction on the RS frame having (187+P) number of N-byte rows (i.e., 235 N-byte rows), as shown in FIG. 65(d). Thereafter, as shown in FIG. 65(e), the 48-byte parity data that have been added at the end of each column are removed. Conversely, however, if the number of rows having the CRC errors occurring therein is greater than the maximum number of errors (i.e., 48 errors) that can be corrected by the RS erasure decoding process, the RS erasure decoding process cannot be performed. In this case, the error may be corrected by performing a general RS decoding process. In addition, the reliability map, which has been created based upon the soft decision value along with the RS frame, may be used to further enhance the error correction ability (or performance) of the present invention.

More specifically, the RS frame decoder 1006 compares the absolute value of the soft decision value of the block decoder 1005 with the pre-determined threshold value, so as to determine the reliability of the bit value decided by the code of the corresponding soft decision value. Also, 8 bits, each being determined by the code of the soft decision value, are grouped to form one data byte. Accordingly, the reliability information on this one data byte is indicated on the reliability map. Therefore, as shown in FIG. 65(c), even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points. Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column.

More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column. For example, it is assumed that the number of rows having CRC errors included therein within the RS frame is greater than 48. And, it is also assumed that the number of erasure points decided based upon the reliability information of the reliability map is indicated as 40 erasure points in the first column and as 50 erasure points in the second column. In this case, a (235,187)-RS erasure decoding process is performed on the first column. Alternatively, a (235,187)-RS decoding process is performed on the second column. When error correction decoding is performed on all column directions within the RS frame by using the above-described process, the 48-byte parity data which were added at the end of each column are removed, as shown in FIG. 65(e).

As described above, even though the total number of CRC errors corresponding to each row within the RS frame is greater than the maximum number of errors that can be corrected by the RS erasure decoding process, when the number of bytes determined to have a low reliability level, based upon the reliability information on the reliability map within a particular column, while performing error correction decoding on the particular column. Herein, the difference between the general RS decoding process and the RS erasure decoding process is the number of errors that can be corrected. More specifically, when performing the general RS decoding process, the number of errors corresponding to half of the number of parity bytes (i.e., (number of parity bytes)/2) that are inserted during the RS encoding process may be error corrected (e.g., 24 errors may be corrected). Alternatively, when performing the RS erasure decoding process, the number of errors corresponding to the number of parity bytes that are inserted during the RS encoding process may be error corrected (e.g., 48 errors may be corrected).

After performing the error correction decoding process, as described above, a RS frame configured of 187 N-byte rows (or packet) may be obtained as shown in FIG. 65(e). The RS frame having the size of N×187 bytes is outputted by the order of N number of 187-byte units. At this point, 1 MPEG synchronization byte, which had been removed by the transmitting system, is added to each 187-byte packet, as shown in FIG. 65(f). Therefore, a 188-byte unit mobile service data packet is outputted.

As described above, the RS frame decoded mobile service data is outputted to the data derandomizer 1007. The data derandomizer 1007 performs a derandomizing process, which corresponds to the inverse process of the randomizer included in the transmitting system, on the received mobile service data. Thereafter, the derandomized data are outputted, thereby obtaining the mobile service data transmitted from the transmitting system. In the present invention, the RS frame decoder 1006 may perform the data derandomizing function. An MPH frame decoder may be configured of M number of RS frame decoders provided in parallel, wherein the number of RS frame encoders is equal to the number of parades (=M) within an MPH frame, a multiplexer for multiplexing each portion and being provided to each input end of the M number of RS frame decoders, and a demultiplexer for demultiplexing each portion and being provided to each output end of the M number of RS frame decoders.

General Digital Broadcast Receiving System

Figure 66:
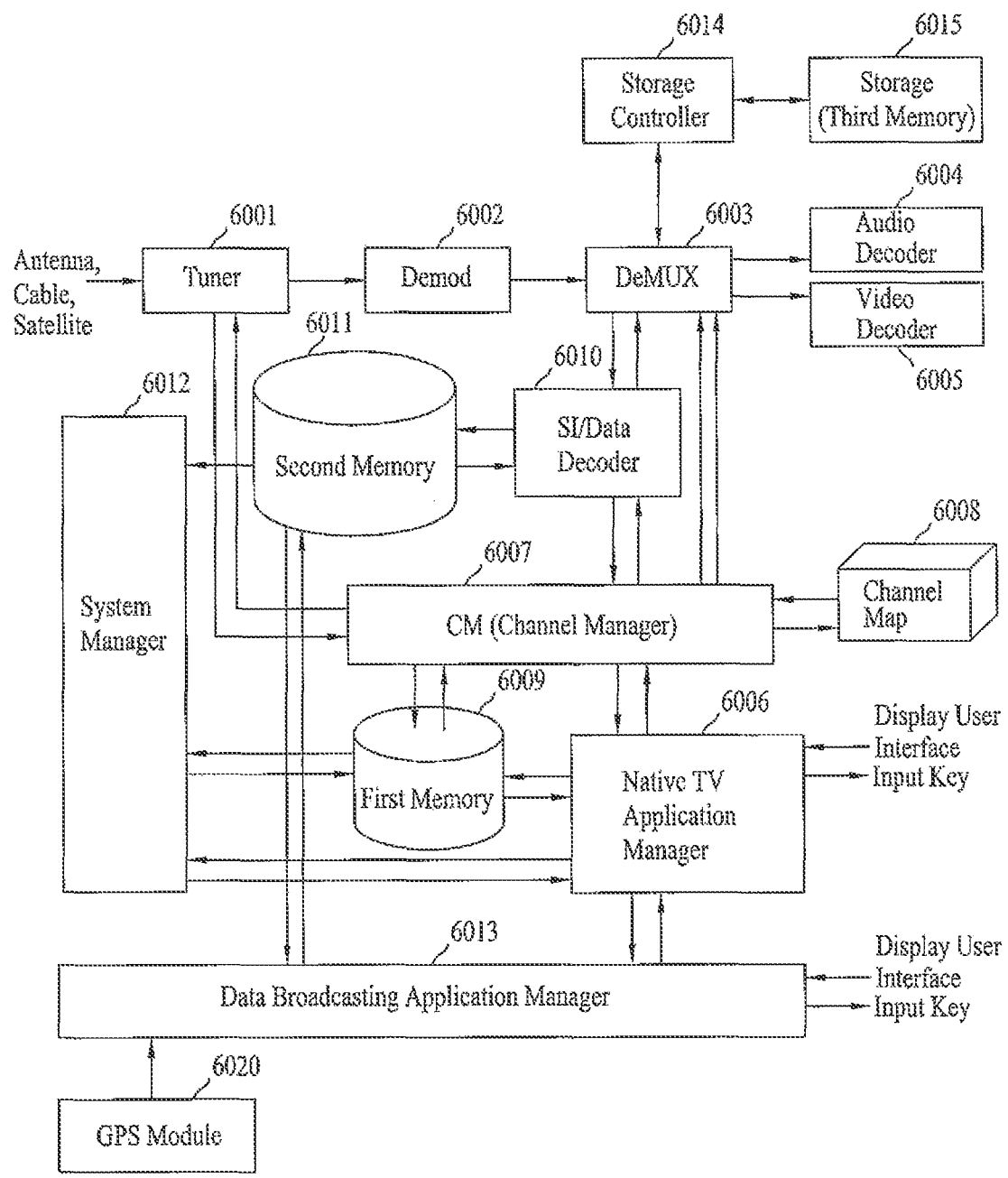
FIG. 66 illustrates a block diagram of a receiving system according to an embodiment of the present invention.

FIG. 66 illustrates a block diagram showing a structure of a digital broadcast receiving system according to an embodiment of the present invention. Herein, the demodulating unit of FIG. 36 may be applied in the digital broadcast receiving system. Referring to FIG. 66, the digital broadcast receiving system includes a tuner 6001, a demodulating unit 6002, a demultiplexer 6003, an audio decoder 6004, a video decoder 6005, a native TV application manager 6006, a channel manager 6007, a channel map 6008, a first memory 6009, an SI and/or data decoder 6010, a second memory 6011, a system manager 6012, a data broadcast application manager 6013, a storage controller 6014, a third memory 6015, and a GPS module 6020. Herein, the first memory 6009 corresponds to a non-volatile random access memory (NVRAM) (or a flash memory). The third memory 6015 corresponds to a large-scale storage device, such as a hard disk drive (HDD), a memory chip, and so on.

The tuner 6001 tunes a frequency of a specific channel through any one of an antenna, cable, and satellite. Then, the tuner 6001 down-converts the tuned frequency to an intermediate frequency (IF), which is then outputted to the demodulating unit 6002. At this point, the tuner 6001 is controlled by the channel manager 6007. Additionally, the result and strength of the broadcast signal of the tuned channel are also reported to the channel manager 6007. The data that are being received by the frequency of the tuned specific channel include main service data, mobile service data, and table data for decoding the main service data and mobile service data.

According to the embodiment of the present invention, audio data and video data for mobile broadcast programs may be applied as the mobile service data. Such audio data and video data are compressed by various types of encoders so as to be transmitted to a broadcasting station. In this case, the video decoder 6004 and the audio decoder 6005 will be provided in the receiving system so as to correspond to each of the encoders used for the compression process. Thereafter, the decoding process will be performed by the video decoder 6004 and the audio decoder 6005. Then, the processed video and audio data will be provided to the users. Examples of the encoding/decoding scheme for the audio data may include AC 3, MPEG 2 AUDIO, MPEG 4 AUDIO, AAC, AAC+, HE AAC, AAC SBR, MPEG-Surround, and BSAC. And, examples of the encoding/decoding scheme for the video data may include MPEG 2 VIDEO, MPEG 4 VIDEO, H.264, SVC, and VC-1.

Depending upon the embodiment of the present invention, examples of the mobile service data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the mobile service data may correspond to meta data. For example, the meta data be written in XML format so as to be transmitted through a DSM-CC protocol.

The demodulating unit 6002 performs VSB-demodulation and channel equalization on the signal being outputted from the tuner 6001, thereby identifying the main service data and the mobile service data. Thereafter, the identified main service data and mobile service data are outputted in TS packet units. An example of the demodulating unit 6002 is shown in FIG. 36 to FIG. 65. Therefore, the structure and operation of the demodulator will be described in detail in a later process. However, this is merely exemplary and the scope of the present invention is not limited to the example set forth herein. In the embodiment given as an example of the present invention, only the mobile service data packet outputted from the demodulating unit 6002 is inputted to the demultiplexer 6003. In this case, the main service data packet is inputted to another demultiplexer (not shown) that processes main service data packets. Herein, the storage controller 6014 is also connected to the other demultiplexer in order to store the main service data after processing the main service data packets. The demultiplexer of the present invention may also be designed to process both mobile service data packets and main service data packets in a single demultiplexer.

The storage controller 6014 is interfaced with the demultiplexer so as to control instant recording, reserved (or pre-programmed) recording, time shift, and so on of the mobile service data and/or main service data. For example, when one of instant recording, reserved (or pre-programmed) recording, and time shift is set and programmed in the receiving system (or receiver) shown in FIG. 66, the corresponding mobile service data and/or main service data that are inputted to the demultiplexer are stored in the third memory 6015 in accordance with the control of the storage controller 6014. The third memory 6015 may be described as a temporary storage area and/or a permanent storage area. Herein, the temporary storage area is used for the time shifting function, and the permanent storage area is used for a permanent storage of data according to the user's choice (or decision).

When the data stored in the third memory 6015 need to be reproduced (or played), the storage controller 6014 reads the corresponding data stored in the third memory 6015 and outputs the read data to the corresponding demultiplexer (e.g., the mobile service data are outputted to the demultiplexer 6003 shown in FIG. 66). At this point, according to the embodiment of the present invention, since the storage capacity of the third memory 6015 is limited, the compression encoded mobile service data and/or main service data that are being inputted are directly stored in the third memory 6015 without any modification for the efficiency of the storage capacity. In this case, depending upon the reproduction (or reading) command, the data read from the third memory 6015 pass trough the demultiplexer so as to be inputted to the corresponding decoder, thereby being restored to the initial state.

The storage controller 6014 may control the reproduction (or play), fast-forward, rewind, slow motion, instant replay functions of the data that are already stored in the third memory 6015 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function.

If the data being inputted correspond to the analog format, for example, if the transmission mode is NTSC, PAL, and so on, the storage controller 6014 compression encodes the inputted data and stored the compression-encoded data to the third memory 6015. In order to do so, the storage controller 6014 may include an encoder, wherein the encoder may be embodied as one of software, middleware, and hardware. Herein, an MPEG encoder may be used as the encoder according to an embodiment of the present invention. The encoder may also be provided outside of the storage controller 6014.

Meanwhile, in order to prevent illegal duplication (or copies) of the input data being stored in the third memory 6015, the storage controller 6014 scrambles (or encrypts) the input data and stores the scrambled (or encrypted) data in the third memory 6015. Accordingly, the storage controller 6014 may include a scramble algorithm (or encryption algorithm) for scrambling the data stored in the third memory 6015 and a descramble algorithm (or decryption algorithm) for descrambling (or decrypting) the data read from the third memory 6015. The scrambling method may include using an arbitrary key (e.g., control word) to modify a desired set of data, and also a method of mixing signals.

Meanwhile, the demultiplexer 6003 receives the real-time data outputted from the demodulating unit 6002 or the data read from the third memory 6015 and demultiplexes the received data. In the example given in the present invention, the demultiplexer 6003 performs demultiplexing on the mobile service data packet. Therefore, in the present invention, the receiving and processing of the mobile service data will be described in detail. However, depending upon the many embodiments of the present invention, not only the mobile service data but also the main service data may be processed by the demultiplexer 6003, the audio decoder 6004, the video decoder 6005, the native TV application manager 6006, the channel manager 6007, the channel map 6008, the first memory 6009, the SI and/or data decoder 6010, the second memory 6011, a system manager 6012, the data broadcast application manager 6013, the storage controller 6014, the third memory 6015, and the GPS module 6020. Thereafter, the processed data may be used to provide diverse services to the users.

The demultiplexer 6003 demultiplexes mobile service data and system information (SI) tables from the mobile service data packet inputted in accordance with the control of the SI and/or data decoder 6010. Thereafter, the demultiplexed mobile service data and SI tables are outputted to the SI and/or data decoder 6010 in a section format. In this case, it is preferable that data for the data service are used as the mobile service data that are inputted to the SI and/or data decoder 6010. In order to extract the mobile service data from the channel through which mobile service data are transmitted and to decode the extracted mobile service data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number.

FIG. 67 illustrates a VCT syntax according to an embodiment of the present invention. The VCT syntax of FIG. 67 is configured by including at least one of a table_id field, a section_syntax_indicator field, a private_indicator field, a section_length field, a transport_stream_id field, a version_number field, a current_next_indicator field, a section_number field, a last_section_number field, a protocol_version field, and a num_channels_in_section field.

The VCT syntax further includes a first 'for' loop repetition statement that is repeated as much as the num_channels_in_section field value. The first repetition statement may include at least one of a short_name field, a major_channel_number field, a minor_channel_number field, a modulation_mode field, a carrier_frequency field, a channel_TSID field, a program_number field, an ETM_location field, an access_controlled field, a hidden field, a service_type field, a source_id field, a descriptor_length field, and a second 'for' loop statement that is repeated as much as the number of descriptors included in the first repetition statement. Herein, the second repetition statement will be referred to as a first descriptor loop for simplicity. The descriptor descriptors( ) included in the first descriptor loop is separately applied to each virtual channel.

Furthermore, the VCT syntax may further include an additional_descriptor_length field, and a third 'for' loop statement that is repeated as much as the number of descriptors additionally added to the VCT. For simplicity of the description of the present invention, the third repetition statement will be referred to as a second descriptor loop. The descriptor additional_descriptors( ) included in the second descriptor loop is commonly applied to all virtual channels described in the VCT.

As described above, referring to FIG. 67, the table_id field indicates a unique identifier (or identification) (ID) that can identify the information being transmitted to the table as the VCT. More specifically, the table_id field indicates a value informing that the table corresponding to this section is a VCT. For example, a 0xC8 value may be given to the table_id field.

The version_number field indicates the version number of the VCT. The section_number field indicates the number of this section. The last_section_number field indicates the number of the last section of a complete VCT. And, the num_channel_in_section field designates the number of the overall virtual channel existing within the VCT section. Furthermore, in the first 'for' loop repetition statement, the short_name field indicates the name of a virtual channel. The major_channel_number field indicates a 'major' channel number associated with the virtual channel defined within the first repetition statement, and the minor_channel_number field indicates a 'minor' channel number. More specifically, each of the channel numbers should be connected to the major and minor channel numbers, and the major and minor channel numbers are used as user reference numbers for the corresponding virtual channel.

The program_number field is shown for connecting the virtual channel having an MPEG-2 program association table (PAT) and program map table (PMT) defined therein, and the program_number field matches the program number within the PAT/PMT. Herein, the PAT describes the elements of a program corresponding to each program number, and the PAT indicates the PID of a transport packet transmitting the PMT. The PMT described subordinate information, and a PID list of the transport packet through which a program identification number and a separate bit sequence, such as video and/or audio data configuring the program, are being transmitted.

FIG. 68 illustrates a service_type field according to an embodiment of the present invention. The service_type field indicates the service type provided in a corresponding virtual channel. Referring to FIG. 68, it is provided that the service_type field should only indicate an analog television, a digital television, digital audio data, and digital video data. Also, according to the embodiment of the present invention, it may be provided that a mobile broadcast program should be designated to the service_type field. The service_type field, which is parsed by the SI and/or data decoder 6010 may be provided to a receiving system, as shown in FIG. 66, and used accordingly. According to other embodiments of the present invention, the parsed service_type field may also be provided to each of the audio decoder 6004 and video decoder 6005, so as to be used in the decoding process.

The source_id field indicates a program source connected to the corresponding virtual channel. Herein, a source refers to a specific source, such as an image, a text, video data, or sound. The source_id field value has a unique value within the transport stream transmitting the VCT. Meanwhile, a service location descriptor may be included in a descriptor loop (i.e., descriptor{ }) within a next 'for' loop repetition statement. The service location descriptor may include a stream type, PID, and language code for each elementary stream.

FIG. 69 illustrates a service location descriptor according to an embodiment of the present invention. As shown in FIG. 69, the service location descriptor may include a descriptor_tag field, a descriptor_length field, and a PCR_PID field. Herein, the PCR_PID field indicates the PID of a transport stream packet within a program specified by a program_number field, wherein the transport stream packet includes a valid PCR field. Meanwhile, the service location descriptor includes a number_elements field so as to indicate a number of PIDs used in the corresponding program. The number of repetition of a next 'for' descriptor loop repetition statement can be decided, depending upon the value of the number_elements field. Referring to FIG. 69, the 'for' loop repetition statement includes a stream_type field, an elementary_PID field, and an ISO_639_language_code field. Herein, the stream_type field indicates the stream type of the corresponding elementary stream (i.e., video/audio data). The elementary_PID field indicates the PID of the corresponding elementary stream. The ISO_639_language_code field indicates a language code of the corresponding elementary stream.

FIG. 70 illustrates examples that may be assigned to the stream_type field according to the present invention. As shown in FIG. 70, ISO/IEC 11172 Video, ITU-T Rec. H.262|ISO/IEC 13818-2 Video or ISO/IEC 11172-2 constrained parameter video stream, ISO/IEC 11172 Audio, ISO/IEC 13818-3 Audio, ITU-T Rec. H.222.0|ISO/IEC 13818-1 private_sections, ITU-T Rec. H.222.0|ISO/IEC 13818-1 PES packets containing private data, ISO/IEC 13522 MHEG, ITU-T Rec. H.222.0|ISO/IEC 13818-1 Annex A DSM CC, ITU-T Rec. H.222.1, ISO/IEC 13818-6 type A, ISO/IEC 13818-6 type B, ISO/IEC 13818-6 type C, ISO/IEC 13818-6 type D, ISO/IEC 13818-1 auxiliary, and so on may be applied as the stream type. Meanwhile, according to the embodiment of the present invention, MPH video stream: Non-hierarchical mode, MPH audio stream: Non-hierarchical mode, MPH Non-A/V stream: Non-hierarchical mode, MPH High Priority video stream: Hierarchical mode, MPH High Priority audio stream: Hierarchical mode, MPH Low Priority video stream: Hierarchical mode, MPH Low priority audio stream: Hierarchical mode, and so on may further be applied as the stream type.

As described above, "MPH" corresponds to the initials of "mobile", "pedestrian", and "handheld" and represents the opposite concept of a fixed-type system. Therefore, the MPH video stream: Non-hierarchical mode, the MPH audio stream: Non-hierarchical mode, the MPH Non-A/V stream: Non-hierarchical mode, the MPH High Priority video stream: Hierarchical mode, the MPH High Priority audio stream: Hierarchical mode, the MPH Low Priority video stream: Hierarchical mode, and the MPH Low priority audio stream: Hierarchical mode correspond to stream types that are applied when mobile broadcast programs are being transmitted and received. Also the Hierarchical mode and the Non-hierarchical mode each correspond to values that are used in stream types having different priority levels. Herein, the priority level is determined based upon a hierarchical structure applied in any one of the encoding or decoding method.

Therefore, when a hierarchical structure-type codec is used, a field value including the hierarchical mode and the non-hierarchical mode is respectively designated so as to identify each stream. Such stream type information is parsed by the SI and/or data decoder 6010, so as to be provided to the video and audio decoders 6004 and 6005. Thereafter, each of the video and audio decoders 6004 and 6005 uses the parsed stream type information in order to perform the decoding process. Other stream types that may be applied in the present invention may include MPEG 4 AUDIO, AC 3, AAC, AAC+, BSAC, HE AAC, AAC SBR, and MPEG-S for the audio data, and may also include MPEG 2 VIDEO, MPEG 4 VIDEO, H.264, SVC, and VC-1 for the video data.

Furthermore, referring to FIG. 70, in fields using the hierarchical mode and the non-hierarchical mode, such as the MPH video stream: Non-hierarchical mode and the MPH audio stream: Non-hierarchical mode, examples of using the MPEG 4 AUDIO, AC 3, AAC, AAC+, BSAC, HE AAC, AAC SBR, and MPEG-S for the audio data, and the MPEG 2 VIDEO, MPEG 4 VIDEO, H.264, SVC, and VC-1 for the video data may also be respectively used as replacements for each of the audio stream and the video stream may be considered as other embodiments of the present invention and may, therefore, be included in the scope of the present invention. Meanwhile, the stream_type field may be provided as one of the fields within the PMT. And, in this case, it is apparent that such stream_type field includes the above-described syntax. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.).

FIG. 71 illustrates a bit stream syntax for an event information table (EIT) according to the present invention. In this embodiment, the EIT shown in FIG. 71 corresponds to a PSIP table including information on a title, start time, duration, and so on of an event in a virtual channel. Referring to FIG. 71, the EIT is configured of a plurality of fields including a table_id field, a section_syntax_indicator field, a private_indicator field, a source_ID, a version_numbers_in_section field, a current_next_indicator field, and a num_event field. More specifically, the table_id field is an 8-bit field having the value of '0xCB', which indicates that the corresponding section is included in the EIT. The section_syntax_indicator field is a 1-bit field having the value of '1'. This indicates that the corresponding section passes through the section_length field and is in accordance with a generic section syntax. The private_indicator field corresponds to a 1-bit field having the value of '1'.

Also, the source_ID corresponds to an ID identifying a virtual channel that carries an event shown in the above-described table. The version_numbers_in_section field indicates the version of an element included in the event information table. In the present invention, with respect to the previous version number, an event change information included in the event information table, wherein the event change information has a new version number is recognized as the latest change in information. The current_next_indicator field indicates whether the event information included in the corresponding EIT is a current information or a next information. And, finally, the num_event field represents the number of events included in the channel having a source ID. More specifically, an event loop shown below is repeated as many times as the number of events.

The above-described EIT field is commonly applied to at least one or more events included in one EIT syntax. A loop statement, which is included as "for (j=0; j<num_event_in_section;j++){ }", describes the characteristics of each event. The following fields represent detailed information of each individual event. Therefore, the following fields are individually applied to each corresponding event described by the EIT syntax. An event_ID included in an event loop is an identifier for identifying each individual event. The number of the event ID corresponds to a portion of the identifier for even extended text message (i.e., ETM_ID). A start_time field indicates the starting time of an event. Therefore, the start_time field collects the starting time information of a program provided from an electronic program information. A length_in_seconds field indicates the duration of an event. Therefore, the length_in_seconds field collects the ending time information of a program provided from an electronic program information. More specifically, the ending time information is collected by adding the start_time field value and the length_in_seconds field value. A title_text( ) field may be used to indicate the tile of a broadcast program.

Meanwhile, the descriptor applied to each event may be included in the EIT. Herein, a descriptors_length field indicates the length of a descriptor. Also, a descriptor loop (i.e., descriptor{ }) included in a 'for' loop repetition statement includes at least one of an AC-3 audio descriptor, an MPEG 2 audio descriptor, an MPEG 4 audio descriptor, an AAC descriptor, an AAC+ descriptor, an HE AAC descriptor, an AAC SBR descriptor, an MPEG surround descriptor, a BSAC descriptor, an MPEG 2 video descriptor, an MPEG 4 video descriptor, an H.264 descriptor, an SVC descriptor, and a VC-1 descriptor. Herein, each descriptor describes information on audio/video codec applied to each event. Such codec information may be provided to the audio/video decoder 6004 and 6005 and used in the decoding process.

Finally, the DCCT/DCCSCT transmits information associated with automatic (or direct) channel change. And, the MGT transmits the versions and PID information of the above-mentioned tables included in the PSIP. Each of the above-described tables included in the PSI/PSIP is configured of a basic unit referred to as a "section", and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PSIP, or a combination of tables included in both the PSI and the PSIP. In order to parse and decode the mobile service data, at least one of the PAT and PMT included in the PSI, and the VCT included in the PSIP is required. For example, the PAT may include the system information for transmitting the mobile service data, and the PID of the PMT corresponding to the mobile service data (or program number). The PMT may include the PID of the TS packet used for transmitting the mobile service data. The VCT may include information on the virtual channel for transmitting the mobile service data, and the PID of the TS packet for transmitting the mobile service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, when the mobile service data correspond to audio data and video data, it is preferable that the mobile service data included (or loaded) in a payload within a TS packet correspond to PES type mobile service data. According to another embodiment of the present invention, when the mobile service data correspond to the data for the data service (or data service data), the mobile service data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the receiving system may acknowledge the reception of the data broadcast program including mobile service data. At this point, the mobile service data may be transmitted by a data/object carousel method. The data/object carousel method corresponds to repeatedly transmitting identical data on a regular basis.

At this point, according to the control of the SI and/or data decoder 6010, the demultiplexer 6003 performs section filtering, thereby discarding repetitive sections and outputting only the non-repetitive sections to the SI and/or data decoder 6010. The demultiplexer 6003 may also output only the sections configuring desired tables (e.g., VCT or EIT) to the SI and/or data decoder 6010 by section filtering. Herein, the VCT or EIT may include a specific descriptor for the mobile service data. However, the present invention does not exclude the possibilities of the mobile service data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 6003 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 6003 may output only an application information table (AIT) to the SI and/or data decoder 6010 by section filtering. The AIT includes information on an application being operated in the receiver for the data service. The AIT may also be referred to as an XAIT, and an AMT. Therefore, any table including application information may correspond to the following description. When the AIT is transmitted, a value of '0x05' may be assigned to a stream_type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 6011 by the SI and/or data decoder 6010.

The SI and/or data decoder 6010 parses the DSM-CC section configuring the demultiplexed mobile service data. Then, the mobile service data corresponding to the parsed result are stored as a database in the second memory 6011. The SI and/or data decoder 6010 groups a plurality of sections having the same table identification (table_id) so as to configure a table, which is then parsed. Thereafter, the parsed result is stored as a database in the second memory 6011. At this point, by parsing data and/or sections, the SI and/or data decoder 6010 reads all of the remaining actual section data that are not section-filtered by the demultiplexer 6003. Then, the SI and/or data decoder 6010 stores the read data to the second memory 6011. The second memory 6011 corresponds to a table and data/object carousel database storing system information parsed from tables and mobile service data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT. When the VCT is parsed, information on the virtual channel to which mobile service data are transmitted may be obtained.

Also, according to the present invention, the SI and/or data decoder 6010 parses the SLD of the VCT, thereby transmitting the stream type information of the corresponding elementary stream to the audio decoder 6004 or the video decoder 6005. In this case, the corresponding audio decoder 6004 or video decoder 6005 uses the transmitted stream type information so as to perform the audio or video decoding process. Furthermore, according to the present invention, the SI and/or data decoder 6010 parses an AC-3 audio descriptor, an MPEG 2 audio descriptor, an MPEG 4 audio descriptor, an AAC descriptor, an AAC+ descriptor, an HE AAC descriptor, an AAC SBR descriptor, an MPEG surround descriptor, a BSAC descriptor, an MPEG 2 video descriptor, an MPEG 4 video descriptor, an H.264 descriptor, an SVC descriptor, a VC-1 descriptor, and so on, of the EIT, thereby transmitting the audio or video codec information of the corresponding event to the audio decoder 6004 or video decoder 6005. In this case, the corresponding audio decoder 6004 or video decoder 6005 uses the transmitted audio or video codec information in order to perform an audio or video decoding process.

The obtained application identification information, service component identification information, and service information corresponding to the data service may either be stored in the second memory 6011 or be outputted to the data broadcasting application manager 6013. In addition, reference may be made to the application identification information, service component identification information, and service information in order to decode the data service data. Alternatively, such information may also prepare the operation of the application program for the data service. Furthermore, the SI and/or data decoder 6010 controls the demultiplexing of the system information table, which corresponds to the information table associated with the channel and events. Thereafter, an A/V PID list may be transmitted to the channel manager 6007.

The channel manager 6007 may refer to the channel map 6008 in order to transmit a request for receiving system-related information data to the SI and/or data decoder 6010, thereby receiving the corresponding result. In addition, the channel manager 6007 may also control the channel tuning of the tuner 6001. Furthermore, the channel manager 6007 may directly control the demultiplexer 6003, so as to set up the A/V PID, thereby controlling the audio decoder 6004 and the video decoder 6005.

The audio decoder 6004 and the video decoder 6005 may respectively decode and output the audio data and video data demultiplexed from the main service data packet. Alternatively, the audio decoder 6004 and the video decoder 6005 may respectively decode and output the audio data and video data demultiplexed from the mobile service data packet. Meanwhile, when the mobile service data include data service data, and also audio data and video data, it is apparent that the audio data and video data demultiplexed by the demultiplexer 6003 are respectively decoded by the audio decoder 6004 and the video decoder 6005. For example, an audio-coding (AC)-3 decoding algorithm, an MPEG-2 audio decoding algorithm, an MPEG-4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm may be applied to the audio decoder 6004. Also, an MPEG-2 video decoding algorithm, an MPEG-4 video decoding algorithm, an H.264 decoding algorithm, an SVC decoding algorithm, and a VC-1 decoding algorithm may be applied to the video decoder 6005. Accordingly, the decoding process may be performed.

Meanwhile, the native TV application manager 6006 operates a native application program stored in the first memory 6009, thereby performing general functions such as channel change. The native application program refers to software stored in the receiving system upon shipping of the product. More specifically, when a user request (or command) is transmitted to the receiving system through a user interface (UI), the native TV application manger 6006 displays the user request on a screen through a graphic user interface (GUI), thereby responding to the user's request. The user interface receives the user request through an input device, such as a remote controller, a key pad, a jog controller, an a touch-screen provided on the screen, and then outputs the received user request to the native TV application manager 6006 and the data broadcasting application manager 6013. Furthermore, the native TV application manager 6006 controls the channel manager 6007, thereby controlling channel-associated operations, such as the management of the channel map 6008, and controlling the SI and/or data decoder 6010. The native TV application manager 6006 also controls the GUI of the overall receiving system, thereby storing the user request and status of the receiving system in the first memory 6009 and restoring the stored information.

The channel manager 6007 controls the tuner 6001 and the SI and/or data decoder 6010, so as to managing the channel map 6008 so that it can respond to the channel request made by the user. More specifically, channel manager 6007 sends a request to the SI and/or data decoder 6010 so that the tables associated with the channels that are to be tuned are parsed. The results of the parsed tables are reported to the channel manager 6007 by the SI and/or data decoder 6010. Thereafter, based on the parsed results, the channel manager 6007 updates the channel map 6008 and sets up a PID in the demultiplexer 6003 for demultiplexing the tables associated with the data service data from the mobile service data.

The system manager 6012 controls the booting of the receiving system by turning the power on or off. Then, the system manager 6012 stores ROM images (including downloaded software images) in the first memory 6009. More specifically, the first memory 6009 stores management programs such as operating system (OS) programs required for managing the receiving system and also application program executing data service functions. The application program is a program processing the data service data stored in the second memory 6011 so as to provide the user with the data service. If the data service data are stored in the second memory 6011, the corresponding data service data are processed by the above-described application program or by other application programs, thereby being provided to the user. The management program and application program stored in the first memory 6009 may be updated or corrected to a newly downloaded program. Furthermore, the storage of the stored management program and application program is maintained without being deleted even if the power of the system is shut down. Therefore, when the power is supplied, the programs may be executed without having to be newly downloaded once again.

The application program for providing data service according to the present invention may either be initially stored in the first memory 6009 upon the shipping of the receiving system, or be stored in the first memory 6009 after being downloaded. The application program for the data service (i.e., the data service providing application program) stored in the first memory 6009 may also be deleted, updated, and corrected. Furthermore, the data service providing application program may be downloaded and executed along with the data service data each time the data service data are being received.

When a data service request is transmitted through the user interface, the data broadcasting application manager 6013 operates the corresponding application program stored in the first memory 6009 so as to process the requested data, thereby providing the user with the requested data service. And, in order to provide such data service, the data broadcasting application manager 6013 supports the graphic user interface (GUI). Herein, the data service may be provided in the form of text (or short message service (SMS)), voice message, still image, and moving image. The data broadcasting application manager 6013 may be provided with a platform for executing the application program stored in the first memory 6009. The platform may be, for example, a Java virtual machine for executing the Java program. Hereinafter, an example of the data broadcasting application manager 6013 executing the data service providing application program stored in the first memory 6009, so as to process the data service data stored in the second memory 6011, thereby providing the user with the corresponding data service will now be described in detail.

Assuming that the data service corresponds to a traffic information service, the data service according to the present invention is provided to the user of a receiver that is not equipped with an electronic map and/or a GPS system in the form of at least one of a text (or short message service (SMS)), a voice message, a graphic message, a still image, and a moving image. In this case, when a GPS module 6020 is mounted on the receiving system, as shown in FIG. 66, the GPS module 6020 receives satellite signals transmitted from a plurality of low earth orbit satellites and extracts the current position (or location) information (e.g., longitude, latitude, altitude), thereby outputting the extracted information to the data broadcasting application manager 6013.

At this point, it is assumed that the electronic map including information on each link and nod and other diverse graphic information are stored in one of the second memory 6011, the first memory 6009, and another memory that is not shown. More specifically, according to the request made by the data broadcasting application manager 6013, the data service data stored in the second memory 6011 are read and inputted to the data broadcasting application manager 6013. The data broadcasting application manager 6013 translates (or deciphers) the data service data read from the second memory 6011, thereby extracting the necessary information according to the contents of the message and/or a control signal. In other words, the data broadcasting application manager 6013 uses the current position information and the graphic information, so that the current position information can be processed and provided to the user in a graphic format.

Figure 72:
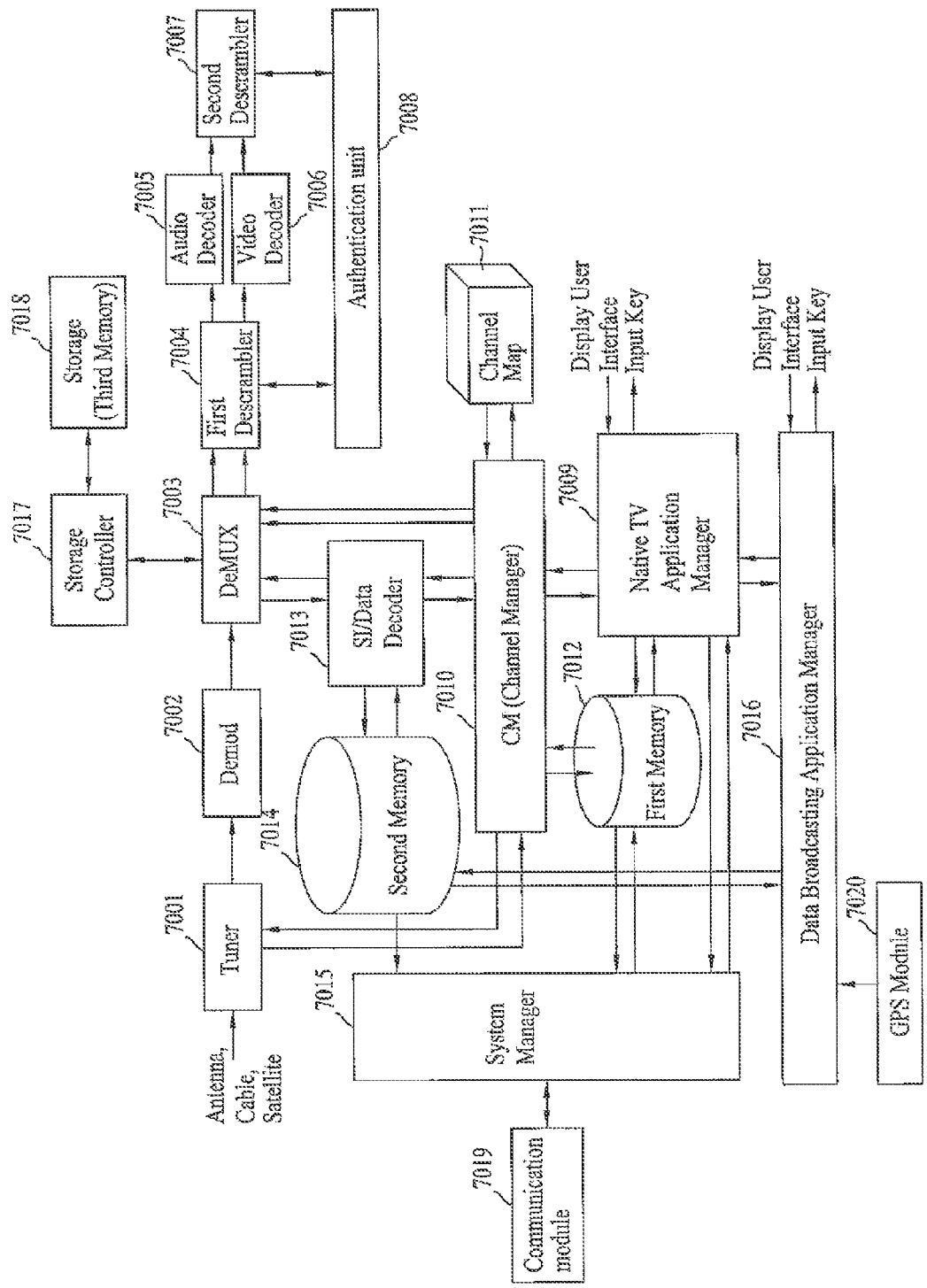
FIG. 72 illustrates a block diagram of a receiving system according to another embodiment of the present invention.

FIG. 72 illustrates a block diagram showing the structure of a digital broadcast (or television) receiving system according to another embodiment of the present invention. Referring to FIG. 72, the digital broadcast receiving system includes a tuner 7001, a demodulating unit 7002, a demultiplexer 7003, a first descrambler 7004, an audio decoder 7005, a video decoder 7006, a second descrambler 7007, an authentication unit 7008, a native TV application manager 7009, a channel manager 7010, a channel map 7011, a first memory 7012, a data decoder 7013, a second memory 7014, a system manager 7015, a data broadcasting application manager 7016, a storage controller 7017, a third memory 7018, a telecommunication module 7019, and a GPS module 7020. Herein, the third memory 7018 is a mass storage device, such as a hard disk drive (HDD) or a memory chip. Also, during the description of the digital broadcast (or television or DTV) receiving system shown in FIG. 72, the components that are identical to those of the digital broadcast receiving system of FIG. 66 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 7004 and 7007, and the authentication means will be referred to as an authentication unit 7008. Such naming of the corresponding components is merely exemplary and is not limited to the terms suggested in the description of the present invention. For example, the units may also be referred to as a decryptor. Although FIG. 72 illustrates an example of the descramblers 7004 and 7007 and the authentication unit 7008 being provided inside the receiving system, each of the descramblers 7004 and 7007 and the authentication unit 7008 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 7008, the scrambled broadcasting contents are descrambled by the descramblers 7004 and 7007, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 7008 and the descramblers 7004 and 7007 will now be described in detail. The receiving system receives the scrambled broadcasting contents through the tuner 7001 and the demodulating unit 7002. Then, the system manager 7015 decides whether the received broadcasting contents have been scrambled. Herein, the demodulating unit 7002 may be included as a demodulating means according to embodiment of the present invention as described in FIG. 36 to FIG. 65. However, the present invention is not limited to the examples given in the description set forth herein. If the system manager 7015 decides that the received broadcasting contents have been scrambled, then the system manager 7015 controls the system to operate the authentication unit 7008. As described above, the authentication unit 7008 performs an authentication process in order to decide whether the receiving system according to the present invention corresponds to a legitimate host entitled to receive the paid broadcasting service. Herein, the authentication process may vary in accordance with the authentication methods.

For example, the authentication unit 7008 may perform the authentication process by comparing an IP address of an IP datagram within the received broadcasting contents with a specific address of a corresponding host. At this point, the specific address of the corresponding receiving system (or host) may be a MAC address. More specifically, the authentication unit 7008 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 7008 performs the authentication process by determining the conformity between the address of the corresponding receiving system and the system information of the receiving system that is mapped with the IP address. In other words, if the authentication unit 7008 determines that the two types of information conform to one another, then the authentication unit 7008 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or another data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 7008 of the receiving system extracts the identification information of the receiving system and the identification information included in the EMM of the broadcasting service that is being received. Then, the authentication unit 7008 determines whether the identification information conform to each other, so as to perform the authentication process. More specifically, if the authentication unit 7008 determines that the information conform to each other, then the authentication unit 7008 eventually determines that the receiving system is entitled to receive the request broadcasting service.

In yet another example, the authentication unit 7008 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 7015 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 7015 transmits the payment information to the remote transmitting system through the telecommunication module 7019.

The authentication unit 7008 authenticates the corresponding receiving system and/or the external module. Then, if the authentication process is successfully completed, the authentication unit 7008 certifies the corresponding receiving system and/or the external module as a legitimate system and/or module entitled to receive the requested paid broadcasting service. In addition, the authentication unit 7008 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 7008, the receiving system may descramble the scrambled broadcasting contents received from the transmitting system. At this point, the descrambling process is performed by the first and second descramblers 7004 and 7007. Herein, the first and second descramblers 7004 and 7007 may be included in an internal module or an external module of the receiving system.

The receiving system is also provided with a common interface for communicating with the external module including the first and second descramblers 7004 and 7007, so as to perform the descrambling process. More specifically, the first and second descramblers 7004 and 7007 may be included in the module or in the receiving system in the form of hardware, middleware or software. Herein, the descramblers 7004 and 7007 may be included in any one of or both of the module and the receiving system. If the first and second descramblers 7004 and 7007 are provided inside the receiving system, it is advantageous to have the transmitting system (i.e., at least any one of a service provider and a broadcast station) scramble the corresponding data using the same scrambling method.

Alternatively, if the first and second descramblers 7004 and 7007 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 7015, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the CAS software is read out from the memory card and stored in the first memory 7012 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 7008 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 7008 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 7015, then the memory card is verified and determined to be a normal memory card that may be used in the receiving system. At this point, the CAS software may either be installed in the first memory 7012 upon the shipping of the present invention, or be downloaded to the first memory 7012 from the transmitting system or the module or memory card, as described above. Herein, the descrambling function may be operated by the data broadcasting application manger 7016 as an application program.

Thereafter, the CAS software parses the EMM/ECM packets outputted from the demultiplexer 7003, so as to verify whether the receiving system is entitled to receive the corresponding data, thereby obtaining the information required for descrambling (i.e., the CW) and providing the obtained CW to the descramblers 7004 and 7007. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 7004 and 7007. Each of the descramblers 7004 and 7007 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 7004 and 7007 may be included in the module either in the form of hardware or in the form of software. In this case, the scrambled data that being received are descrambled by the module and then demodulated. Also, if the scrambled data that are being received are stored in the third memory 7018, the received data may be descrambled and then stored, or stored in the memory at the point of being received and then descrambled later on prior to being played (or reproduced). Thereafter, in case scramble/descramble algorithms are provided in the storage controller 7017, the storage controller 7017 scrambles the data that are being received once again and then stores the re-scrambled data to the third memory 7018.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 7019. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 7019 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 7019 may also be configured. Also, the PDU may be configured in the Java application of the receiving system and then outputted to the telecommunication module 7019. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1×EV-DO, which can be connected through a mobile telecommunication base station, such as CDMA and GSM, and also provided with a wireless LAN, mobile internet, WiBro, WiMax, which can be connected through an access point. The above-described receiving system corresponds to the system that is not equipped with a telecommunication function. However, a receiving system equipped with telecommunication function does not require the telecommunication module 7019.

The broadcasting data being transmitted and received through the above-described wireless data network may include data required for performing the function of limiting data reception. Meanwhile, the demultiplexer 7003 receives either the real-time data outputted from the demodulating unit 7002 or the data read from the third memory 7018, thereby performing demultiplexing. In this embodiment of the present invention, the demultiplexer 7003 performs demultiplexing on the enhanced data packet. Similar process steps have already been described earlier in the description of the present invention. Therefore, a detailed of the process of demultiplexing the enhanced data will be omitted for simplicity.

The first descrambler 7004 receives the demultiplexed signals from the demultiplexer 7003 and then descrambles the received signals. At this point, the first descrambler 7004 may receive the authentication result received from the authentication unit 7008 and other data required for the descrambling process, so as to perform the descrambling process. The audio decoder 7005 and the video decoder 7006 receive the signals descrambled by the first descrambler 7004, which are then decoded and outputted. Alternatively, if the first descrambler 7004 did not perform the descrambling process, then the audio decoder 7005 and the video decoder 7006 directly decode and output the received signals. In this case, the decoded signals are received and then descrambled by the second descrambler 7007 and processed accordingly.

As described above, the present invention has the following advantages. More specifically, the present invention is highly protected against (or resistant to) any error that may occur when transmitting supplemental data through a channel. And, the present invention is also highly compatible to the conventional receiving system. Moreover, the present invention may also receive the supplemental data without any error even in channels having severe ghost effect and noise.

Furthermore, the present invention is even more effective when applied to mobile and portable receivers, which are also liable to a frequent change in channel and which require protection (or resistance) against intense noise.

Another Embodiment of Transmitting System

In another embodiment of the transmitting system, mobile service data is transmitted on the basis of an Internet protocol (IP).

In one embodiment of the present invention, main service data is transmitted on the basis of an MPEG-2 and mobile service data is transmitted on the basis of the IP.

Figure 73:
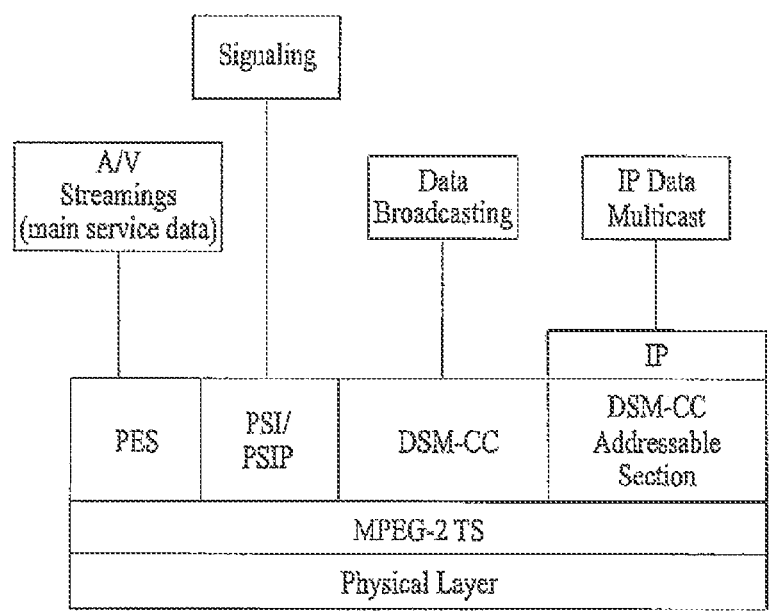
FIG. 73 shows an embodiment of a protocol stack for providing a main service on the basis of the MPEG-2.

FIG. 73 shows an embodiment of a protocol stack for providing a main service on the basis of the MPEG-2.

In FIG. 73, A/V streamings for the main service are elementary streams (ESs) and are packetized by a packetized elementary stream (PES) method, and a PES packet is packetized to an MPEG-2 TS of a 188 byte-unit. Signaling information such as PSI/PSIP including the configuration information of each service is sectioned. That is, Signaling information such as PSI/PSIP tables are divided into a plurality of sections. For example, a VCT in the PSIP may be divided into 256 sections. At this time, one section can carry several pieces of virtual channel information, but information on one virtual channel is not divided into two or more sections. Hereinafter, the signaling information formed as a table is named program table information or program table.

Data broadcasting is sectioned by a digital storage media-command and control (DSM-CC) method, and a DSM-CC section is packetized to the MPEG-2 TS of the 188 byte-unit. An IP datagram for IP data multicast is encapsulated to a DSM-CC addressable section, and the encapsulated DSM-CC addressable section is packetized to the MPEG-2 TS of the 188 byte-unit. The TS packetizing process is performed in a network layer.

TS packets of the PES type or TS packets of the section type are modulated by a predetermined transmission method, for example, the VSB transmission method, in a physical layer and are transmitted to a receiving system. That is, the physical layer is used to transmit a main service using the VSB transmission technology and corresponds to a first layer of an open systems interconnection (OSI) model.

Figure 74:
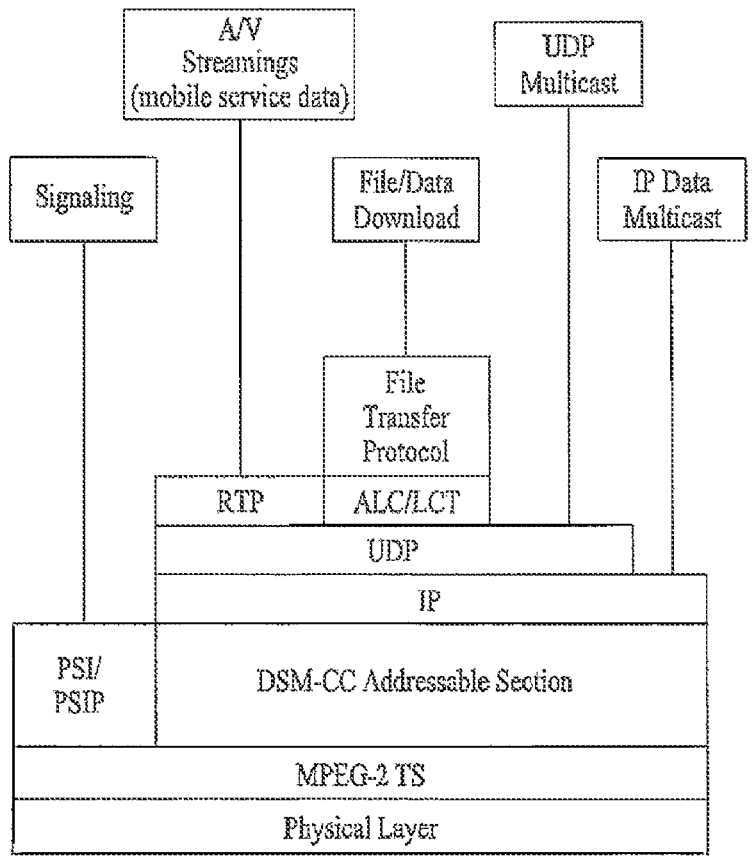
FIG. 74 shows an embodiment of the protocol stack for providing the mobile service on the basis of the IP.

FIG. 74 shows an embodiment of the protocol stack for providing the mobile service on the basis of the IP. FIG. 74 shows an example of the protocol stack for using the MPEG-2 TS as a bearer in a mobile physical layer and providing the mobile service by the encapsulated IP datagrams.

Figure 75:
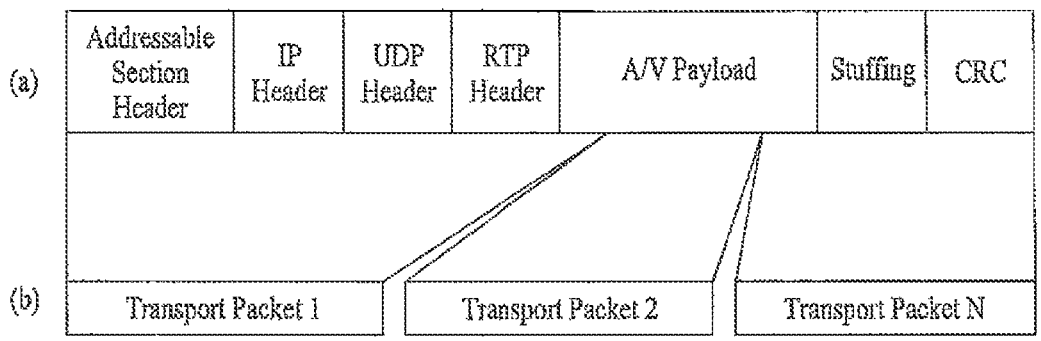
FIG. 75(a) and FIG. 75(b) show an example of mapping the IP datagram to the TS packet via the DSM-CC addressable section.

That is, in FIG. 74, the signaling information for the mobile service is encapsulated in a section structure such as PSI/PSIP. The A/V streaming for the mobile service is packetized in an IP layer according to a real time protocol (RTP) method as shown in FIG. 75 (a), a RTP packet is packetized according to a user datagram protocol (UDP) method again, and a RTP/UDP packet is packetized according to the IP method, thereby becoming RTP/UDP/IP packet data. In the present invention, the packetized RTP/UDP/IP packet data is referred to as an IP datagram, for convenience of description.

The IP datagram is encapsulated to a DSM-CC addressable section structure and the encapsulated DSM-CC addressable section is packetized to the MPEG-2 TS of the 188-byte unit again as shown in FIG. 75 (b).

FIG. 75 shows an example of mapping the IP datagram to the TS packet via the DSM-CC addressable section.

That is, one addressable section has a structure in which an RTP header, a UDP header, an IP header, and an addressable section header are added in front of an A/V payload and stuffing data (optional) and a CRC are added next to the A/V payload, as shown in FIG. 75 (a). The addressable section is divided by a fixed length, that is, in 184-byte units, as shown in FIG. 75 (b), and a 4-byte TS packet header is added to 184 bytes so as to configure the TS packet of the 188-byte unit.

In FIG. 74, a file/data download is packetized according to a file transfer protocol method and is packetized according to an asynchronous layered coding/layered coding transport (ALC/LCT) method again. The ALC/LCT packet is packetized according to the UDP method again and the ALC/LCT/UPD packet is packetized according to the IP method again, thereby becoming ALC/LCT/UDP/IP packet data. In the present invention, for convenience of description, the packetized ALC/LCT/UDP/IP packet data is referred to as an IP datagram. The IP datagram is encapsulated to the DSM-CC addressable section structure and the encapsulated DSM-CC addressable section is packetized to the MPEG-2 TS of the 188-byte unit.

A UDP multicast is packetized according to the UDP method and the UDP packet is packetized according to the IP method again. The IP multicast is packetized according to the IP method. The IP datagram packetized according to the IP method is encapsulated to a DSM-CC addressable section structure and the encapsulated DSM-CC addressable section is packetized to the MPEG-2 TS of the 188-byte unit again.

The MPEG-2 TS packet is modulated by a predetermined transmission method, for example, a VSB transmission method in a mobile physical layer and is transmitted to a receiving system.

In the case where the IP-based mobile service is provided as shown in FIG. 74, all data may be divided into the IP datagram and program table information such as the PSI/PSIP data of the section type.

Since the IP datagram and the PSI/PSIP data are transmitted in the MPEG-2 TS format, overhead may be included. That is, the information on the TS packet header included in each TS packet may act as the overhead.

Figure 76:
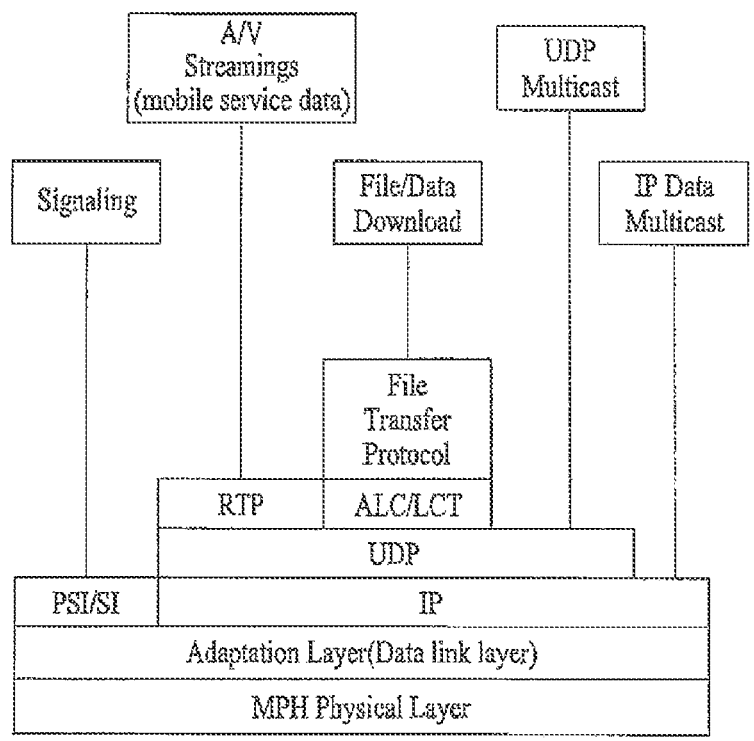
FIG. 76 shows another embodiment of a protocol stack for providing the IP-based mobile service in order to prevent the above-described problem.

FIG. 76 shows another embodiment of a protocol stack for providing the IP-based mobile service in order to prevent the above-described problem.

In FIG. 76, an adaptation layer is interposed between the IP layer and the physical layer such that the IP datagram and the program table information such as PSI/PSIP data are transmitted without using the MPEG-2 TS format. The upper layer including the IP layer of FIG. 76 has the same structure as FIG. 75 and thus the detailed description thereof will be omitted.

Figure 77:
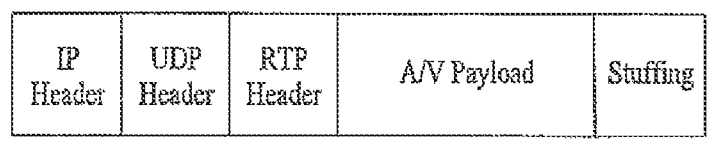
FIG. 77 shows an example of IP datagram.

Even in FIG. 76, the signaling for the mobile service is encapsulated to the program table information such as the PSI/PSIP section structure and is referred to as PSI/PSIP data or program table information, for convenience of description. A RTP header, a UDP header, and an IP header are sequentially added to the A/V streaming for the mobile service so as to configure the IP datagram as shown in FIG. 77.

The adaptation layer is a data link layer for dividing the IP datagram and the program table information of the section type and connecting the data such that the divided data can be processed in the upper layer.

That is, in the adaptation layer, a RS frame including the program table information such as the PSI/PSIP data, the IP datagram and an identifier for dividing the program table information and the IP datagram is generated.

Figures 78, 79:
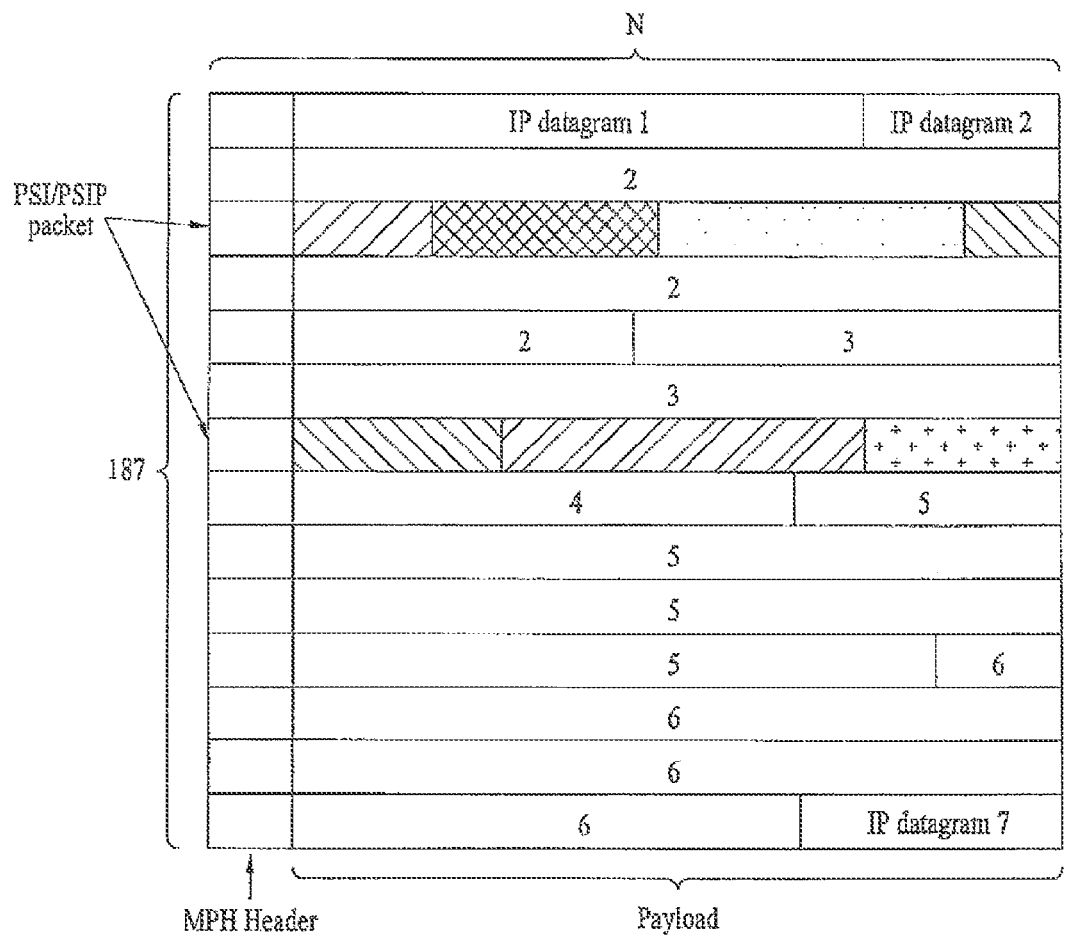
FIG. 78 shows an example of the RS frame generated in the adaptation layer of the present invention.
FIG. 79 shows an example of fields allocated to the header region in the MPH service data packet according to the present invention.

FIG. 78 shows an example of the RS frame generated in the adaptation layer of the present invention.

In one RS frame, a length of column (i.e., the number of rows) is 187 bytes, and a length of row (i.e., the number of columns) is N bytes, wherein the N may depend on signaling information such as a transmission parameter. The transmission parameter (or TPC information) can include sub-frame information, slot information, parade related information (for example, parade ID, parade repetition period, etc.), data group information with sub-frame, RS frame mode information, RS code mode information, SCCC block information, SCCC outer code mode information, FIC version information, etc.

In the present invention, N is equal to or greater than 187. That is, the RS frame of FIG. 78 has a size of N(row)*187 (column) bytes.

In the present invention, each row of N bytes is referred to as a MPH service data packet, for convenience of description. The MPH service data packet may be configured by a 2-byte MPH header and an N−2 byte payload. The allocation of 2 bytes to the MPH header region is only exemplary and is changed according to designers. Thus, the present invention is not limited to the above embodiment.

The RS frame is generated by collecting the program table information and/or the IP datagram having the size of N−2 (row)*187(column) bytes. One RS frame may include the program table information and the IP datagram corresponding to at least one mobile service. For example, the program table information such as the PSI/PSIP data and the IP datagram of two mobile services including news and stock may be included in one RS frame.

The program table information or the IP datagram is allocated to the payload in the MPH service data packet configuring the RS frame.

At this time, in the present embodiment, the program table information and the IP datagram are not allocated to one MPH service data packet together.

In FIG. 78, the program table information such as PSI/PSIP data is allocated to two MPH service data packets in one RS frame and the IP datagram is allocated to the remaining MPH service data packets.

In FIG. 78, the location of the MPH service data packet, to which the program table information such as PSI/PSIP data is allocated in one RS frame, and the number of MPH service data packets are only exemplary and may be changed according to designers. The present invention is not limited to the above embodiment.

At this time, when the program table information such as the PSI/PSIP data or the IP datagram is allocated to one MPH service data packet, if the length of the MPH service data packet including the MPH header is smaller than N bytes, stuffing bytes can be allocated to the remaining portion. For example, if the length of the MPH service data packet including the MPH header is N−20 bytes after the program table information is allocated to one MPH service data packet, stuffing bytes can be allocated to the remaining 20 bytes.

The program table information may include a plurality of tables such as PMT, PAT, VCT, MGT, RRT, ETT and EIT data. Plural pieces of table data in program table information may be sequentially allocated to one MPH service data packet or only data corresponding to one table may be allocated to one MPH service data packet.

FIG. 79 shows an example of fields allocated to the header region in the MPH service data packet according to the present invention, which may include a Type Indicator field, an Error indicator field, a Priority field (or stuff indicator field) and a Pointer field.

The Type Indicator field may have, for example, 4 3 bits and represents the type of the data allocated to the payload in the MPH service data packet. That is, the Type Indicator field indicates whether the data of the payload is the IP datagram or signaling information referred as program table information.

At this time, the data type configures one logical channel. In the logical channel for transmitting the IP datagram, several mobile services are multiplexed and transmitted and the mobile services are demultiplexed in the IP layer.

The Error Indicator field may have, for example, 1 bit and represents whether an error occurs in the MPH service data packet. For example, if the value of the Error Indicator field is 0, it is indicated that the error does not occur in the MPH service data field and, if the value of the Error Indicator field is 1, it is indicated that the error occurs in the MPH service data field.

The Priority field may have, for example, 1 bit and represent region information in a data group into which the data of the payload in the MPH service data packet will be inserted. For example, the data of the payload in the MPH service data packet is data which will be inserted into an A/B region (A/B region) in the data group if the value of the Priority field is 1, and is data which will be inserted into a C region if the value of the Priority field is 0.

If the stuff indicator field is in the MPH service data packet in substitute for the priority field, the stuff indicator field indicates whether the MPH service data packet includes any stuffing bytes in its payload.

The Pointer field may have, for example, 11 bits and represent location information in which new data (that is, a new signaling information or a new IP datagram) is started in the MPH service data packet.

For example, if the IP datagram 1 and the IP datagram 2 are allocated to a first MPH service data packet in the RS frame as shown in FIG. 78, the value of the Pointer field represents the start location of the IP datagram 2 in the MPH service data packet.

If new data is not present in the MPH service data packet, the value of the Pointer field has a maximum value. In the present invention, since 11 bits are allocated to the Pointer field, if the value of the pointer field is 2047, it is indicated that new data is not present in the packet.

The sequence, the location and the semantics of the fields allocated to the header in the MPH service data packet shown in FIG. 79 are only exemplary for facilitating the understanding of the present invention. The sequence, the location, and the semantics of the fields allocated to the header in the MPH service data packet and the number of fields allocated additionally can be easily changed by those skilled in the art and thus the present invention is not limited to the above embodiment.

Figure 80:
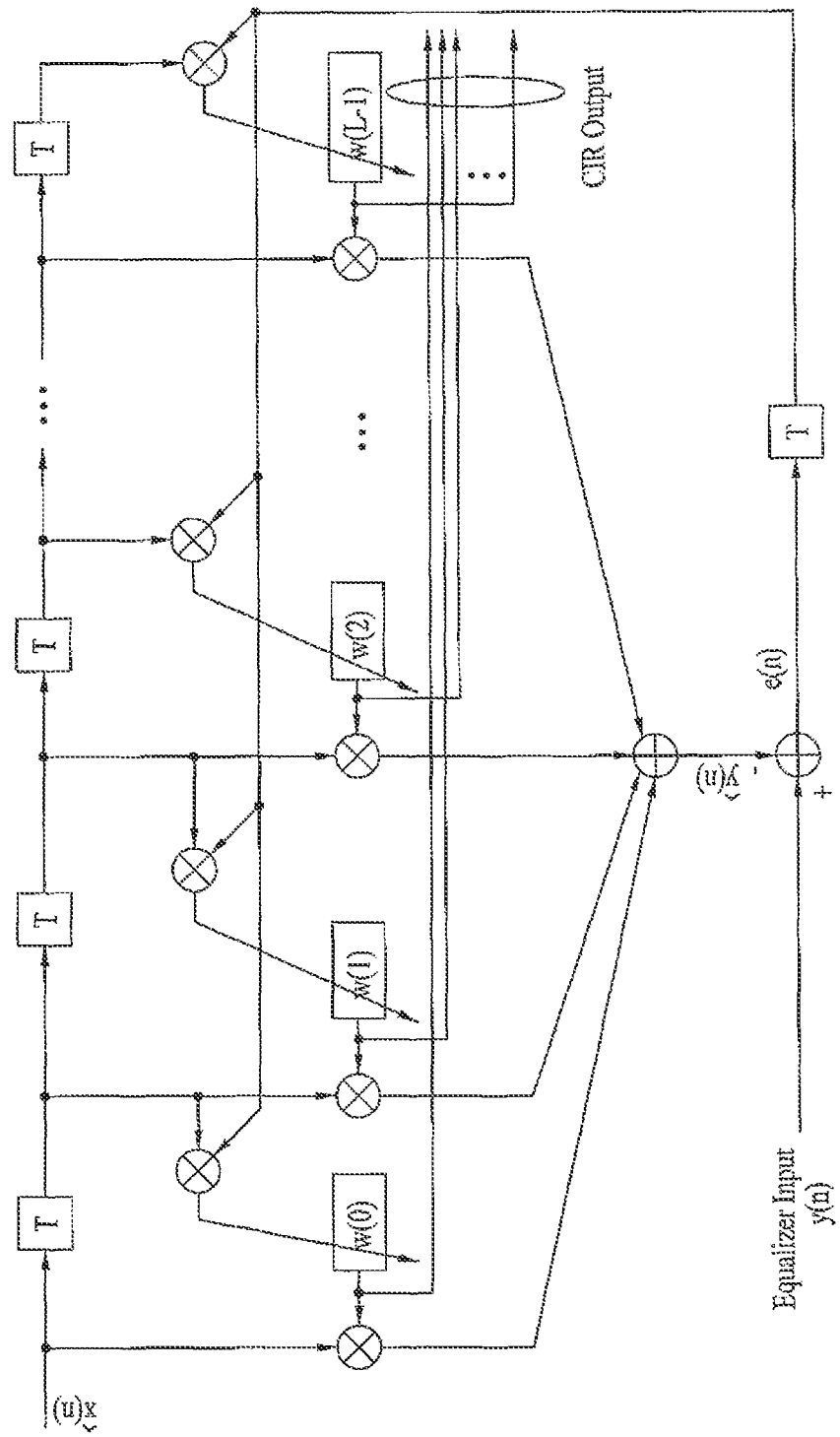
FIG. 80 show another embodiment of the RS frame of the present invention.

FIG. 80 show another embodiment of the RS frame of the present invention, wherein FIG. 80 (a) shows an example of the RS frame which will be allocated to the A/B region in the data group and FIG. 80 (b) shows a configuration example of the RS frame which will be allocated to the C/D region in the data group.

Even in FIGS. 80 (a) and (b), the length of the column (that is, the number of rows) of the RS frame which will be allocated to the A/B region and the length of the column (that is, the number of rows) of the RS frame which will be allocated to the C/D region are equal to 187 and the RS frame which will be allocated to the A/B region and the RS frame which will be allocated to the C/D region may be different from each other in the length of the rows (that is, the number of column). In the embodiment of the present invention, the data group is divided into the A, B, C, and D regions according to the interference of the main service data. The interference of the main service data is decreased in order of A>B>C>D regions. As the interference of the main service data is decreased, an error occurrence probability is decreased and thus the reception performance is excellent.

In the embodiment of the present invention, when the length of the row of the RS frame which will be allocated to the A/B region in the data group is N1 bytes and the length of the row of the RS frame which will be allocated to the C/D region is N2 bytes, a condition of N1>N2 is satisfied. N1 and N2 may vary according to the modulation mode or depending on to which region the RS frame is transmitted in the data group.

In the present invention, the row of N1 and N2 bytes is referred to as the MPH service data packet, for convenience of description. The MPH service data packet in the RS frame which will be allocated to the A/B region in the data group may be configured by a 2-byte MPH header and an N1-2-byte payload. The MPH service data packet in the RS frame which will be allocated to the C/D region in the data group may be configured by a 2-byte MPH header and an N2-2-byte payload.

The allocation of 2 bytes to the MPH header region is only exemplary and may be changed according to designers. The present invention is not limited to the above embodiment. The sequence, the location and the semantics of the field allocated to the MPH header of the MPH service data packet of FIGS. 80 (*a*) and (*b*) are applicable to FIG. 79 without alteration.

In the embodiment of the present invention, the RS frame for the A/B region and the RS frame for the C/D region in the date group may includes both the program table information like the PSI/PSIP data and the IP datagram. Also, one RS frame may include the IP datagram corresponding to at least one mobile service.

The RS frame of FIG. 80 (*a*) includes the program table information and the IP datagram for two types of mobile services. And, the RS frame of FIG. 80 (*b*) includes the IP datagram for two types of mobile services.

In FIG. 80 (*a*), the program table information for the two types of mobile services is allocated to two MPH service data packet in one RS frame and the IP datagram for the two types of mobile services is allocated to the remaining MPH service data packets.

Even in FIG. 80 (*a*), the locations of the MPH service data packets to which the program table information in the RS frame is allocated and the number of MPH service data packets are only exemplary and may be changed according to the designers. The present invention is not limited to the above embodiment.

The portion which is not described in FIGS. 80A and 80B is applicable to FIG. 78 without alteration.

The MPH service data packet in the RS frame generated as shown in FIG. 78 or FIGS. 80A and 80B extends to a plurality of MPH service data packets.

Figure 81:
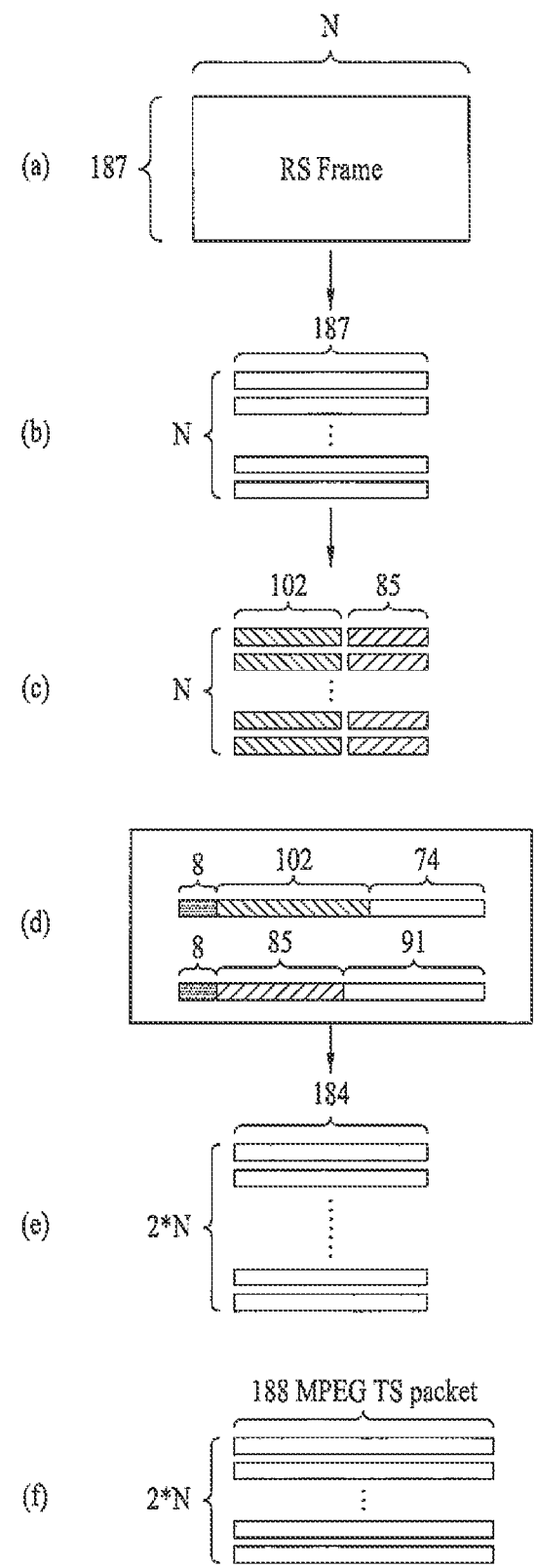
FIG. 81(a) to FIG. 81(f) show an embodiment of a process of extending the MPH service data packet into a plurality of MPH service data packets.

FIG. 81 is a view showing an embodiment of a process of extending the MPH service data packet into a plurality of MPH service data packets.

In FIG. 81, (a) to (f) show an example of extending a RS frame having a size of N(row)*187(column) bytes to a RS frame having a size of 188(row)*2N(column) bytes as shown in FIG. 78.

First, as shown in (a) of FIG. 81, when the RS frame having the size of N(row)*187(column) bytes is divided into 187-byte units in the row direction, one RS frame is divided into N temporary packets of 187 bytes as shown in (b) of FIG. 81. That is, when the temporary packets of 187 bytes shown in (b) of FIG. 81 are sequentially collected, the RS frame shown in (a) of FIG. 81 is obtained.

Each of the temporary packets of 187 bytes shown in (b) of FIG. 81 is divided into a plurality of temporary packets again. At this time, when each of the temporary packets of 187 bytes is divided into the plurality of temporary packets, the sizes of the plurality of divided packets may be equal to or different from one another.

In FIG. 81, (c) shows an example of dividing each of the temporary packets of 187 bytes into temporary packets of 102 bytes and temporary packets of 85 bytes.

The division of each of the temporary packets of 187 bytes into the temporary packets of 102 bytes and the temporary packets of 85 bytes is only exemplary and the scope of the present invention is not limited to the above-described numerals.

In the present invention, for convenience of description, each temporary packet of 102 bytes is a first temporary packet and each temporary packet of 85 bytes is a second temporary packet.

In the present invention, as shown in (d) of FIG. 81, a temporary header mph_stl_header of 8 bytes is added in front of the first temporary packet and dummy bytes of 74 bytes are added next to the first temporary packet, thereby configuring the first temporary packet of 184 bytes. A temporary header mph_stl_header of 8 bytes is added in front of the second temporary packet and dummy bytes of 91 bytes are added next to the second temporary packet, thereby configuring the second temporary packet of 184 bytes.

That is, one temporary packet of 187 bytes extends to two temporary packets of 184 bytes.

FIG. 82 is a view showing fields allocated to the header regions (mph_stl_header) of the first and second temporary packets of the present invention, which may include a parade_id field, a region_id field, a pkt_number field, a max_pkt-number field, a parade_size field, a sccc-mode field, and an rs_mode field.

The parade_id field may have, for example, 8 bits and indicates the id of the parade via which the RS frame will be transmitted.

The region_id field may have, for example, 1 bit and indicates information on the region to which the RS frame will be transmitted. For example, the RS frame is allocated to the A/B region if the value of the region_id field is "1" and is allocated to the C region if the value of the region_id field is "0".

A 7-bit reserved field for future use may be allocated next to the region_id field.

The pkt_number field may have, for example, 16 bits and indicates the sequence of the 184-byte packet doubled as shown in FIG. 81D. The value of the pkt_number field has, for example, 0 to max_packet_number (e.g., 2N−1). At this time, the even-numbered pkt_number field value including 0 is represented in the packet extended from 102 bytes and the odd-numbered pkt_number field value is represented in the packet extended from 85 bytes.

The max_packet_number field may have, for example, 16 bits and indicates a maximum value which the pkt_number field value reaches in the RS frame. For example, the max_packet_number field value may be represented by 2N−1.

The parade_size field may have, for example, 5 bits and indicates the size of one parade.

The sccc_mode field may have, for example, 3 bits and indicates a coding rate of each region in the data group. Table 1 shows an example of the SCCC mode according to the sccc_mode field value.

The rs_mode field may have, for example, 4 bits and indicates the RS mode of each region in the data group.

A 6-bit reserved field for future use may be allocated next to the rs_mode field.

The sequence, the location and the semantics of the fields allocated to the temporary header in the extended temporary packet shown in FIG. 82 are only exemplary for facilitating the understanding of the present invention and the sequence, the location and the semantics of the fields allocated to the temporary header and the number of fields allocated additionally may be easily modified by those skilled in the art. Thus, the present invention is not limited to the above embodiment.

When the 8-byte temporary header and the 74-byte or 91-byte dummy bytes are added to the first and second temporary packets, the RS frame of N(row)*187(column) bytes can extend to 2N packets having 184 bytes as shown in FIG. 81E. That is, the RS frame of N(row)*187(column) bytes extends to the RS frame of 184(row)*2N(column) bytes.

Subsequently, as shown in (f) of FIG. 81, a 4-byte MPEG header is added to each 184-byte packet in the RS frame extended as shown in (e) of FIG. 81 so as to configure a TS packet of 188 bytes. That is, the RS frame of 184(row)*2N (column) bytes extends to the RS frame of 188(row)*2N (column) bytes again.

In the embodiment of the present invention, the generation of the RS frame described with reference to FIGS. 78 to 82 and the extension of the packets in the RS frame are performed by a service multiplexer.

Figure 83:
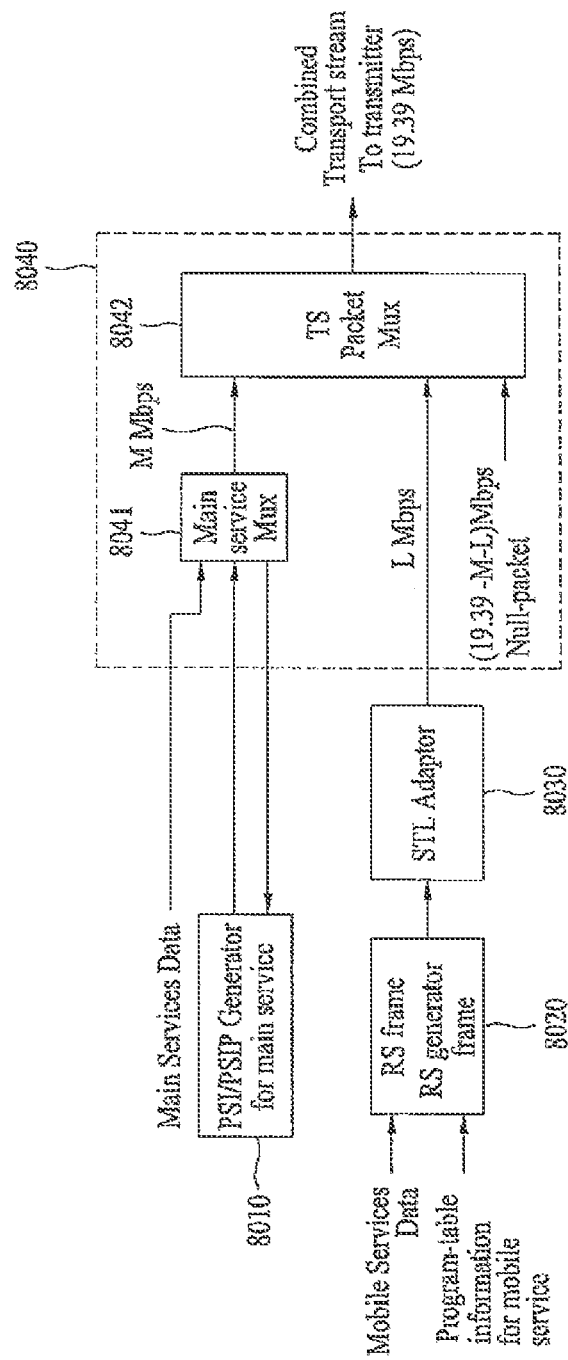
FIG. 83 shows another embodiment of the service multiplexer according to the present invention.

FIG. 83 shows another embodiment of the service multiplexer according to the present invention.

The service multiplexer of FIG. 83 is positioned in a studio of each broadcasting station and may include a PSI/PSIP generator 8010 for a main service, a RS frame generator 8020, a studio-to-transmitter link (STL) adaptor 8030 and a transport multiplexer 8040.

The transport multiplexer 8040 may include a main service multiplexer 8041 and a transport stream (TS) multiplexer 8042.

The RS frame generator 8020 corresponds to the adaptation layer of FIG. 76, receives the IP datagram and the program table information for at least one type of mobile service, and configures the RS frame as shown in FIG. 78 or (a) and (b) of FIG. 80.

For example, as shown in FIG. 78, the RS frame includes 187 MPH service data packets including the 2-byte MPH header and the N−2-byte payload.

The RS frame generated by the RS frame generator 8020 is input to the STL adaptor 8030.

The STL adaptor 8030 performs the processes shown (a) to (f) in FIG. 81 with respect to the RS frame output from the RS frame generator 8020 and extends the 187 packets of N bytes to 2N TS packets of 188 bytes.

In the present invention, each of the TS packets of 188 bytes extended by the STL adaptor 8030 is referred to as a mobile service data packet, for convenience of description.

At least one type of main service data and the PSI/PSIP data generated by the PSI/PSIP generator 8010 for the main service are input to the main service multiplexer 8041 of the transport multiplexer 8040. The main service multiplexer 8041 encapsulates the received main service data and PSI/PSIP data to MPEG-2 TS packets, multiplexes the TS packets, and outputs the multiplexed TS packets to the TS packet multiplexer 8042. Each of the data packets output from the main service multiplexer 8041 is referred to as a main service data packet, for convenience of description.

At this time, an identifier is required for distinguishing between the main service data packet and the mobile service data packet by a transmitter. The identifier may use a predetermined value by the agreement between the transmitter and the receiver, separate data or data obtained by changing the predetermined location value in the data packet.

In the embodiment of the present invention, different packet identifiers are allocated to the main service data packet and the mobile service data packet.

When the MPEG header is added to each packet of 184 bytes by the STL adaptor 8030, the PID of the agreement with the transmitter or the exciter may be set in the MPEG header.

As another embodiment, the synchronization byte in the MPEG header of the mobile service data packet is changed such that the data packets are distinguished using the synchronization byte values of the service data packets.

The identifiers for distinguishing between the main service data packet and the mobile service data packet are not specially restricted and thus the present invention is not limited to the above embodiments.

Meanwhile, the transport multiplexer 8040 may use the transport multiplexer used in the existing digital broadcasting system without alteration. In order to multiplex the mobile service data with the main service data and transmit the multiplexed data, the data rate of the main service is restricted to the data rate of M Mbps, and L Mbps corresponding to the remaining data rate are allocated to the mobile service output from the STL adaptor 8030. Accordingly, the transport multiplexer which has been already used can be used without alteration. Then, the TS packet multiplexer 8042 multiplexes the main service data packet output from the main service multiplexer 8041 at the data rate of M Mbps and the mobile service data packet output from the STL adaptor 8030 at the data rate of L Mbps and transmits the multiplexed packet to the transmitter.

Although the output data rate of L Mbps of the STL adaptor 8030 and the output data rate of M Mbps of the main service multiplexer 8041 are added, the output data rate of the TS packet multiplexer 8042 may not become 19.39 Mbps.

In this case, the TS packet multiplexer 8042 receives a null data packet having a data rate of (19.39-M-L) Mbps, multiplexes the main service data packet and the mobile service data packet, and outputs the multiplexed packet. At this time, the identifier is included in the null data packet such that the transmitter distinguishes the null data packet.

Accordingly, the output data rate of the TS packet multiplexer 8042 may be adjusted to 19.39 Mbps.

That is, since the mobile service data extends by an additional coding process of the transmitter, even when 187 bytes are allocated to two TS packets by the STL adaptor 8030 so as to configure the data of L Mbps and the output data rate of the STL adaptor 8030 and the output data rate of the main service multiplexer 8041 are added, the output data rate of the TS packet multiplexer 8042 may be smaller than 19.39 Mbps. At this time, the null data packets are filled by a difference such that the output data rate of the TS packet multiplexer 8042 becomes 19.39 Mbps.

In order to allow the transmitter to distinguish among the main service data, the mobile service data and the null data, the service multiplexer may insert an identifier. The method of inserting the identifier refers to the service multiplexer of FIG. 2 and thus the detailed description thereof will be omitted.

As the transmitter, for example, the transmitter of FIG. 3 may be used. In this case, when the data packet is received from the service multiplexer, the demultiplexer 210 determines whether the received data packet is the main service data packet, the mobile service data packet or the null data packet using the identifier (e.g., the PID in the MPEG header) included in the data packet.

The null data packet determined by the demultiplexer 210 is not processed and is discarded and the main service data packet is output to the packet jitter mitigater 220. The operation after processing the main service data packet refers to the transmitter of FIG. 3 and thus the detailed description thereof will be omitted herein.

The mobile service data packet determined by the demultiplexer 210 is input to the pre-processor 230.

The pre-processor 230 performs the inverse processes (a) to (f) of FIG. 81 and configures the RS frame shown in FIG. 78 or the RS frame shown in (a) and (b) of FIG. 80.

For example, when the pre-processor 230 removes the 4-byte MPEG header added to the mobile service data packet and collects and configures all data having the pkt_number field value of 0 to max_pkt_number in the data in which the parade_id field value and the region_id field value of the mph_stl_header added to the first and second temporary packets of 184-byte units are identical, one RS frame having a size of N*187 bytes can be configured as shown in (a) of FIG. 81. The mph_stl_header and the dummy byte are not included in the RS frame. At this time, the transmission parameters necessary for the pre-processing/post-processing of the RS frame may be decided by the information associated with the parade of the mph_stl_header.

The process of configuring the RS frame from the mobile service data packet may be performed in the previous stage of the data randomizer 301 of the pre-processor 230 or by the RS frame encoder 302.

If the process of configuring the RS frame is performed by the data randomizer 301, the data randomizer 301 performs the randomizing process in the units of the MPH service data packet of N bytes. If the process of configuring the RS frame is performed by the RS frame encoder 302, the data randomizer 301 may perform the randomizing process in the units of the mobile service data packet of 187 bytes.

In the present invention, the RS frame encoder 302 performs the inverse processes of the processes (a) to (f) of FIG. 81 and configures the RS frame shown in FIG. 78 or the RS frames shown in (a) and (b) of FIG. 80.

When the RS frame shown in FIG. 78 or (a) and (b) of FIG. 80 is configured, the RS frame encoder 302 performs at least one of an error correction encoding process and an error detection encoding process in RS frame units. Accordingly, it is possible to cope with a propagation environment which is rapidly changed and deteriorated by scattering burst errors which may be generated by a variation in propagation environment while applying robustness to the mobile service data.

The RS frame encoder 302 collects a plurality of RS frames so as to configure a super frame and may perform row permutation in super frame units.

The detailed description of the error correction encoding process, the error detection encoding and the row permutation performed by the RS frame encoder 302 cites the above-described contents and will be omitted herein.

The detailed description of the blocks in the pre-processor after the RS frame encoder 302 cites the above-described contents and will be omitted herein.

The packet multiplexer 240 located at the output sides of the packet jitter mitigater 220 and the pre-processor 230 multiplexes the mobile service data packet output from the pre-processor 230 and the main service data packet output from the packet jitter mitigater 220 by a predetermined multiplexing method and outputs the multiplexed data to the data randomizer 251 of the post-processor 250.

Figure 84:
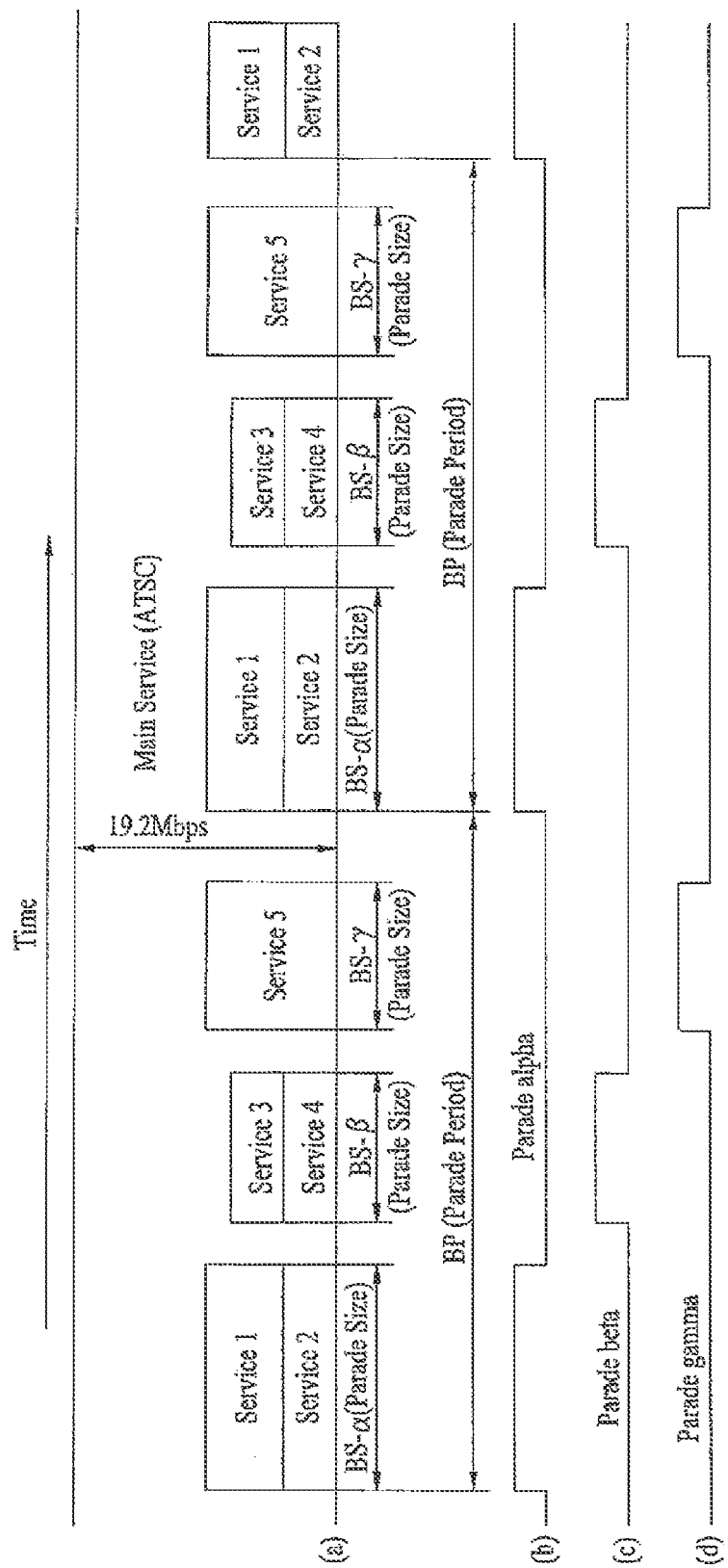
FIG. 84(a) to FIG. 84(d) show an embodiment of the multiplexing method of the packet multiplexer.

FIG. 84 shows an embodiment of the multiplexing method of the packet multiplexer 240. That is, three parades exist in one parade period, and the main service data and the mobile service data are multiplexed such that at least one mobile service is transmitted via each parade.

That is, each parade is repeated for each parade id such that the same mobile service is transmitted. In the present invention, the transmission path is called a parade. In other words, the parades are temporally multiplexed in one physical channel.

For example, a mobile service 1 and a mobile service 2 are transmitted via a parade alpha, a mobile service 3 and a mobile service 4 are transmitted via a parade beta, and a mobile service 5 is transmitted via a parade gamma.

At this time, each parade has information of unique ID (parade_id), parade repetition cycle, parade size (NoG), etc. This information can be transmitted to the receiving system by being included in a specific region of the RS frame as the transmission parameter (or TPC information).

At this time, one parade may transmit either one RS frame as shown in FIG. 78 or two RS frames, i.e., a primary RS frame and a secondary RS frame as shown in (a) and (b) of FIG. 80. If one parade transmits both the primary RS frame and the secondary RS frame as shown in (a) and (b) of FIG. 80, the information that can identify the two RS frames can be transmitted to the receiving system by being included in the specific region of the RS frame as the transmission parameter (or TPC information).

The receiving system can control parade demultiplexing using this transmission parameter. In this case, region_id can be transmitted as information that can identify the primary RS frame from the secondary RS frame within one parade. The region_id represents information of a region within the data group to which data of the corresponding RS frame will be transmitted. For example, if the region_id has a value of 0, the data of the RS frame is allocated to the A/B region within the data group. If the region_id field has a value of 1, the RS frame is allocated to the C/D region.

In the present invention, the A/B region and the C/D region in the data group are allocated to one parade.

The data of the RS frame delivered via one parade configures two logical channels via the MPH service data packet. One of the two logical channels is a channel for the program table information and the other thereof is a channel for the IP datagram. Only the IP datagram is transmitted via the channel for the IP datagram, and multiplexing of the components configuring the mobile service and multiplexing of mobile services included in one parade are performed in the IP layer.

The receiving system can identify each ensemble by combination of the parade_id and the region_id. The receiving system can also generate ensemble identifier (ensemble_id) by combination of the parade_id and the region_id.

In other words, one RS frame transmits one ensemble. The ensemble is a collection of services requiring the same quality of service (QoS) and encoded with the same FEC codes.

For example, if one parade is comprised of one RS frame, the ensemble, the RS frame, and the parade can be mapped at 1:1:1. For another example, if one parade is comprised of the primary RS frame and the secondary RS frame, the primary ensemble can be mapped with the primary RS frame and the secondary ensemble can be mapped with the secondary RS frame. In other words, the primary ensemble is transmitted through the primary RS frame of one parade, and the secondary ensemble is transmitted through the secondary RS frame of the parade.

Therefore, if the parade_id is combined with the region_id, the primary ensemble and the secondary ensemble can be identified from each other within one parade.

As another method of identifying the ensemble, at least one bit is added to the parade_id, for example, the left of the parade_id, so as to constitute ensemble_id, whereby each ensemble can be identified from another ensemble using the ensemble_id. In this case, the ensemble identifier (i.e., ensemble_id) includes parade identifier (i.e., parade_id).

For example, if the ensemble_id is for the primary Ensemble delivered through this Parade, the added MSB shall be '0'. Otherwise, if it is for the secondary Ensemble, the added MSB shall be '1'.

The receiving system can perform parade demultiplexing and power control using the parade_id. Also, the receiving system can perform demultiplexing of the ensemble by combining the parade_id with the region_id, or can perform demultiplexing of the ensemble using the ensemble_id obtained by adding one bit to the left of the parade_id.

Figure 85:
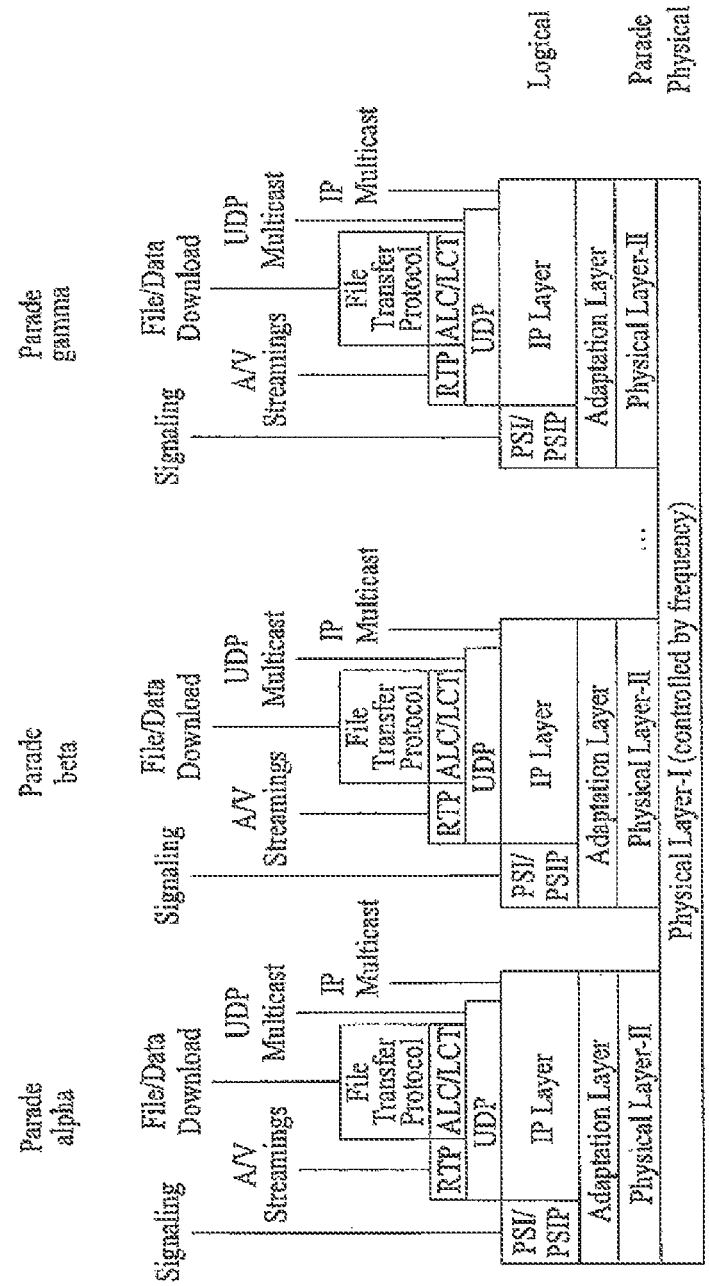
FIG. 85 shows an example of multiplexing three parades in the physical channel decided by one frequency and multiplexing parades into two logical channels.

FIG. 85 shows an example of multiplexing three parades (parade alpha, parade beta and parade gamma) in the physical channel decided by one frequency and multiplexing parades into two logical channels (signaling channel and IP datagram channel) using a protocol stack.

When the mobile service data is transmitted with the parade, in the receiving system which can receive the mobile service data, power is turned on only in the parade period of the mobile service so as to receive the data and is turned off in the remaining period such that the data of that period is not received. Thus, the power consumption of the receiving system can be reduced. This property is particularly advantageous in a mobile receiver which requires low power consumption.

For example, if the mobile service which is desired to be received exists in the parade alpha, the power is turned on only in the parade alpha period as shown in FIG. 84B.

The detailed description of the blocks in the transmitter after the packet multiplexer 240 cites the above-described contents and will be omitted herein.

Figure 86:
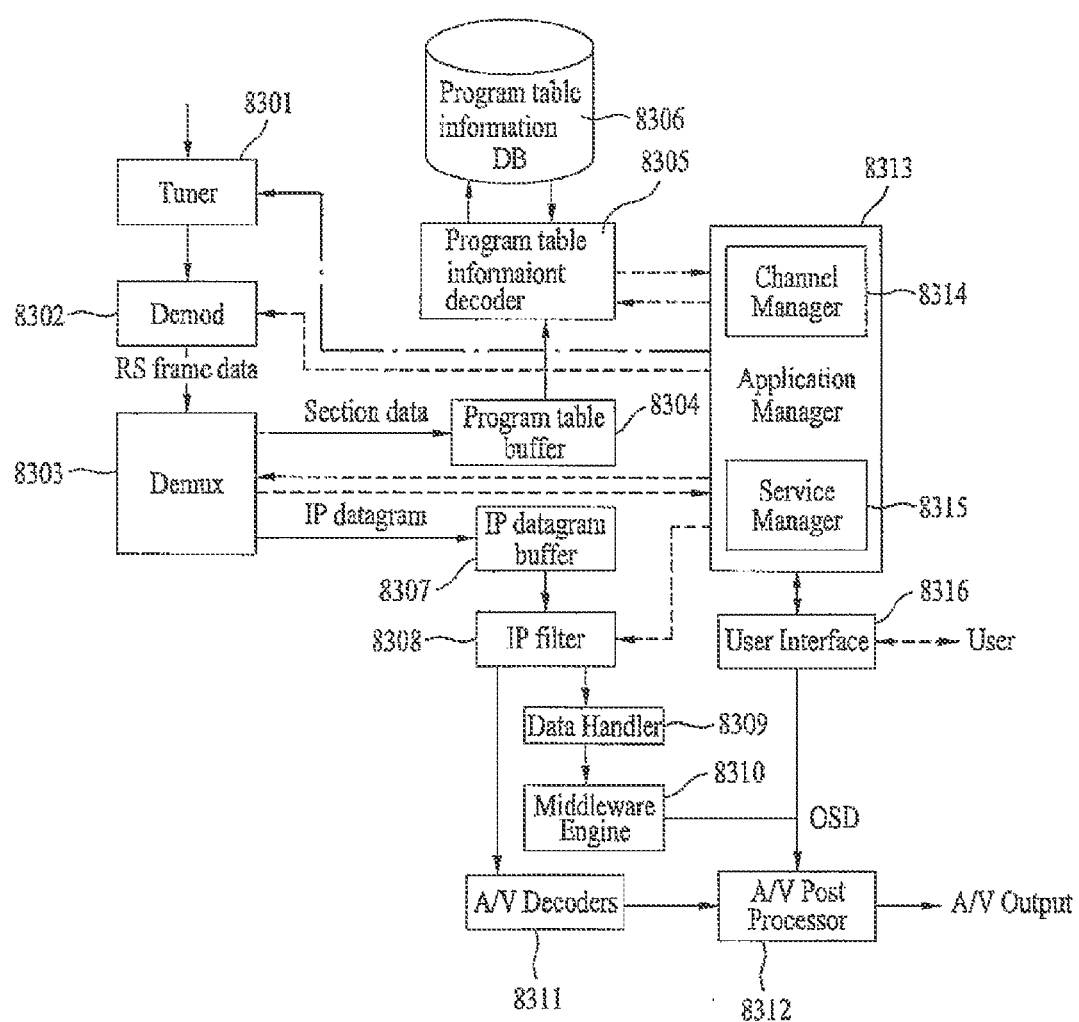
FIG. 86 is a block diagram showing the configuration of the receiving system according to another embodiment of the present invention.

FIG. 86 is a block diagram showing the configuration of the receiving system according to another embodiment of the present invention.

The receiving system of FIG. 86 includes a tuner 8301, a demodulator 8302, a demultiplexer 8303, a program table buffer 8304, a program table decoder 8305, a program table database 8306, an IP datagram buffer 8307, an IP filter 8308, a data handler 8309, a middleware engine 8310, an A/V decoder 8311, an A/V post-processor 8312, an application manager 8313, and a user interface 8316. The application manger 8313 may include a channel manager 8314 and a service manager 8315. Herein, the program table is signaling information like PSI/PSIP table.

In FIG. 86, the data flow is represented by a solid line and the control flow is represented by a dotted line.

The tuner 8301 tunes into the frequency of a specific channel via any one of an antenna, a cable and a satellite, down-converts a signal into an intermediate frequency (IF) signal, and outputs the IF signal to the demodulator 8302. At this time, the tuner 8301 is controlled by the channel manager 8314 of the application manager 8313 and reports the result and the strength of the broadcasting signal of the tuned channel to the channel manager 8314. The data received with the frequency of the specific channel may include main data, mobile service data and table data for decoding the main data and the mobile service data.

The demodulator 8302 performs VSB demodulation and channel equalization with respect to the signal output from the tuner 8301 and separately outputs the main data and the mobile service data. The demodulator 8302 is, for example, shown in FIG. 30. This is only exemplary and the scope of the present invention is not limited thereto.

Meanwhile, the transmitter can transmit signaling information (or TPC information) including the transmission parameter to at least one of the field synchronization region, the base data region, and the mobile service data region. Accordingly, the demodulating unit 8302 can extract the transmission parameter from the field synchronization region, the base data region, and the mobile service data region.

The transmission parameter can include sub-frame information, slot information, parade related information (for example, parade ID, parade repetition period, etc.), data group information with sub-frame, RS frame mode information, RS code mode information, SCCC block information, SCCC outer code mode information, FIC version information, etc.

The demodulating unit 8302 performs block decoding, RS frame decoding, etc. using the extracted transmission parameter. For example, the demodulating unit 8302 performs block decoding of each region within the data group with reference to SCCC related information (for example, SCCC block information and SCCC outer code mode) within the transmission parameter, and performs RS frame decoding of each region within the data group with reference to RS related information (for example, RS code mode).

In the embodiment of the present invention, only the mobile service data output from the demodulator 8302 is input to the demultiplexer 8303.

At this time, the mobile service data input to the demultiplexer 8303 is the RS frame data shown in FIG. 78 or FIGS. 80 (*a*) and (*b*).

That is, the RS frame decoder in the demodulator 8302 performs the inverse process of the RS frame encoder of the transmitting system, corrects errors in the RS frame, and outputs the error-corrected frame to the data derandomizer. When the data derandomizer derandomizes the error-corrected RS frame by the inverse process of the transmitting system, the RS frame shown in FIG. 78 or (a) and (b) FIG. 80 is obtained.

The demultiplexer 8303 determines whether the MPH service data packet is the program table data or the IP datagram by referring to the MPH header of the MPH service data packet in the received RS frame. The determined program table data is output to the program table buffer 8304 and the IP datagram is output to the IP datagram buffer 8307.

The demultiplexer 8303 may receive the RS frame of every parade, or may receive only the RS frame of the parade, which includes a desired mobile service, in accordance with the power control. For example, if the demultiplexer 8303 receives the RS frame of every parade, the demultiplexer 8303 can demultiplex the parade, which includes a desired mobile service, using the parade_id.

At this time, since one parade transmits one or two RS frames and one ensemble is mapped with one RS frame, if one parade transmits two RS frames, the demultiplexer 8303 needs to identify the RS frame, which transmits ensemble including mobile service data to be decoded, from the parade which includes a desired mobile service. That is, when the inputted one parade or the demultiplexed parade of a plurality of parades transmits both the primary ensemble and the secondary ensemble, the demultiplexer 8303 selects any one of the primary ensemble and the secondary ensemble.

For example, the demultiplexer 8303 can demultiplex the RS frame, which transmits ensemble including mobile service data to be decoded, by combining the parade_id with the region_id within the transmission parameter. For another example, the demultiplexer 8303 can demultiplex the RS frame, which transmits ensemble including mobile service data to be decoded, using the ensemble_id obtained by adding one bit to the left of the parade_id.

The program table buffer 8304 temporarily stores and outputs the program table data of the section type to the program table decoder 8305.

The program table decoder 8305 distinguishes between the tables using the table id and the section length in the program table data, and parses the sections of the distinguished tables, and stores the parsed result in the program table database 8306. For example, the program table decoder 8305 collects the sections having the same table id so as to configure the table, parses the table, and the stores the parsed result in the program table database 8306.

The IP datagram buffer 8307 temporarily stores and outputs the IP datagram to the IP filter 8308.

The IP filter 8308 filters only the IP datagram corresponding to a desired mobile service under the control of the service manager 8315 and outputs the filtered IP datagram to the A/V decoder 8311 and/or the data handler 8309.

The A/V decoder 8311 divides the IP datagram into an audio signal and a video signal, decodes the signals by a decoding algorithm, and outputs the decoded signals to the A/V post-processor 8312. For example, at least one of an AC-3 decoding algorithm, an MPEG-2 audio decoding algorithm, an MPEG-4 audio decoding algorithm, an AAC decoding algorithm, an AAC+ decoding algorithm, a HE AAC decoding algorithm, and an AAC SBR decoding algorithm, an MPEG surround decoding algorithm and a BSAC decoding algorithm may be used as the audio decoding algorithm, and at least one of an MPEG-2 video decoding algorithm, an MPEG-4 video decoding algorithm, an H.264 decoding algorithm, an SVC decoding algorithm and a VC-1 decoding algorithm may be used as the video decoding algorithm.

The data handler 8309 processes the datagram necessary for data broadcasting in the IP datagram and mixes the datagram with A/V data via the middleware engine 8310. The middleware engine 8310 is, for example, a Java middleware engine.

The application manager 8313 receives the key input of a TV viewer and responds to the requirement of the viewer via a graphic user interface (GUI) on a TV screen. The application manager 8313 stores and retrieves GUI control, the user requirement and the TV system state of the TV receiver in and from a memory (e.g., a NVRAM or a flash memory). Also, the application manager 8313 receives parade related information, for example, parade_id from the demodulating unit 8302 or the IP filter 8308 and controls the demultiplexer 8303 to select the RS frame of the parade channel where a desired mobile service exists. Also, the application manager 8313 receives parade_id and region_id or ensemble_id from the demodulating unit 8302 or the IP filter 8308 and controls the demultiplexer 8303 to select the RS frame of ensemble including mobile service data to be decoded from the parade. The application manager 8313 controls the channel manager 8314 to perform channel related operation (channel map management and operation of program table decoder).

The channel manager 8314 manages a physical channel and logical channel map and controls the tuner 8301 and the program table decoder 8305 so as to respond to the channel requirement of the viewer. The channel manager 8314 receives the parsing requirement and the parsed result of the table associated with the channel to be tuned. On the basis of the result, the channel map is updated and information on the desired mobile service is delivered to the service manager 8316 such that the service manager 8316 controls the IP filter 8308.

The service manager 8316 controls the IP filter 8308, retrieves only the IP datagram corresponding to the mobile service desired by the user from the IP datagram buffer 8307, and sends the IP datagram to the application layer. In this process, the components (e.g., audio and video streams) of the mobile service are separated from the IP datagram and are output to the A/V decoder 8311. That is, the audio and video streams in the IP datagram are demultiplexed in the IP layer.

Figure 87:
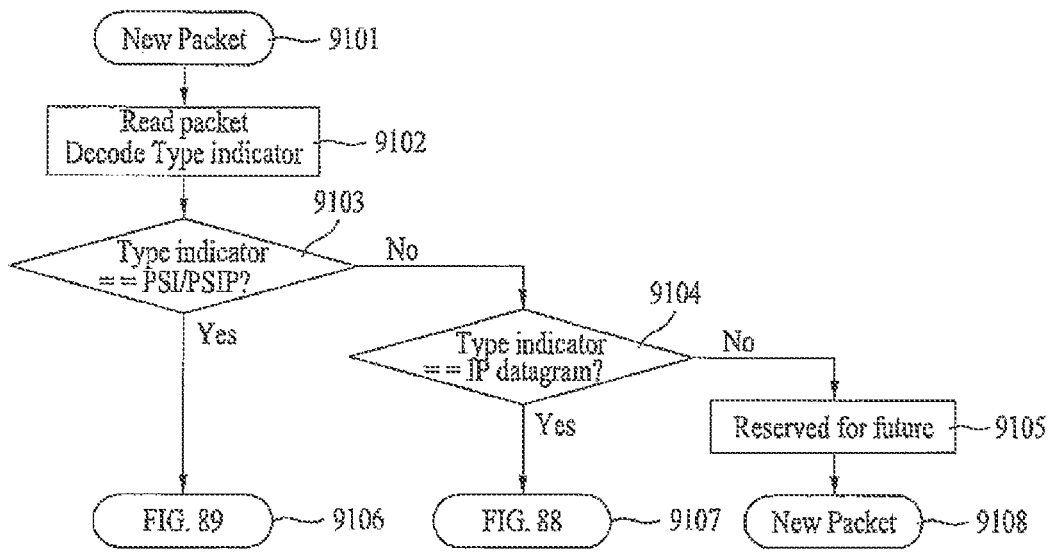
FIG. 87 shows an embodiment of a process of determining the MPH service data packet in the RS frame.

FIG. 87 shows an embodiment of a process of determining the MPH service data packet in the RS frame is the IP datagram or the program table data by the demultiplexer 8303.

That is, one MPH service data packet in the RS frame is received (step 9101) and the Type Indicator field of the MPH header in the MPH service data packet is parsed (step 9102). If the Type Indicator field value is parsed, it is determined whether the MPH service data packet is the data configuring the PSI/PSIP section or the IP datagram.

Figure 89:
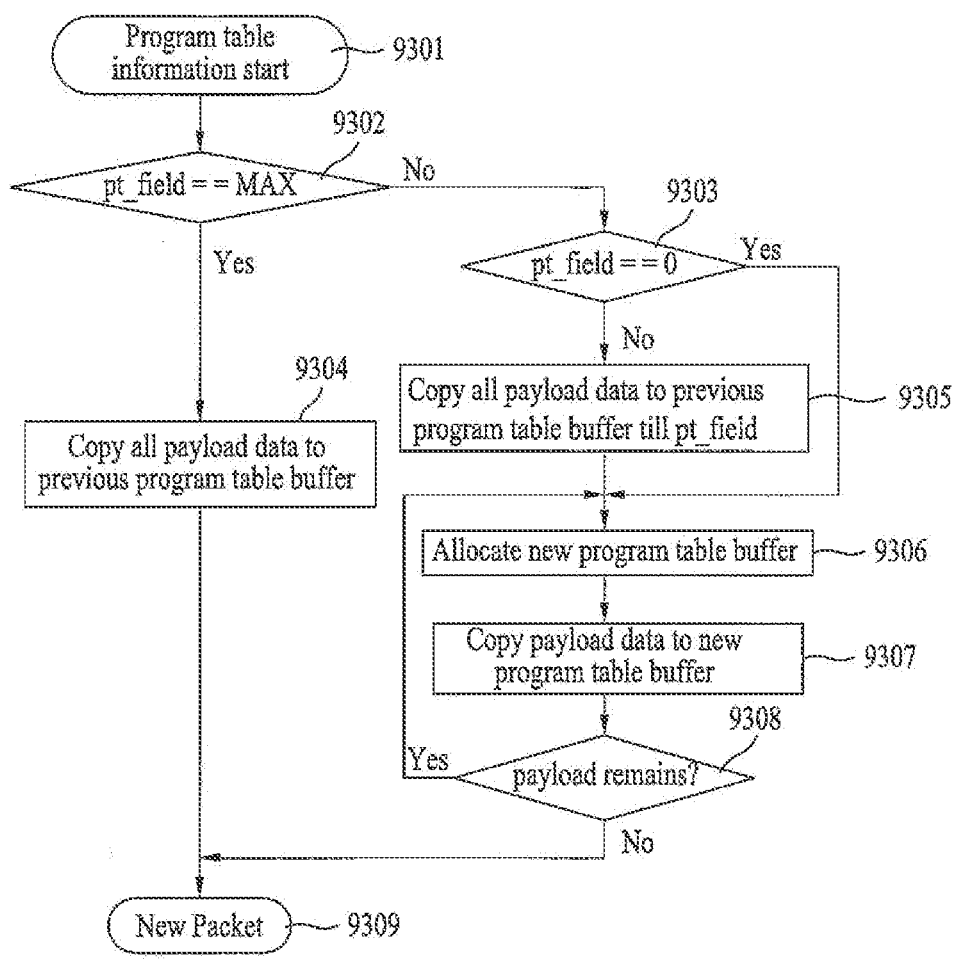
FIG. 89 shows an embodiment of the process performed when the Type Indicator field indicates that the MPH service data packet is the program table data.

If it is determined that the MPH service data packet is the data configuring the program table section in the step S9103, the process progresses to the process of FIG. 89 such that the data carried in the payload in the MPH service data packet is output to the program table buffer 8304 (step 9106).

Figure 88:
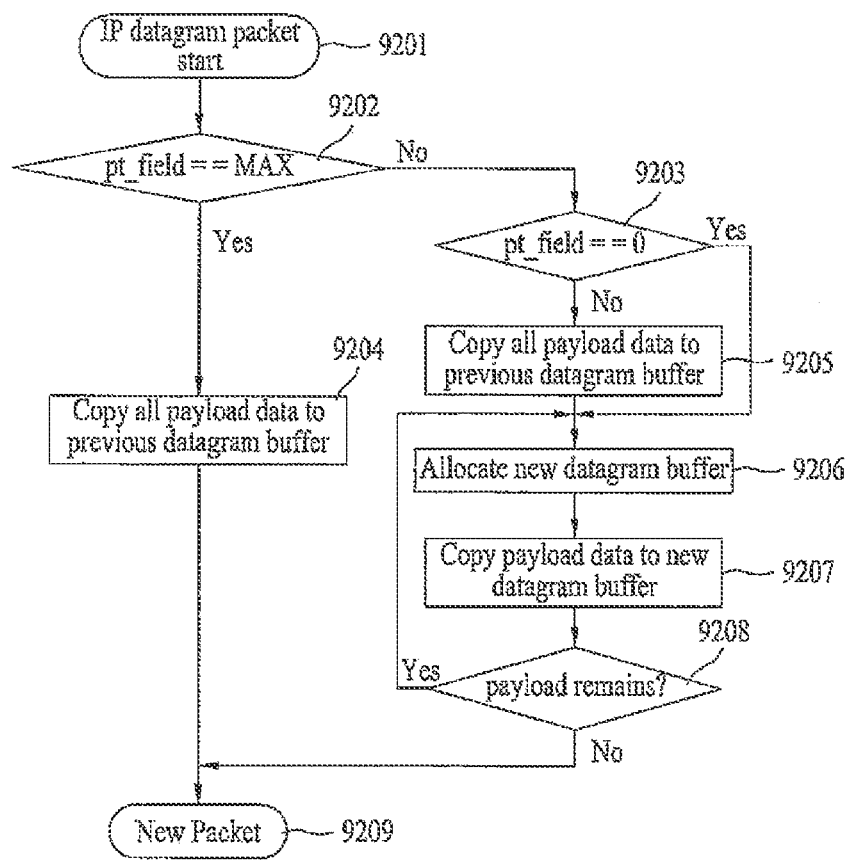
FIG. 88 shows an embodiment of a process performed when the Type Indicator field indicates that the MPH service data packet is the IP datagram.

If it is determined that the MPH service data packet is the IP datagram in the step S9104, the process progresses to the process of FIG. 88 (step 9107) such that the data carried in the payload in the MPH service data packet is output to the IP datagram buffer 8307. If it is determined that the MPH service data packet is neither the program table data nor the IP datagram in the step S9104, the data is the reserved data for extension of the system and thus is discarded and then a next packet is received (steps 9105 and 9108).

FIG. 88 shows an embodiment of a process performed when the Type Indicator field indicates that the MPH service data packet is the IP datagram.

That is, if the Type Indicator field of the MPH header in the MPH service data packet read from the RS frame indicates that the data carried in the payload in the MPH service data packet is the IP datagram (step 9201), then it is determined whether the pointer field (pt_field) value is a maximum value (step 9202).

If it is determined that the pointer field value is the maximum value in the step 9202, since all data of the payload in the MPH service data packet succeeds the IP datagram of the previous MPH service data packet, the data of the payload is copied to the previous datagram buffer (step 9204) and a next MPH service data packet is received (step 9209). If it is determined that the pointer field value is not maximum value in step 9202, it is determined whether or not the pointer field value is 0 (step 9203). If it is determined that the pointer field value is not 0, since the data before the data indicated by the pointer field corresponds to the IP datagram of the previous MPH service data packet, the data is copied to the previous IP datagram (step 9205). If it is determined that the pointer field value is 0 in step 9203, since a new IP datagram is started, a new IP datagram buffer is allocated (step 9206). Thereafter, the data of the payload is copied to the new IP datagram buffer (step 9207).

If one IP datagram is completed via the above-described process (step 9208), a process of receiving the new IP datagram is repeated and, otherwise, the process progresses to the step of receiving a next data packet because the data is received next to the next MPH service data packet.

Figure 90:
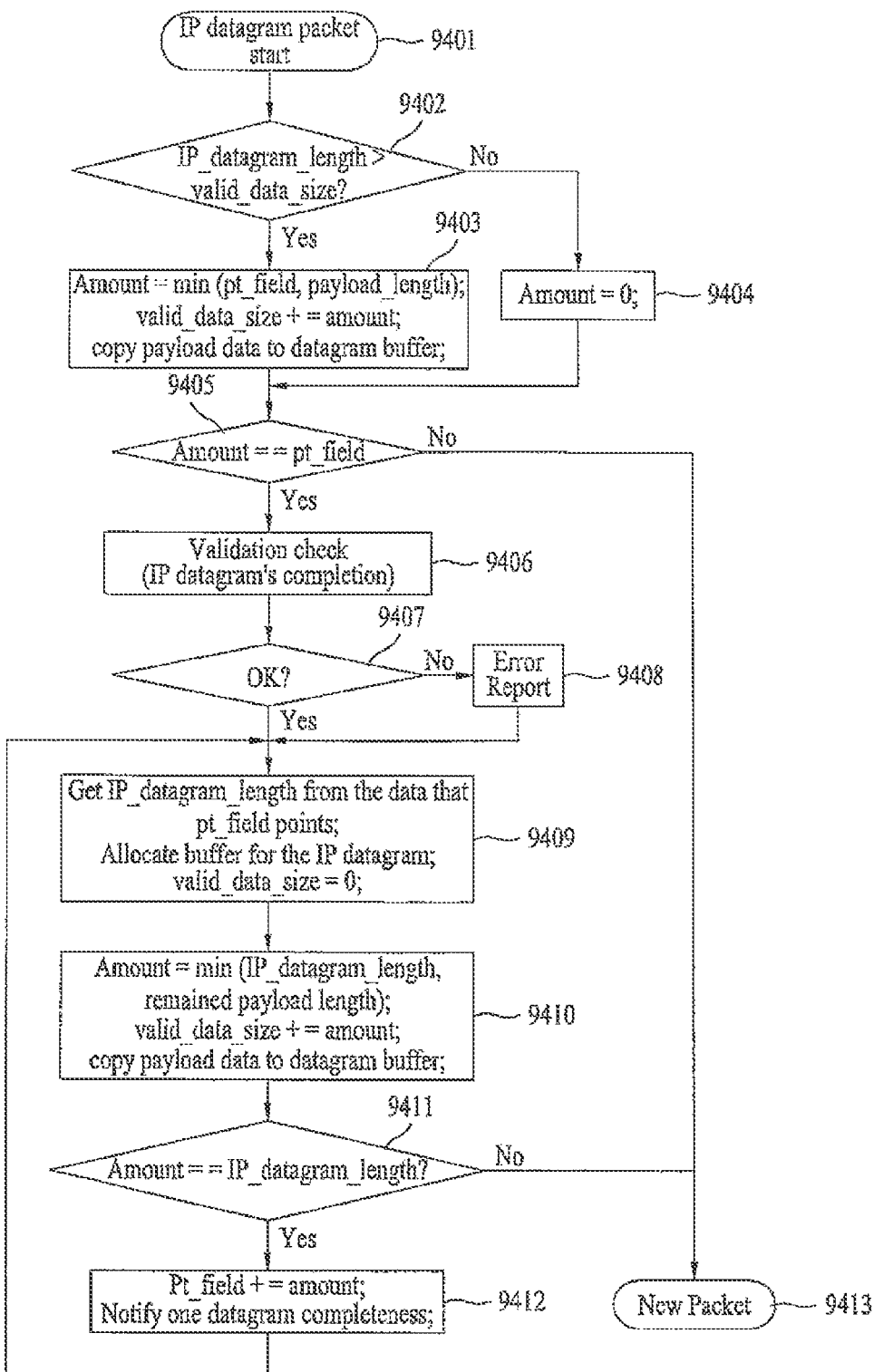
FIG. 90 is a flowchart showing an embodiment of a detailed process of FIG. 88.

FIG. 90 is a flowchart showing an embodiment of a detailed process of FIG. 88.

That is, if the MPH service data packet including the IP datagram is received (step 9401), the length of the IP datagram which is currently being received is compared with the size of the valid data stored in the IP datagram buffer 8307 in the step 9402 (IP_datagram_length>valid_data_size). At this time, if the length of the IP datagram is larger than the valid data size, since the data necessary for completing one IP datagram is present in the payload of the MPH service data packet, the process progresses to a step 9403. If so not, since new data should be received, the process progresses to a step 9404 of setting the amount of data to 0. In the step 9403, the predetermined amount of data included in the payload of the MPH service data packet is decided and the data is transmitted to the IP datagram buffer 8302 by the predetermined amount. Then, the process progresses to the step 9405 of comparing the amount of data with the pointer field value (amount>pt_field). If the amount of data and the pointer field value are equal, it is indicated that one IP datagram is completed. However, since an error may occur, the process progresses to a step 9406 of testing the integrity of the data. If the amount is different from the pt_field in the step 9405, since all the data of the payload of the packet belongs to the same IP datagram as specified by the step 9403, the process returns to the routine of processing the next MPH service data packet (step 9413).

In a step 9407, it is checked whether or not the integrity of the data is ensured. If the integrity of the data is not ensured, the process progresses to a step 9408 of reporting that the error occurs and progresses to a step 9409. In the step 9404, the data of the front portion is read from the portion indicating the pointer field pt_field and the length of the IP datagram is obtained from the data included in the IP datagram header. Then, the memory is allocated for the IP datagram and the valid_data_size is initialized to "0". Thereafter, similar to the step 9403, the data is copied to the IP datagram buffer 8307 and the valid_data_size is updated (step 9410). If the amount of data copied to the IP datagram buffer 8307 is equal to the amount of IP datagram (step 9411), since it is indicated that the transmission of one IP datagram is completed, the pointer field pt_field is copied and it is reported that the transmission is completed (step 9412). Thereafter, since there is data to be processed, the process progresses to the step 9409. If the amount of copied data is different from the amount of IP datagram in the step 9411, since it is indicated that the end of the payload of the MPH service data packet is reached, the process progresses to a step 9413 of processing a next packet.

FIG. 89 shows an embodiment of the process performed when the Type Indicator field indicates that the MPH service data packet is the program table data. The process of FIG. 89 is equal to the process of FIG. 88 except that the program table data carried in the payload of the MPH service data packet is transmitted to the program table buffer 8304. Therefore, a portion overlapping with FIG. 88 in the description of the portions configuring FIG. 89 cites the contents of FIG. 88 and the description thereof will be omitted.

Figure 91:
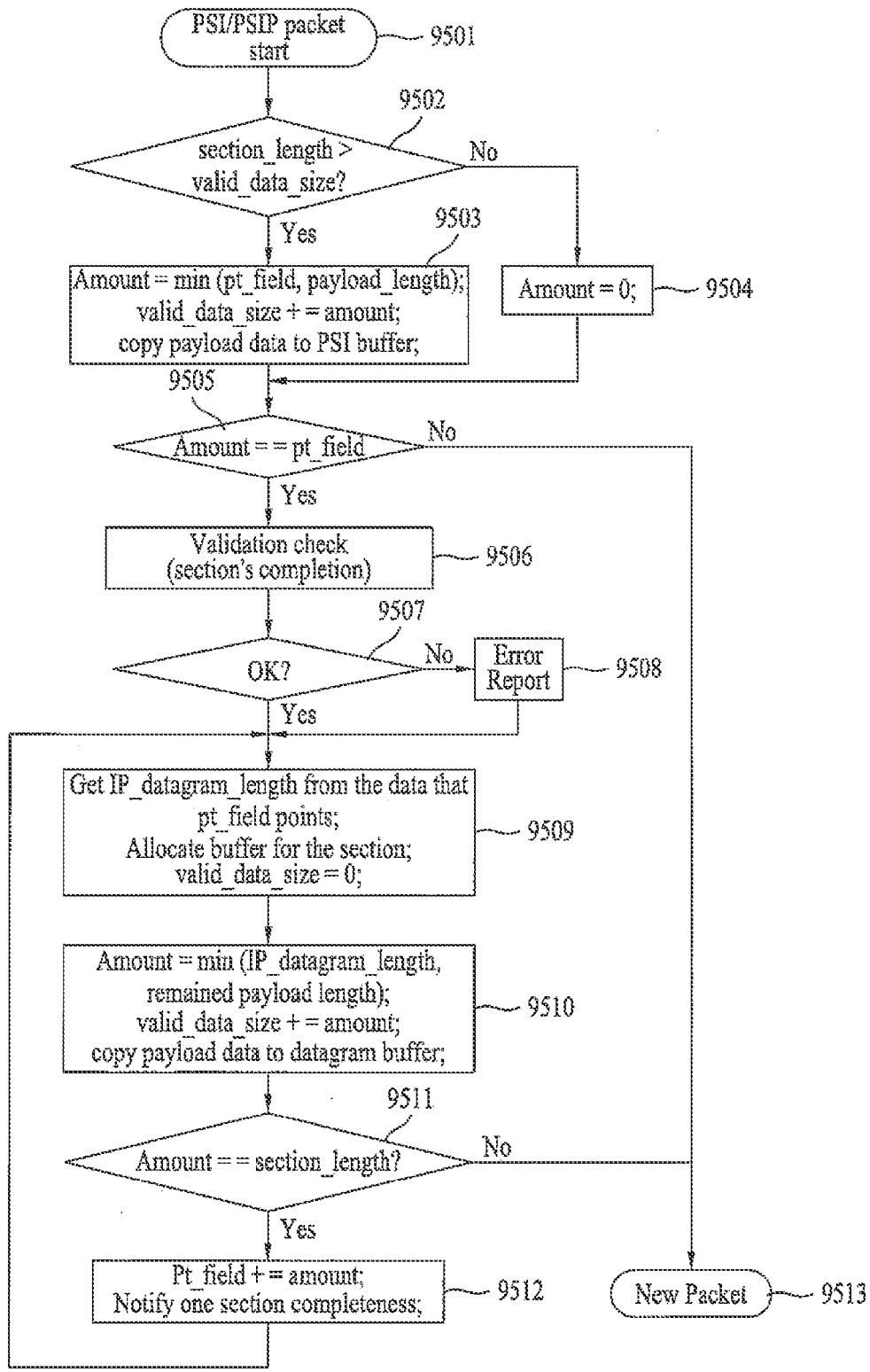
FIG. 91 shows an embodiment of a detailed process of processing the program table data of FIG. 89.

FIG. 91 shows an embodiment of a detailed process of processing the program table data of FIG. 89. The process of FIG. 91 is equal to the process of FIG. 90 except that the program table data is processed. Therefore, a portion overlapping with FIG. 90 in the description of the portions configuring FIG. 91 cites the contents of FIG. 88 and the description thereof will be omitted.

Hereinafter, a process of receiving and processing service guide information on the basis of the protocol and the broadcast transmitting/receiving system will be described.

The service guide information includes at least one of service schedule information for allowing the user to select a service and information for allowing the user to purchase, access and store items using a terminal. The user can receive the service guide information via the terminal and select or purchase a desired service. Here, an interactive channel indicates a bi-directional communication channel and a broadcast channel indicates a uni-directional communication channel which does not specify the user in multicasts.

The service guide information may be processed by the terminal by a first step (hereinafter, referred to as a bootstrap step) of whether the terminal can use the service guide information or how the service guide information is obtained, a second step (hereinafter, referred to as an acquisition step) of acquiring and processing the service guide information by the terminal, and a third step (hereinafter, referred to as a update step) of updating the service guide information acquired by the terminal.

The terminal can acquire the information for the first step from the received signal and acquire the service guide information using that information as trigger information. Hereinafter, the information acquired by the first step is called bootstrap information. The terminal can acquire the service guide information using the bootstrap information and acquire the service information from the service guide information or access the contents.

The service guide information may have a hierarchical structure and the sub-unit of the hierarchical structure is called a fragment. The fragment is encoded such that at least one fragment unit is encapsulated or a larger unit is built. The encapsulated unit is called a container.

The following reference numerals are only used in each drawing and are valid in the corresponding drawing although overlapping with those of the other drawings.

Figure 92:
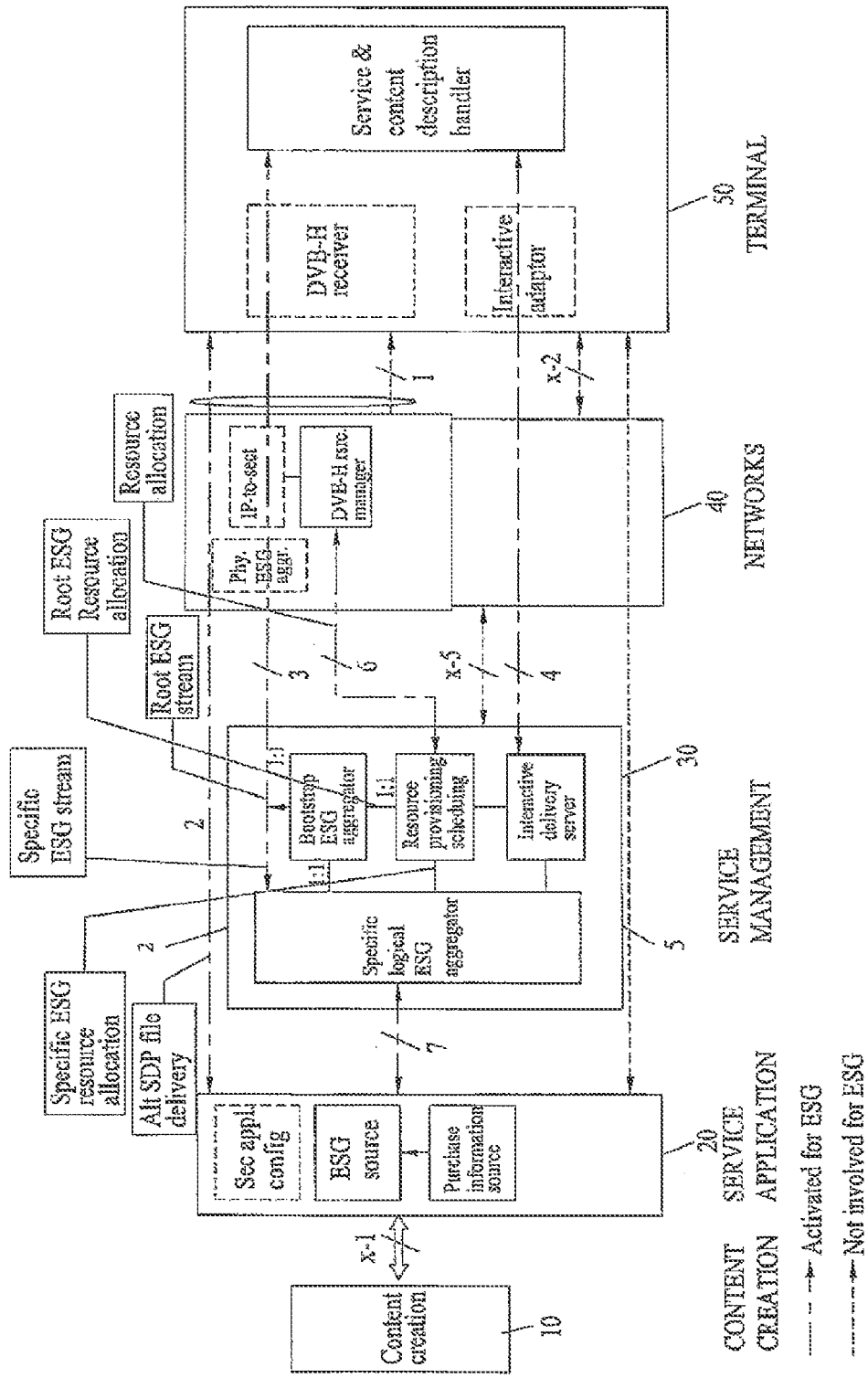
FIG. 92 shows the structure of a system for transmitting the service guide information.

FIG. 92 shows the structure of a system for transmitting the service guide information. The system of FIG. 92 includes a content creation device 10, a service application device 20, a service management device 30, a network 40 and a terminal 50.

The left side of the network is a side for providing the service guide information, which includes broadcasting stations/communication facilities, and the right side of the network is a side for receiving the service guide information.

The content creation device 10 creates digital contents to be provided to the terminal and transmits the contents to the service application device 20.

The service application device 20 can provide the live television contents, data broadcast and VoD created by the content creation device 10 and create the service guide information.

The service management device 30 manages the service such that the service guide information is provided to the terminal.

The upper portion of the network 40 represents the broadcasting channel and the lower portion of the network 40 represents the interactive channel.

The terminal 50 may receive the broadcasting signal (the broadcasting signal according to a system such as the DVB-H or the MPH) via the broadcasting channel and transmit/receive a communication signal according to a communication system such as 3G/4G via the interactive channel.

FIG. 92 shows the connection between the devices in the system. FIG. 92 shows the communication 1 between the network 40 and the terminal 50 via the broadcasting channel, the communication 2 between the service application device 20 and the terminal via the broadcasting channel, the communication 3 between the service management device 30 and the terminal 50 via the broadcasting channel, the communication 4 between the service management device 30 and the terminal 50 via the interactive channel, the communication 5 between the service application device 20 and the terminal 50 via the interactive channel, the management 6 of a network source by the service management device 30, and the communication 7 between the service application device 20 and the service management device 30.

Figure 93:
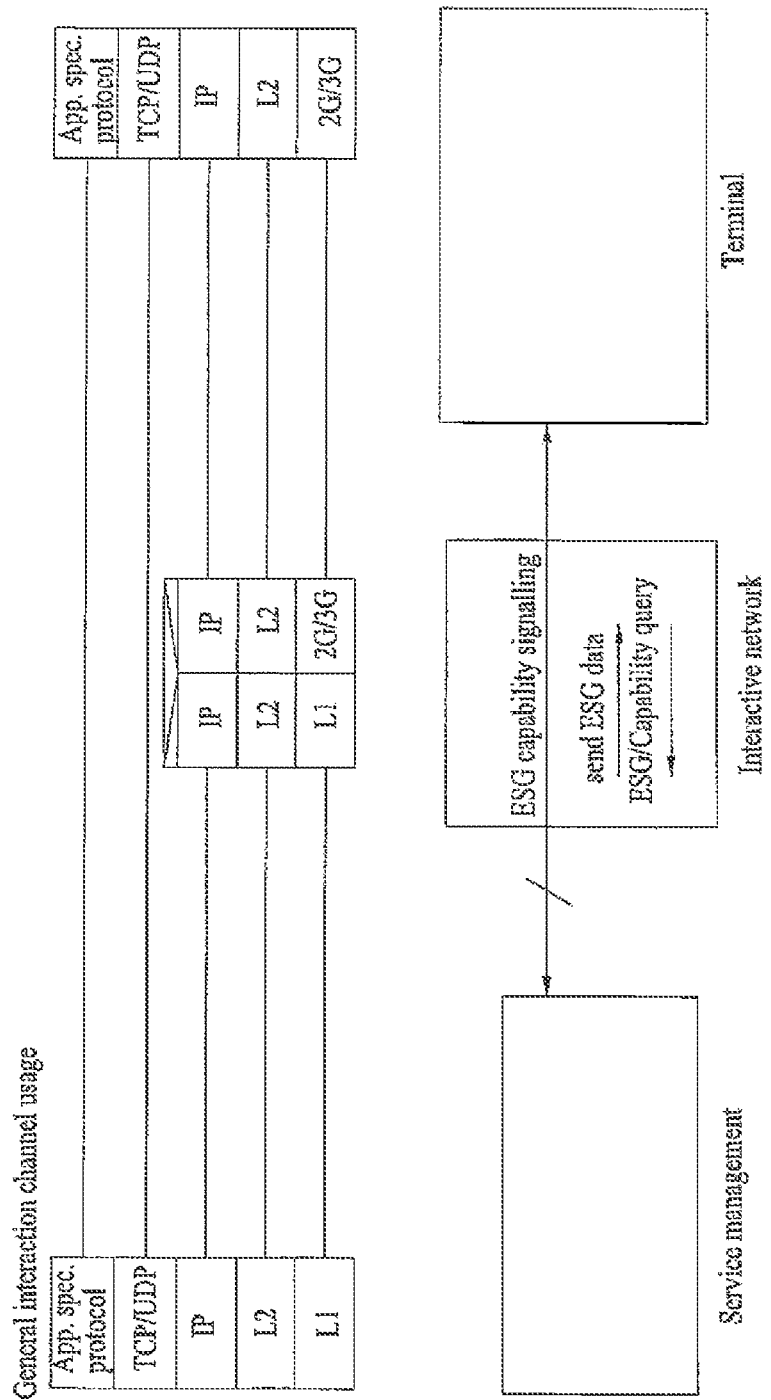
FIG. 93 shows an interface for allowing the service management device 30 and the terminal 50 to transmit/receive the service guide information via the interactive channel in the communication relationship shown in FIG. 92.

FIG. 93 shows an interface for allowing the service management device 30 and the terminal 50 to transmit/receive the service guide information via the interactive channel in the communication relationship shown in FIG. 92. Hereinafter, a method of requesting the information associated with the service guide information to the service management device 30 and receiving the information will be described.

In an OSI protocol layer for allowing the service management device 30 and the terminal 50 to process and transmit/receive a signal via the network, an IP protocol may be located on L1 and L2 which are hardware layers and a protocol associated with the application may be located on the IP protocol via a TCP/UDP.

If the signal transmitted via the physical layer of the service management device 30 is transmitted to the terminal via the L1, L2 and IP protocols over the network, the signal is transmitted via the interactive channel according to the protocol associated with 3G/4G. The terminal transmits the signal according to the physical layer 3G/4G associated with the 3G/4G communication system, the protocol L2 of the data link layer associated with hardware, the IP protocol, the TCP/UDP protocol, and the protocol associated with the application.

In the case where the service management device 30 and the terminal 50 transmit/receive the service guide information via the interactive channel, the terminal 50 queries the service guide information or the server for providing the service guide information (that is, the server in the service management device 30). Then, the service management device 30 transmits signaling information for the capability of the server for providing the service guide information or data according to the service guide information to the terminal 50 according to the query.

Now, the capability of the server for providing the service guide information will be described.

The capability of the server for providing the service guide information via the interactive channel may be decided according to the attributes of the service guide information provided via the broadcasting channel. For example, in the case where the attribute of the service guide information received by the terminal via the broadcasting channel is included in the entry information of the service guide information, it may be determined whether the terminal accesses the server for providing the service guide information via the interactive channel according to the attribute.

Figure 94:
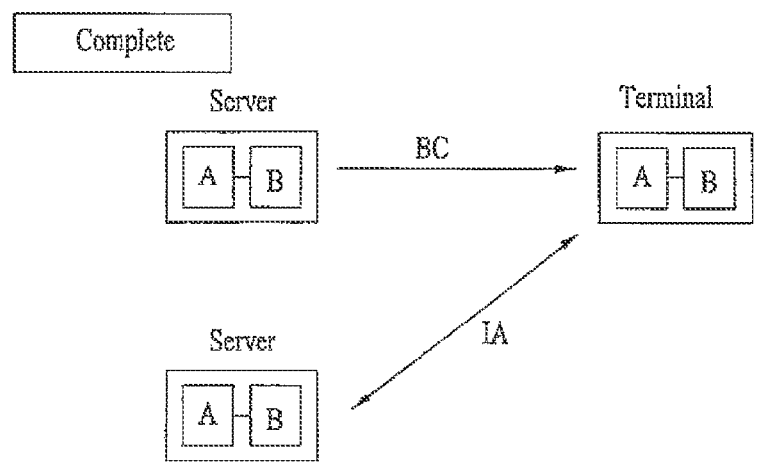
FIG. 94 shows the case where the capability of the server is complete.
Figure 95:
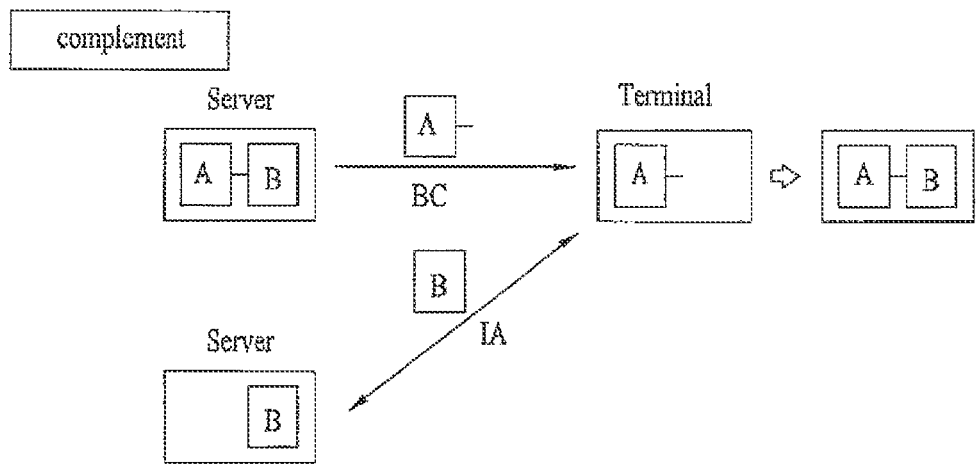
FIG. 95 shows the case where the capability of the server is complementing.
Figure 96:
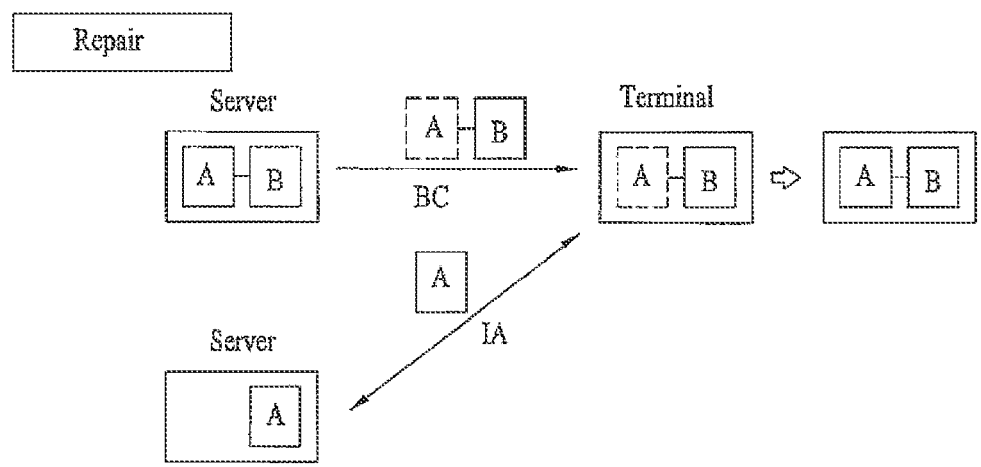
FIG. 96 shows the case where the capability of the server is repair.

The capability of the server for providing the service guide information via the interactive channel includes complete, complementing and repair. FIGS. 94 to 96 show the capability of the server for providing the service guide information.

FIG. 94A shows the case where the capability of the server is complete.

The complete indicates the capability of the server in the case where the server for providing the service guide information can provide all service guide information via any channel, for example, the interactive channel. Accordingly, the terminal can receive the service guide information A and B, which can be received via the broadcasting channel (BC), from the server having the complete capability via the interactive channel (IC).

FIG. 95 shows the case where the capability of the server is complementing.

The complementing indicates the capability of the server which can complement the service guide information (B can be provided) in the case where the service guide information of the terminal which receives the service guide information via the broadcasting channel (BC) does not completely include the service guide information of the server (only A is received). Accordingly, the terminal can receive the service guide information B from the server having the complementing capability via the interactive channel (IA) in the case where only A of the service guide information including A and B is received via the broadcasting channel. For example, in the case where the terminal obtains the supplementary information B other than the service guide information A necessary for providing the service via the interactive channel, the capability of the service for providing the supplementary information B is complementing.

FIG. 96 shows the case where the capability of the server is repair.

The repair indicates the capability of the server which can retransmit the service guide information of a lost portion via the interactive channel in the case where the service guide information received by the terminal via the broadcasting channel is lost. In the case where the terminal cannot normally receive A of the service guide information including A and B via the broadcasting channel, the service guide information A can be received from the server having the repair capability via the interactive channel.

Figure 97:
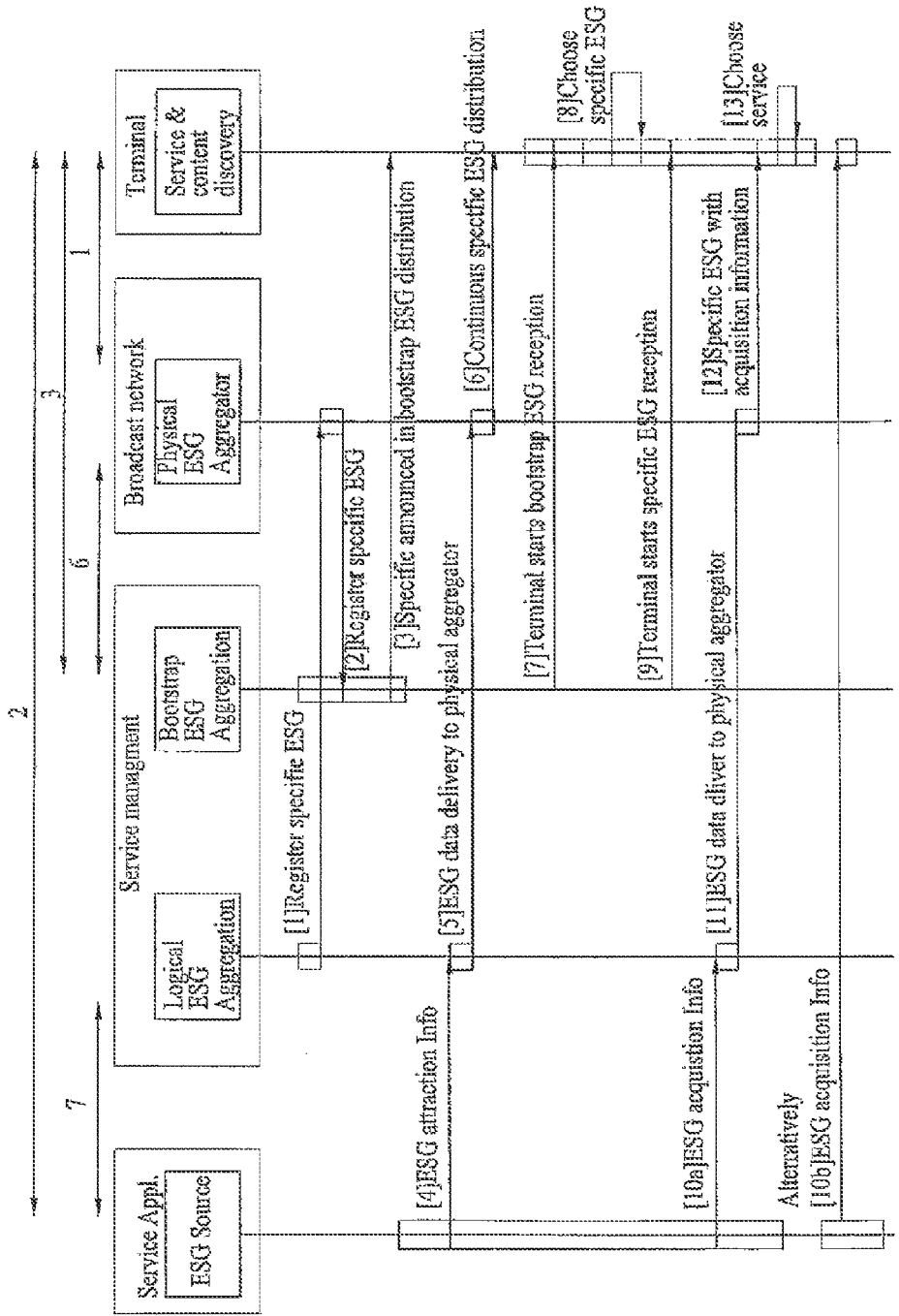
FIG. 97 is a conceptual view showing a process of receiving the service guide information via the broadcasting channel.

FIG. 97 is a conceptual view showing a process of receiving the service guide information via the broadcasting channel.

The service management device includes a logical ESG aggregation which aggregates the service guide information and a bootstrap ESG aggregator which aggregates bootstrap information for the service guide information.

The broadcasting network performs a physical ESG aggregator function and the terminal performs a service and content delivery process.

The service management device aggregates the service guide information and registers the service guide information [1]. By this process, the IP address to which the service guide information is delivered is set in the network. The bootstrap information for the service guide information is registered in the service management device [2]. The service guide information is delivered to the terminal via the broadcasting network using the bootstrap information [3]. In this case, since the power of the terminal is turned off, the terminal cannot receive the bootstrap information although the bootstrap information is delivered via the broadcasting network.

The service application device delivers the attraction information of the service guide information to the service management device [4]. After the service management device delivers the service guide information to the network [5], the service guide information is delivered via the network [6]. Since the power of the terminal is turned off, the terminal cannot receive the service guide information although the service guide information is delivered via the broadcasting network.

If the power of the terminal is turned on, the terminal receives the bootstrap information from the service management device [7].

The terminal which receives the bootstrap information selects specific service guide information of the service guide information which can be received from the bootstrap information [8]. The terminal receives the specific service guide information [9].

When the content creation device transmits the acquisition information of the service guide information to the service management device [10a], the service management device transmits the data of the service guide information to the physical aggregator [11]. When the network transmits the specific service guide information to the terminal using the acquisition information [12], the terminal selects the service desired by the user from the service guide information [13]. The terminal can directly receive the service guide information from the content creation device [10b].

The device included in the system shown in FIG. 97 transmits/receives information via the above-described communication path and the arrows of the upper side of FIG. 97 represent the communication paths.

As described above, the service guide information may be used to receive the mobile broadcasting service. As shown in FIGS. 94 to 96, in the case where the terminal receives the service using the service guide information via the interactive channel, the following process may be performed.

Figure 98:
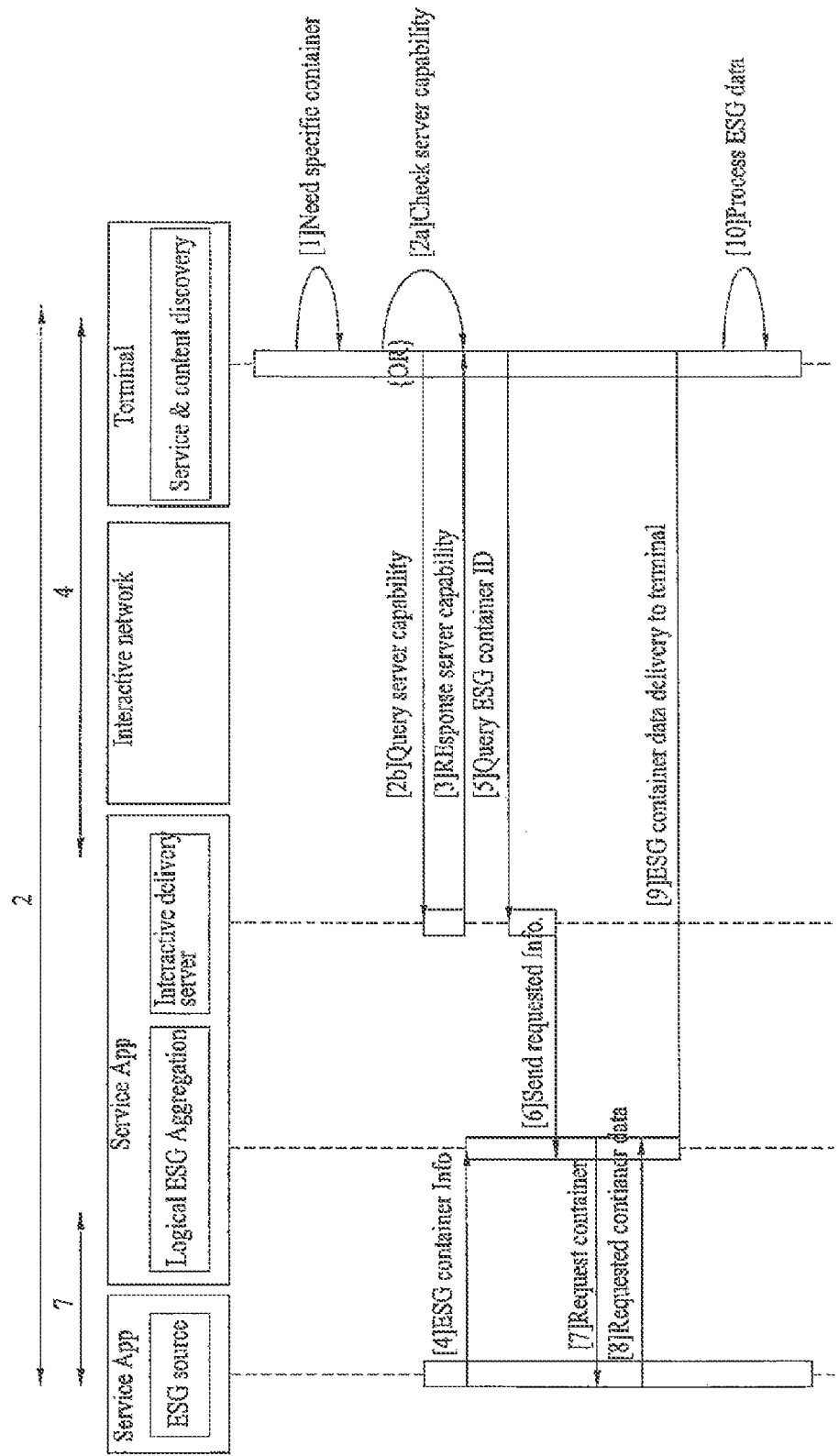
FIGS. 98 to 100 are views showing a process of receiving the service guide information from the server having the complete attribute by the terminal.
Figure 99:
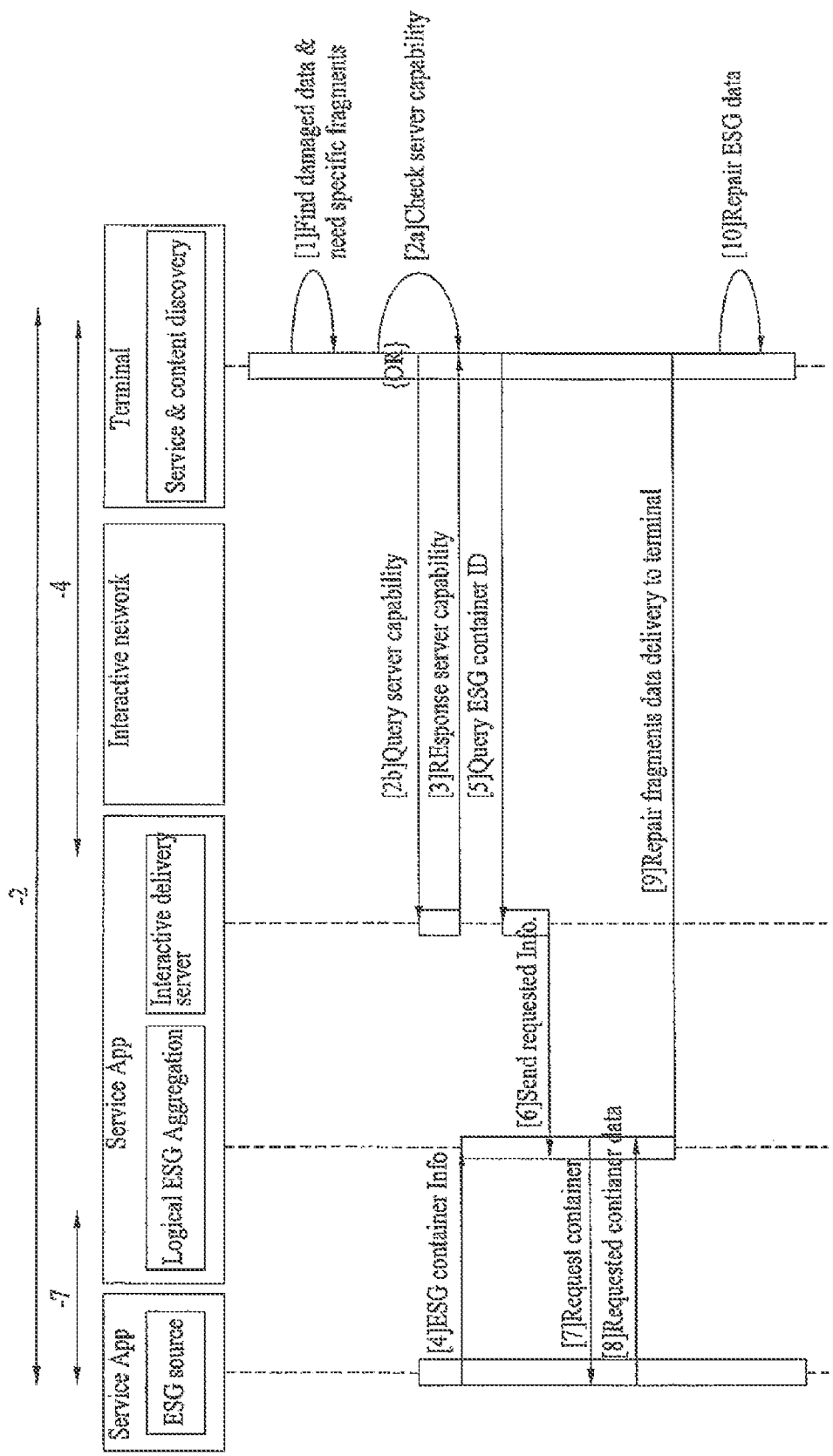
Figure 100:
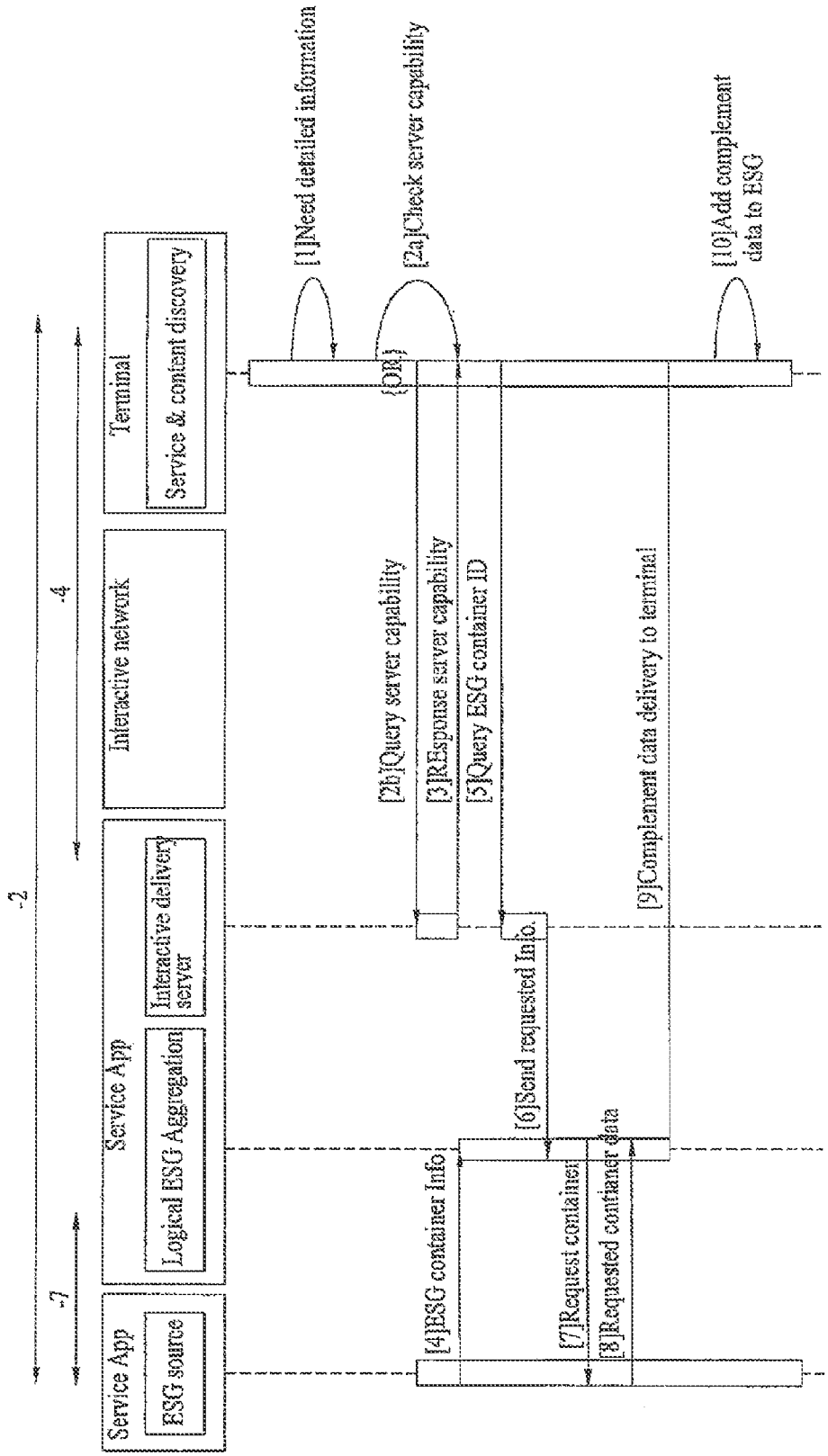

FIGS. 98 to 100 are views showing a process of receiving the service guide information from the server having the complete attribute by the terminal. The process of receiving the service guide information will now be described with reference to FIGS. 98 to 100.

FIG. 98 shows an example in which the terminal requests and receives the service guide information to and from the server having the complete capability.

The terminal receives the service guide information from the server having the complete attribute and receives a need for receiving a specific container in the service guide information from the user [1].

The terminal acquires the capability of the service management device which can communicate via the interactive channel and provide the service guide information, from the bootstrap information [2a]. Alternatively, the terminal queries the capability of the server for providing the service guide information in the service management device for storing the service guide information via the interactive channel [2b]. Then, the terminal receives the information on the capability of the server from the server in the service management device [3].

The service application device transmits the information on the container of the service guide information to the ESG aggregation of the service management device [4]. Meanwhile, when the terminal requests the container to the service management device using the container ID of the service guide information [5], the server in the service management device receives the request and sends the requested information to the ESG aggregation in the service management device [6]. When the ESG aggregation requests the requested container to the service application device [7], the service application device transmits the requested container data of the service guide information to the ESG aggregation [8]. Then, the container data of the service guide information is transmitted to the terminal [9] and the terminal processes and outputs the container data to the user.

FIG. 99 shows an example in which the terminal requests and receives the service guide information to and from the server having the repair capability.

The terminal determines whether or not there is lost data in the service guide information received via the broadcasting channel and determines whether or not a specific fragment is required due to the loss [1]. Similar to FIG. 98, the terminal receives the information on the capability of the device for providing the service guide information in the service management device via the bootstrap information or by the request to the service management device [2a], [2b] and [3].

Then, the service application device transmits the fragment and the repair information of the service guide information to the service management device [4]. The terminal queries the repair fragment of the service guide information to the server of the service management device such that the terminal repairs the lost information to the complete information if the service guide information received via the broadcasting channel is lost [5].

The server of the service management device transmits the queried information to the ESG aggregation [6] and the ESG aggregation requests the repair fragment to the service application device [7]. When the service application device transmits the requested repair fragment data to the ESG aggregation [8], the transmitted repair fragment is transmitted to the terminal via the communication channel [9]. The terminal repairs the lost portion of the service guide information received via the broadcasting channel using the repair data of the service guide information.

FIG. 100 shows an example in which the terminal requests and receives the service guide information to and from the server having the repair capability.

The terminal determines whether there is necessary detailed information such as supplementary information in the service guide information received via the broadcasting channel [1]. The terminal receives the information on the capability of the device for providing the service guide information in the service management device via the bootstrap information or by the request to the service management device [2a], [2b] and [3]. The service application device transmits the complement information for complementing the service guide information to the aggregation of the service management device [4].

The terminal queries the data for complementing the service guide information such as the detailed supplementary information to the server of the service management device [5]. The server of the service management device transmits the queried information to the ESG aggregation [6] and the ESG aggregation requests the complement data to the service application device [7]. When the service application device transmits the requested complement data to the ESG aggregation [8], the transmitted complement data is transmitted to the terminal via the communication channel [9]. The terminal complements the complement data of the service guide information to the service guide information received via the broadcasting channel and provides the complemented data to the user [10].

Meanwhile, as described above, the service guide information can be acquired from the bootstrap information. The process of receiving the bootstrap information of the service guide information will now be described.

An IP/MAC notification table (INT) of table information transmitted by at least one section in the broadcasting signal includes mapping information between an IP address of an Internet protocol (IP) stream and a packet identifier (PID) of a transport stream in the transport stream of the broadcasting signal. In the case where the terminal acquires the IP address for receiving the bootstrap information of the service guide information from the INT which is the mapping information, the terminal can check the PID for receiving the bootstrap information from the program number on the PMT in which the acquired IP address is defined. In the case where the packet corresponding to the PID is encapsulated in the transmitted signal, the terminal can decapsulate the transmitted signal and acquire the bootstrap information.

FIG. 101 is a view showing an example in which the bootstrap information for receiving the service guide information is represented in the form of a descriptor. The bootstrap information of the service guide information provides information on a provider of the service guide information or information for acquiring the available service guide information. FIG. 101 shows a descriptor associated with the acquisition of the service guide information (represented by an ESG access descriptor) and FIG. 102 shows entry information ESGEntry parsed from the descriptor of FIG. 101. The descriptor for acquiring the service guide information describes an item associated with the access to the entry point of the service guide information transmitted via the broadcasting channel. Accordingly, the entry point may become the bootstrap information for allowing the terminal to receive the service guide information.

The service guide information transmitted by the bootstrap information shown in FIG. 101 may be transmitted in the form of the stream based on the IP. For example, the service guide information may be transmitted according to an asynchronous layered coding/layered coding transport (ALC/LCT) in a file delivery over unidirectional transport (FULTE) session. For example, the service guide information may be transmitted/received according to a file transmission/reception protocol on the IP protocol in the form of an Extensible Markup Language (XML) file, a hypertext markup language (HTML) file and a JPG file.

The terminal can acquire the bootstrap information of the service guide information from the IP address described in table information (e.g., the INT) according to the program table information like the PSI/SI. For example, the bootstrap information can be acquired from 224.0.23.14 if the IP address is transmitted in the IP version 4 format according to the broadcast transmitting/receiving system and the bootstrap information can be acquired from FF0X:0:0:0:0:0:0:12 D if the IP address is transmitted in the IP version 6 format. In FIG. 97, n_o_ESGEntries indicates the number of entry information (the number of ESGEntries) of the service guide information in which the access information is signaled in the service guide information. The terminal can parse the entry information for receiving the service information according to the number of entry information using the descriptor of FIG. 101.

FIG. 102 shows an example representing the entry information ESGEntry of the service guide information shown in FIG. 101. In the entry information ESGEntry of the service guide information, an ESGEntryVersion field indicates the version of the entry information ESGEntry of the service guide information and indicates whether the descriptor shown in FIG. 102 is transmitted via the broadcasting channel or the interactive channel. For example, the ESGEntryVersion field has a value of 1 if the descriptor of FIG. 102 is transmitted only via the broadcasting channel and has a value of 2 if the descriptor of FIG. 102 is transmitted only via the interactive channel.

An ESGEntryLength field indicates the length of the ESGEntry in byte units. A ProviderID field indicates the ID of the provider of the service guide information. An n_o_AccessPoints field indicates the number of entry points which can receive the service guide information. A "for" loop parses the information on the entry point according to the number of entry points. An AccessType field indicates the channel type which can access and receive the service guide information. In addition, an AccessPointLength field indicates the length of the entry point information according to the AccessType field.

If the service guide information is received via the broadcasting channel when the AccessType field is 0x01, the entry point information of the service guide information received via the broadcasting channel is as follows.

If a MultipleStreamTransport field is 1, it is indicated that the IP address is provided in a session for implementing the service guide information via an announcement channel and the service guide information is provide to a location indicated by the IP address. If the MultipleStreamTransport field is 0, it is indicated that the container of all service guide information is provided in the session for implementing the service guide information.

An IPVersion6 field indicates whether SourceIPAddress and DestinationIPAddress are set according to the IP version 6.

The bootstrap information of the service guide information may include the SourceIPAddress and the DestinationIPAddress which operate in the session (e.g., the FLUTE session) for transmitting/receiving the service guide information according to the value of the IPVersion6 field. The IP address may describe the source or destination IP address when the value of the IPVersion6 field is the IPversion6 or IPversion4 (if(IPversion6)). A Port field indicates the port of the IP stream of the session (e.g., FLUTE session) for transmitting/receiving the service guide information, and a TSI field indicates a transport session identifier of the session for transmitting/receiving the service guide information.

In contrast, if the AccessType field is 0x02, it is indicated that the service guide information can be transmitted/received via the interactive channel. If the service guide information is transmitted/received via the interactive channel, the capability of the server for providing the service guide information via the interactive channel may be set in a ServerCapability field. The terminal can acquire the information indicating whether the capability of the server is complete, repair or complementing, from the ServerCapability field shown in FIG. 102.

A URL_Length field indicates the length of the character of the location information which can provide the service guide information via the interactive channel and a URLByte field includes the location information of the server according to the length of the character.

FIG. 103 shows the semantics of values of the main fields of FIG. 102. The ServerCapability field indicating the capability of the server for providing the service guide information may have a service guide download value, a repair fragment download value, and a complementing data download value. The terminal acquires the information on the capability of the server according to the ServerCapability field. The terminal may request the service guide information to the server using a communication protocol, for example, a simple object access protocol (SOAP) according to the capability of the server according to the ServerCapability field. This example is shown in FIG. 104.

Figure 104:
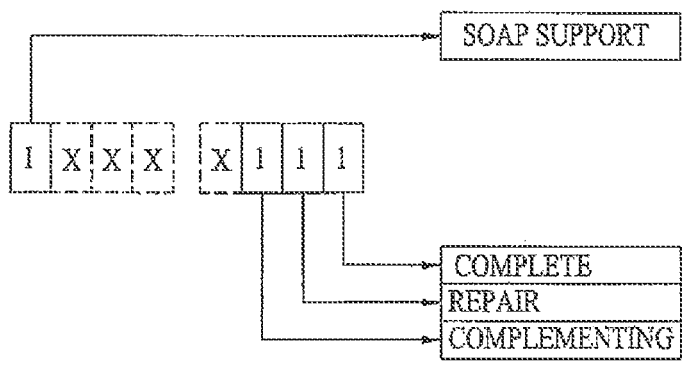
FIG. 104 shows the ServerCapability field.

FIG. 104 shows the ServerCapability field.

FIG. 104 is a view an example in which the ServerCapability field is represented in a bitwise form. For example, a first bit of the ServerCapability field may represent a protocol used when the service guide information is requested to the server. In FIG. 104, 1 represents the SOAP.

A first bit of three last bits indicates that the capability of the server for providing the service guide information is complementing, a second bit thereof indicates that the capability of the server is repair, and a third bit thereof indicates that the capability of the server is complete.

Figure 105:
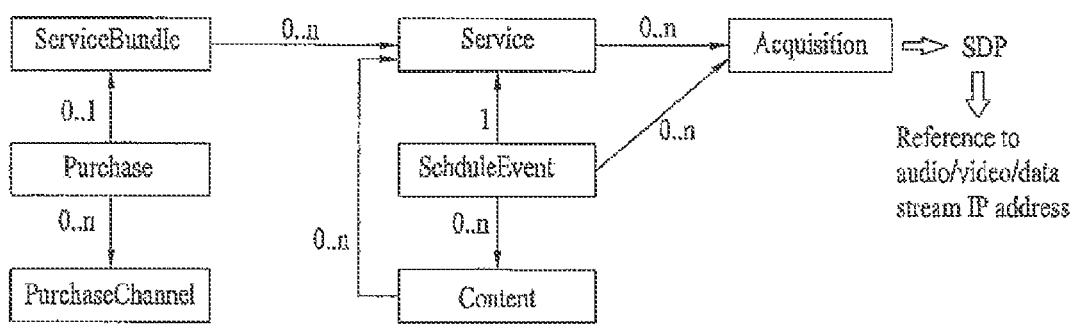
FIG. 105 is a view showing an example of the service guide information.

FIG. 105 is a view showing an example of the service guide information. The basic structure of the service guide information will be described with reference to FIG. 101.

The service guide information may be provided to the user in the sub-units. Here, the sub-unit of the service guide information is called a fragment. The example of FIG. 105 includes a service fragment, a schedule event fragment, a content fragment, a service bundle fragment, a purchase fragment, a purchase channel fragment, and an acquisition fragment. Arrows of FIG. 105 represent reference relationships and the syntaxes represent the XML format. In the example of FIG. 105, the service bundle fragment can refer to the service fragment. The numeral described on the arrow denotes information on the number of available sub units. For example, 0 . . . n indicates that the sub-units include 0 to n (n is a natural number).

The service fragment includes a service provided to the user, for example, information on a service such as a television channel. The service bundle fragment includes information on a service bundle. The service fragment refers to FIG. 106.

The service bundle fragment may include information on a service bundle and the contents are shown in FIG. 107. The service bundle may include, for example, a sports service bundle, a cinema service bundle and so on. The content fragment (FIG. 108) includes metadata of contents. For example, the type of the contents, such as audio/video (A/V), a text and an image of the contents, may be included in the content fragment.

The schedule event fragment includes schedule information of contents included in the service and is shown in FIG. 109. For example, the schedule event fragment includes the broadcast time of the contents. The purchase fragment (FIG. 110) includes the purchase information of the service which can be purchased by the user. The purchase channel fragment (FIG. 111) indicates an interface via which the terminal or the user communicates with a purchase system. The purchase channel fragment includes information on a parameter associated with the purchase system or the management of a purchase channel.

The acquisition fragment (FIG. 112) includes information associated with the access of the service or the contents. The user can access the service or the contents via the information associated with the acquisition fragment and purchase the service or the contents.

The service guide information may have a layered structure and the sub-unit of the layered structure is called the fragment. The fragment is encoded, at least one fragment unit is encapsulated to build a large unit, and the large unit is transmitted. The encapsulated unit is called a container.

As described above, the service guide information can be acquired from the bootstrap information. Hereinafter, a process of receiving the bootstrap information of the service guide information will be described.

An IP/MAC notification table (INT) of table information transmitted by at least one section in the broadcasting signal includes mapping information between an IP address of an IP stream and a packet identifier (PID) of a transport stream in the transport stream of the broadcasting signal. In the case where the terminal acquires the IP address for receiving the bootstrap information of the service guide information from the INT which is the mapping information of the broadcasting signal, the terminal can check the PID including the bootstrap information using a program number on a program map table (PMT) in which the acquired IP address is defined. In the case where the packet corresponding to the PID is subjected to multiprotocol encapsulation (MPE), the terminal can MPE-decapsulate the packet and acquire the bootstrap information.

The service guide information may be, for example, transmitted according to an asynchronous layered coding/layered coding transport (ALC/LCT) in a file delivery over unidirectional transport (FLUTE) session operated on an IP protocol or the SDP.

Figure 114:
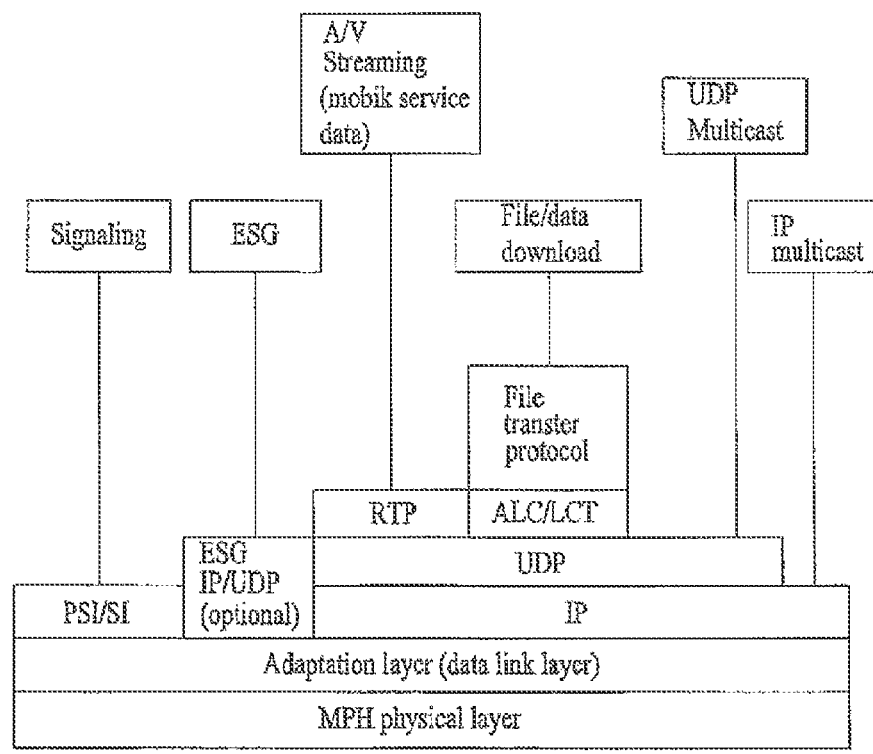
FIG. 114 shows a protocol which can acquire the service guide information.

The example of the protocol for delivering the bootstrap information is shown in FIG. 114 in detail. The terminal can acquire the bootstrap information of the service guide information from the IP address described in the program table information (e.g., INT) like program specification information/service information (PSI/SI). For example, the IP address may be transmitted in the IP version 4 format or the IP version 6 format according to the above-described broadcasting system and the bootstrap information can be acquired according to the IP address.

Figure 113:
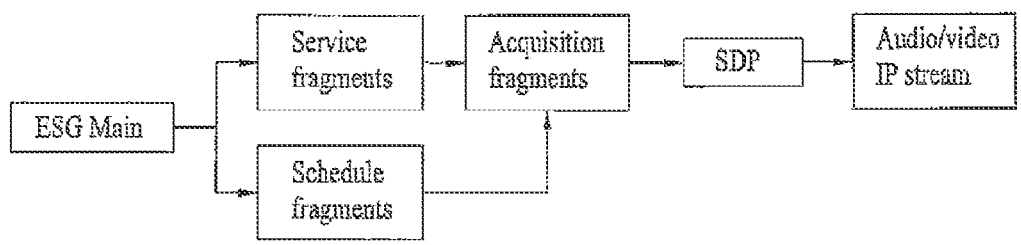
FIG. 113 shows a process of acquiring a stream containing desired broadcasting contents from the service guide information.

FIG. 113 shows a process of acquiring a stream containing desired broadcasting contents from the service guide information output on the screen by the user. The service fragment or the schedule fragment may be accessed from the main of the service guide information (ESG main) or the service fragment may be accessed via the schedule fragment. The acquisition fragment may be accessed via the service fragment or the schedule fragment such that the IP stream including the actual A/V/Data stream of the contents is acquired.

FIG. 114 shows a protocol which can acquire the service guide information.

In FIG. 114 an adaptation layer may be located on a physical layer, and a protocol which describes signaling information (e.g., broadcasting stream multiplexing information) of the broadcasting signal like the PSI/SI, an IP stream, or a stream including the service guide information is located on the adaptation layer.

The A/V may be transmitted accordingly to the RTP of the UDP layer via an IP layer, and a file including data information is transmitted by a file transfer protocol via an ALC/LCT layer on the IP layer. The IP multicast is available from the IP layer and the UDP multicast is available via the UDP layer.

Meanwhile, the service guide information may be transmitted in the IP stream format via the IP/UDP on the adaptation layer if a single/multi stream is transmitted or may be transmitted in a specific stream format representing the service guide information on the adaptation layer if the single stream is transmitted. In this case, information indicating that the service guide information is included in the IP datagram may be in a data field describing the IP datagram.

FIG. 115 shows the structure of the RS packet in the case where the service guide information (ESG) is transmitted by the above-described MPH packet (which is called the RS packet because the RS frame data is transmitted) according to FIG. 114. The service guide information may be included in one RS packet of the region AB. If the service guide information is included, this example represents information indicating that the service guide information is included in the payload of the header of the RS packet including the service guide information.

Figure 116:
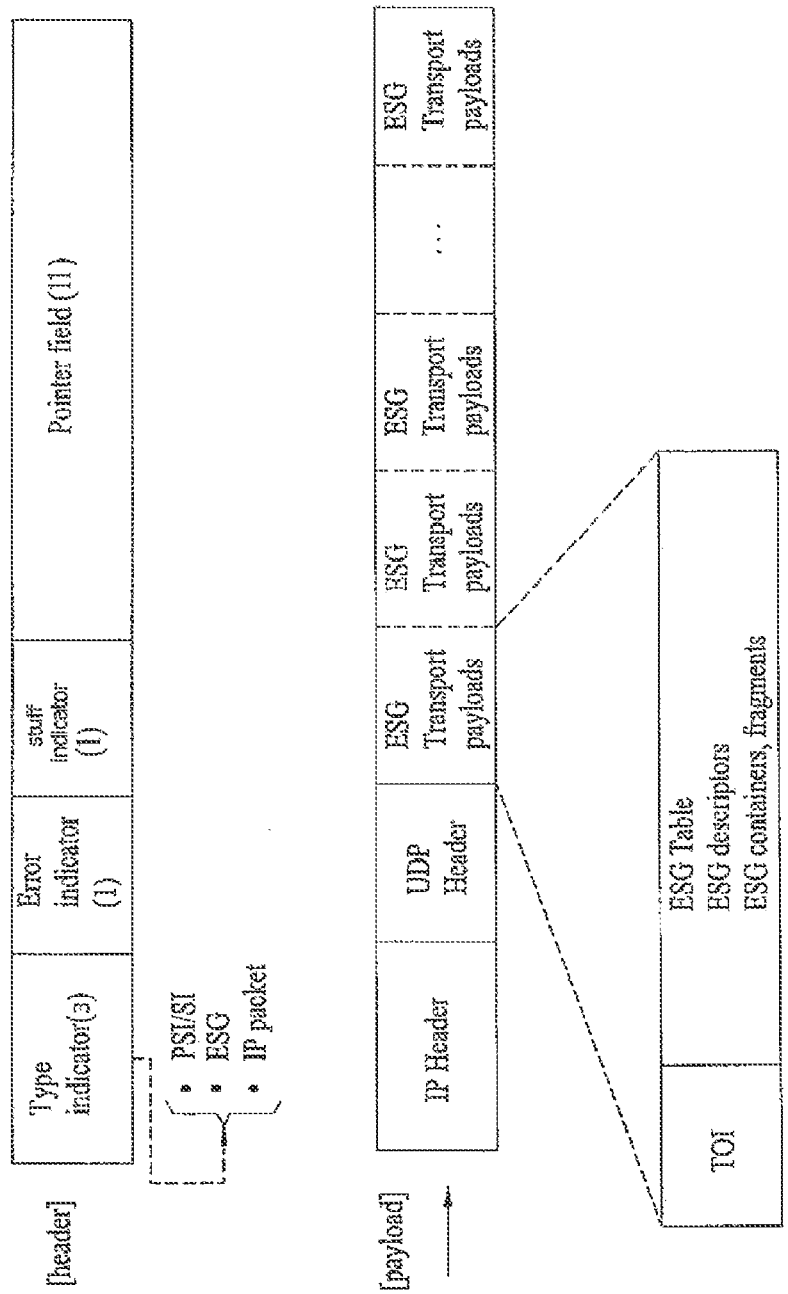
FIG. 116 shows the structure of the RS packet for delivering the service guide information.

FIG. 116 shows the structure of the RS packet for delivering the service guide information. The header of the RS packet may include a Type Indicator field, an Error Indicator field, a stuff indicator field, and a Pointer field. The description of the fields of the header is shown in FIG. 79. The Type Indicator field may include a field indicating which information of the IP packets including the program table information, the service guide information, and the A/V/Data is filled in the payload of the RS packet. Accordingly, it can be seen that the service guide information is included in the payload of the RS packet, from the Type Indicator field of the RS packet.

If the service guide information is included in the payload of the RS packet, an IP header, an UDP header and at least one ESG transport payload may be included in the payload. One service guide information transport payload includes data of the service guide information and TOI. The TOI may indicate whether the data of the service guide information is a table, a descriptor or service guide information container (or a fragment). If the service guide information is transmitted in the single stream format, the IP header and the UDP header may not be included in the payload of the RS packet.

Figure 117:
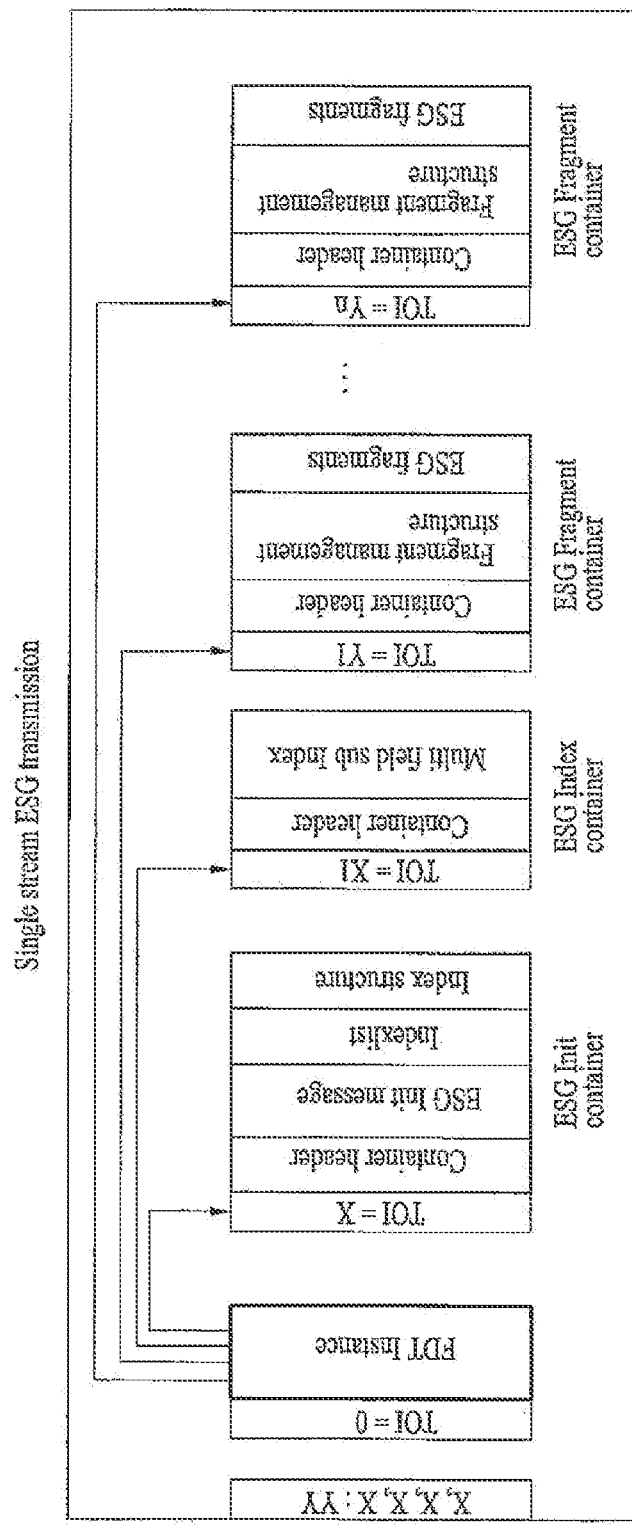
FIGS. 117 and 118 show the actual data structure of the service guide information.
Figure 118:
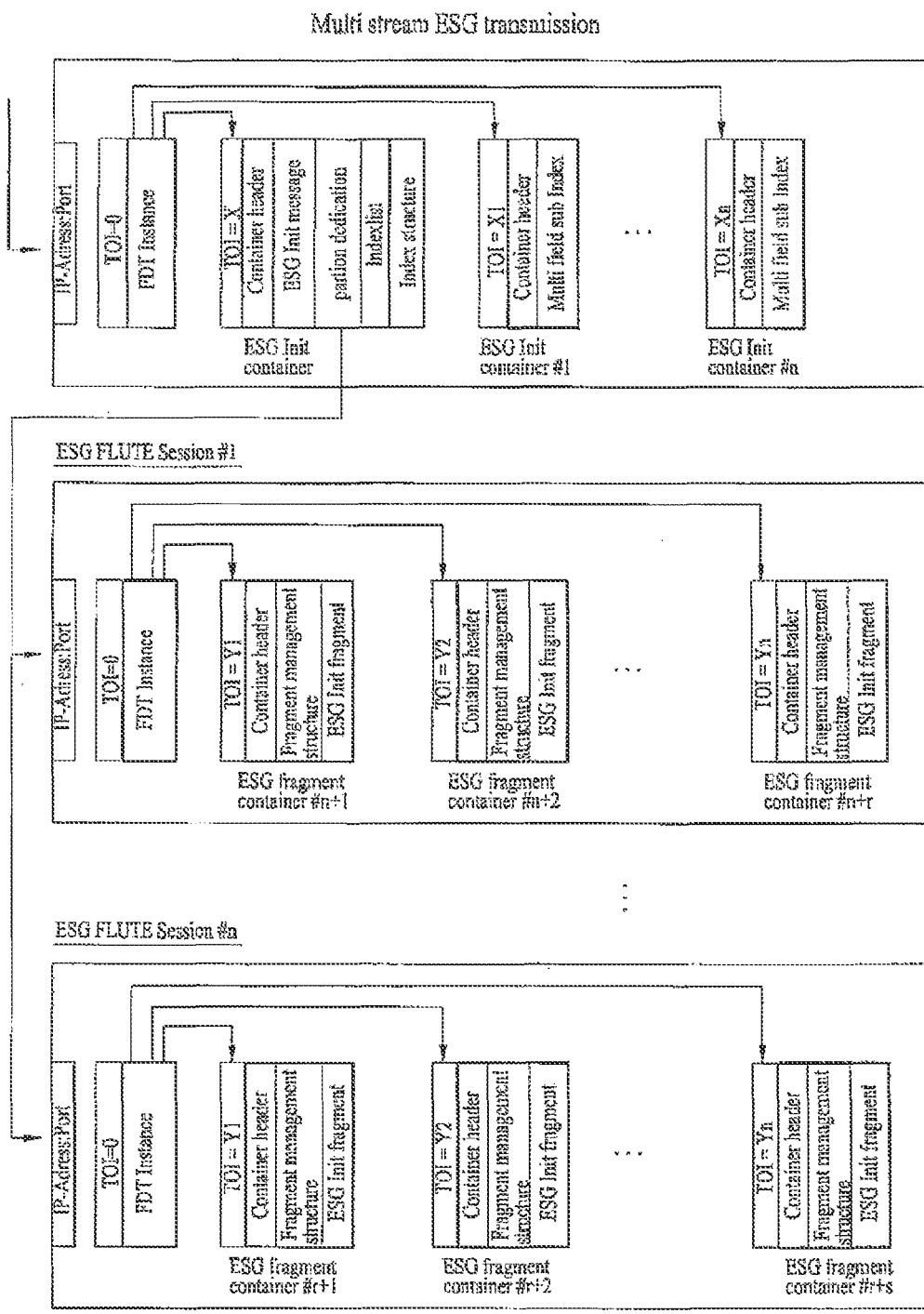

FIGS. 117 and 118 show the actual data structure of the service guide information. FIG. 117 shows the case where the service guide information is transmitted in the single stream format. In this case, the service guide information can be distinguished according to the TOI in one IP (X.X.X.X:YY).

For example, if the TOI is 0, the data of the service guide information may become a file delivery table (FDT). The FDT describes the location of the TOI in which the unity of the service guide information (e.g., the container or the fragment) is started in the service guide information (denoted by an arrow). That is, a TOI list including the data of the service guide information is described in the FDT. The configuration of the FDT may follow the FLUTE. The FDT is shown in FIG.

119. The data of the service guide information may include information in container, message or fragment units.

FIG. 117 shows the case where the service guide information is transmitted in the multi stream format. In this case, the FDT is described in the data of the service guide information in which the TOI included in one IP stream is 0. In a partition declaration (partition declaration descriptor) of the data according to the TOI, if the associated service guide information is included in different IP streams, the IP addresses (IP address ports) of the different IP streams are included. In the IP stream according to the different IP address ports, the TOI list in the stream is included in the FDT in which the TOI is 0. Accordingly, although the service guide information is transmitted by a plurality of IP streams, the service guide information can be found and provided.

FIG. 119 shows the structure of the FDT shown in FIGS. 117 and 118.

The FDT element (FDT-instance) may have a file element in the type (FDT-instanceType). The File-Type which is the attribute of the file element may describe the location information (Content-location) in which the TOI is located in the payload of one RS packet and the value of the TOI according to the location information. Accordingly, although the containers of the service guide information are multiplexed in the payload of the RS packet, the location information of each data according to the TOI list can be acquired as shown in FIG. 119.

Figure 120:
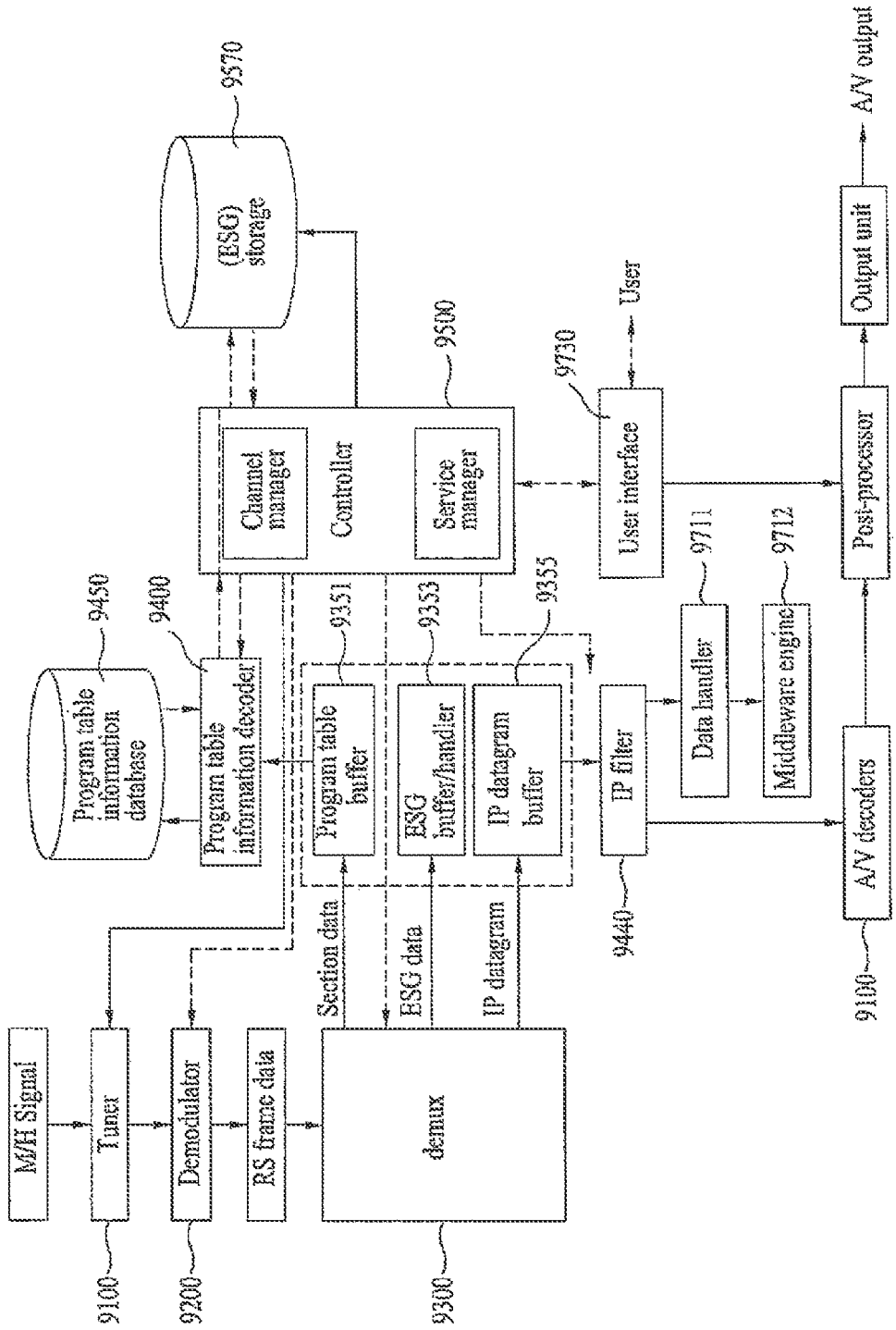
FIG. 120 is a view showing an example of a broadcast receiving system.

FIG. 120 is a view showing an example of a broadcast receiving system. Hereinafter, the example of the broadcast receiving system will be described with reference to FIG. 120. The broadcast receiving system includes a tuner 9100, a demodulator 9200, a demultiplexer 9300, a buffer 9350, a program table information decoder 9400, an IP filter 9440, a program table information database 9450, a controller 9500, a database 9570, an A/V decoder 9600, a data handler 9711, a middleware engine 9712, a user interface 9730, a post-processor 9800, and a output unit.

The tuner 9100 may receive a broadcasting signal transmitted via at least one of a channel for fixed reception or a channel for mobile reception. That is, the broadcasting signal received by the tuner 1100 may include main service data and mobile service data. The tuner 1100 tunes a channel selected by the user and outputs the broadcasting signal of the channel. The broadcasting signal received via the channel for fixed reception may include a terrestrial/cable broadcasting signal.

The demodulator 9200 demodulates the signal output from the tuner 9100 and outputs the demodulated signal. The demodulator 9200 may demodulate at least one of the broadcasting signal of the channel for fixed reception and the broadcasting signal of the channel for mobile reception. For example, the demodulator 9200 may demodulate a 74VSB/256VSB modulation signal or a 64QAM/258QAM modulation signal. The example of the mobile service data and the main service data is shown in FIG. 30 in detail. The demodulator 9200 may not demodulate and may ignore the broadcasting signal according to a null packet which is transmitted in order to adjust the transfer rate of the received signal. The data output from the demodulator 9200 is the above-described data having an RS packet format and is input to the demultiplexer 9300.

The demultiplexer 9300 may demultiplex the RS packet output from the demodulator 9200 and output the demultiplexed packet. The demultiplexer 9300 may directly receive the mobile service data stream or the main service data stream from an external apparatus. For example, if the broadcast receiving system receives the broadcasting stream from a digital VCR, the demultiplexer 9300 may directly receive the broadcasting stream via a predetermined interface, for example, an IEEE-1394 interface, and demultiplex the broadcasting stream. The demultiplexer 9300 may demultiplex the section data, the service guide information and the IP datagram in the received broadcasting stream. For example, the demultiplexer 9300 outputs the program table information to the program table information buffer 9351 of the buffer 9350 according to the value of the Type Indicator field of the RS packet header, outputs the service guide information to a service guide information buffer 9353, and outputs and stores the IP datagram to and in an IP datagram buffer 9355. The demultiplexer 9300 of the embodiment of FIG. 120 divides and outputs only the service guide information even when the service guide information is located on the IP/UDP, that is, is transmitted by the IP datagram. According to the embodiment, the service guide information may be output as the IP datagram, the IP header may be removed, and only the payload may be stored in the service guide information buffer.

The IP datagram stored in the IP datagram buffer is output to the IP filter 9440 such that the broadcasting signal selected by the controller 9500 is output. The service guide information stored in the service guide information buffer may be stored in the service guide information database 9570. The service guide information stored in the service guide information database 9570 or the service guide information buffer is processed by the controller 9500, is output to the post-processor 9800 and is output on the screen.

The IP filter 9440 may output only the datagram including a video/audio signal of the broadcast selected by the user in the IP datagram to the A/V decoder 9600 under the control of the controller 9500. Alternatively, the data included in the IP datagram may be processed by the data handler 9711 and output to the post-processor 9800 via the middleware engine 9712.

The program table information decoder 9400 may decode the demultiplexed program table information (PSI/PSIP) and output the decoded information to the controller 9500. The program table information decoder 9400 may store the decoded program table information in the program table information database 9450. In the case where the program table information of the mobile service data/main service data is included in the broadcasting signal, the program table information decoder 9400 may decode the program table information of the mobile service data/main service data. In this case, the program table information of the mobile service data and the program table information of the main service data may include the respective identifiers for identifying the service data. For example, if the program table information of the mobile service data and the program table information of the main service data have respective PIDs, the program table information of the mobile service data and the program table information of the main service data may be separately decoded. Alternatively, if the program table information of the mobile service data and the program table information of the main service data have the same PID but include the respective identifiers for identifying the services, the program table information of the mobile service data and the program table information of the main service data have the same PID may be recognized as separate tables and decoded.

The controller 9500 may control the components shown in FIG. 120 and store the information on the channel using the received program table information. For example, the controller 9500 may store the information on the video/audio/data stream of each channel in a channel map form using the program table information parsed by the program table information decoder 9400. For example, the controller 9500 may separately store the channel map of the mobile service data and the channel map of the main service data.

The controller 9500 can receive a user control signal via the user interface 9730. When the user transmits a control signal such as channel change, the controller 9500 may control the tuner 9100 and the demodulator 9200 by referring to the channel map information such that the signal of the channel desired by the user is output. The controller 9500 may control the tuner 9100, the demodulator 9200 and the demultiplexer 9500 such that the broadcasting signal of the channel is output, if the channel change between virtual channels for providing the main service and the mobile service or the channel change between the virtual channels for providing the mobile service. For example, if a channel change command is input, the controller 9500 may select the changed channel via the tuner 9100 by referring to the channel map. The controller 9500 may control the demodulator 9200 such that the signal of the channel selected by the user is demodulated. For example, if the user selects the channel for mobile reception, the controller 9500 may control the demodulator 9200 such that only the parade, in which the mobile service data of the channel for mobile reception is multiplexed, of the broadcasting signal is demodulated (the demodulating operation of the demodulator may refer to FIG. 30). If the user selects the channel for fixed reception, the controller 9500 may control the demodulator 9200 such that only the main service data is demodulated. The controller 9500 may control the demultiplexer 9300 such that the packet of the broadcasting signal of the channel selected by the user is demultiplexed according to the stored channel map.

The controller 9500 may control the power of the blocks shown in FIG. 110. For example, if the broadcast receiving system shown in FIG. 110 receives the mobile service data, the power of the broadcast receiving system may be controlled such that the signal is received only in the parade including the mobile service data of the reception channel. Accordingly, the broadcast receiving system can reduce power consumption although the channel for mobile reception is received. The controller 9500 can acquire the identifier of the parade from the descriptor of the program table information or the signaling information. Accordingly, the controller 9500 may control the demodulator 9200 to demodulate only the corresponding parade via the parade information indicating in which parade the broadcasting signal of the channel desired by the user is transmitted. The controller may control the demultiplexer 9300 to demultiplex the broadcasting signal according to the PID of the broadcasting stream of the channel desired by the user.

Meanwhile, the controller 9500 may control the service manager 9540 or the user interface 9370 of the broadcast receiving system of FIG. 120. The controller 9500 may update and manage the channel map via the program table information and control the tuner 9100 and the program table information decoder 9400 so as to operate the channel manager 9530 according to the user's requirement for the channel. The channel manager 9530 may update the channel map using the program table information which is newly received and control the IP filter 9440 such that the video/audio stream of the channel desired by the user is output.

The controller 9500 may decode the fragment included in the service guide information or the XML file and output the decoded fragment to the post-processor 9800, in order to output the service guide information stored in the service guide information database 9570.

The service guide information database 9570 may store the data of the service guide information, channel information according to the channel map, or the application. For example, the service guide information database 9570 may be a nonvolatile random access memory (NVRAM), a flash memory, or a memory which may be used as a PVR device.

The IP filter 9440 filters the IP datagram stored in the IP datagram database. The IP filter 9440 may filter the IP datagrams included in the service selected by the user under the control of the service manager 9540 of the controller 9500 and output the filtered datagrams to the A/V decoder 9600 and the data handler 9711.

The data processor includes the data handler 9711 and the middleware engine 9712 (denoted by a dotted line). The data handler 9711 may process a data broadcasting signal which is the IP datagram transmitted from the IP filter, and the middleware engine 9712 may control the environment of the broadcast receiving system such that the data broadcasting signal is output, process the data so as to be mixed with the A/V data, and output the processed data.

The A/V decoder 9600 decodes the video and/or audio stream output from the demultiplexer 9300 and outputs the decoded stream. For example, the A/V decoder 9600 may decode the audio stream encoded according to the AC-3 method or the video stream encoded according to the MPEG-2 method.

The post-processor 9800 may receive the audio/video signal from the A/V decoder 9600, receive the data from the middleware engine 9712, and post-processes the data such that the output unit 9900 outputs the data. The data is processed such that the data is output on an on-screen-display (OSD) of the output unit 9900 according to the control command of the user interface 9730.

The output unit 9900 may output the video/audio signal output from the A/V decoder 9600. In the example of FIG. 110, the output unit 9900 includes a display unit for outputting the video signal and a speaker for outputting the audio signal. The output unit 9900 may display the graphic signal according to the user interface 9730 on the display unit together with the video signal output on the screen. The signal output from output unit 9900 as the graphic signal includes data of which the service guide information of FIG. a is processed. Accordingly, the user may select, purchase and access the service or the contents in the output service guide information.

Figure 121:
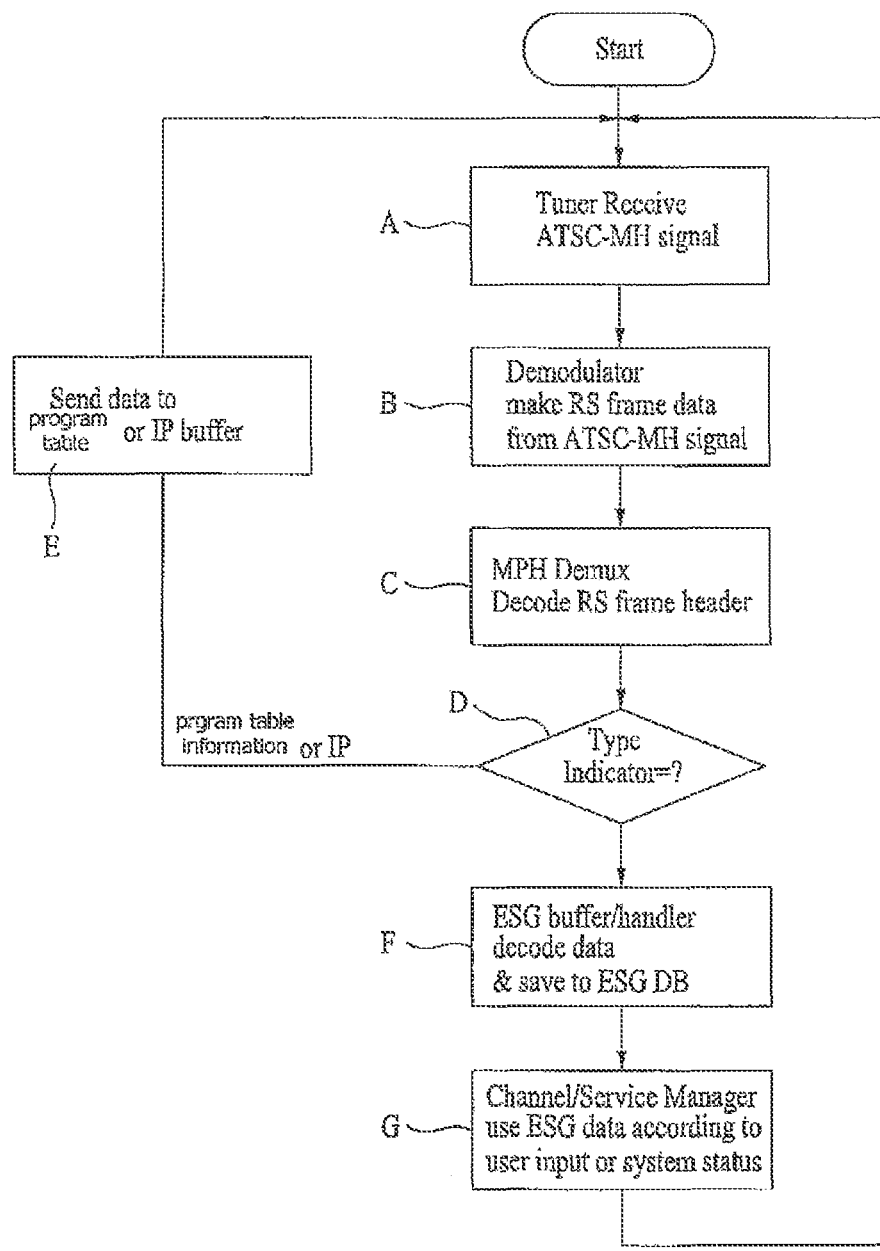
FIG. 121 is a view showing an example of receiving service guide information

FIG. 121 is a flowchart illustrating a method of receiving the service guide information from the broadcasting system.

First, the tuner receives the broadcasting signal (MH signal) according to the broadcast receiving system (A).

Then, the demodulator acquires RS frame data from the received broadcasting signal (B).

The demultiplexer demultiplexes the data included in the payload of the RS frame data using an RS frame header (C).

If the payload of the RS frame data is the program table information and the A/V/Data of the IP stream from the Type Indicator field of the RS frame header (D), the program table information and the A/V/Data of the IP stream are processed according to the receiving method (E).

In contrast, if the Type Indicator field indicates the service guide information (ESG) (D), the service guide information buffer/handler decodes the service guide information data and stores the decoded service guide information data in the service guide information database (F).

The channel manager or the service manager of the application manager may output and process the service guide information according to the state of the system or the input signal of the user (G).

In this embodiment, the Type Indicator field is an example of information indicating that the service guide information is in the MPH RS frame. This information may be included is in any field of the MPH broadcast data.

According to the present invention, it is possible to receive mobile service data via even a channel having serious ghost or noise, without an error.

According to the present invention, it is possible to improve the reception performance of the receiving system in an environment having a significant channel variation, by inserting known data to a specific location of a data region and transmitting the data.

According to the present invention, it is possible to reduce the power of the receiving system by multiplexing the mobile service data and the main service data in a parade.

In particular, the present invention is efficiently applicable to a portable or mobile receiver which requires robustness against a rapid channel variation or noise.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method for transmitting broadcast signals, the method comprising:
    encoding, by an encoder processor, service data of a service, signaling information about the encoded service data, and bootstrapping information for Electronic Service Guide (ESG) information related to the service; and
    transmitting, by a transmitter, the broadcast signals including the encoding service data, the encoded signaling information, and the encoded bootstrapping information
    wherein the service data is transmitted in Asynchronous Layered Coding/Layered Coding Transport (ALC/LCT) packets,
    wherein the broadcast signals are transmitted via a first channel, and
    wherein the bootstrapping information includes information indicating whether or not the ESG information is transmitted via a second channel.

2. The method of claim 1, wherein the bootstrapping information includes destination internet protocol (IP) address information containing a destination address of the ALC/LCT packets carrying the service, port information containing a port number of the ALC/LCT wickets carrying the service, and source IP address information containing a source address of the ALC/LCT packets carrying the service.

3. The method of claim 1, wherein the bootstrapping information is transmitted via a first channel, and
    wherein the bootstrapping information includes information indicating whether or not Electronic Service Guide (ESG) information is transmitted via a second channel.

4. The method of claim 3, wherein the bootstrapping information includes location information for acquiring die ESG information via the second channel.

5. The method of claim 1, wherein the service data includes Electronic Service Guide (ESG) information.

6. An apparatus for transmitting broadcast signals, the apparatus comprising:
    an encoder processor to encode service data of a service, signaling information about the encoded service data, and bootstrapping information for Electronic Service Guide (ESG) information related to the service; and
    a transmitter to transmit the broadcast signals including the encoding service data, the encoded signaling information, and the encoded bootstrapping information
    wherein the service data is transmitted in Asynchronous Layered Coding/Layered Coding Transport (ALC/LCT) packets, wherein the broadcast signals are transmitted via a first channel, and
    wherein the bootstrapping information includes information indicating whether or not the ESG information is transmitted via a second channel.

7. The apparatus of claim 6, wherein the bootstrapping information includes destination internet protocol (IP) address information containing a destination address of the ALC/LCT packets carrying the service, port information containing a port number of the ALC/LCT packets carrying the service, and source IP address information containing a source address of the ALC/LCT packets carrying the service.

8. The apparatus of claim 6, wherein the bootstrapping information is transmitted via a first channel, and
    wherein the bootstrapping information includes information indicating whether or not Electronic Service Guide (ESG) information is transmitted via a second channel.

9. The apparatus of claim 8, wherein the bootstrapping information includes location information for acquiring the ESG information via the second channel.

10. The apparatus of claim 6, wherein the service data includes Electronic Service Guide(ESG) information.

\* \* \* \* \*